US011009793B2

(12) United States Patent
Fukushima et al.

(10) Patent No.: US 11,009,793 B2
(45) Date of Patent: May 18, 2021

(54) MONOMER, POLYMER, RESIST COMPOSITION, AND PATTERNING PROCESS

(71) Applicant: Shin-Etsu Chemical Co., Ltd., Tokyo (JP)

(72) Inventors: Masahiro Fukushima, Joetsu (JP); Masayoshi Sagehashi, Joetsu (JP); Koji Hasegawa, Joetsu (JP); Teppei Adachi, Joetsu (JP); Kazuhiro Katayama, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 241 days.

(21) Appl. No.: 16/108,598

(22) Filed: Aug. 22, 2018

(65) Prior Publication Data

US 2019/0064664 A1 Feb. 28, 2019

(30) Foreign Application Priority Data

Aug. 23, 2017 (JP) ............................ JP2017-159962

(51) Int. Cl.

| | |
|---|---|
| ***G03F 7/00*** | (2006.01) |
| ***G03F 7/039*** | (2006.01) |
| ***G03F 7/20*** | (2006.01) |
| ***G03F 7/038*** | (2006.01) |
| ***G03F 7/004*** | (2006.01) |
| *C08F 220/28* | (2006.01) |
| *C08F 220/30* | (2006.01) |

(52) U.S. Cl.

CPC .......... *G03F 7/0397* (2013.01); *G03F 7/0045* (2013.01); *G03F 7/0382* (2013.01); *G03F 7/2024* (2013.01); *C08F 220/283* (2020.02); *C08F 220/303* (2020.02)

(58) Field of Classification Search

CPC .................................................. C08F 220/282

See application file for complete search history.

(56) References Cited

U.S. PATENT DOCUMENTS

| | | | |
|---|---|---|---|
| 6,800,423 B2 | 10/2004 | Yokoyama et al. | |
| 7,300,739 B2 | 11/2007 | Allen et al. | |
| 7,563,558 B2 | 7/2009 | Allen et al. | |
| 8,227,183 B2 | 7/2012 | Tsubaki et al. | |
| 2017/0226252 A1 | 8/2017 | Sagehashi et al. | |

FOREIGN PATENT DOCUMENTS

| | | | |
|---|---|---|---|
| JP | 2003-195502 A | 7/2003 | |
| JP | 2005-3862 A | 1/2005 | |
| JP | 2005-003863 A | 1/2005 | |
| JP | 2006-145775 A | 6/2006 | |
| JP | 2006-215067 A | 8/2006 | |
| JP | 2006-317803 A | 11/2006 | |
| JP | 4554665 B2 | 7/2010 | |
| KR | 10-2017-0094496 A | 8/2017 | |
| KR | 20170094496 A * | 8/2017 | ............ C08F 220/18 |
| WO | 20040/74936 A1 | 9/2004 | |

OTHER PUBLICATIONS

Kim et al. (Macromolecular Rapid Communications; vol. 26, pp. 1412-1417 (2005)) (Year: 2005).*

Office Action dated Nov. 18, 2019, issued in counterpart KR application No. 10-2018-0098640, with English translation. (17 pages).

Jin-Baek Kim and Kyoung-Seon Kim, "Novel Photobleachable Deep UV Resists Based on Single Component Nonchemically Amplified Resist System", Macromolecular Rapid Communications, (2005), vol. 26, pp. 1412-1417, cited in KR Office Action dated Nov. 18, 2019. (6 pages).

Sooriyakumaran et al., "193-nm Negative Resist Based on Acid-Catalyzed Elimination of Polar Molecules", Proc. SPIE, (2004), vol. 5376, pp. 71. Cited in Specification. ( 8 pages).

* cited by examiner

*Primary Examiner* — Chanceity N Robinson

(74) *Attorney, Agent, or Firm* — Westerman, Hattori, Daniels & Adrian, LLP

(57) ABSTRACT

A monomer and polymer having a substituent group capable of polarity switch under the action of acid are provided. A resist composition comprising the polymer forms at a high resolution a negative pattern insoluble in alkaline developer and having high etch resistance.

17 Claims, No Drawings

MONOMER, POLYMER, RESIST COMPOSITION, AND PATTERNING PROCESS

CROSS-REFERENCE TO RELATED APPLICATION

This non-provisional application claims priority under 35 U.S.C. § 119(a) on Patent Application No. 2017-159962 filed in Japan on Aug. 23, 2017, the entire contents of which are hereby incorporated by reference.

TECHNICAL FIELD

This invention relates to a monomer, a polymer, a resist composition comprising the polymer, and a pattern forming process using the composition.

BACKGROUND ART

To meet the demand for higher integration density and operating speed of LSIs, the effort to reduce the pattern rule is in rapid progress. The wide-spreading flash memory market and the demand for increased storage capacities drive forward the miniaturization technology. As the advanced miniaturization technology, the self-aligned double patterning (SADP) process of adding film to opposite sidewalls of lines of a resist pattern resulting from ArF lithography for thereby forming two patterns with half line width from one pattern is successful in manufacturing microelectronic devices at the 20-nm node in a mass scale. As the miniaturization technology for microelectronic devices of the next generation 10-nm node, the self-aligned quadruple patterning (SAQP) which is double repetition of SADP is a candidate. It is pointed out that this process is quite expensive because formation of sidewall film by CVD and processing by dry etching are repeated several times. Extreme ultraviolet (EUV) lithography of wavelength 13.5 nm is capable of forming a pattern with a size of the order of 10 nm via single exposure, but suffers from the problems of still low laser power and low productivity. As the miniaturization technology comes to the deadlock, the development of three-dimensional devices such as vertically stacked flash memories typically BiCS is started, but expected to be a high cost process.

Recently, a highlight is put on the organic solvent development again. A positive resist composition featuring a high resolution is subjected to organic solvent development to form a negative pattern. As the ArF resist composition for negative tone development with organic solvent, positive ArF resist compositions of the prior art design may be used. Such a pattern forming process is described in Patent Document 1.

In the process of forming a negative tone pattern via organic solvent development, a film from which a robust protective group such as cyclic structure having dry etch resistance has been eliminated is left as the negative pattern. Thus the film is short of dry etch resistance. This serious problem must be overcome before the negative pattern formation via organic solvent development can be implemented.

On the other hand, studies have also been made on the negative pattern formation via development in alkaline aqueous solution. Known resist compositions used in this process include a negative resist composition of polarity switch type comprising a base resin comprising recurring units having γ-hydroxycarboxylic acid which forms lactone ring by PEB (see Patent Document 2), a negative resist composition comprising a copolymer comprising alcoholic hydroxyl-containing (meth)acrylate units and fluoroalcohol-containing units and a crosslinker (see Patent Document 3), and negative resist compositions of crosslinking type comprising a crosslinker and a combination of α-hydroxyacrylate and lactone units (see Patent Document 4), α-hydroxyacrylate and fluoroalcohol units (see Patent Documents 5 to 7), and mono(meth)acryloyloxypinacol and fluoroalcohol units (see Patent Document 8).

Of these, Patent Document 1 describes a negative resist composition of polarity switch type, not resorting to crosslinking reaction, in which γ-hydroxycarboxylic acid units incur swell of the pattern after development. Patent Documents 2 to 7 relate to negative resist compositions of crosslinking type. Although the negative pattern formation by cooperation of alcoholic hydroxyl group and crosslinker has the problems of bridging between pattern features and pattern collapse due to swell, it is observed that the incorporation of fluoroalcohol units has a swell-reducing effect. Moreover, as recent examples of negative pattern formation by polarity switch, there are proposed base resins having polar units such as tertiary hydroxyl group, tertiary ether bond, tertiary ester bond or acetal bond as the polarity switch group. Of these, a polymer using a polar unit having one tertiary hydroxyl group is unlikely to swell after development. However, the difference of dissolution rate in developer between unexposed and exposed regions is insufficient, which raises the problem that a footing occurs at the bottom of a line-and-space pattern, that is, pattern features take a tapered shape. See Patent Documents 9 and 10 and Non-Patent Document 1.

All the negative pattern forming processes mentioned above are effective to some extent in forming pattern features with a size of the order of 100 nm. However, their performance is insufficient in forming pattern features with a size of smaller than 100 nm, because pattern bridging and collapse due to swell, and footing at the pattern bottom inevitably occur. Although active efforts have recently been devoted on the negative pattern forming process via organic solvent development, the organic solvent used as the developer is more expensive than conventional alkaline developers. From the standpoint of etch resistance improvement, it is desired to have a negative resist composition which is amenable to conventional alkaline development at a high resolution and allows a robust backbone structure to be left in the film after development.

CITATION LIST

Patent Document 1: JP 4554665 (U.S. Pat. No. 8,227,183)
Patent Document 2: JP-A 2003-195502
Patent Document 3: WO 2004/074936
Patent Document 4: JP-A 2005-003862
Patent Document 5: JP-A 2005-003863
Patent Document 6: JP-A 2006-145775
Patent Document 7: JP-A 2006-317803
Patent Document 8: JP-A 2006-215067
Patent Document 9: U.S. Pat. No. 7,300,739
Patent Document 10: U.S. Pat. No. 7,563,558
Non-Patent Document 1: Proc. SPIE vol. 5376, p 71 (2004)

DISCLOSURE OF INVENTION

The requirements for further miniaturization continue severer in these years. In the negative pattern forming process via organic solvent development, on which active efforts have been devoted, the negative pattern defined in the resist film has a reduced carbon density as compared with that prior to exposure. It is then desired to improve the resistance to etching of the resist film and the retention of pattern shape after etching.

An object of the invention is to provide a monomer having a substituent group capable of polarity switch under the action of acid, a polymer having a substituent group capable of polarity switch under the action of acid, a resist composition comprising the polymer, and a pattern forming process using the composition.

The inventors have found that a resist composition comprising a polymer having a substituent group capable of polarity switch under the action of acid as base resin forms at a high resolution a negative pattern insoluble in alkaline developer and having high etch resistance.

In one aspect, the invention provides a monomer having a partial structure represented by the formula (1) and an organic group containing a polymerizable functional group, and adapted to undergo a polarity switch under the action of acid.

(1)

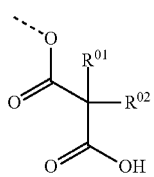

Herein $R^{01}$ and $R^{02}$ are each independently hydrogen, or a $C_1$-$C_6$ straight, branched or cyclic monovalent hydrocarbon group in which any constituent —$CH_2$— moiety may be replaced by —O— or —C(═O)—, $R^{01}$ and $R^{02}$ may bond together to form an alicyclic group with the carbon atom to which they are attached, the broken line denotes a valance bond to the organic group containing a polymerizable functional group.

In a preferred embodiment, the monomer is represented by the formula (1a) or (1b).

(1a)

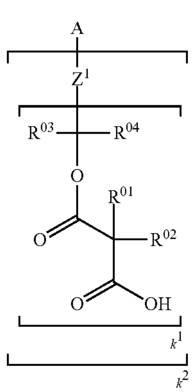

-continued (1b)

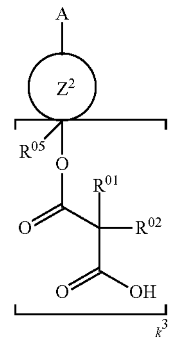

Herein A is a $C_2$-$C_{20}$ organic group containing a polymerizable functional group; $R^{01}$ and $R^{02}$ are each independently hydrogen, or a $C_1$-$C_6$ straight, branched or cyclic monovalent hydrocarbon group in which any constituent —$CH_2$— moiety may be replaced by —O— or —C(═O)—, $R^{01}$ and $R^{02}$ may bond together to form an alicyclic group with the carbon atom to which they are attached; $R^{03}$ to $R^{05}$ are each independently a $C_1$-$C_{10}$ straight, branched or cyclic monovalent hydrocarbon group in which any constituent —$CH_2$— moiety may be replaced by —O— or —C(═O)—, $R^{03}$ and $R^{04}$ may bond together to form an alicyclic group with the carbon atom to which they are attached; $Z^1$ is a single bond, or a $C_1$-$C_{20}$ straight, branched or cyclic $(k^1+1)$-valent aliphatic hydrocarbon group in which any constituent —$CH_2$— moiety may be replaced by —O— or —C(═O)—, with the proviso that when A bonds with $Z^1$ or $Z^2$ via an ester bond, the carbon atom in $Z^1$ or $Z^2$ in bond with the ester oxygen atom in A is not tertiary carbon atom, excluding the case wherein the carbon atom in $Z^1$ or $Z^2$ in bond with A is the carbon atom at the 1-position on an adamantane ring; $Z^2$ is a $C_3$-$C_{10}$ $(k^3+1)$-valent cycloaliphatic hydrocarbon group in which any constituent —$CH_2$— moiety may be replaced by —O— or —C(═O)—; $k^1$ is an integer of 1 to 4, $k^2$ is 1 or 2, and $k^3$ is an integer of 1 to 3.

In a more preferred embodiment, A is an acryloyloxy, methacryloyloxy or optionally heteroatom-containing cycloalkenyl group.

In a second aspect, the invention provides a polymer comprising recurring units having a partial structure represented by the formula (1) on a side chain, and adapted to undergo a polarity switch under the action of acid, (1)

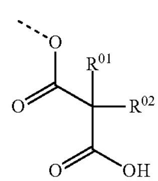

Herein $R^{01}$ and $R^{02}$ are as defined above, the broken line denotes a valance bond to an organic group containing a backbone.

Specifically, the polymer comprises recurring units containing a group represented by the formula (2a) and/or a group represented by the formula (2b) on the side chain.

(2a)

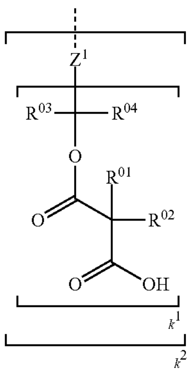

(2b)

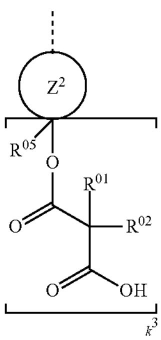

Herein the broken line denotes a valance bond to the polymer backbone, $R^{01}$ and $R^{02}$ are as defined above; $R^{03}$ to $R^{05}$ are each independently a $C_1$-$C_{10}$ straight, branched or cyclic monovalent hydrocarbon group in which any constituent —$CH_2$— moiety may be replaced by —O— or —C(═O)—, $R^{03}$ and $R^{04}$ may bond together to form an alicyclic group with the carbon atom to which they are attached; $Z^1$ is a single bond, or a $C_1$-$C_{20}$ straight, branched or cyclic ($k^1$+1)-valent aliphatic hydrocarbon group in which any constituent —$CH_2$— may be replaced by —O— or —C(═O)—, with the proviso that when the backbone bonds with $Z^1$ or $Z^2$ via an ester bond, the carbon atom in $Z^1$ or $Z^2$ in bond with the ester oxygen atom therein is not tertiary carbon atom, excluding the case wherein the carbon atom in $Z^1$ or $Z^2$ is the carbon atom at the 1-position on an adamantane ring; $Z^2$ is a $C_3$-$C_{10}$ ($k^3$+1)-valent cycloaliphatic hydrocarbon group in which any constituent —$CH_2$-moiety may be replaced by —O— or —C(═O)—; $k^1$ is an integer of 1 to 4, $k^2$ is 1 or 2, and $k^3$ is an integer of 1 to 3.

In a preferred embodiment, the recurring units are selected from the formulae (3a) to (3c).

(3a)

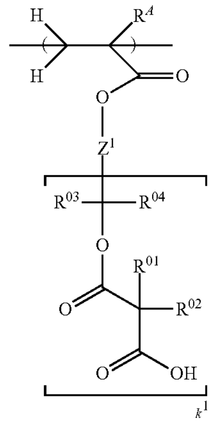

(3b)

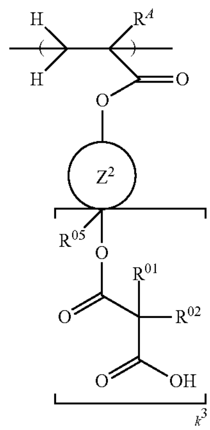

(3c)

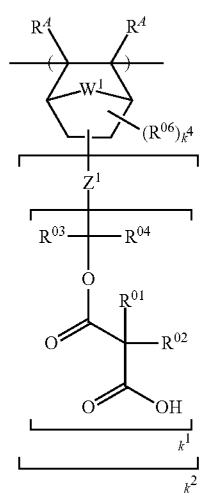

Herein $R^A$ is each independently hydrogen, methyl or trifluoromethyl; $R^{01}$, $R^{02}$ and $R^{06}$ are each independently hydrogen, or a $C_1$-$C_6$ straight, branched or cyclic monovalent hydrocarbon group in which any constituent —$CH_2$— moiety may be replaced by —O— or —C(═O)—, $R^{01}$ and $R^{02}$ may bond together to form an alicyclic group with the carbon atom to which they are attached, in the case of $k^4 \geq 2$, two $R^{06}$ may bond together to form an alicyclic group with the carbon atoms to which they are attached; $R^{03}$ to $R^{05}$ are each independently a $C_1$-$C_{10}$ straight, branched or cyclic monovalent hydrocarbon group in which any constituent —$CH_2$— moiety may be replaced by —O— or —C(═O)—, $R^{03}$ and $R^{04}$ may bond together to form an alicyclic group with the carbon atom to which they are attached; $W^1$ is —$CH_2$—, —$CH_2CH_2$—, —O— or —S—, or two separate —H; $Z^1$ is a single bond, or a $C_1$-$C_{20}$ straight, branched or cyclic $(k_1+1)$-valent aliphatic hydrocarbon group in which any constituent —$CH_2$— moiety may be replaced by —O— or —C(═O)—, with the proviso that the carbon atom in $Z^1$ or $Z^2$ in bond with the ester oxygen atom in the polymer backbone in the formula is not tertiary carbon atom, excluding the case wherein the carbon atom in $Z^1$ or $Z^2$ is the carbon atom at the 1-position on an adamantane ring; $Z^2$ is a $C_3$-$C_{10}$ $(k^3+1)$-valent cycloaliphatic hydrocarbon group in which any constituent —$CH_2$— moiety may be replaced by —O— or —C(═O)—; $k^1$ is an integer of 1 to 4, $k^2$ is 1 or 2, $k^3$ is an integer of 1 to 3, and $k^4$ is an integer of 1 to 4.

In a preferred embodiment, the polymer may further comprise recurring units of at least one type selected from recurring units having the formulae (4a) to (4c).

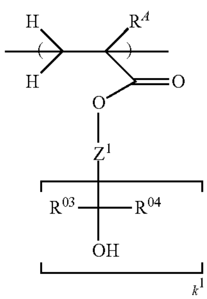

(4a)

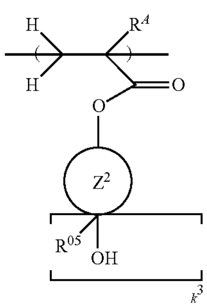

(4b)

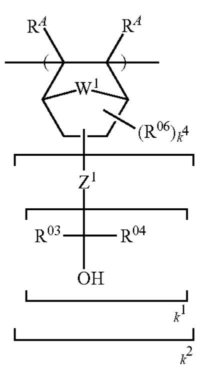

(4c)

Herein $R^A$, $R^{03}$ to $R^{06}$, $W^1$, $Z^1$, $Z^2$, $k^1$, $k^2$, $k^3$, and $k^4$ are as defined above.

In a preferred embodiment, the polymer may further comprise recurring units of at least one type selected from recurring units having the formulae (5a) to (5c).

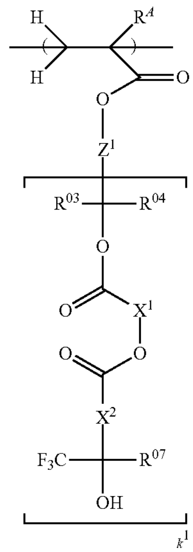

(5a)

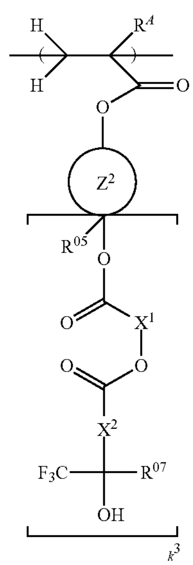

(5b)

-continued (5c)

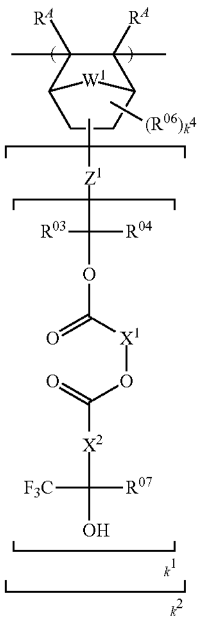

Herein $R^A$, $R^{03}$ to $R^{06}$, $W^1$, $Z^1$, $Z^2$, $k^1$, $k^2$, $k^3$, and $k^4$ are as defined above; $R^{07}$ is hydrogen, methyl or trifluoromethyl; $X^1$ is a $C_1$-$C_{10}$ straight, branched or cyclic alkylene group; $X^2$ is a single bond, methylene or ethylidene group.

In a preferred embodiment, the polymer may further comprise recurring units of at least one type selected from recurring units having the formulae (6a) to (6d).

(6a)

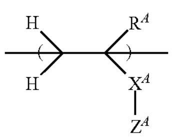

(6b)

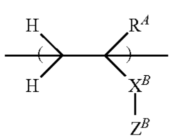

(6c)

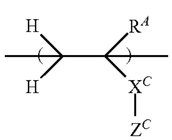

(6d)

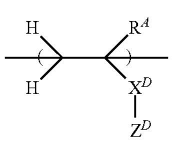

Herein $R^A$ is as defined above; $Z^A$ is a $C_1$-$C_{20}$ fluoroalcohol-containing substituent group which is free of a structure undergoing a polarity switch under the action of acid; $Z^B$ is a $C_6$-$C_{20}$ phenolic hydroxyl-containing substituent group; $Z^C$ is a $C_1$-$C_{20}$ carboxyl-containing substituent group; $Z^D$ is a substituent group having a lactone structure, sultone structure, carbonate structure, cyclic ether structure, acid anhydride structure, alcoholic hydroxyl, alkoxycarbonyl, sulfonamide or carbamoyl moiety; $X^A$ to $X^D$ are each independently a single bond, methylene, ethylene, phenylene, fluorinated phenylene, naphthylene, —O—R—, or —C(═O)—Z—R—, Z is —O— or —NH—, and R is a $C_1$-$C_6$ straight, branched or cyclic alkylene, $C_2$-$C_6$ straight, branched or cyclic alkenylene, phenylene or naphthylene group, which may contain a carbonyl moiety, ester bond, ether bond or hydroxyl moiety.

In a preferred embodiment, the polymer may further comprise recurring units of at least one type selected from recurring units having the formulae (7a) to (7c).

(7a)

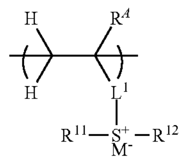

(7b)

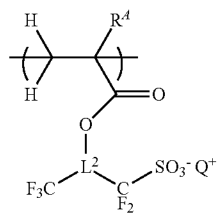

(7c)

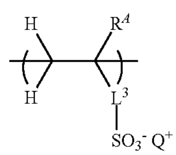

Herein $R^A$ is as defined above; $R^{11}$ and $R^{12}$ are each independently a $C_1$-$C_{20}$ straight, branched or cyclic monovalent hydrocarbon group which may contain a heteroatom, $R^{11}$ and $R^{12}$ may bond together to form a ring with the sulfur atom to which they are attached; $L^1$ is a single bond, phenylene group, —C(═O)-$L^{11}$-$L^{12}$- or —O-$L^{12}$-, $L^{11}$ is —O— or —NH—, $L^{12}$ is a $C_1$-$C_6$ straight, branched or cyclic alkylene group, $C_2$-$C_6$ straight, branched or cyclic alkenylene group, or phenylene group, which may contain a carbonyl moiety, ester bond, ether bond or hydroxyl moiety; $L^2$ is a single bond or -$L^{21}$-C(═O)—O—, $L^{21}$ is a $C_1$-$C_{20}$ straight, branched or cyclic divalent hydrocarbon group which may contain a heteroatom; $L^3$ is a single bond, methylene, ethylene, phenylene, fluorinated phenylene, —C(═O)-$L^{31}$-$L^{32}$- or —O-$L^{32}$-, $L^{31}$ is —O— or —NH—, and $L^{32}$ is a $C_1$-$C_6$ straight, branched or cyclic alkylene group, $C_2$-$C_6$ straight, branched or cyclic alkenylene group, or phenylene group, which may contain a carbonyl moiety, ester bond, ether bond or hydroxyl moiety; $M^-$ is a non-nucleophilic counter ion.

$Q^+$ is a sulfonium cation having the formula (7d) or an iodonium cation having the formula (7e).

(7d)

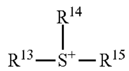

(7e)

$$R^{16}—I^+—R^{17}$$

Herein $R^{13}$ to $R^{17}$ are each independently a $C_1$-$C_{20}$ straight, branched or cyclic monovalent hydrocarbon group which may contain a heteroatom, any two of $R^{13}$, $R^{14}$ and $R^{15}$ may bond together to form a ring with the sulfur atom to which they are attached.

In a preferred embodiment, the polymer may further comprise recurring units of at least one type selected from recurring units having the formula (8).

(8)

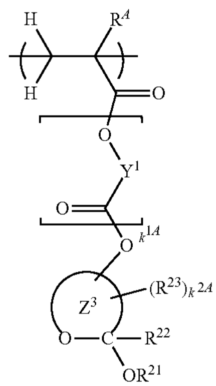

Herein $R^A$ is as defined above; $R^{21}$ to $R^{23}$ are each independently hydrogen or a $C_1$-$C_{15}$ straight, branched or cyclic monovalent hydrocarbon group in which any constituent —$CH_2$-moiety may be replaced by —O— or —C(═O)—; $Y^1$ is each independently a $C_1$-$C_{15}$ straight, branched or cyclic divalent hydrocarbon group in which any constituent —$CH_2$— moiety may be replaced by —O— or —C(═O)—; the arc $Z^3$ is a divalent hydrocarbon group which bonds with the carbon and oxygen atoms in the formula to form a $C_4$-$C_{20}$ non-aromatic mono- or polycyclic ring having a hemiacetal structure; $k^{1A}$ is 0 or 1, and $k^{2A}$ is an integer of 0 to 3.

In a third aspect, the invention provides a resist composition comprising a base resin containing the polymer defined above.

The resist composition may further comprising an acid generator and/or an organic solvent.

In a fourth aspect, the invention provides a pattern forming process comprising the steps of applying the resist composition onto a substrate, prebaking to form a resist film, exposing the resist film to high-energy radiation to define exposed and unexposed regions, baking, and developing the exposed resist film in a developer to form a pattern.

In a preferred embodiment, the developing step uses an alkaline developer in which the unexposed region of resist film is dissolved and the exposed region of resist film is not dissolved, for forming a negative tone pattern.

Advantageous Effects of Invention

Using a polymer comprising the inventive monomer as base resin, a resist composition having high transparency to radiation of wavelength 500 nm or less, especially 300 nm or less, e.g., KrF, ArF or $F_2$ laser radiation, EUV or EB is formulated. The resist composition having improved development properties is quite useful because a negative pattern insoluble in alkaline developer and having a high resolution and etch resistance can be formed therefrom.

DESCRIPTION OF EMBODIMENTS

In the disclosure, the singular forms "a," "an" and "the" include plural referents unless the context clearly dictates otherwise. The notation (Cn-Cm) means a group containing from n to m carbon atoms per group. In the chemical formulae, the broken line denotes a valence bond. Me stands for methyl, Et for ethyl, Ph for phenyl, and Ac for acetyl.

The abbreviations and acronyms have the following meaning.

EB: electron beam

EUV: extreme ultraviolet

PAG: photoacid generator

Mw: weight average molecular weight

Mn: number average molecular weight

Mw/Mn: molecular weight distribution or dispersity

GPC: gel permeation chromatography

PEB: post-exposure bake

LWR: line width roughness

It is understood that for some structures represented by chemical formulae, there can exist enantiomers and diastereomers because of the presence of asymmetric carbon atoms. In such a case, a single formula collectively represents all such isomers. The isomers may be used alone or in admixture.

Monomer

The invention provides a polymerizable monomer having a partial structure represented by the formula (1) and an organic group containing a polymerizable functional group.

(1)

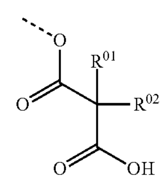

In formula (1), $R^{01}$ and $R^{02}$ are each independently hydrogen, or a $C_1$-$C_6$ straight, branched or cyclic monovalent hydrocarbon group in which any constituent —$CH_2$— moiety may be replaced by —O— or —C(═O)—. $R^{01}$ and $R^{02}$ may bond together to form an alicyclic group with the carbon atom to which they are attached. The broken line denotes a valance bond to the organic group containing a polymerizable functional group.

The monomer having a partial structure of formula (1) is preferably a monomer represented by the formula (1a) or (1b).

(1a)

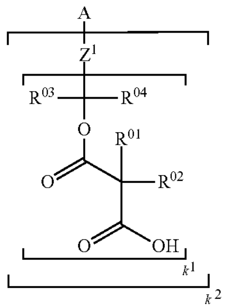

(1b)

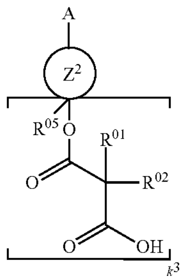

Herein A is a $C_2$-$C_{20}$ organic group containing a polymerizable functional group. $R^{01}$ and $R^{02}$ are each independently hydrogen, or a $C_1$-$C_6$ straight, branched or cyclic monovalent hydrocarbon group in which any constituent —$CH_2$— moiety may be replaced by —O— or —C(═O)—, $R^{01}$ and $R^{02}$ may bond together to form an alicyclic group with the carbon atom to which they are attached. $R^{03}$ to $R^{05}$ are each independently a $C_1$-$C_{10}$ straight, branched or cyclic monovalent hydrocarbon group in which any constituent —$CH_2$— moiety may be replaced by —O— or —C(═O)—, $R^{03}$ and $R^{04}$ may bond together to form an alicyclic group with the carbon atom to which they are attached. $Z^1$ is a single bond, or a $C_1$-$C_{20}$ straight, branched or cyclic ($k^1$+1)-valent aliphatic hydrocarbon group in which any constituent —$CH_2$— moiety may be replaced by —O— or —C(═O)—. When A bonds with $Z^1$ or $Z^2$ via an ester bond, the carbon atom in $Z^1$ or $Z^2$ in bond with the ester oxygen atom in A is not tertiary carbon atom, excluding the case wherein the carbon atom in $Z^1$ or $Z^2$ in bond with A is the carbon atom at the 1-position on an adamantane ring. $Z^2$ is a $C_3$-$C_{10}$ ($k^3$+1)-valent cycloaliphatic hydrocarbon group in which any constituent —$CH_2$— moiety may be replaced by —O— or —C(═O)—, $k^1$ is an integer of 1 to 4, $k^2$ is 1 or 2, and $k^3$ is an integer of 1 to 3.

Suitable monovalent hydrocarbon groups include alkyl groups such as methyl, ethyl, propyl, isopropyl, n-butyl, s-butyl, t-butyl, cyclopentyl, cyclohexyl, 2-ethylhexyl, n-octyl, norbornyl, tricyclodecanyl, and adamantyl.

When $R^{01}$ and $R^{02}$, or $R^{03}$ and $R^{04}$ bond together to form an alicyclic group with the carbon atom to which they are attached, suitable alicyclic groups include cyclopropane, cyclobutane, cyclopentane, and cyclohexane rings.

Examples of the $C_1$-$C_{20}$ straight, branched or cyclic ($k^1$+1)-valent aliphatic hydrocarbon group $Z^1$ are shown below, but not limited thereto.

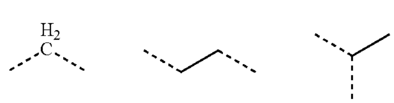

-continued

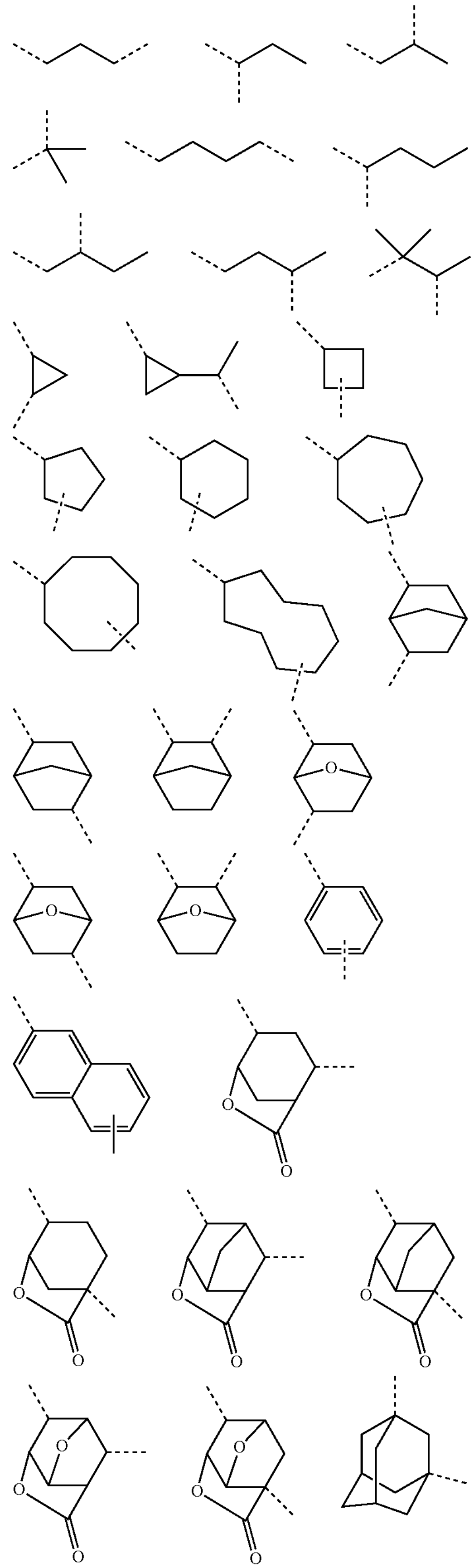

-continued
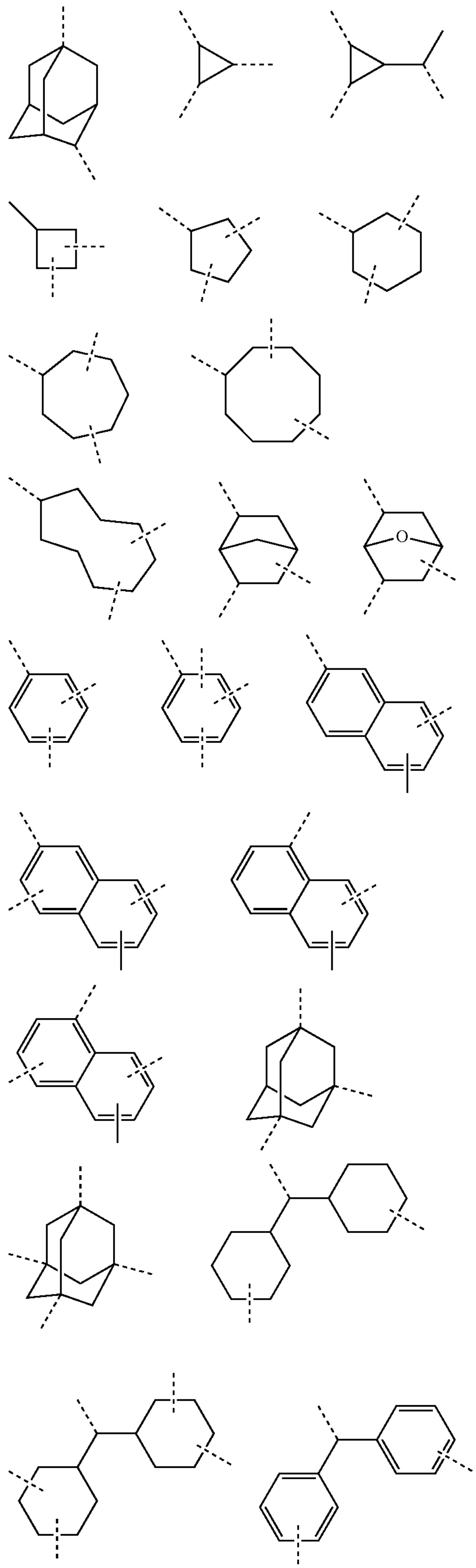
-continued
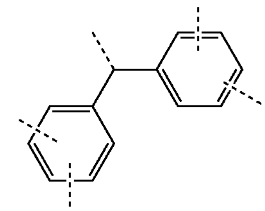
In formulae (1a) and (1b), A is a $C_2$-$C_{20}$ organic group containing a polymerizable functionality, examples of which are shown below, but not limited thereto.
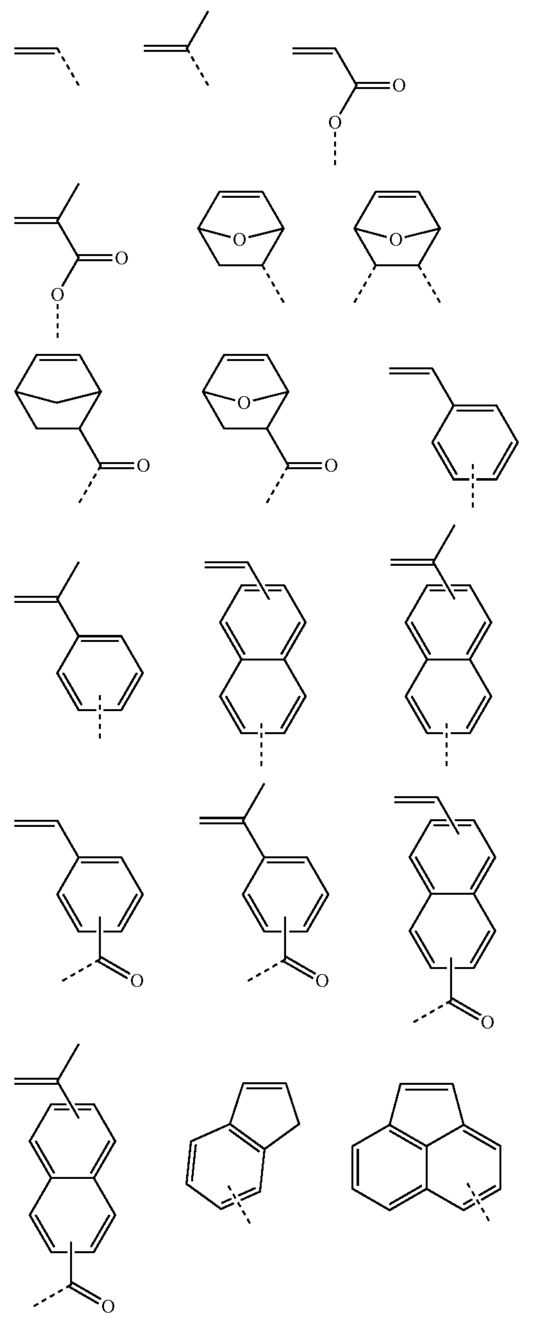

-continued

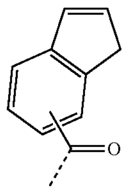
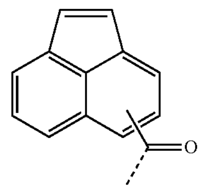
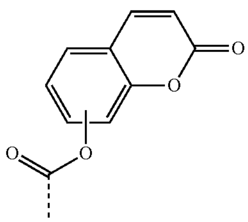
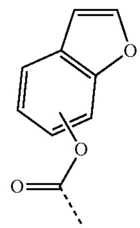
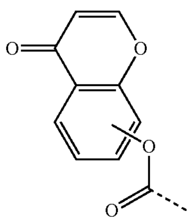
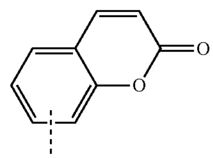
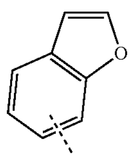
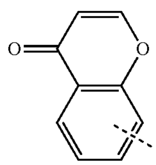
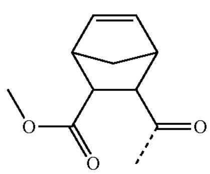
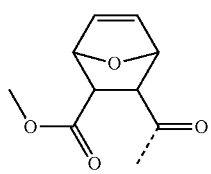
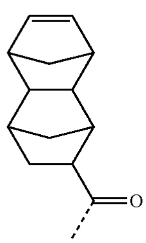

Examples of the $C_3$-$C_{10}$ ($k^3$+1)-valent cycloaliphatic hydrocarbon group $Z^2$ are shown below, but not limited thereto.

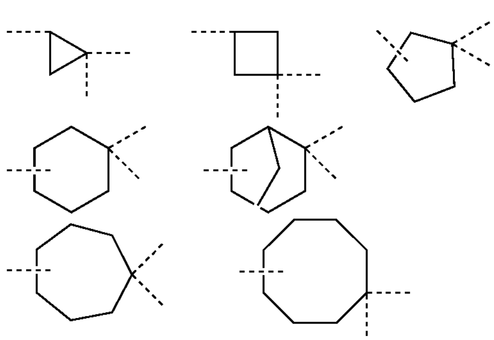

-continued

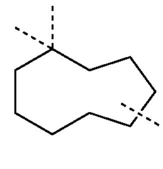
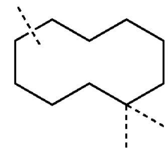
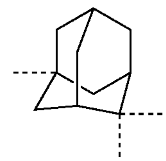

Among others, A is preferably selected from acryloyloxy, methacryloyloxy, cycloalkenyl, and vinyl groups, more preferably from acryloyloxy, methacryloyloxy, and cycloalkenyl groups. Those monomers wherein A is acryloyloxy or methacryloyloxy are advantageous in that monomers of widely varying structures can be prepared owing to ease of introduction of (meth)acryloyl group into hydroxyl group, and are liable to polymerization reaction. Those monomers in which A is cycloalkenyl are also advantageous in that polymers resulting therefrom have a robust structure and hence, an acid diffusion control capability.

Of the monomers having formula (1a) or (1b), monomers having the following formula (1a-1), (1b-1) or (1c-1) are preferred.

(1a-1)

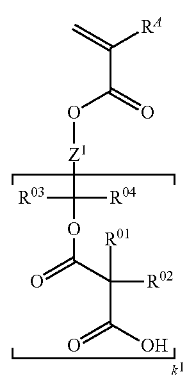

(1b-1)

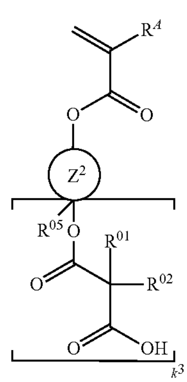

-continued

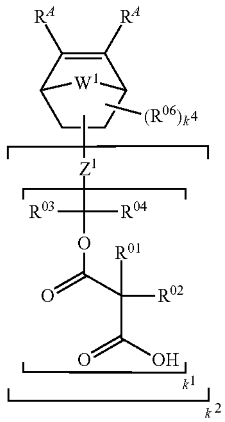

(1c-1)

Herein $R^{01}$ to $R^{05}$, $Z^1$, $Z^2$, $W^1$, $k^1$ to $k^3$ are as defined above. $R^A$ is each independently hydrogen, methyl or trifluoromethyl. $R^{06}$ is each independently hydrogen, or a $C_1$-$C_6$ straight, branched or cyclic monovalent hydrocarbon group in which any constituent —$CH_2$— moiety may be replaced by —O— or —C(═O)—, and $k^4$ is an integer of 1 to 4. In the case of $k^4 \geq 2$, two $R^{06}$ may bond together to form an alicyclic group with the carbon atom(s) to which they are attached.

Of these, those monomers having the following formula (1a-2), (1b-2) or (1c-2) are especially preferred for the reasons that the monomers have an alicyclic structure and a high carbon density so that polymers obtained therefrom are expectable to be rigid, and that the monomers themselves may be prepared from readily available reactants.

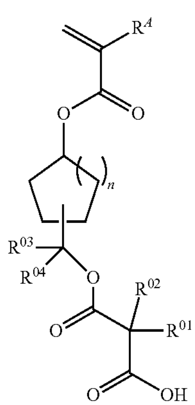

(1a-2)

-continued

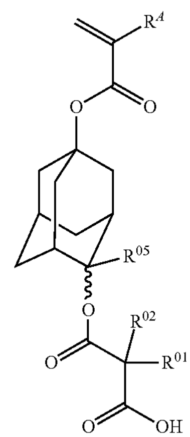

(1b-2)

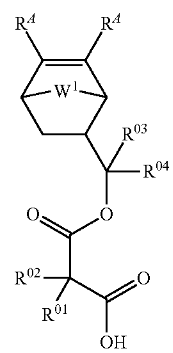

(1c-2)

Herein $R^A$, $R^{01}$ to $R^{05}$, and $W^1$ are as defined above, n is 1 or 2.

Examples of the monomer having formula (1a) are shown below, but not limited thereto. Herein A is as defined above.

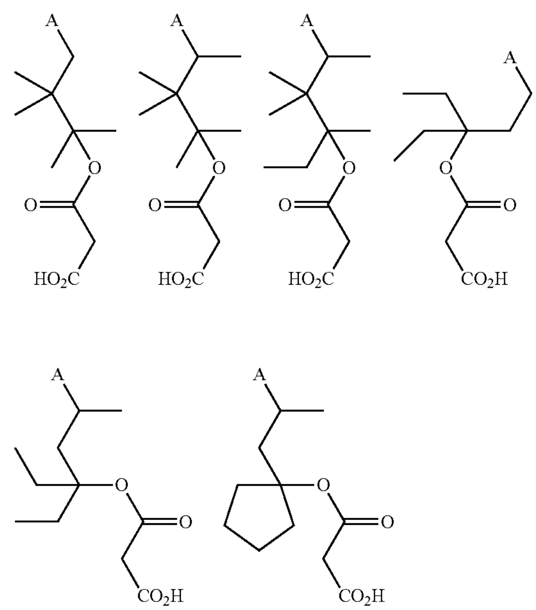

-continued
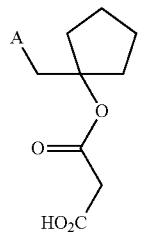
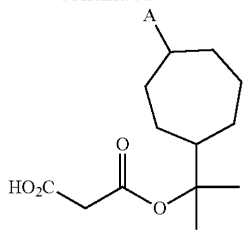
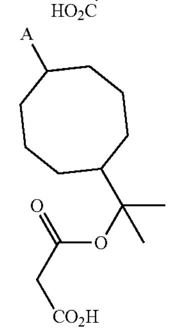
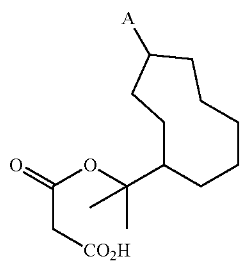
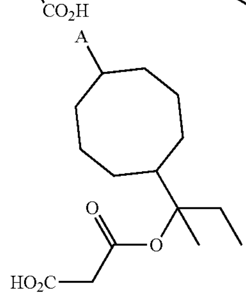
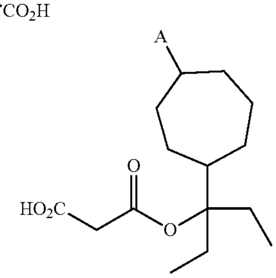
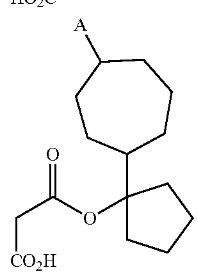
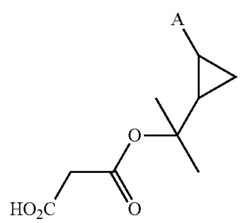
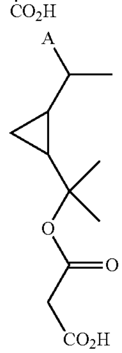
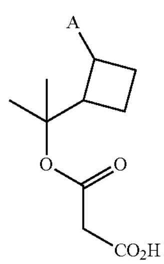
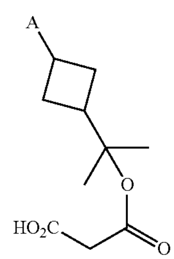
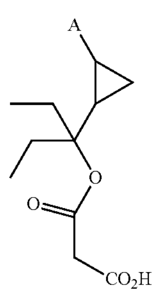
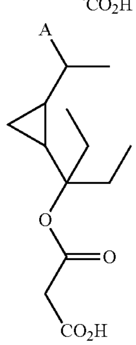
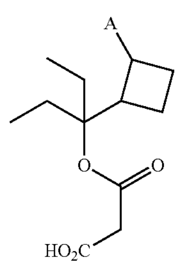
-continued
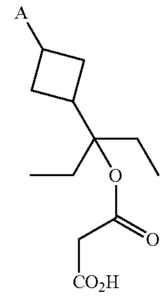
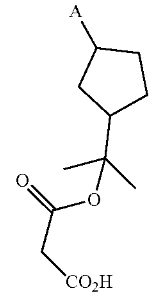
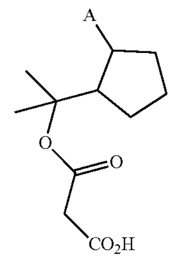
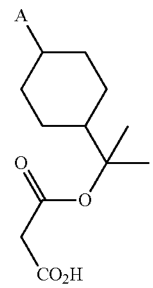
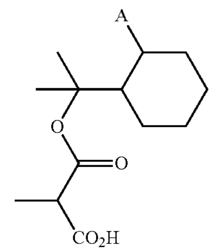
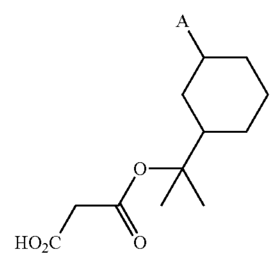
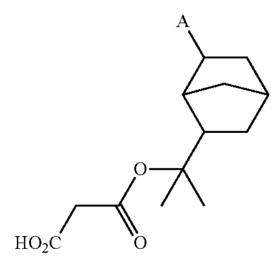
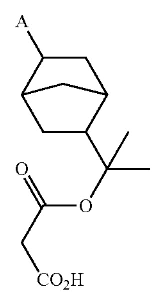
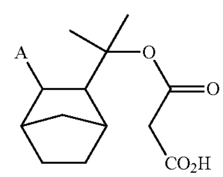
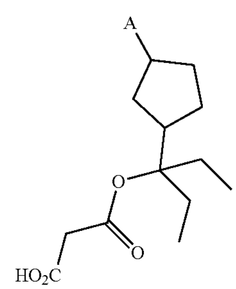
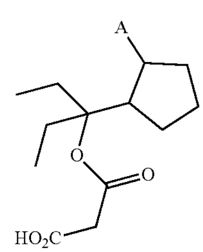
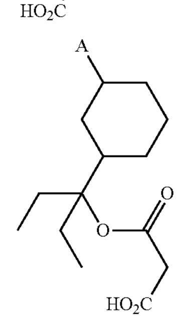

-continued
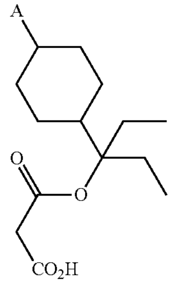
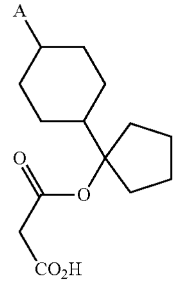
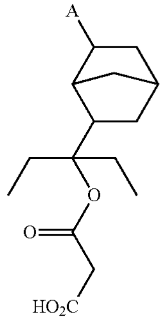
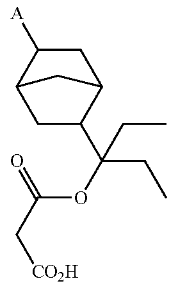
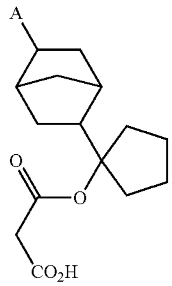
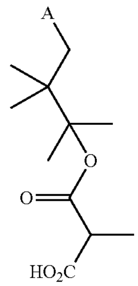
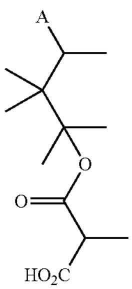
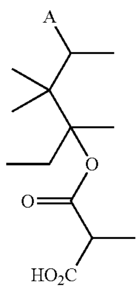
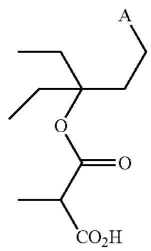
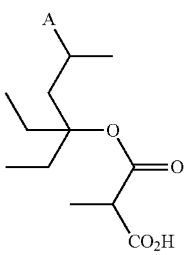
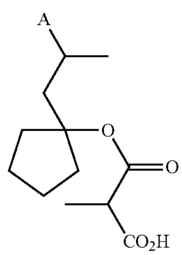
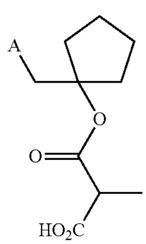
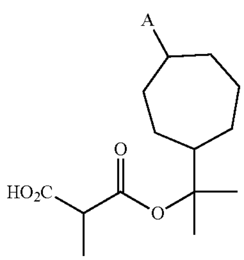
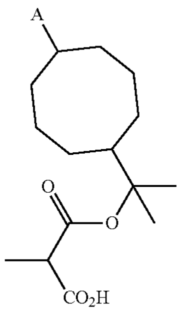
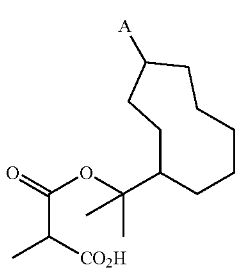
-continued
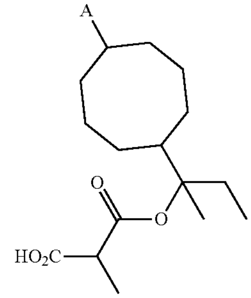
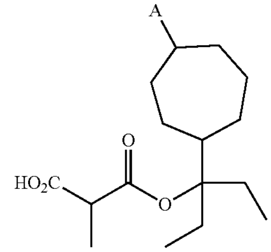
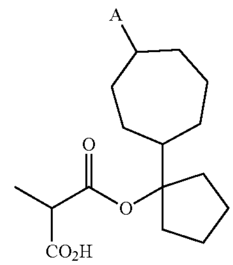
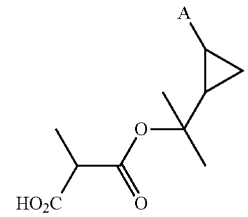
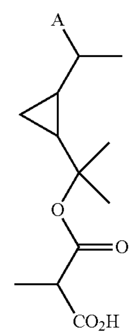
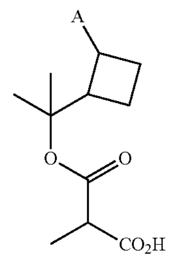
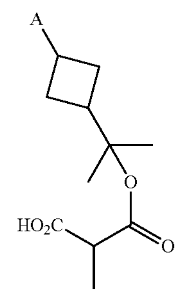
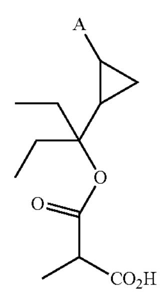
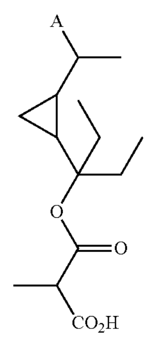
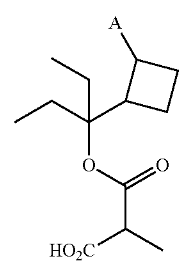
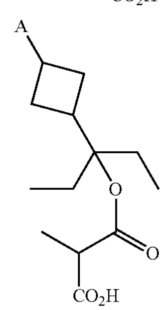
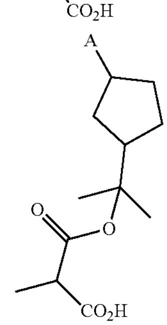
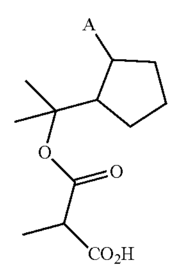

-continued
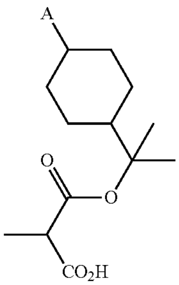
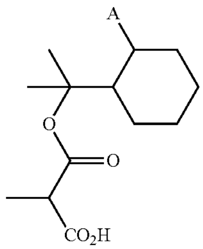
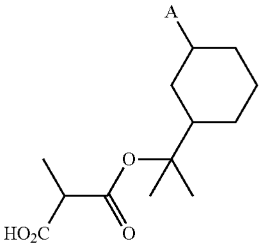
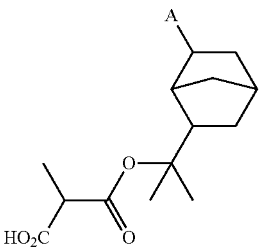
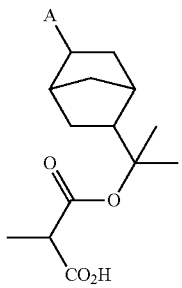
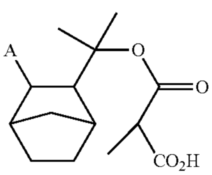
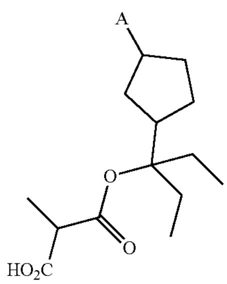
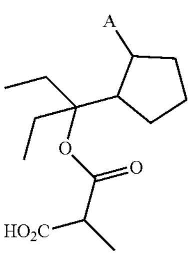
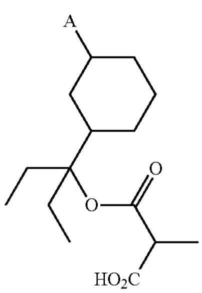
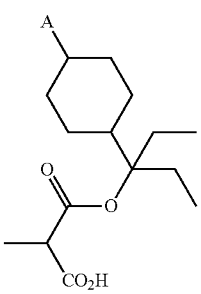
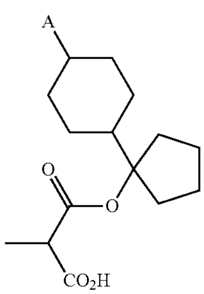
-continued
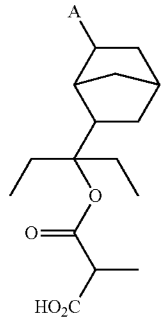
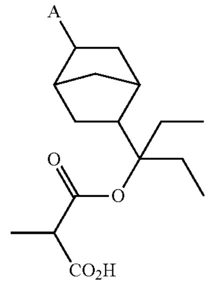
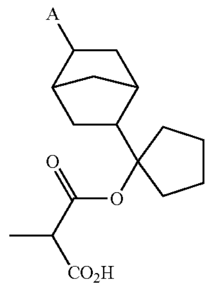
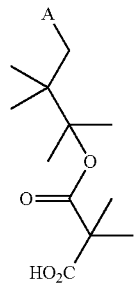
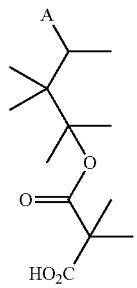
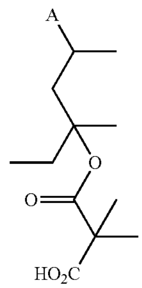
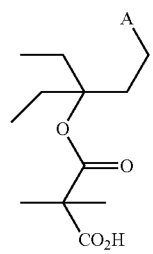
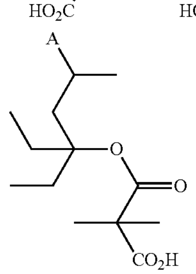
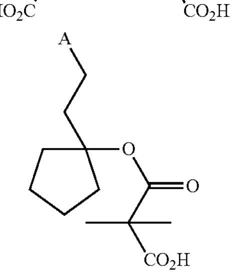
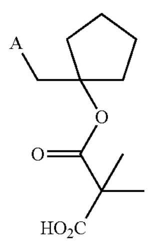
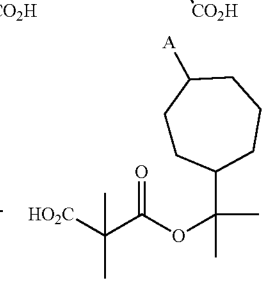
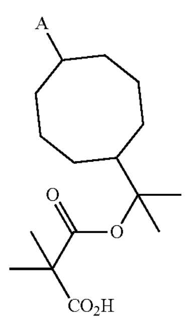
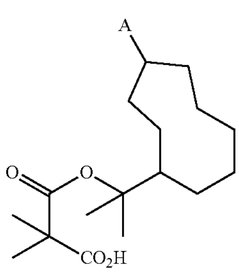

-continued
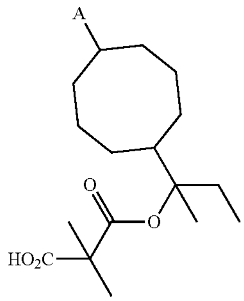
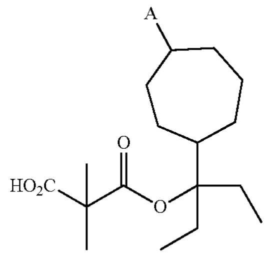
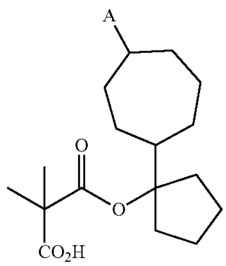
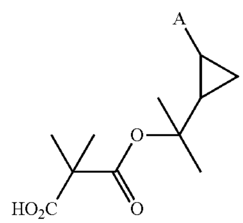
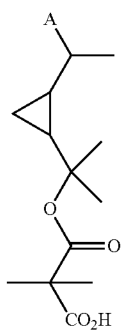
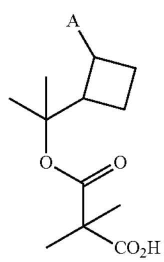
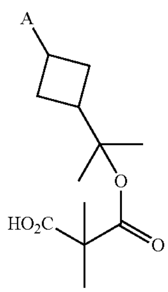
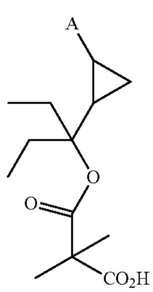
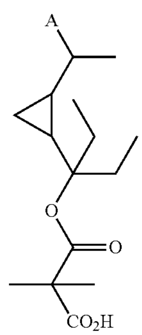
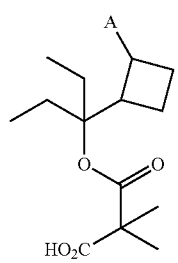
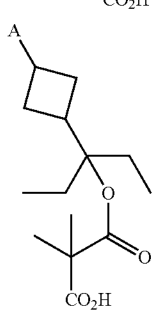
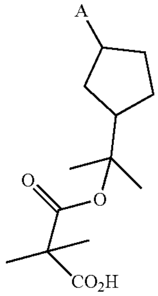
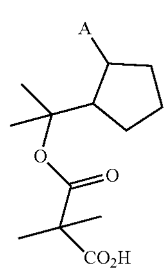
-continued
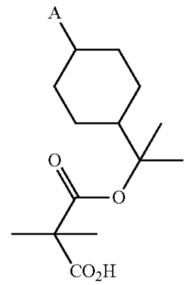
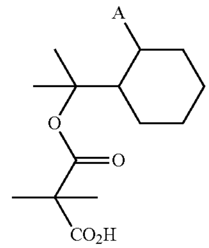
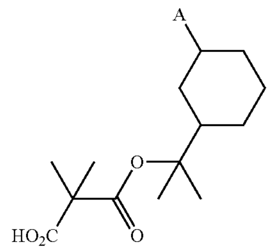
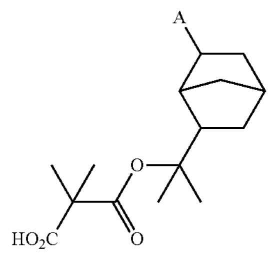
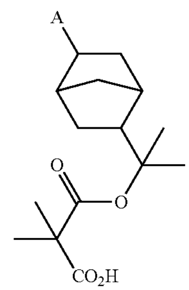
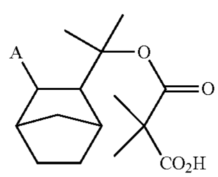
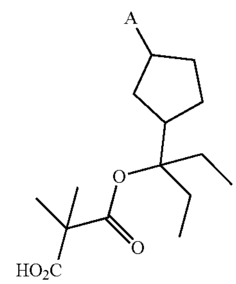
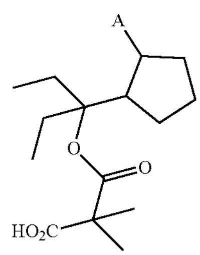
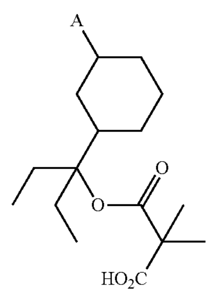
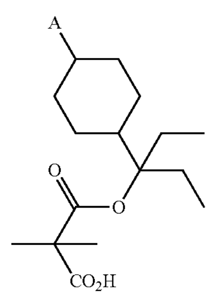
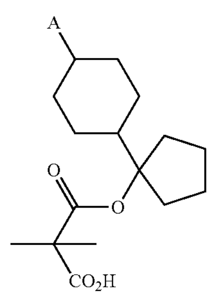

-continued
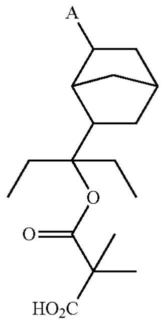
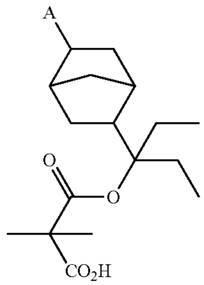
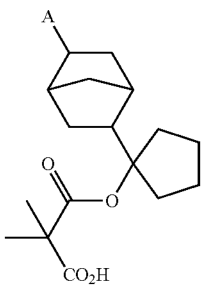
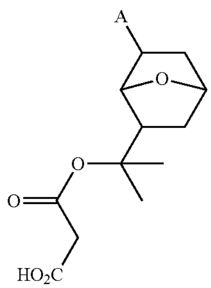
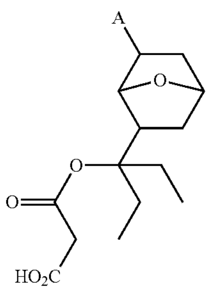
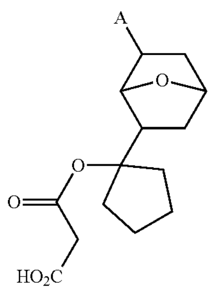
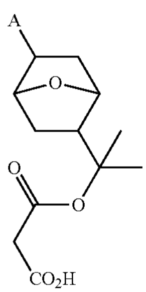
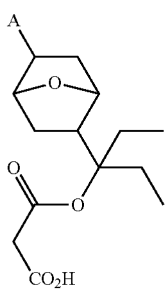
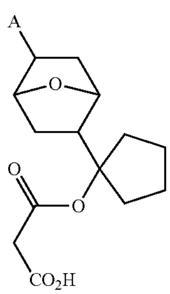
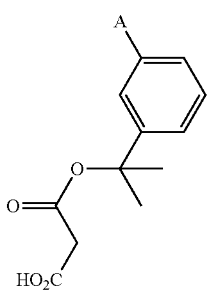
-continued
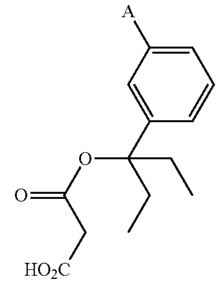
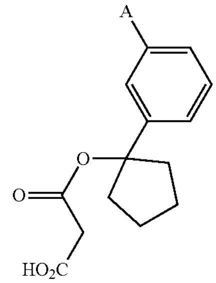
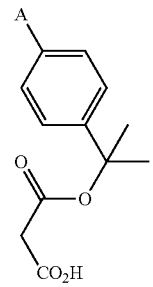
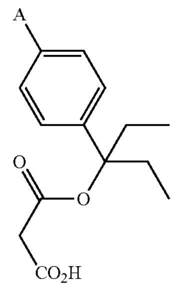
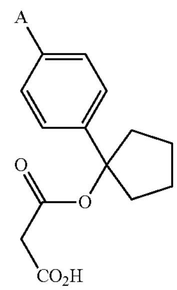
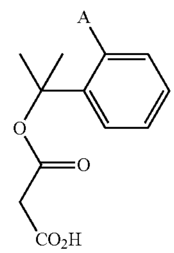
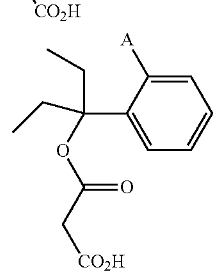
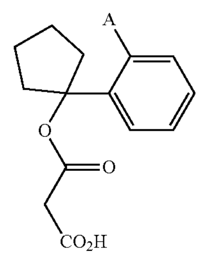
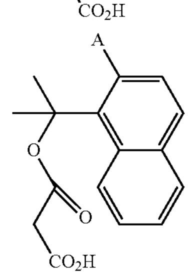
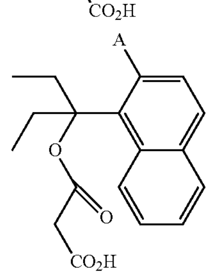
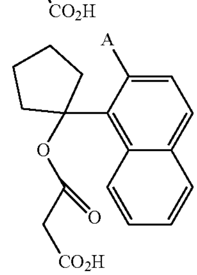
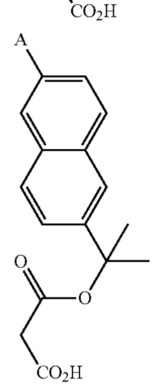
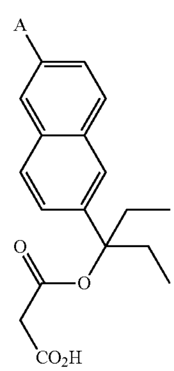

-continued
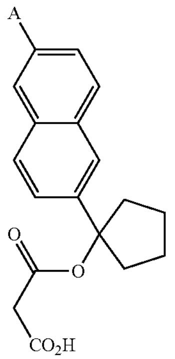
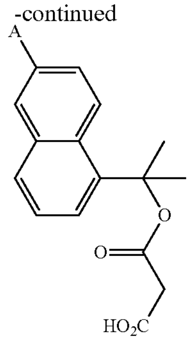
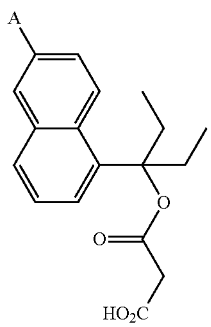
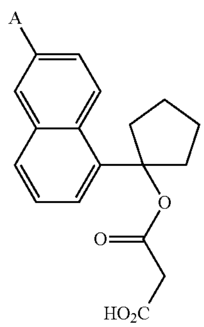
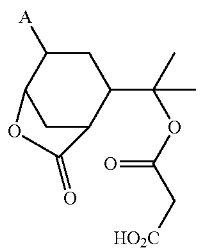
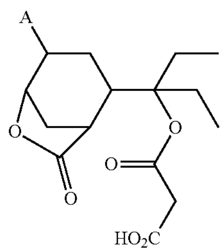
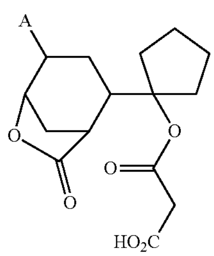
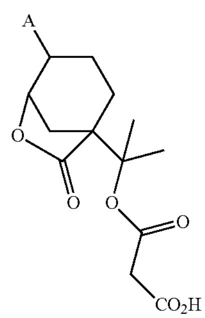
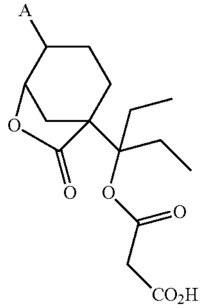
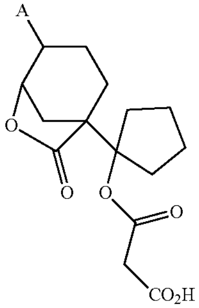
-continued
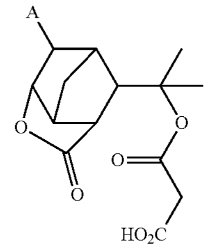
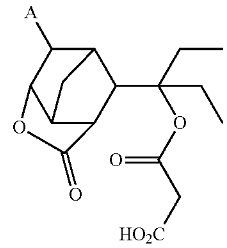
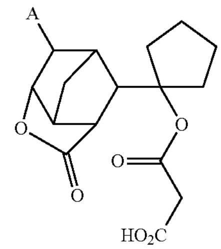
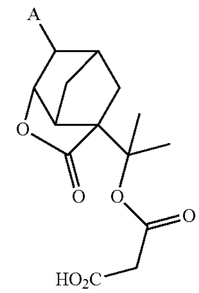
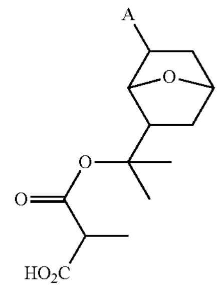
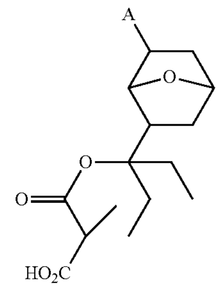
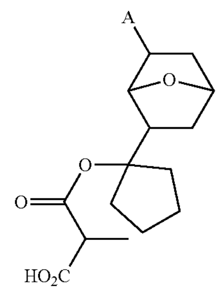
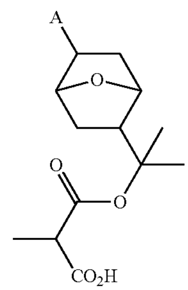
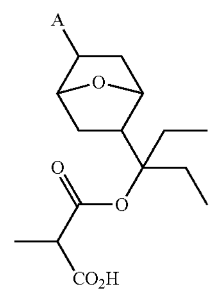
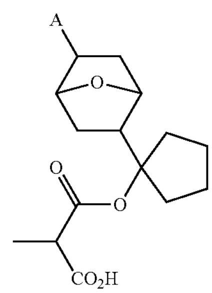
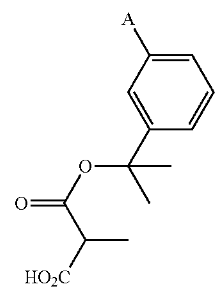
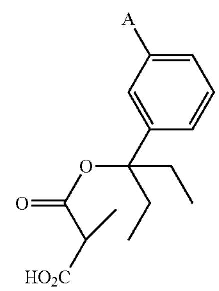

-continued
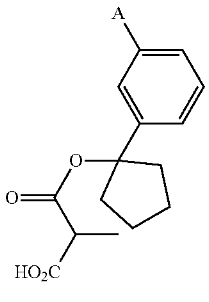
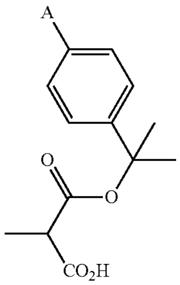
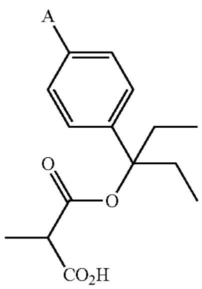
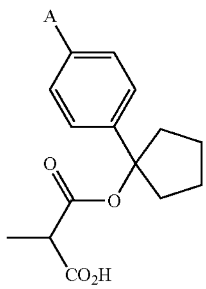
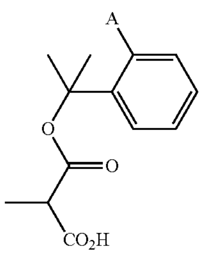
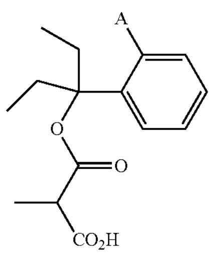
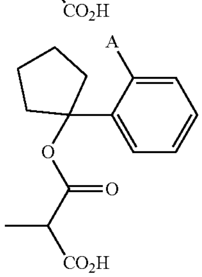
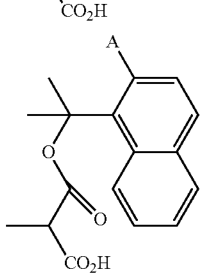
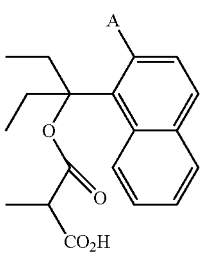
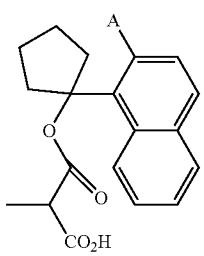
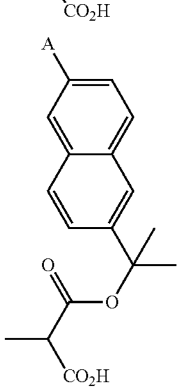
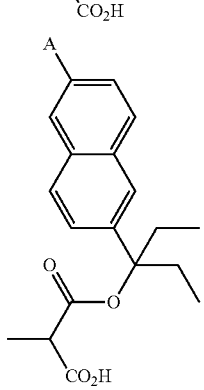
-continued
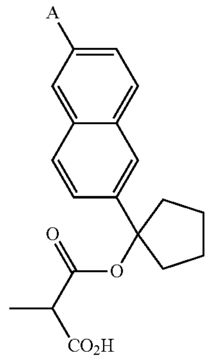
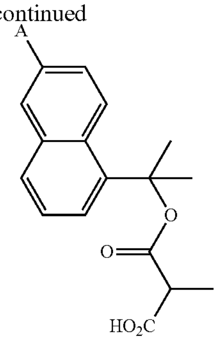
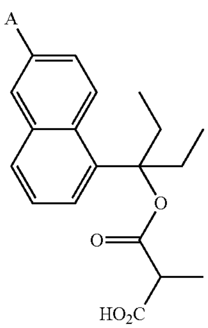
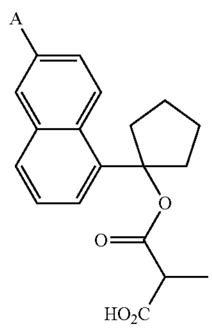
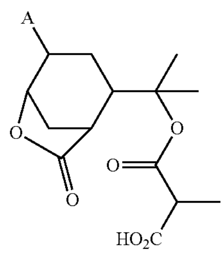
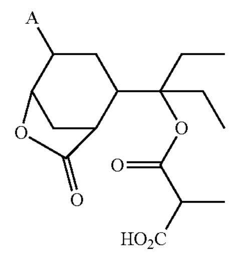
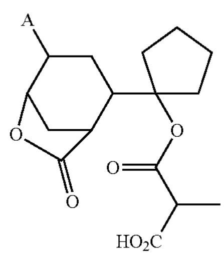
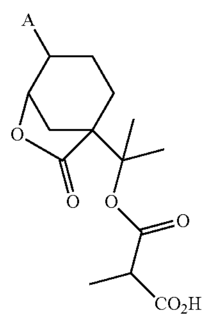
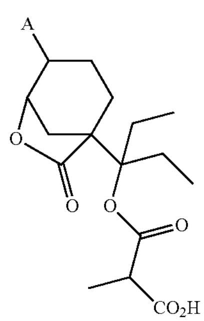
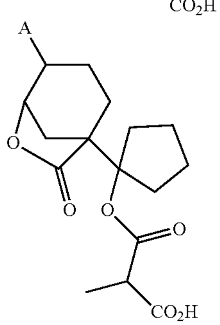

-continued
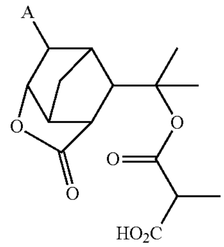
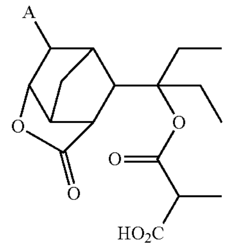
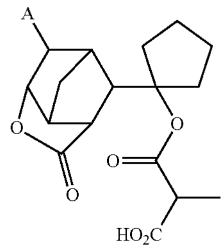
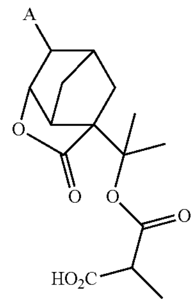
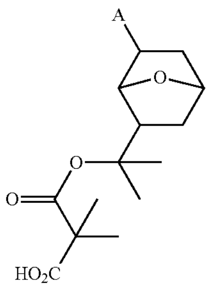
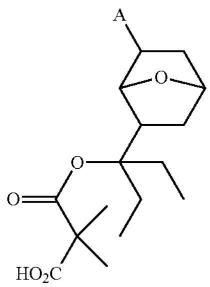
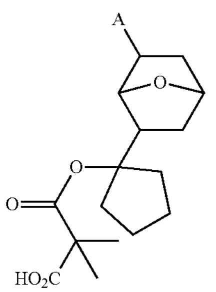
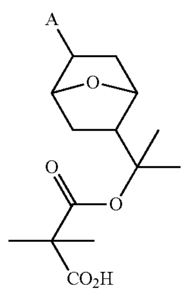
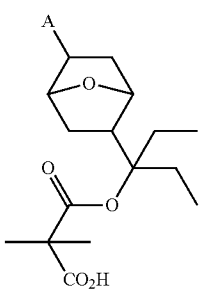
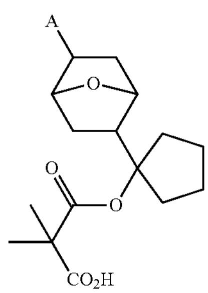
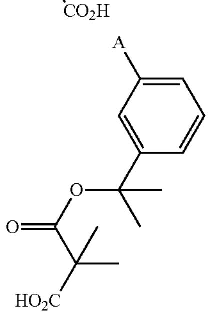
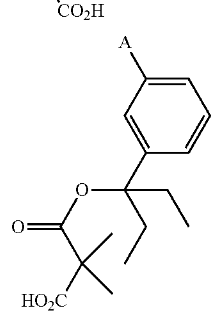
-continued
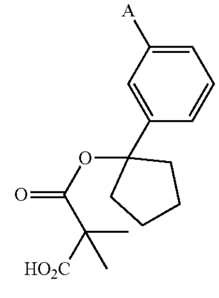
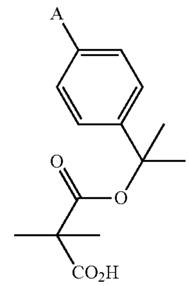
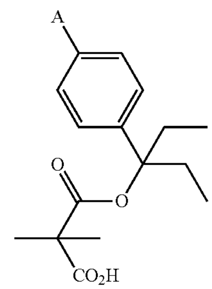
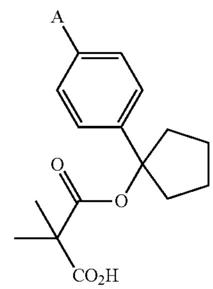
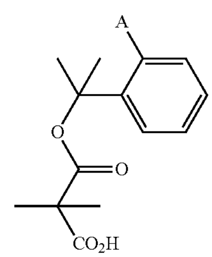
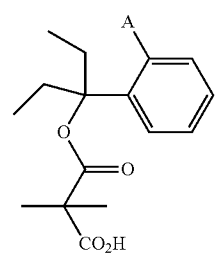
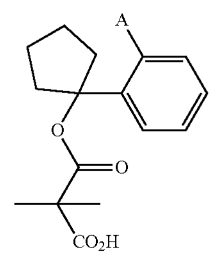
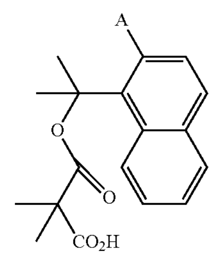
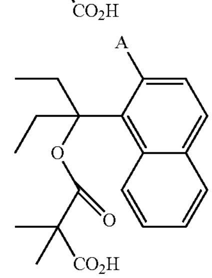
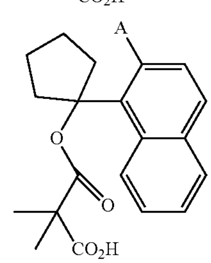
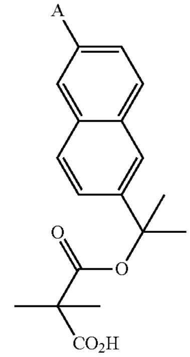
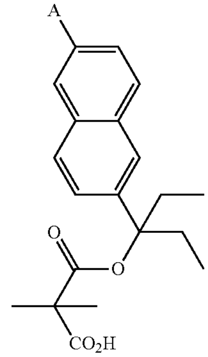

-continued
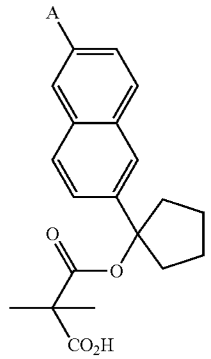
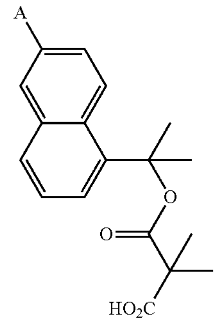
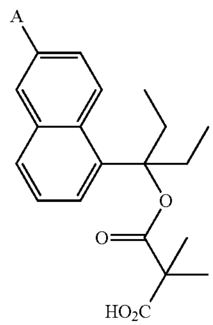
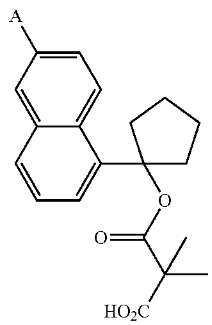
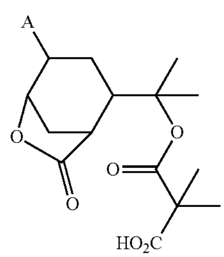
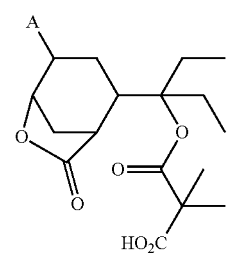
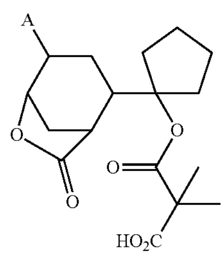
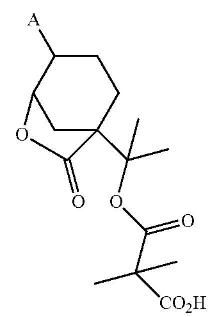
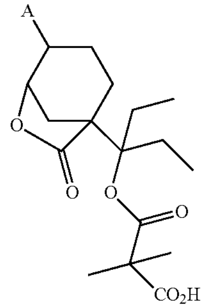
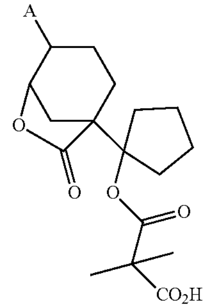
-continued
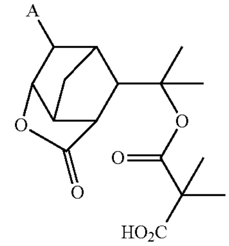
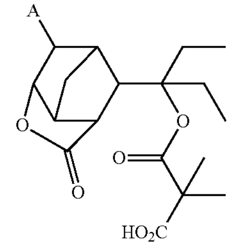
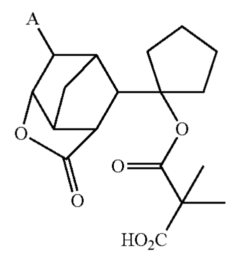
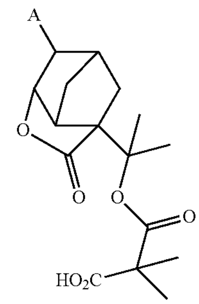
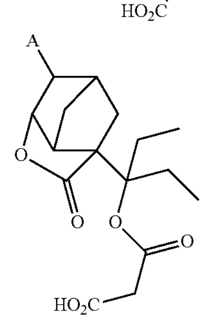
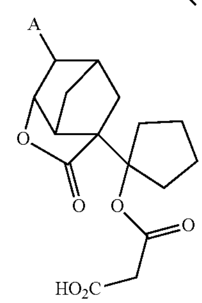
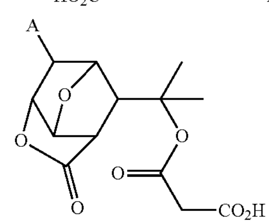
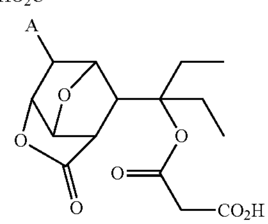
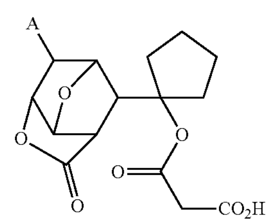
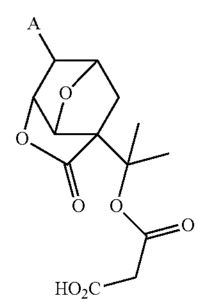
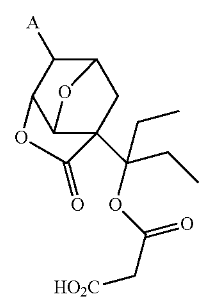
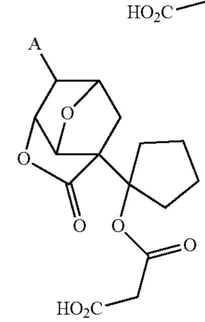

-continued
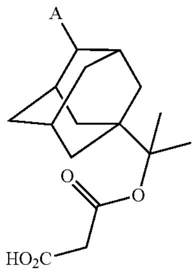
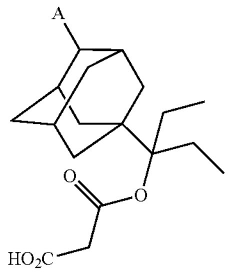
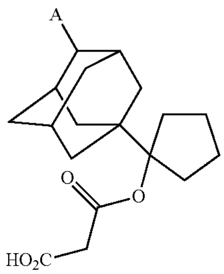
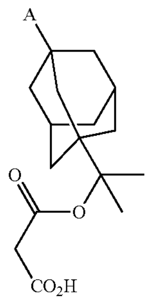
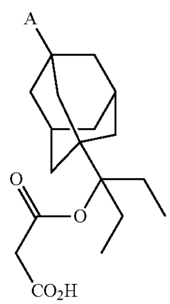
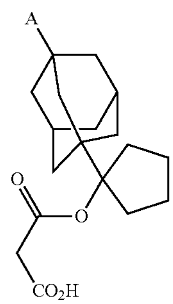
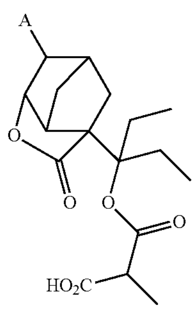
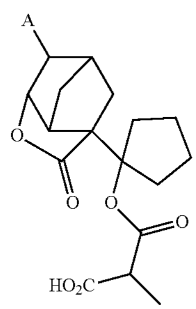
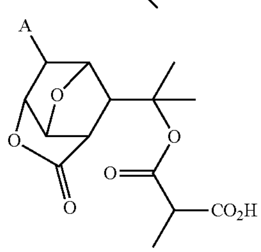
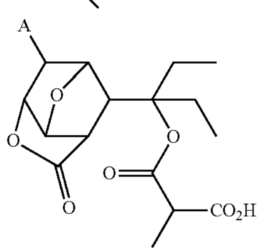
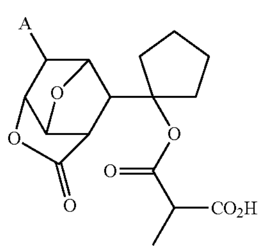
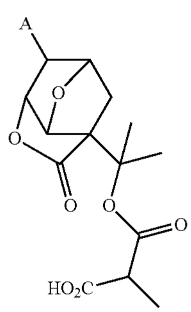
-continued
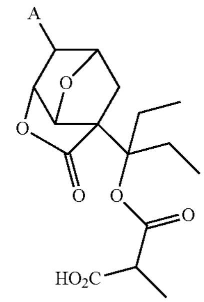
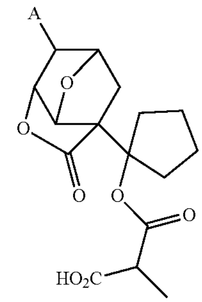
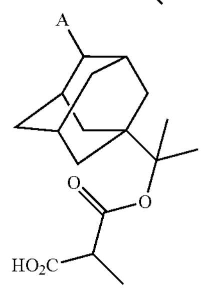
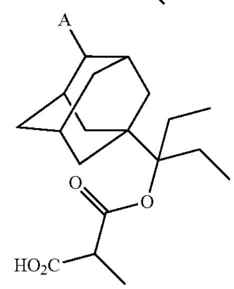
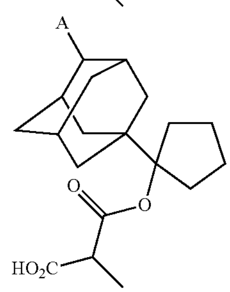
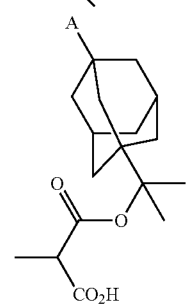
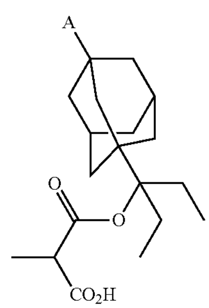
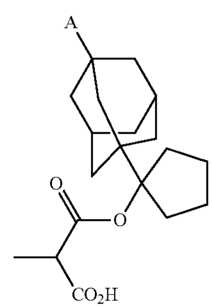
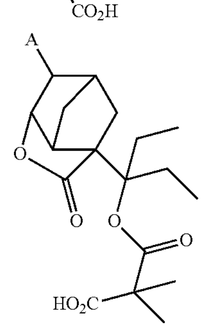
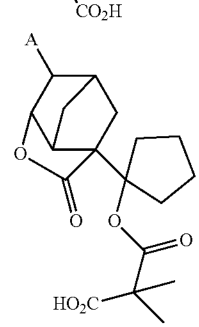
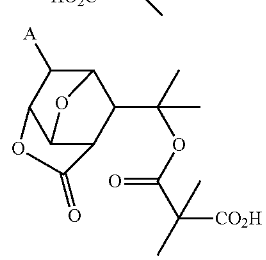
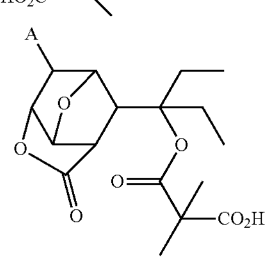

-continued
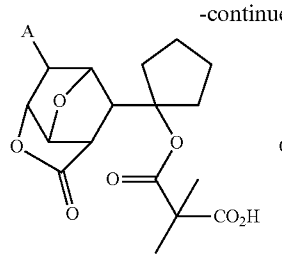
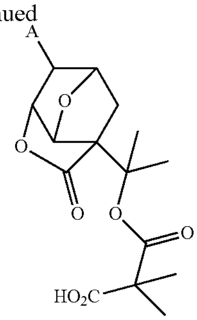
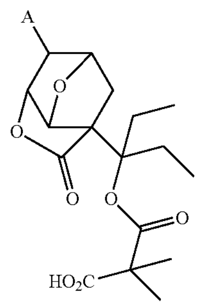
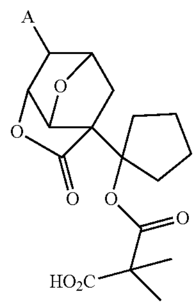
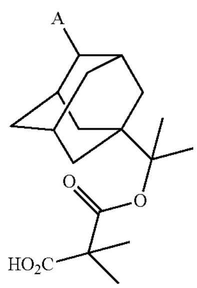
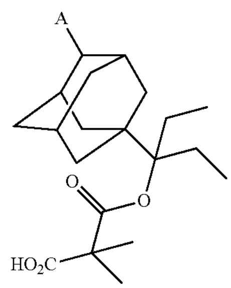
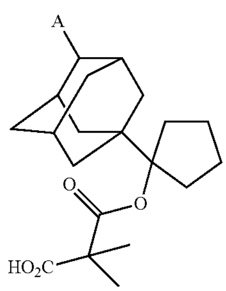
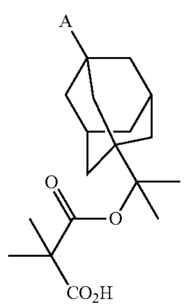
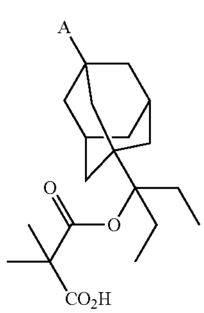
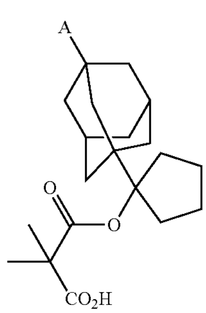
-continued
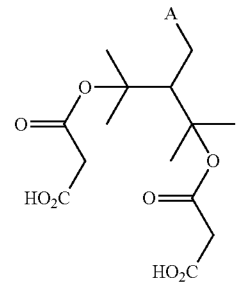
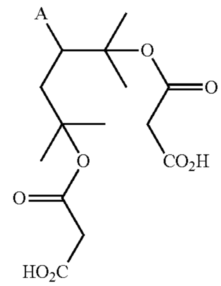
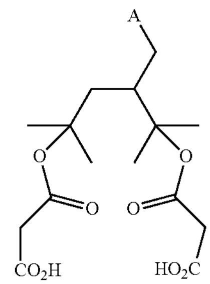
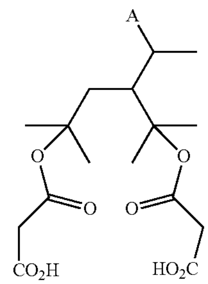
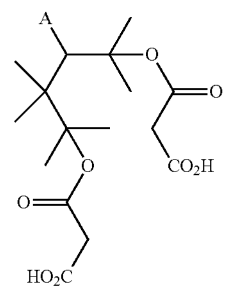
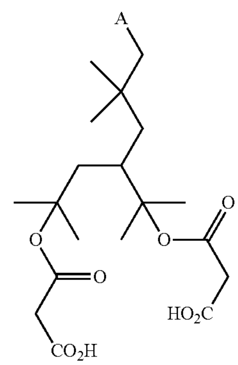
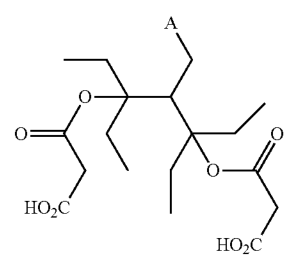
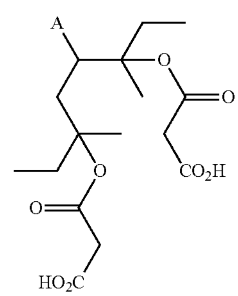
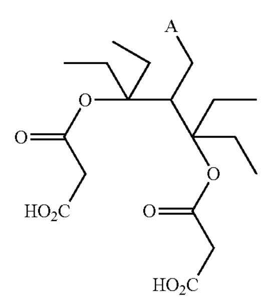
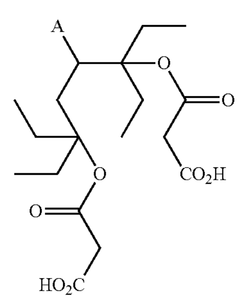

-continued
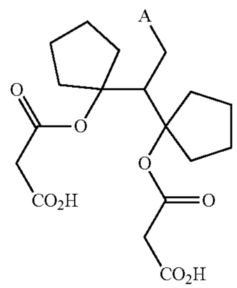
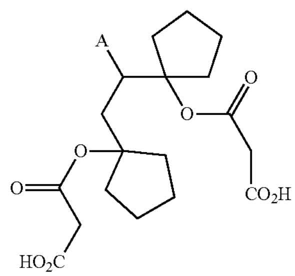
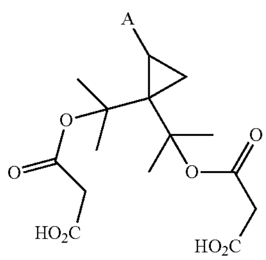
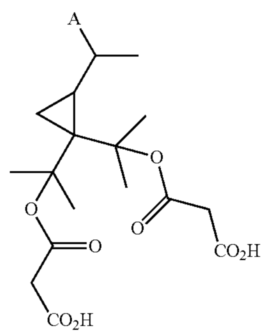
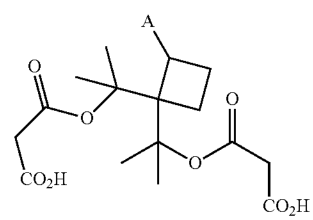
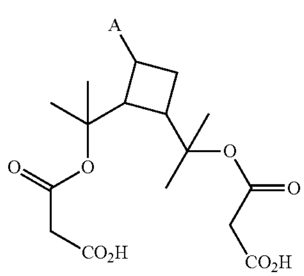
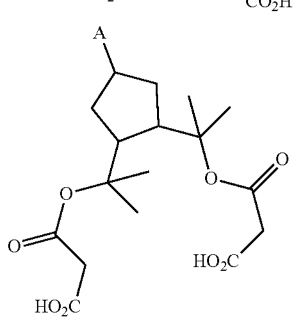
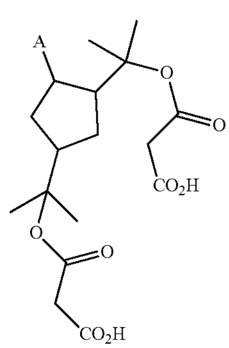
-continued
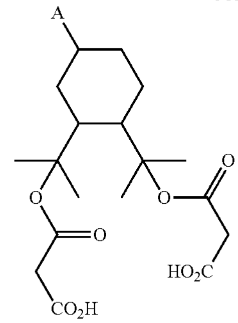
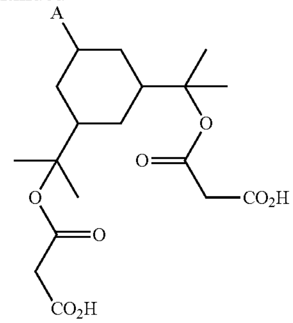
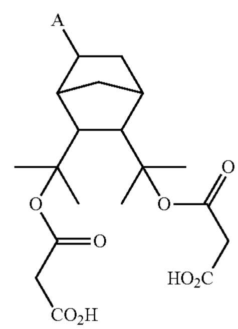
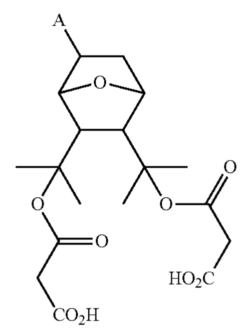
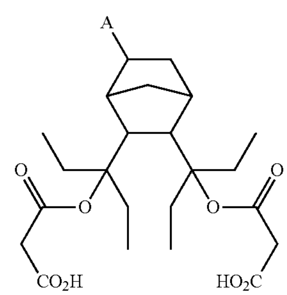
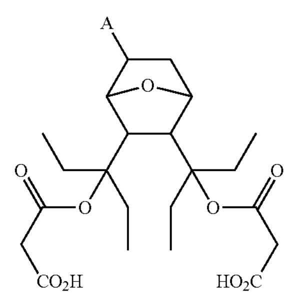
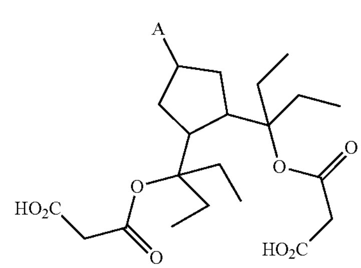

-continued
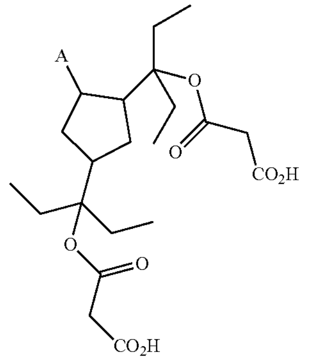
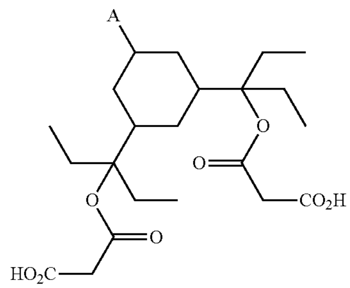
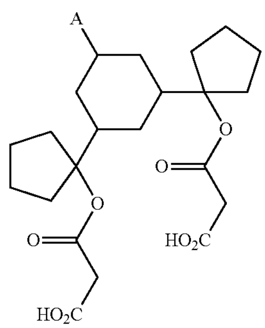
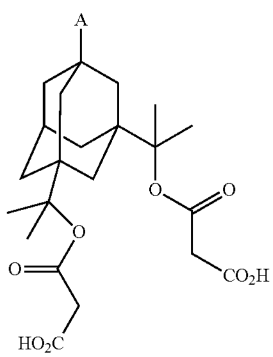
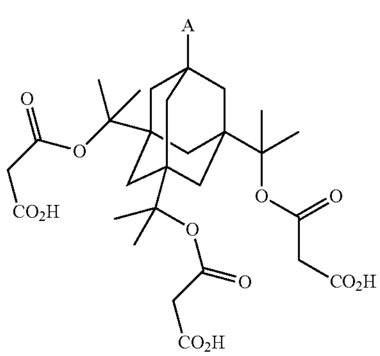
-continued
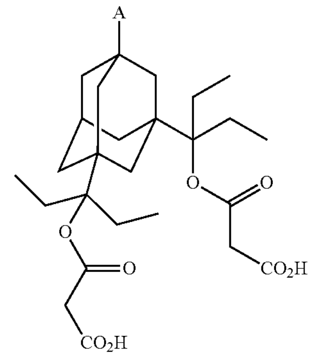
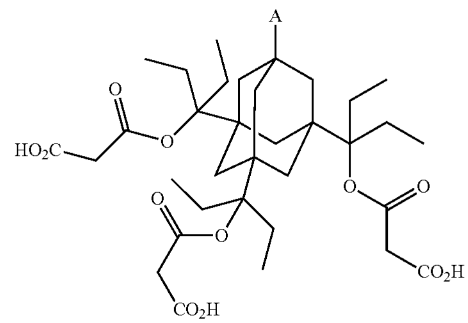
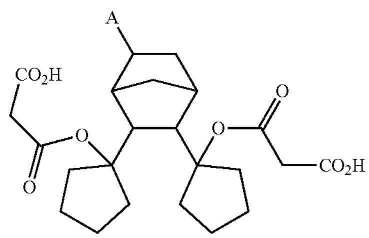
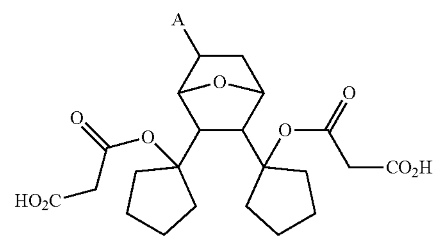
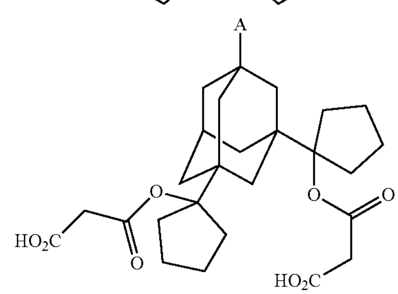
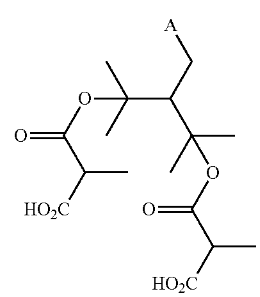
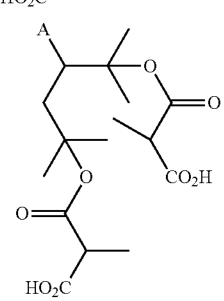

-continued
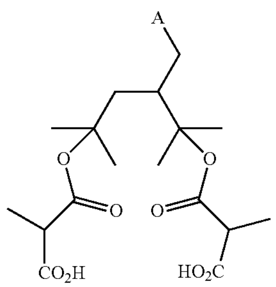
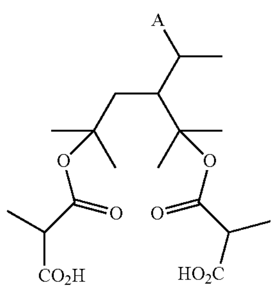
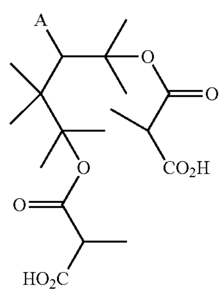
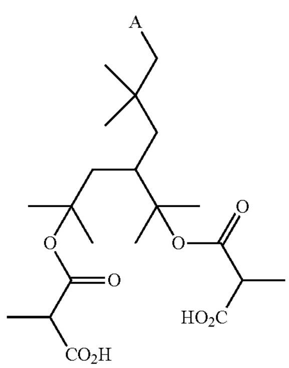
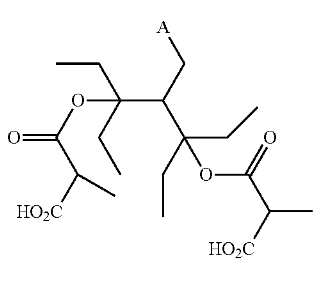
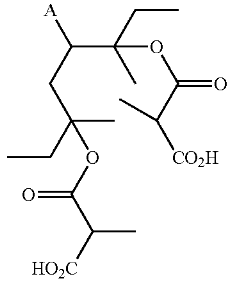
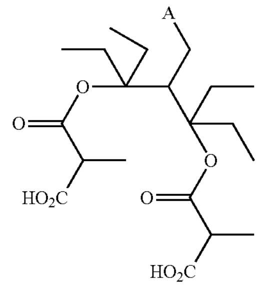
-continued
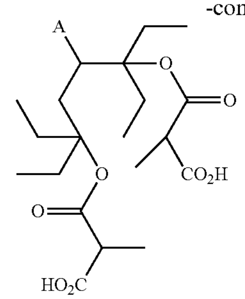
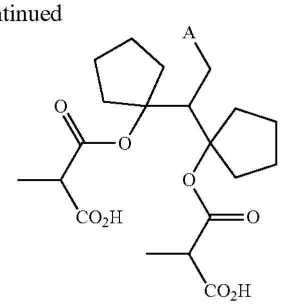
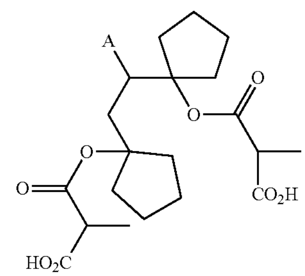
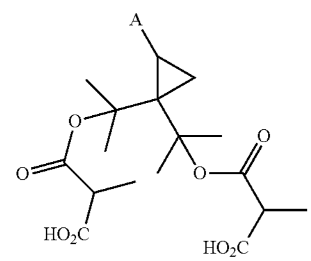
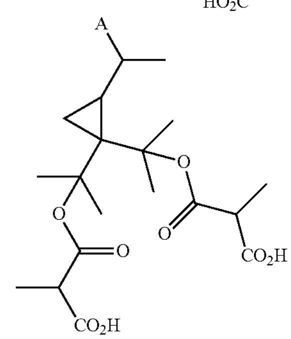
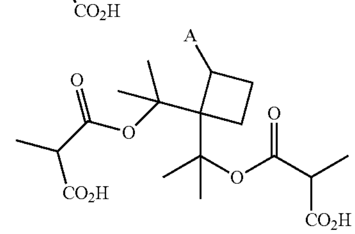
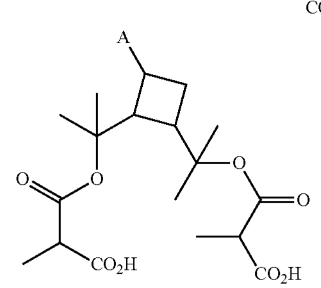

-continued
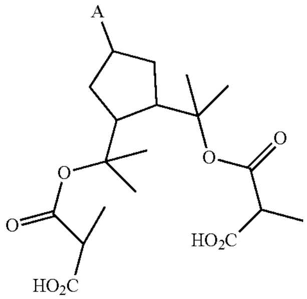
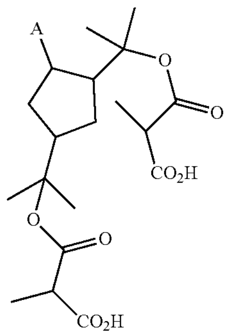
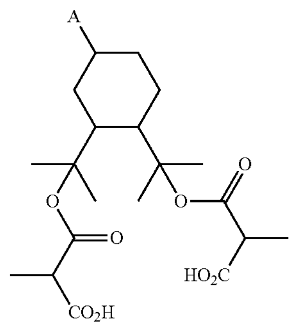
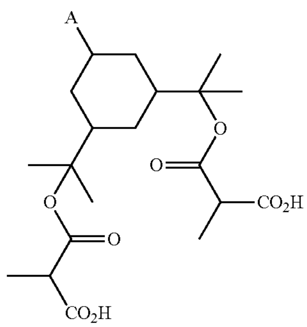
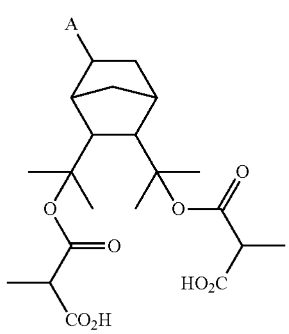
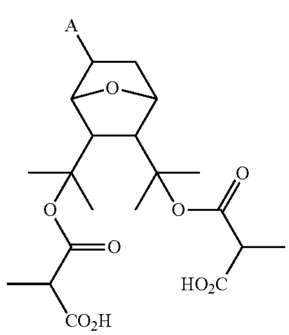
-continued
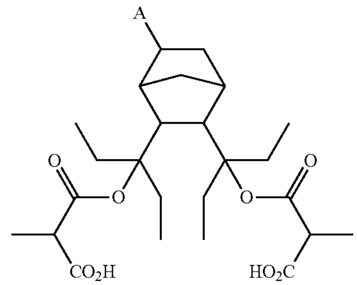
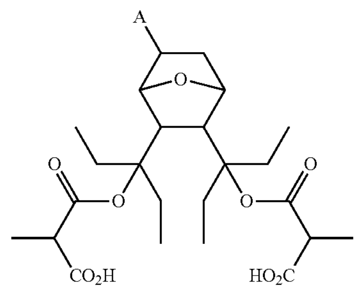
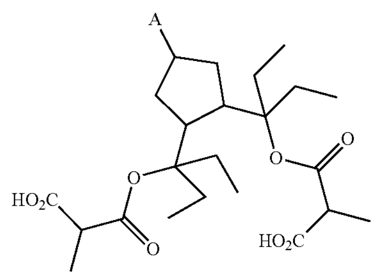
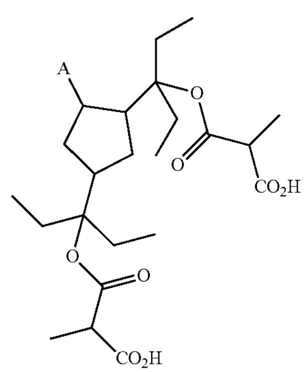
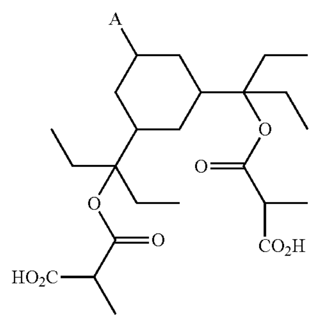

-continued
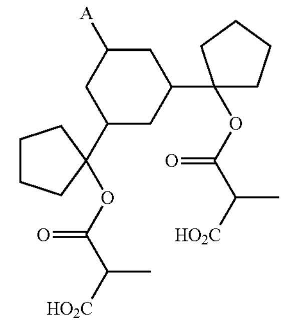
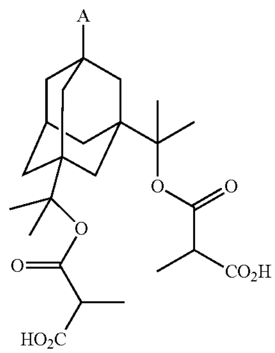
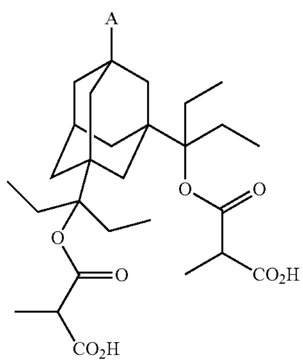
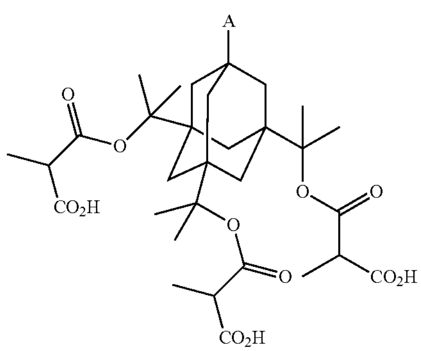
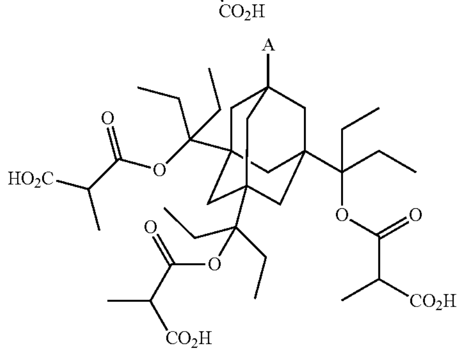
-continued
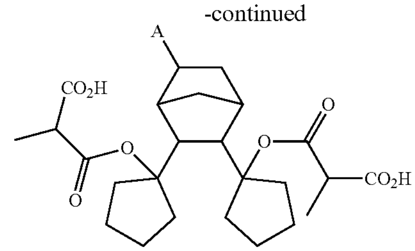
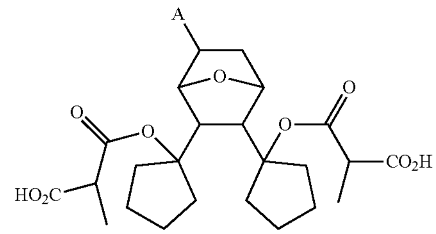
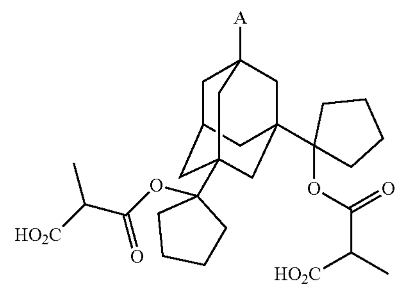
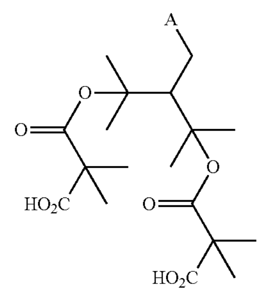
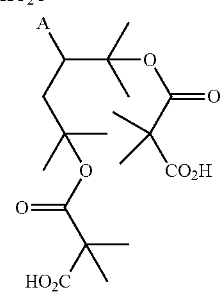
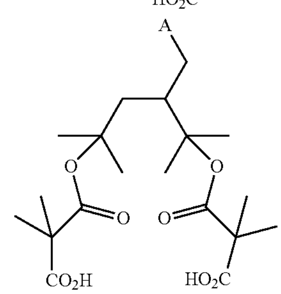
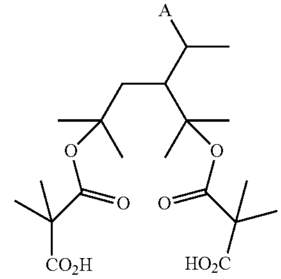
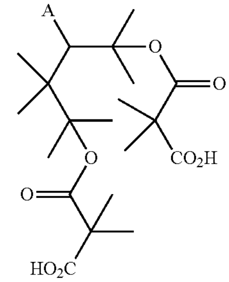

-continued
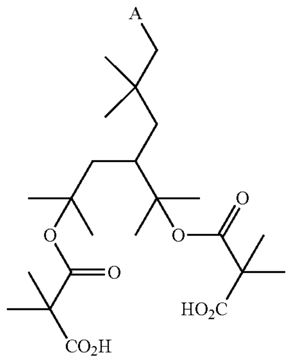
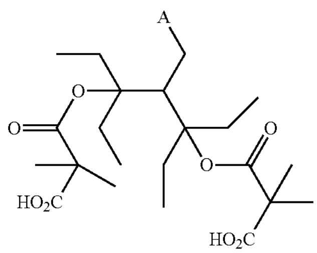
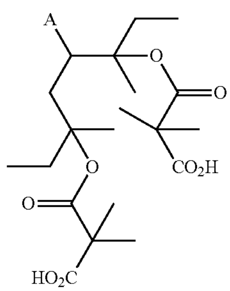
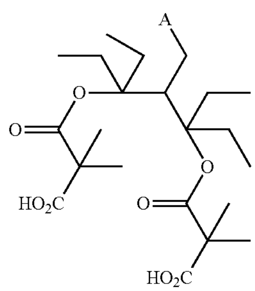
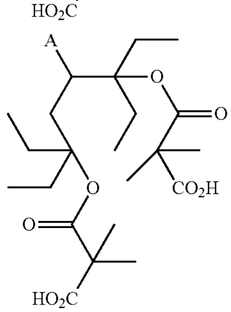
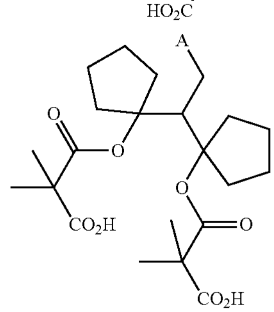
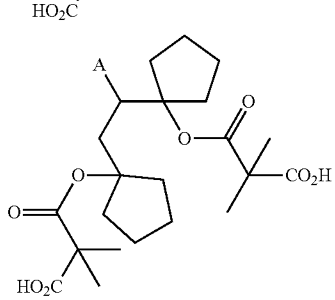
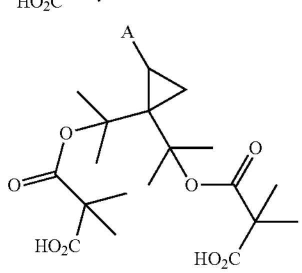
-continued
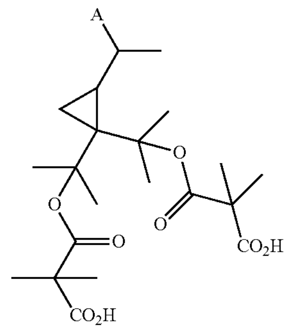
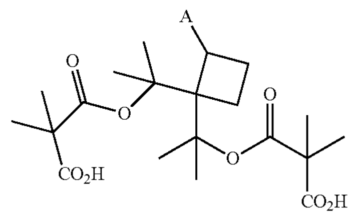
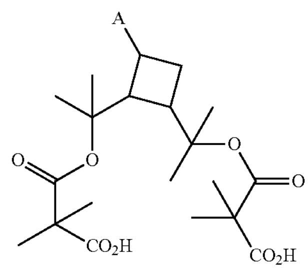
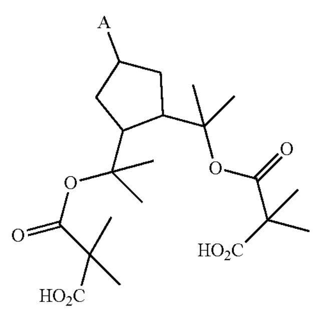
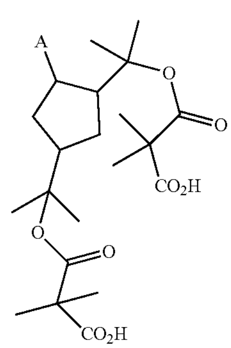
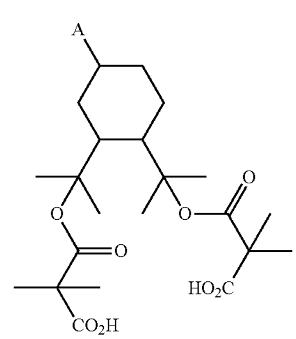

-continued
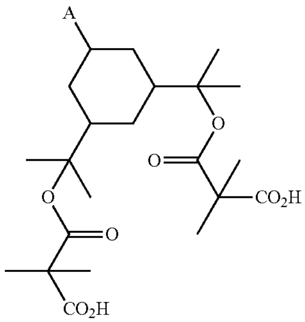
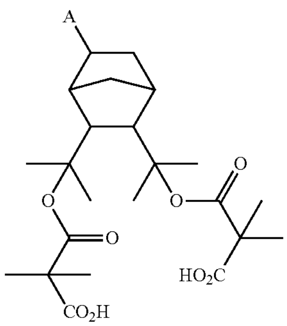
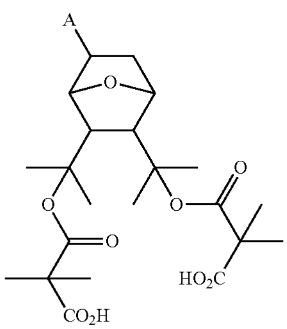
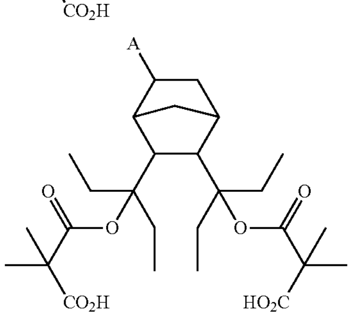
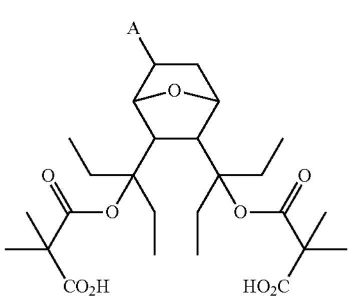
-continued
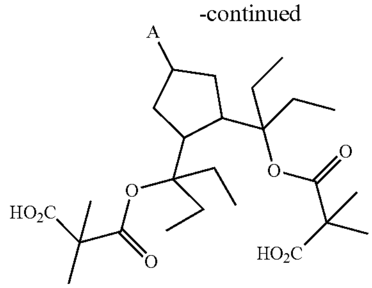
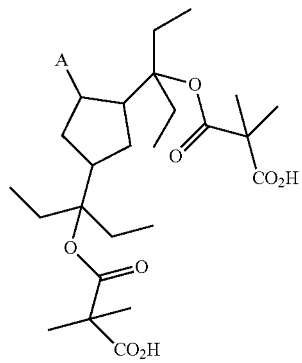
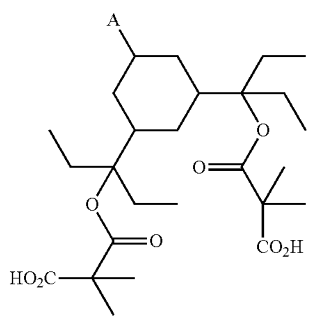
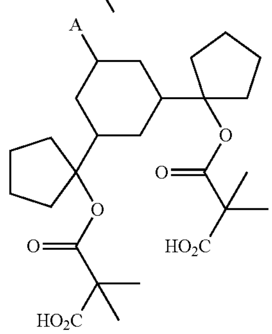
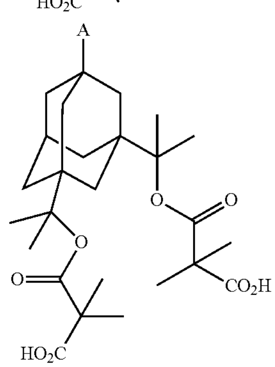

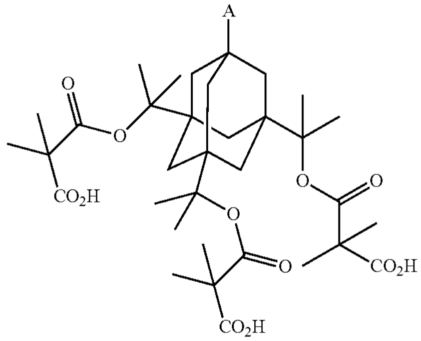
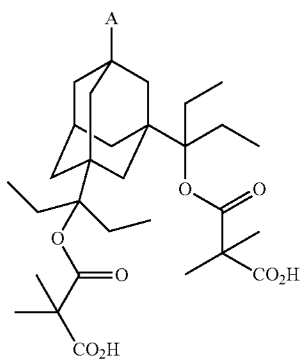
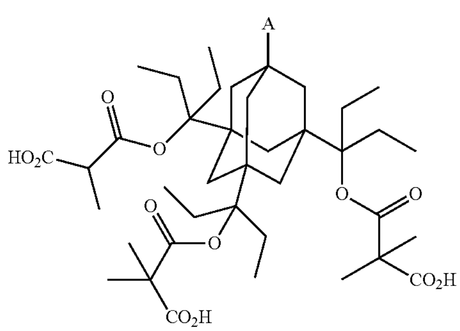
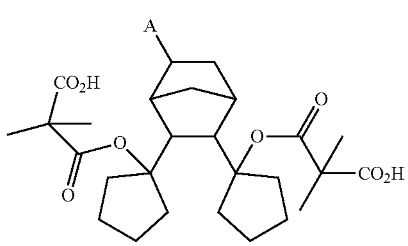
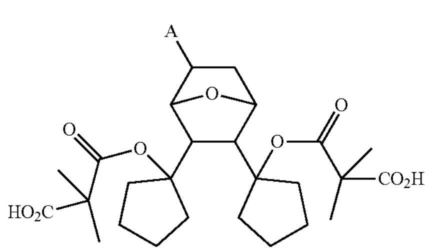
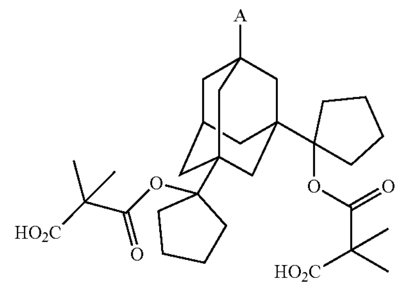
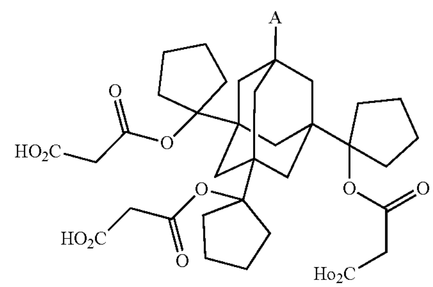
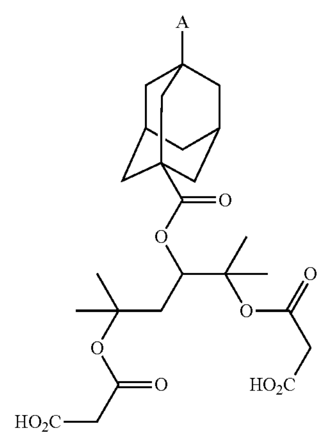
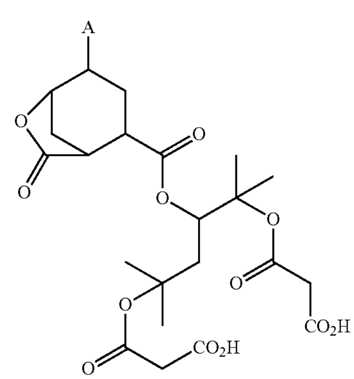

-continued
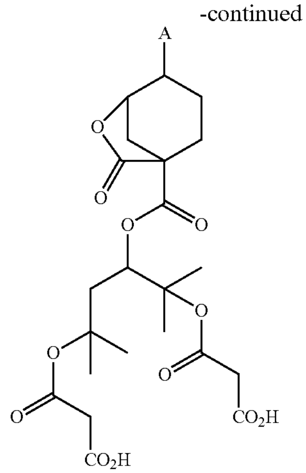
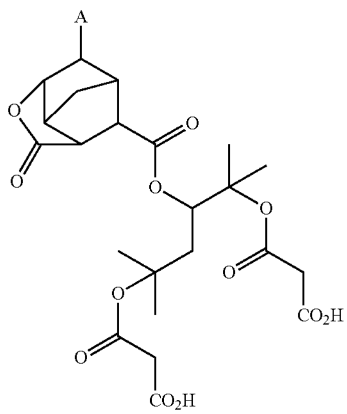
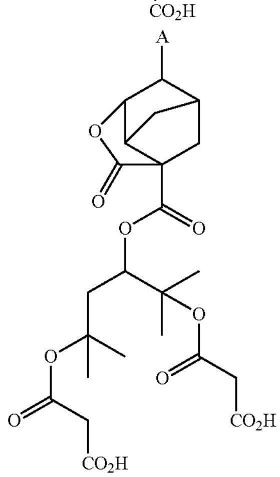
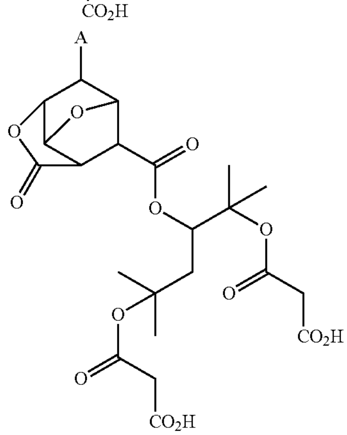
-continued
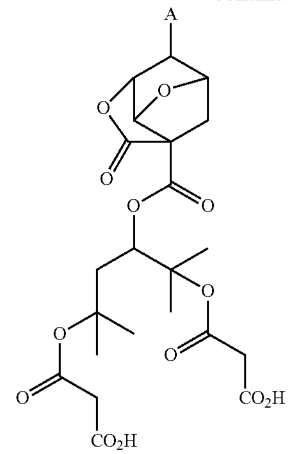
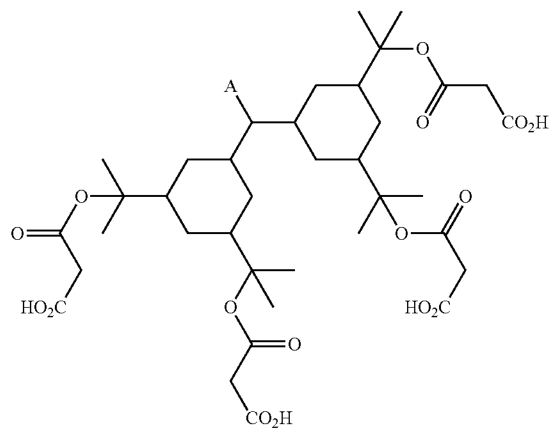
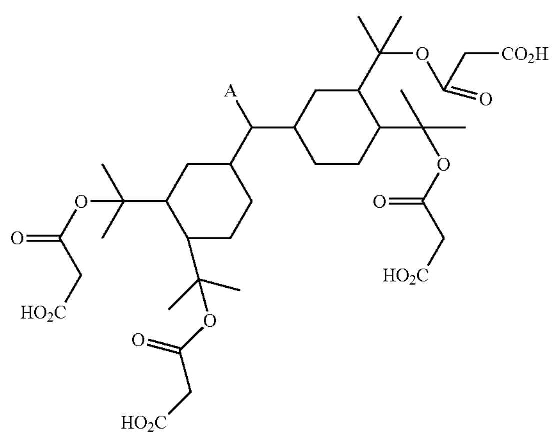
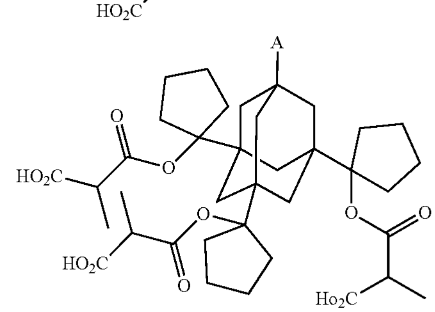

-continued
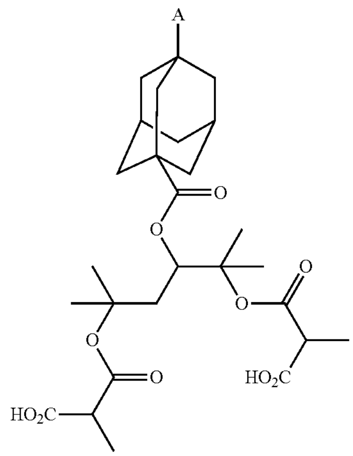
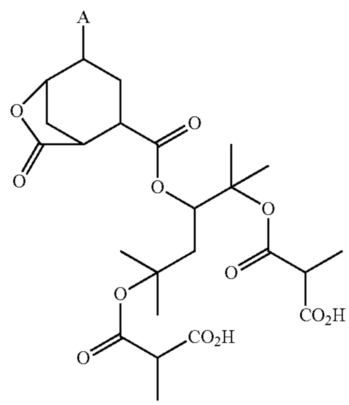
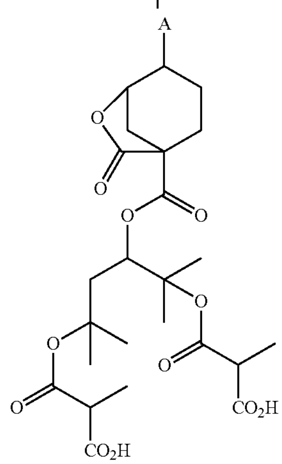
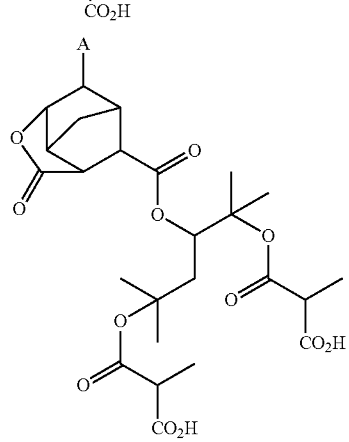
-continued
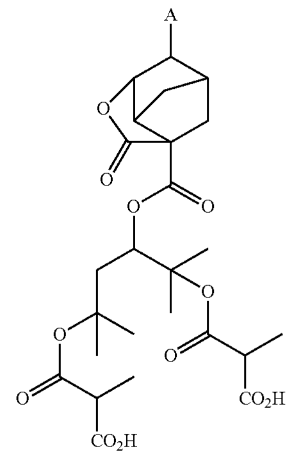
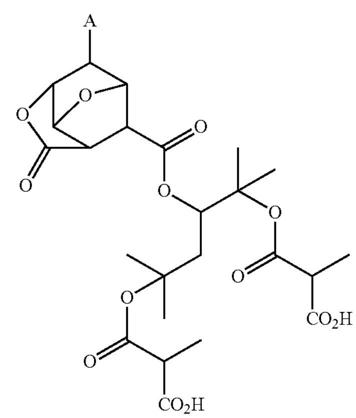
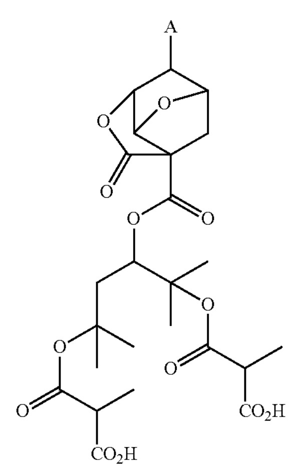

-continued
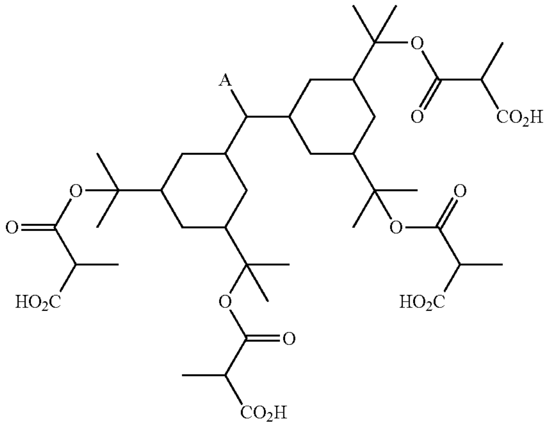
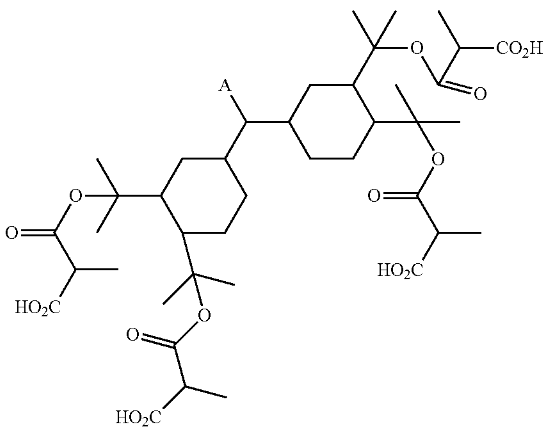
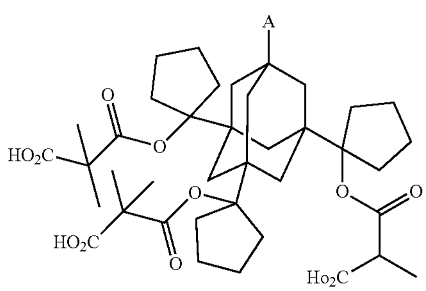
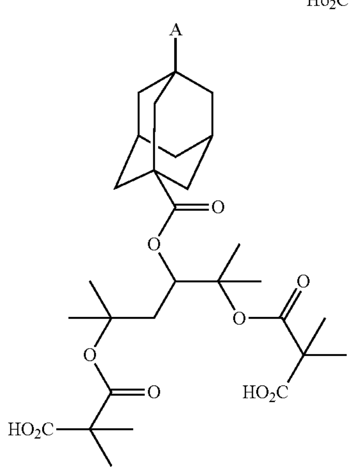
-continued
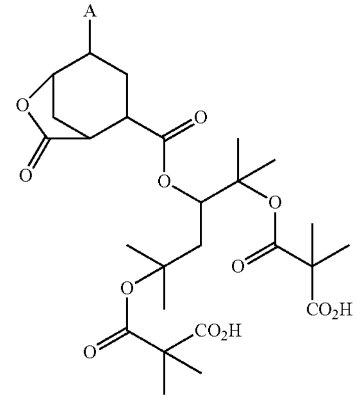
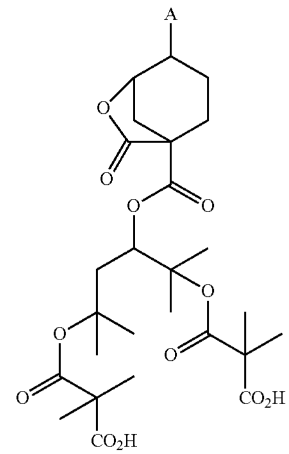
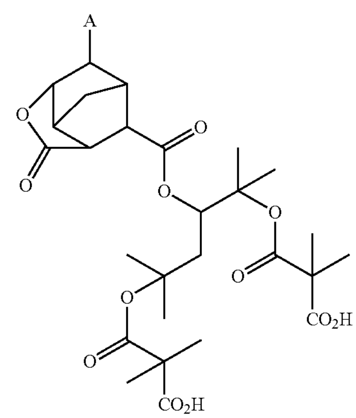
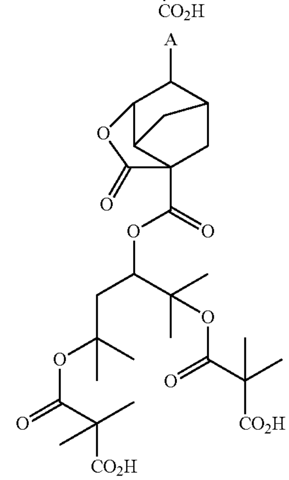

-continued
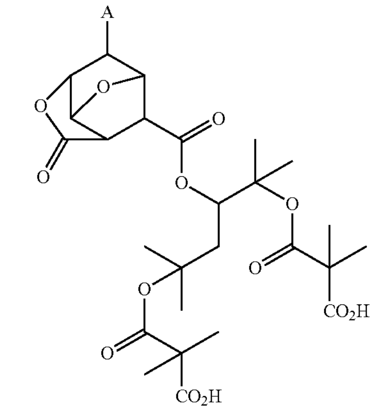
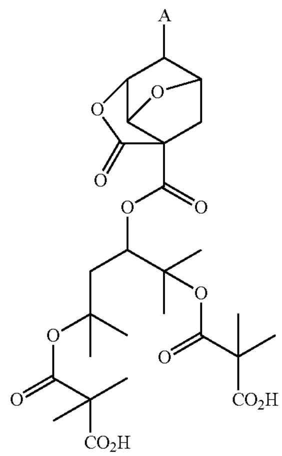
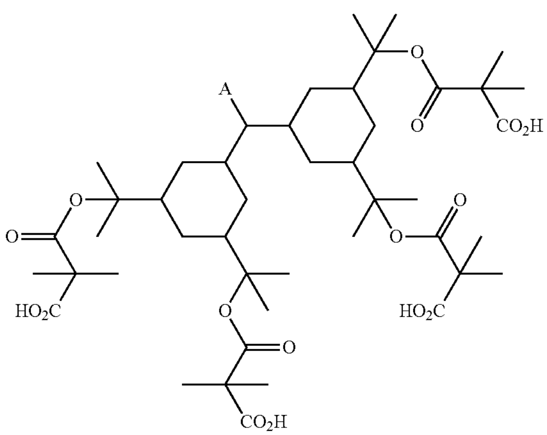
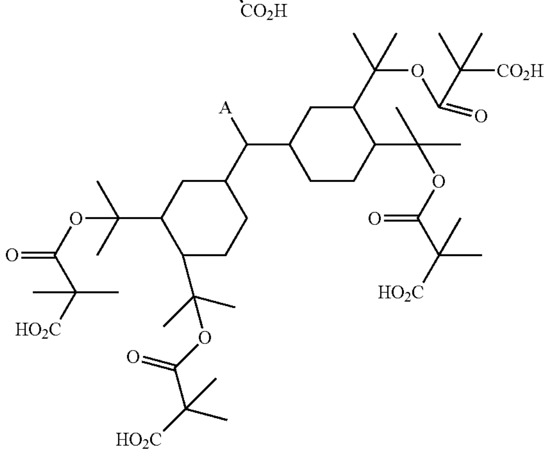
-continued
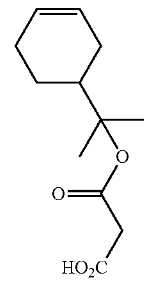
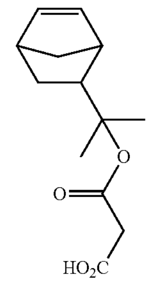
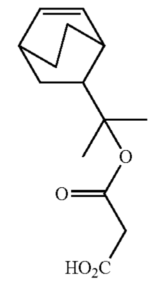
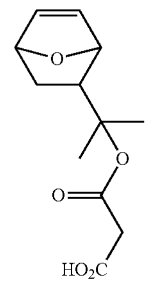
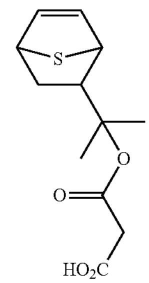
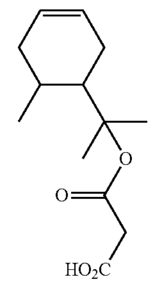
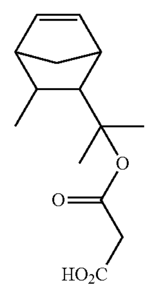
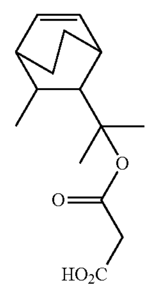
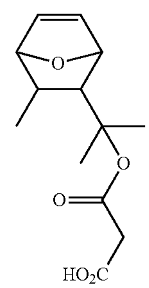
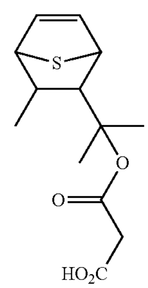
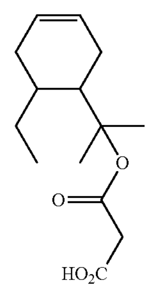
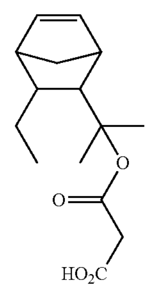
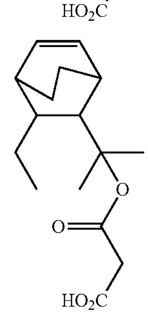
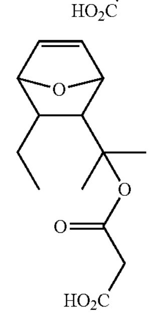
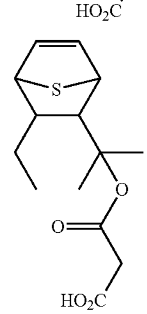
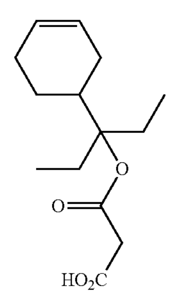
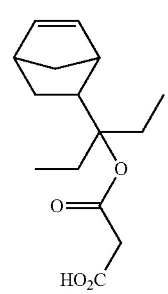
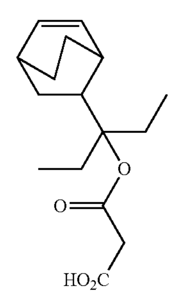

-continued
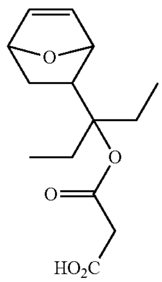
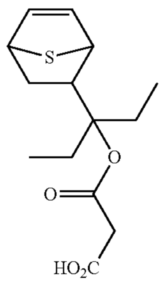
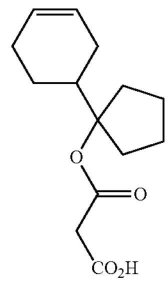
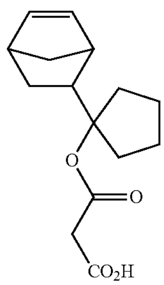
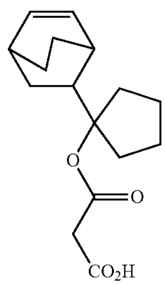
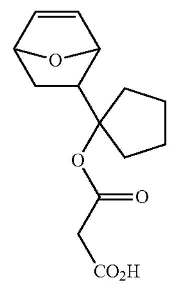
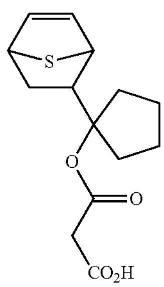
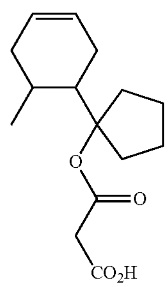
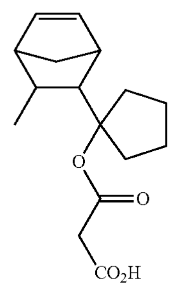
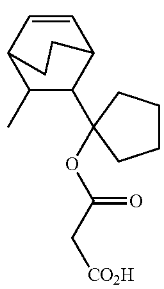
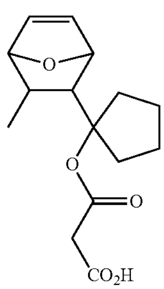
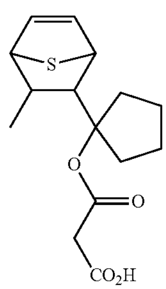
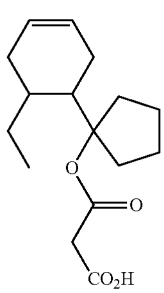
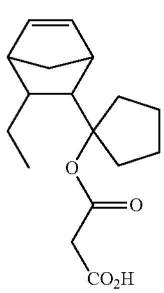
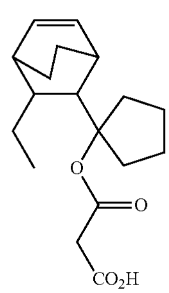
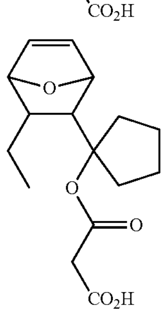
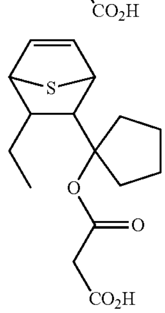
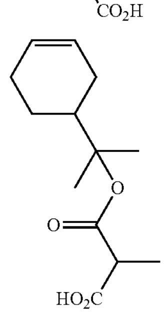
-continued
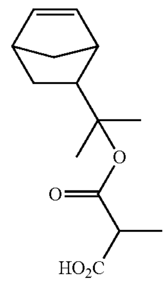
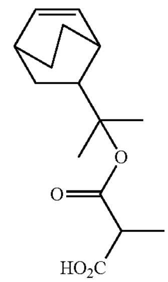
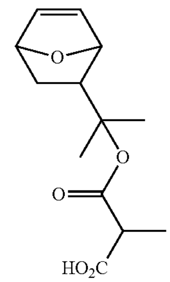
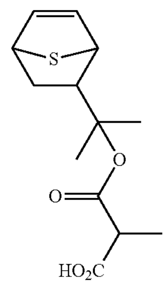
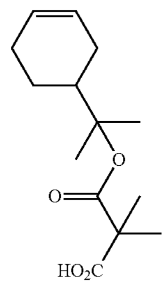
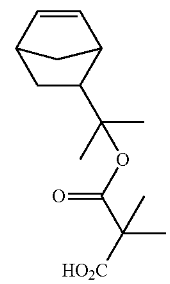
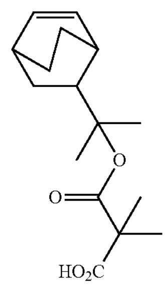
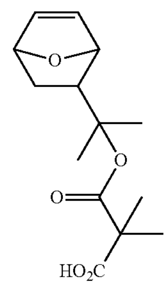
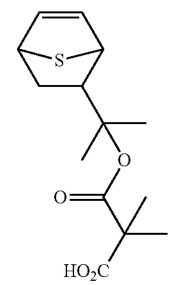
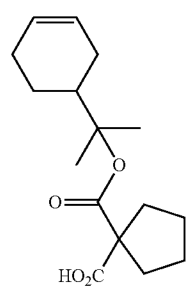
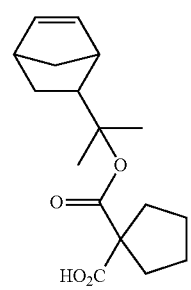
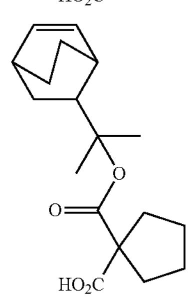
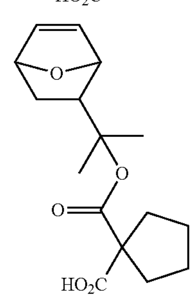
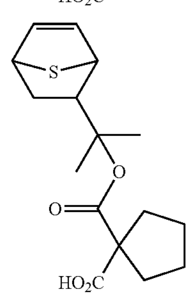
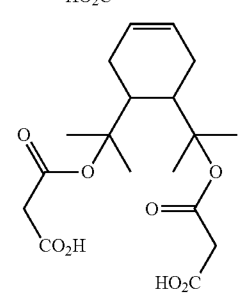

-continued
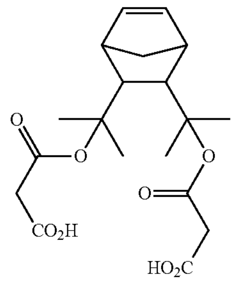
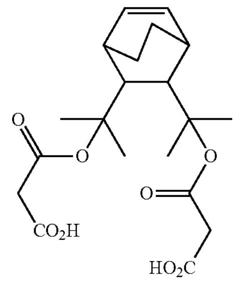
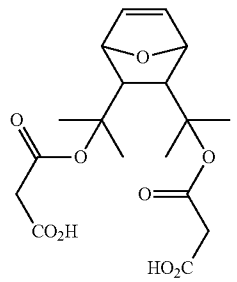
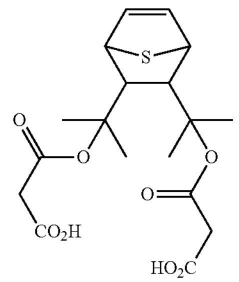
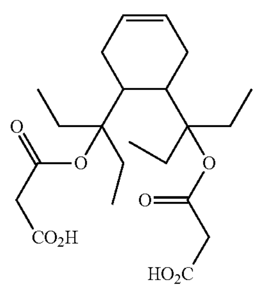
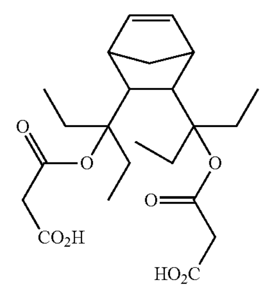
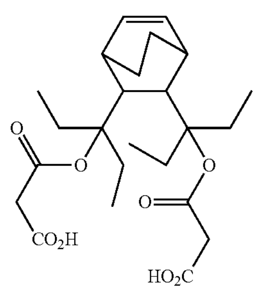
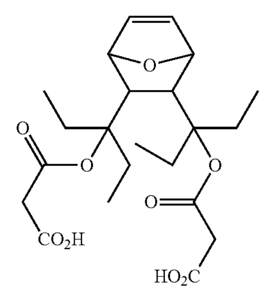
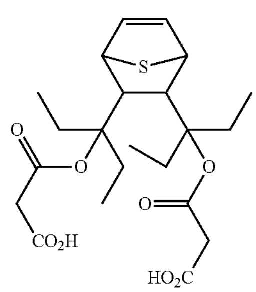
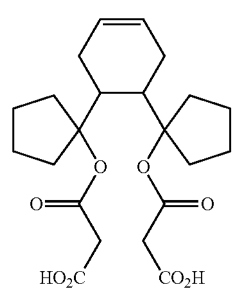
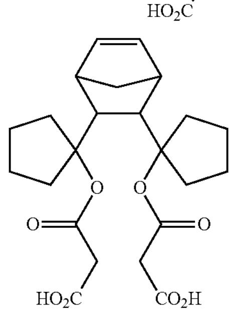
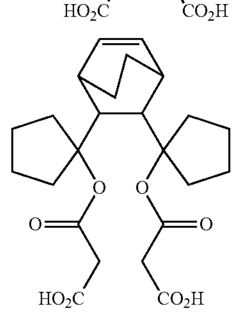
-continued
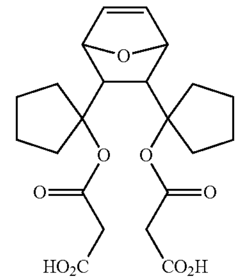
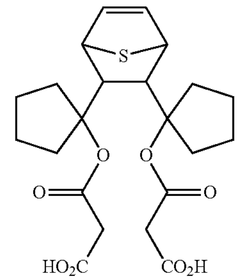
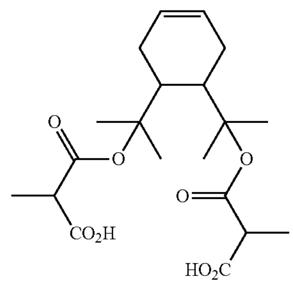
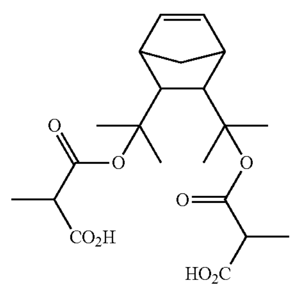
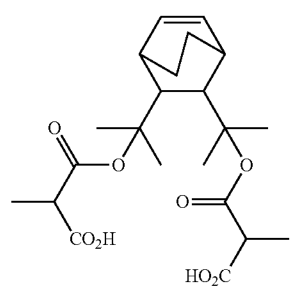
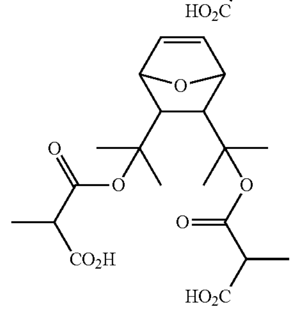
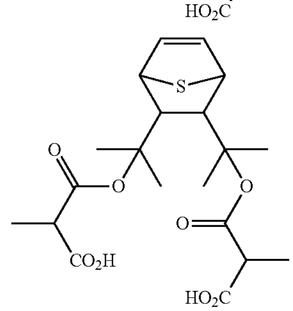

-continued
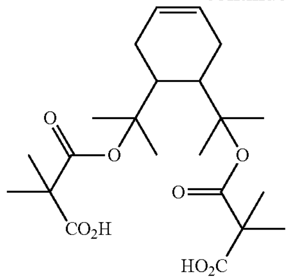
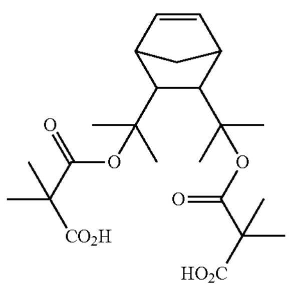
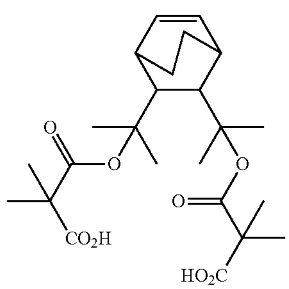
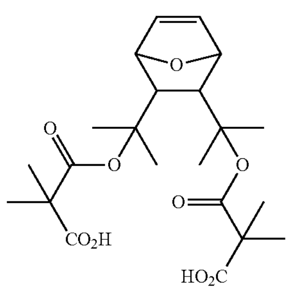
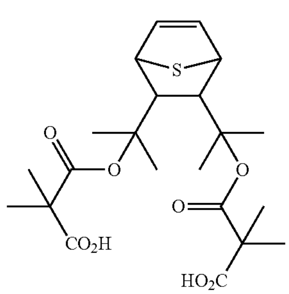
Examples of the monomer having formula (1b) are shown below, but not limited thereto. Herein A is as defined above.
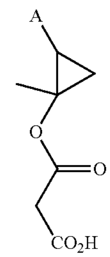
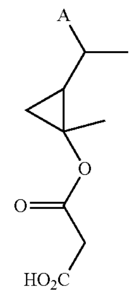
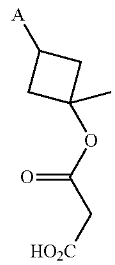
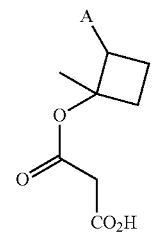
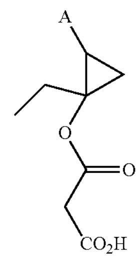
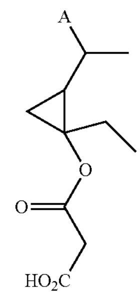
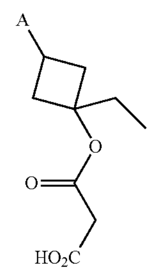
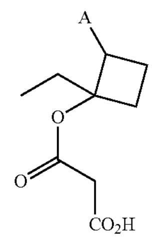
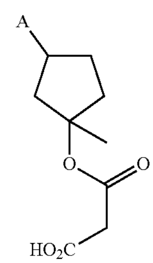
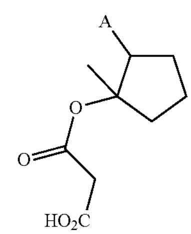
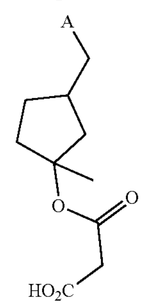
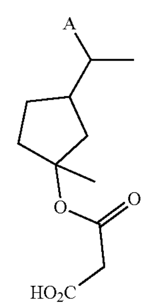
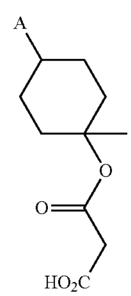
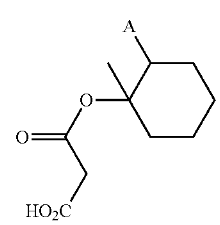
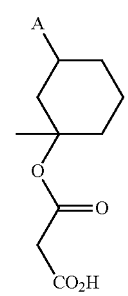

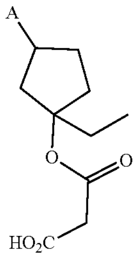
A
O
O
HO2C
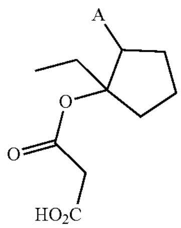
A
O
O
HO2C
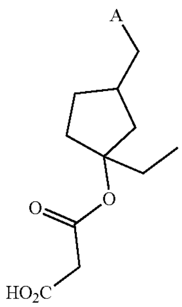
A
O
O
HO2C
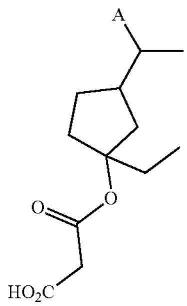
A
O
O
HO2C
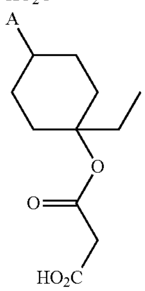
A
O
O
HO2C
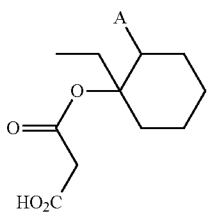
A
O
O
HO2C
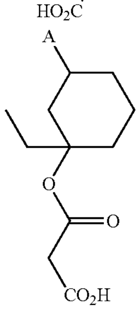
A
O
O
CO2H
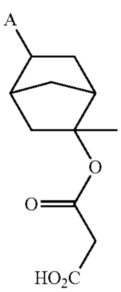
A
O
O
HO2C
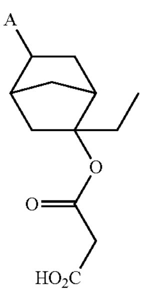
A
O
O
HO2C
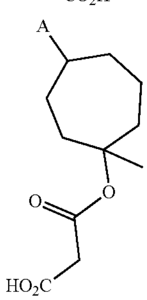
A
O
O
HO2C
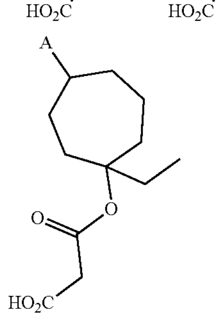
A
O
O
HO2C
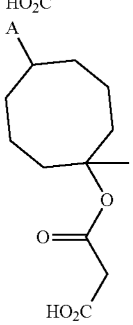
A
O
O
HO2C
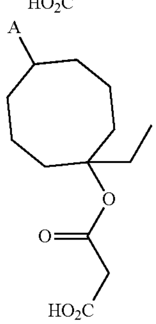
A
O
O
HO2C
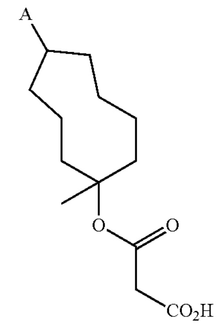
A
O
O
CO2H
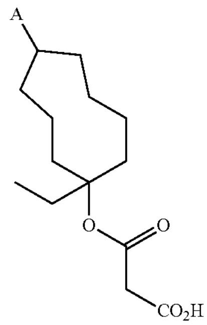
A
O
O
CO2H
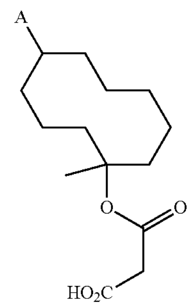
A
O
O
HO2C
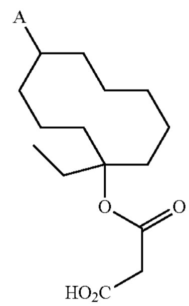
A
O
O
HO2C
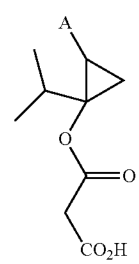
A
O
O
CO2H
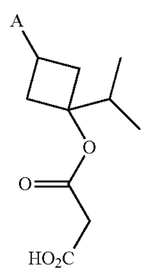
A
O
O
HO2C
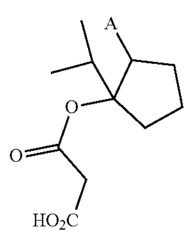
A
O
O
HO2C
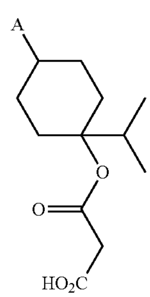
A
O
O
HO2C
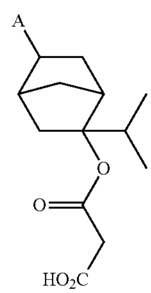
A
O
O
HO2C
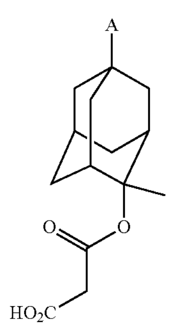
A
O
O
HO2C
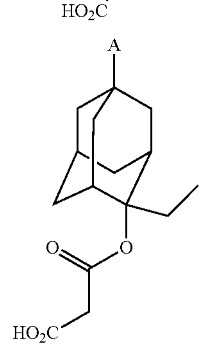
A
O
O
HO2C -continued
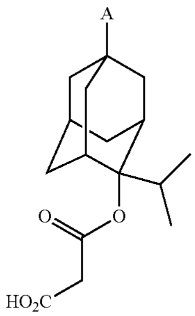
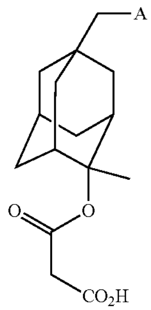
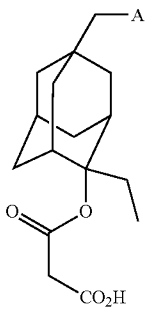
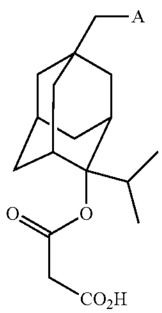
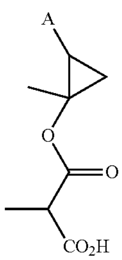
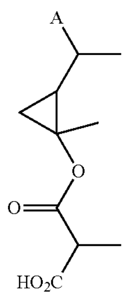
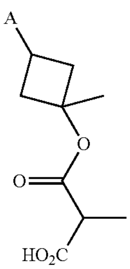
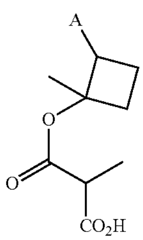
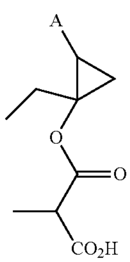
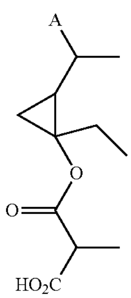
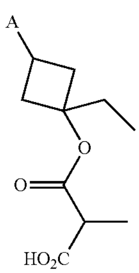
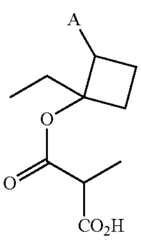
-continued
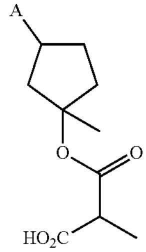
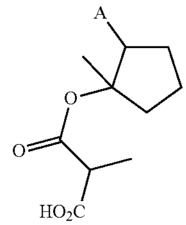
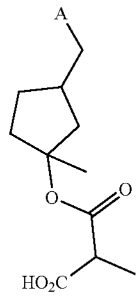
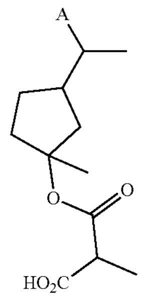
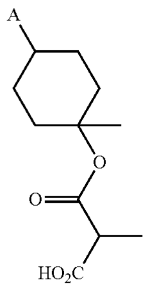
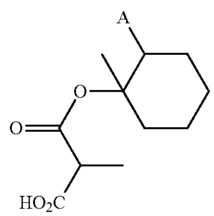
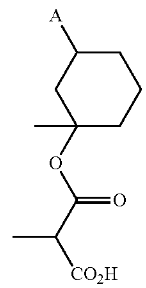
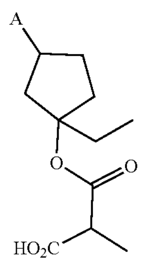
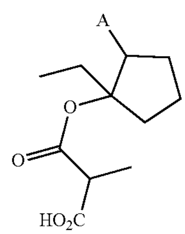
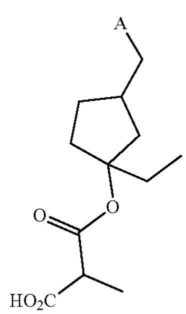
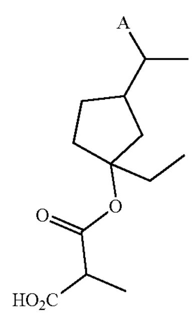
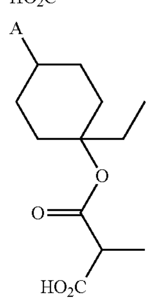
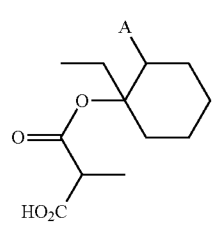

-continued
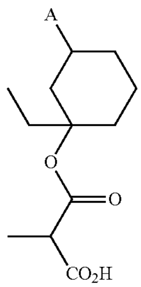
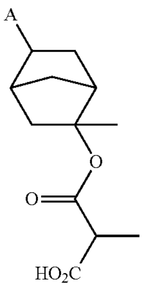
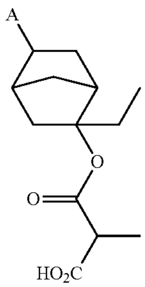
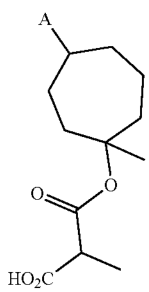
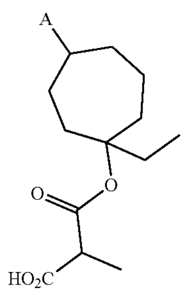
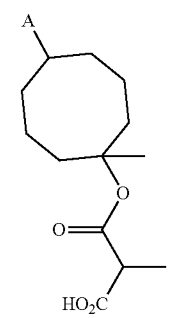
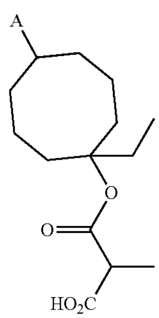
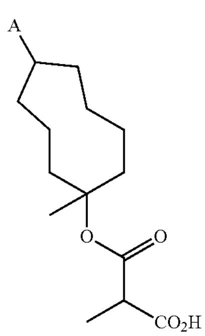
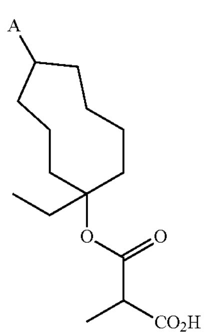
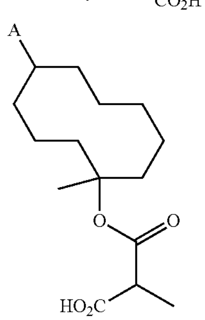
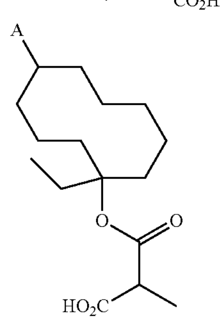
-continued
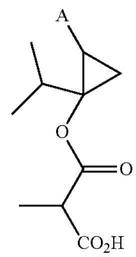
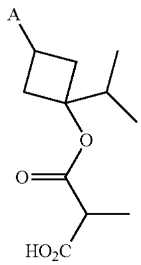
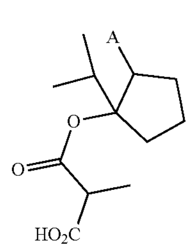
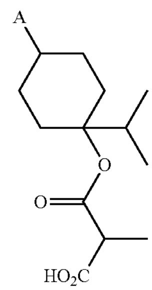
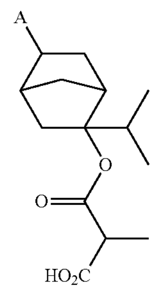
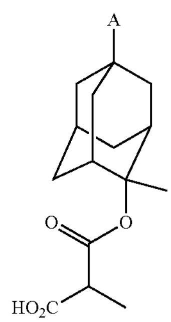
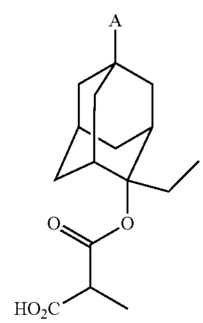
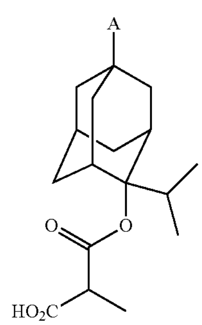
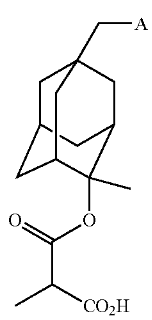
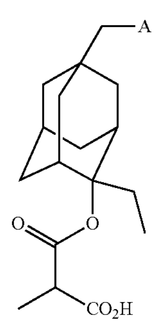
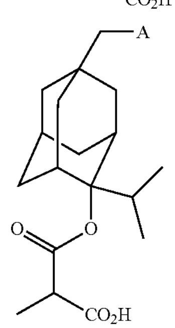

-continued
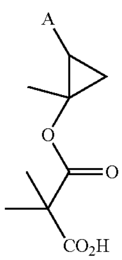
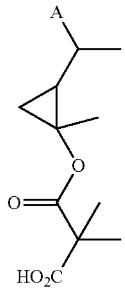
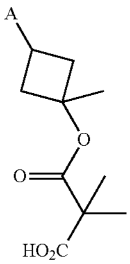
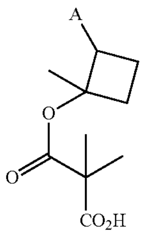
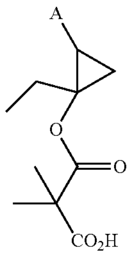
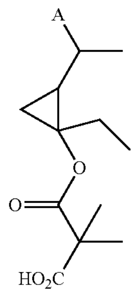
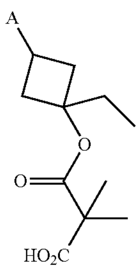
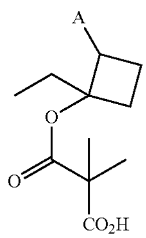
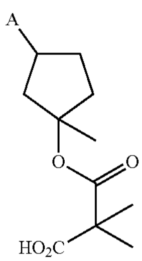
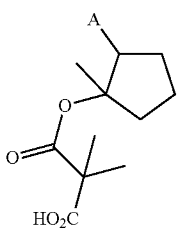
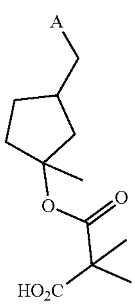
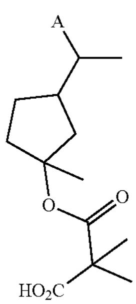
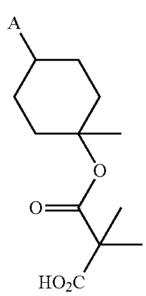
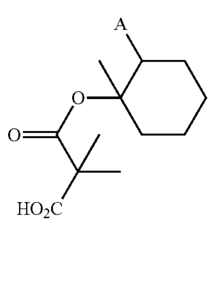
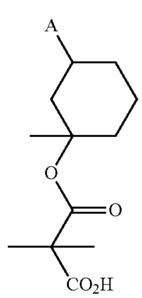
-continued
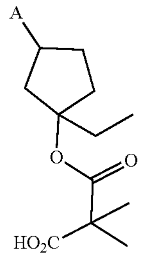
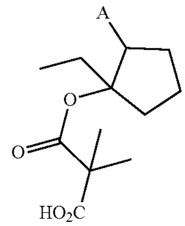
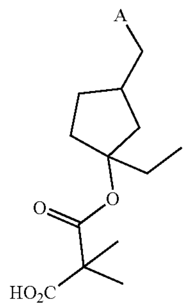
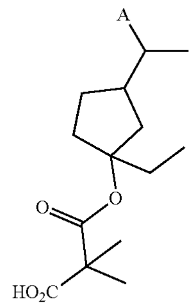
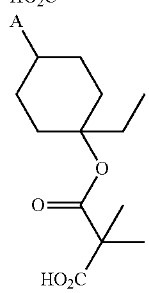
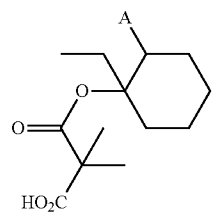
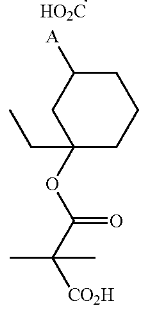
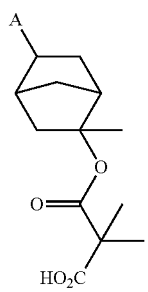
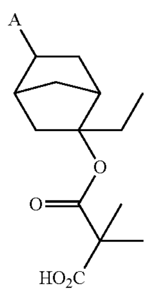
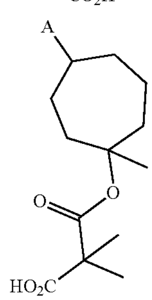
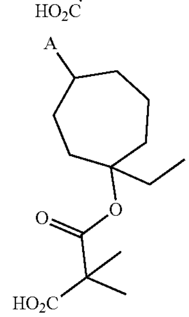
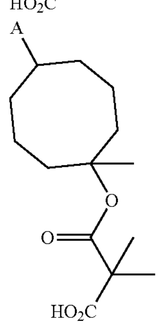
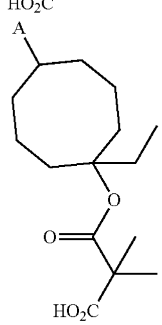

-continued
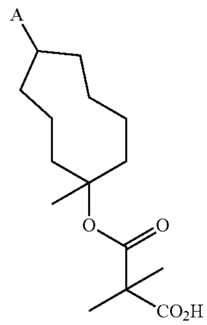
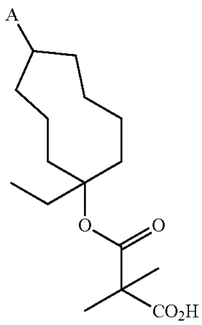
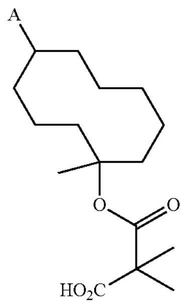
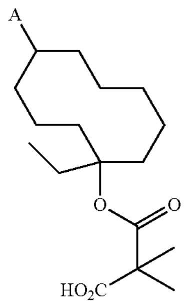
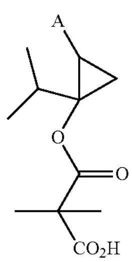
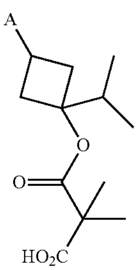
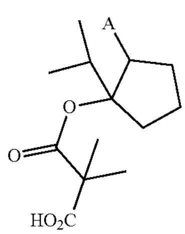
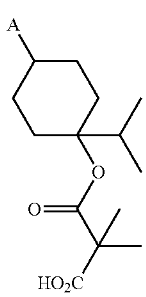
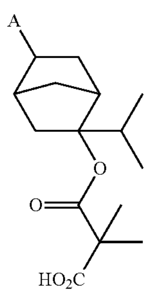
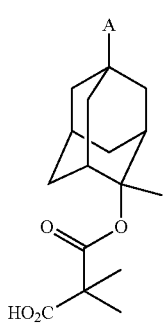
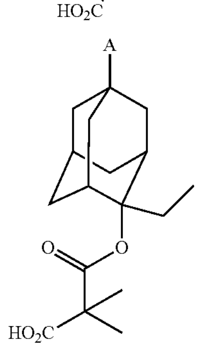
-continued
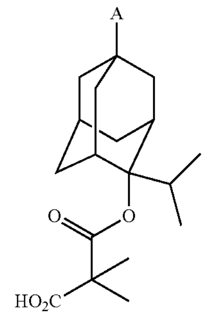
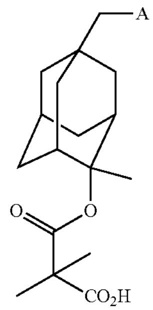
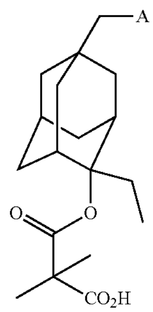
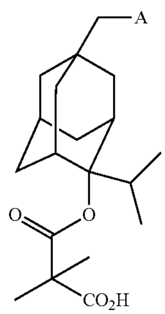
The method for preparing the polymerizable monomer of the invention is described by referring to a (meth)acrylate monomer having formula (1a-1) or (1b-1), but the method is not limited thereto. The method is illustrated by the reaction scheme below.
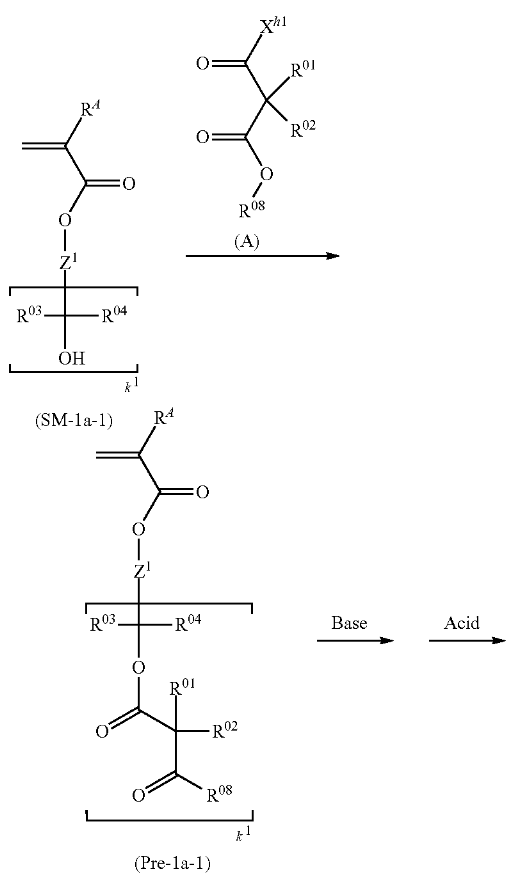

-continued

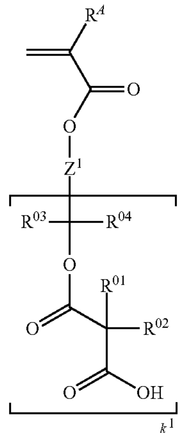
(1a-1)

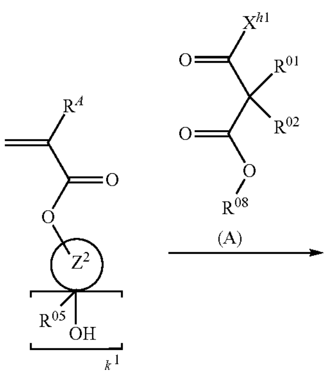
(SM-1b-1)

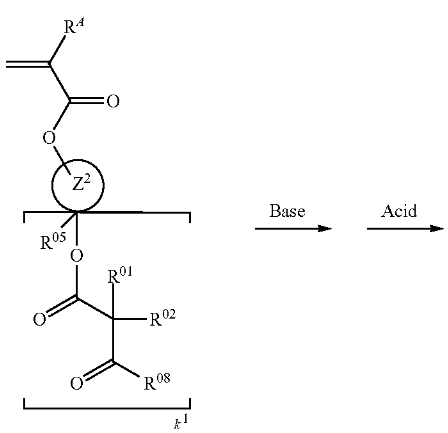
(Pre-1b-1)

-continued

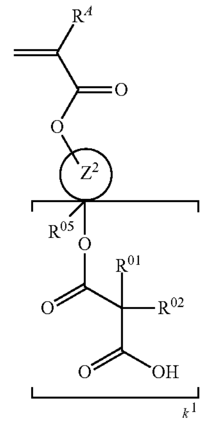
(1b-1)

Herein $R^A$, $R^{01}$ to $R^{05}$, $Z^1$, $Z^2$ and $k^1$ are as defined above, $R^{08}$ is methyl or ethyl, and $X^{h1}$ is chlorine, bromine or iodine.

A first step starting with (meth)acrylate (SM-1a-1) or (SM-1b-1) is an esterification reaction with an acid chloride of formula (A), as derived from malonic acid monoester, to form an intermediate (Pre-1a-1) or (Pre-1b-1).

The reactant, (meth)acrylate (SM-1a-1) or (SM-1b-1) may be synthesized by a well-known method or purchased from a commercial supplier. The reaction may be performed in a solventless system or in a solvent (e.g., methylene chloride, acetonitrile, tetrahydrofuran, diisopropyl ether, toluene or hexane) by sequentially or simultaneously adding (meth)acrylate (SM-1a-1) or (SM-1b-1) and a corresponding carboxylic acid chloride of formula (A) such as methylmalonyl chloride (of formula (A) wherein both $R^{01}$ and $R^{02}$ are hydrogen, $R^{08}$ is methyl, and $X^{h1}$ is chlorine), and optionally cooling or heating the reaction system. It is desirable from the standpoint of yield that the reaction time is determined so as to drive the reaction to completion by monitoring the reaction process by gas chromatography (GC) or silica gel thin layer chromatography (TLC). Usually, the reaction time is about 0.5 to 24 hours. From the reaction mixture, the intermediate (Pre-1a-1) or (Pre-1b-1) is recovered through an ordinary aqueous workup. If necessary, the intermediate may be purified by a standard technique such as distillation, chromatography or recrystallization.

A second step is hydrolysis of intermediate (Pre-1a-1) or (Pre-1b-1) at its terminal ester bond with a base and conversion of the resulting carboxylic acid salt under acidic conditions to (meth)acrylate monomer (1a-1) or (1b-1).

Specifically, the intermediate (Pre-1a-1) or (Pre-1b-1) is dissolved in a solvent (e.g., acetonitrile, tetrahydrofuran, dioxane or diisopropyl ether), a base is added thereto, and reaction is performed while cooling or heating if necessary, whereby the terminal ester bond is hydrolyzed. Examples of the base used herein include aqueous solutions of metal hydroxides such as sodium hydroxide, potassium hydroxide, and lithium hydroxide and aqueous solutions of organic bases such as tetramethylammonium hydroxide and benzyltrimethylammonium hydroxide. It is desirable from the standpoint of yield that the reaction time is determined so as to drive the reaction to completion by monitoring the reaction process by silica gel TLC. Usually, the reaction time is about 0.5 to 24 hours. Thereafter, an acid is added to the resulting carboxylic acid salt, whereby carboxylic acid is produced under acidic conditions. Examples of the acid used herein include hydrochloric acid, sulfuric acid, nitric acid, phosphoric acid and methanesulfonic acid. The end compound is extracted from the reaction mixture, and the monomer (1a-1) or (1b-1) is recovered through an ordinary aqueous workup. If necessary, the monomer may be purified by a standard technique such as distillation, chromatography or recrystallization.

In an alternative method, the (meth)acrylate monomer (1a-1) or (1b-1) is prepared by converting a malonic acid derivative to a mixed acid anhydride for activation and forming a direct ester bond to the reactant, (meth)acrylate (SM-1a-1) or (SM-1b-1).

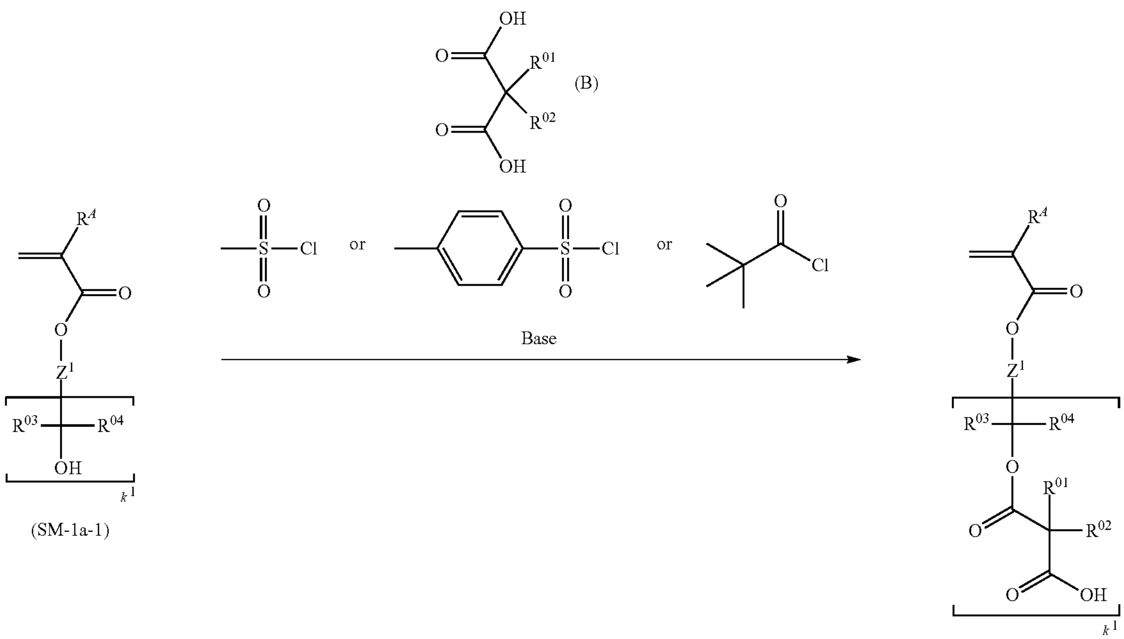

(SM-1a-1) (1a-1)

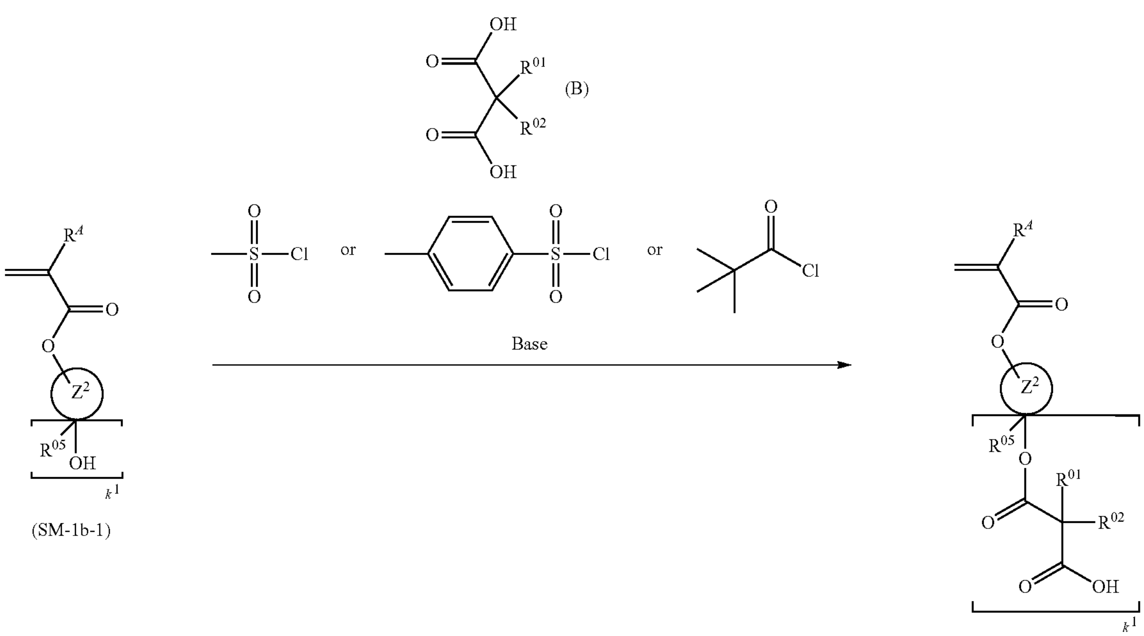

(SM-1b-1) (1b-1)

Herein $R^A$, $R^{01}$ to $R^{05}$, $Z^1$, $Z^2$ and $k^1$ are as defined above.

The reaction may be performed in a solventless system or in a solvent (e.g., methylene chloride, acetonitrile, tetrahydrofuran, diisopropyl ether, toluene or hexane) by sequentially or simultaneously adding the reactant, (meth)acrylate (SM-1a-1) or (SM-1b-1), a malonic acid of formula (B) wherein both $R^{01}$ and $R^{02}$ are hydrogen, and a base (e.g., triethylamine or pyridine), further adding a sulfonic acid chloride (e.g., methanesulfonyl chloride or p-toluenesulfonyl chloride) or carboxylic acid chloride (e.g., pivalic acid chloride), and optionally cooling or heating the reaction system. It is desirable from the standpoint of yield that the reaction time is determined so as to drive the reaction to completion by monitoring the reaction process by silica gel TLC. Usually, the reaction time is about 0.5 to 24 hours. The end compound is extracted from the reaction mixture, and the (meth)acrylate monomer (1a-1) or (1b-1) is recovered through an ordinary aqueous workup. If necessary, the monomer may be purified by a standard technique such as distillation, chromatography or recrystallization.

Polymer

The invention also provides a polymer comprising recurring units having a partial structure represented by the formula (1) on a side chain.

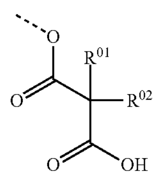

(1)

Herein $R^{01}$ and $R^{02}$ are as defined above.

The recurring units having a partial structure of formula (1) are preferably recurring units containing a group of the formula (2a) or (2b).

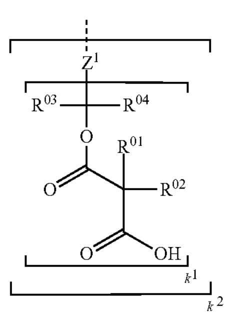

(2a)

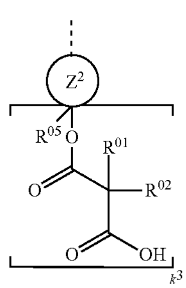

(2b)

Herein $R^{01}$ to $R^{05}$, $Z^1$, $Z^2$ and $k^1$ to $k^3$ are as defined above, and the broken line denotes a valance bond to the polymer backbone.

The recurring unit containing a group of formula (2a) or (2b) has a malonic acid structure bonded via a tertiary ester at an end as an acid labile group. This end structure functions as a leaving group with a high acid reactivity. The polymer undergoes efficient elimination reaction under the action of acid, losing the malonic acid structure and producing an olefin on the backbone side. The generated malonic acid, in turn, undergoes quick decarboxylation reaction during a heating step whereby it is decomposed into carbon dioxide and an acetic acid derivative. One exemplary reaction scheme is shown below.

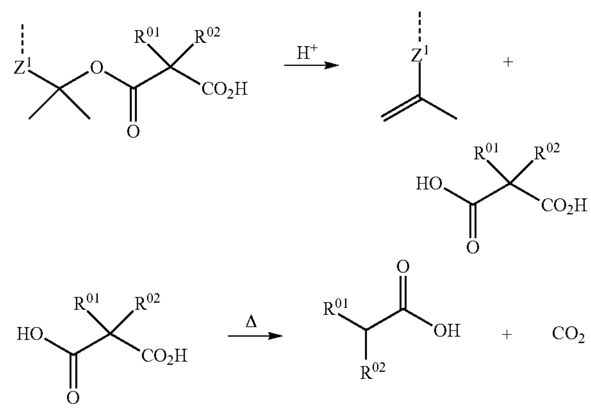

Herein $R^{01}$, $R^{02}$, and $Z^1$ are as defined above.

As mentioned above, a resist composition comprising the inventive polymer as a base resin has a very high solubility in alkaline developer prior to exposure, due to the presence of a carboxyl group exhibiting a high affinity to alkaline developer. After exposure, in the exposed region, the terminal carboxyl-containing malonic acid structure is eliminated and lost via reaction with the acid generated in the exposed region, and as a result of structural conversion to olefin, the resist in the exposed region undergoes a substantial drop of solubility in alkaline developer and becomes insoluble in the developer. In the unexposed region where the carboxyl group having alkaline affinity is retained intact in the resin, the resist is rapidly dissolved in the developer without being swollen. The malonic acid generated by elimination in the exposed region undergoes decarboxylation reaction in the subsequent heating step whereby it is decomposed into carbon dioxide and acetic acid, that is, a compound having a lower boiling point, which volatilizes from within the resist film. The series of reactions indicate that the inventive polymer is a base resin having a very high dissolution contrast or a very large difference of dissolution rate in alkaline developer between the exposed region and the unexposed region. In addition, since the polymer maintains a high carbon density and resin film thickness even after the switch of developer solubility after exposure, it is quite effective for restraining bridging between pattern features and pattern collapse due to swell, which are regarded problematic with prior art negative tone resist materials of polarity switch type and negative tone resist materials utilizing crosslinking reaction. Also the polymer has excellent etch resistance, enabling resolution of finer size patterns.

Prior to the present invention, U.S. Pat. No. 7,563,558 describes a monomer having a carboxyl group at a polarity switch site, and a polymer having the monomer incorporated as recurring units. Described as the exemplary structure are a monomer having glycolic acid incorporated via a tertiary ether bond, represented by formula (Z-1), and a monomer having succinic acid incorporated via a tertiary ester bond, represented by formula (Z-2). When a polymer comprising these monomers is used as a base resin in a resist composition, the composition exhibits a very high solubility in alkaline developer due to the presence of carboxyl group having high alkaline developer affinity prior to exposure. After exposure, as a result of reaction with the acid generated in the exposed region, glycolic acid is eliminated and lost on use of a monomer of formula (Z-1), or succinic acid is eliminated and lost on use of a monomer of formula (Z-2), as shown in the reaction scheme below. Unlike the inventive monomer and polymer, glycolic acid and succinic acid are no more decomposed, and since they are high boiling compounds, they will not volatilize from within the resist film during the heating step. That is, they are retained in the exposed region. With such an alkali-affinity compound left in the exposed region as well, no sufficient dissolution contrast is established upon development in alkaline developer because the developer can penetrate into not only the unexposed region, but also the exposed region. As a result, resist properties are degraded. With this borne in mind, the resist composition comprising the monomer or polymer according to the invention exerts superior resist performance to the prior art.

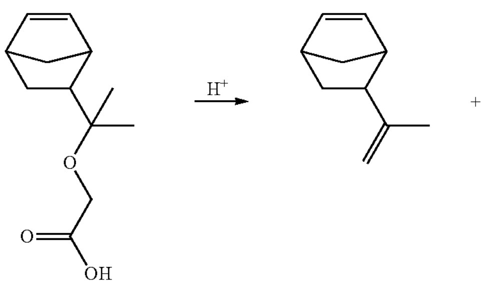

(Z-1)

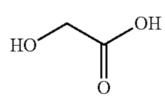

glycolic acid

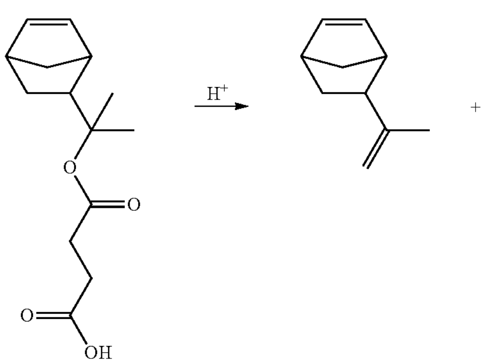

(Z-2)

-continued

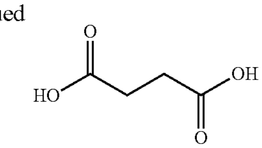

succinic acid

In a preferred embodiment, the recurring units containing a group of formula (2a) and the recurring units containing a group of formula (2b) are derived from a monomer having formula (1a) and a monomer having formula (1b), respectively. Of these recurring units, those units derived from monomers wherein A is acryloyloxy or methacryloyloxy or monomers wherein A is cycloalkenyl, that is, units having the following formulae (3a) to (3c) are especially preferred.

(3a)

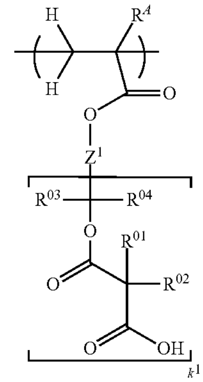

(3b)

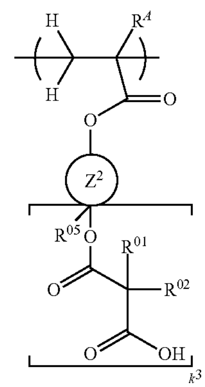

(3c)

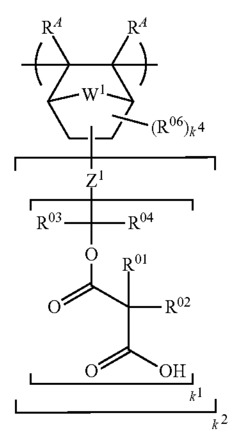

Herein $R^A$, $R^{01}$ to $R^{06}$, $W^1$, $Z^1$, $Z^2$ and $k^1$ to $k^4$ are as defined above. Notably, the carbon atom in $Z^1$ or $Z^2$ in bond with the ester oxygen atom in the polymer backbone in the formula is not tertiary carbon atom, excluding the case wherein the carbon atom in $Z^1$ or $Z^2$ is the carbon atom at the 1-position on an adamantane ring.

The polymer may further comprise recurring units of at least one type selected from recurring units having the formulae (4a) to (4c).

(4a)

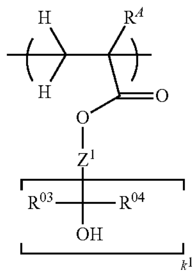

(4b)

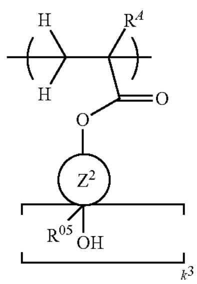

(4c)

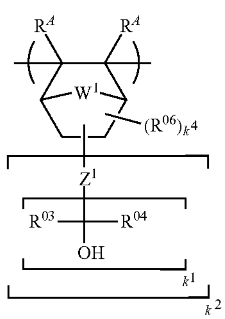

Herein $R^A$, $R^{03}$ to $R^{06}$, $W^1$, $Z^2$ and $k^1$ to $k^4$ are as defined above. The carbon atom in $Z^1$ or $Z^2$ in bond with the ester oxygen atom in the polymer backbone in the formula is not tertiary carbon atom, excluding the case wherein the carbon atom in $Z^1$ or $Z^2$ is the carbon atom at the 1-position on an adamantane ring.

Now that recurring units having formula (4a), (4b) or (4c) are incorporated in addition to the recurring units containing a group of formula (2a) and/or recurring units containing a group of formula (2b), the dissolution rate in alkaline developer of the polymer or base resin in the unexposed region is further improved. The recurring unit having the formula (4a), (4b) or (4c) is a unit having 1 to 4 tertiary alcoholic hydroxyl groups which are acid labile groups. Prior to exposure, the polymer has a high affinity to and solubility in alkaline developer due to the presence of hydrophilic hydroxyl groups. After exposure, hydroxyl groups are lost in the exposed region, and the polymer in the exposed region experiences a substantial drop of solubility in alkaline developer and becomes insoluble in the developer.

Examples of the recurring units having formula (4a) are given below, but not limited thereto. $R^A$ is as defined above.

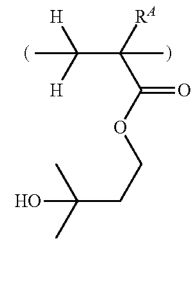

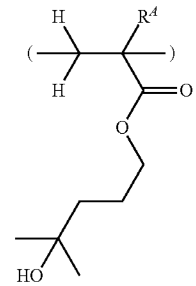

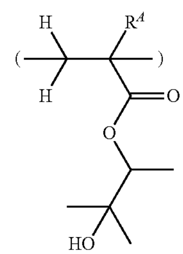

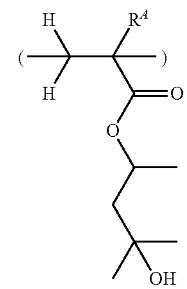

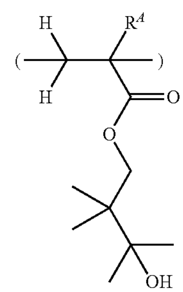

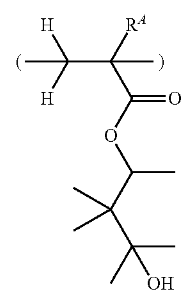

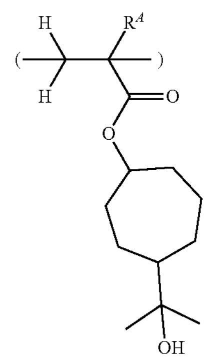

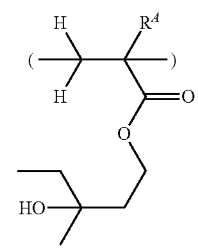

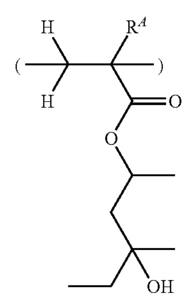

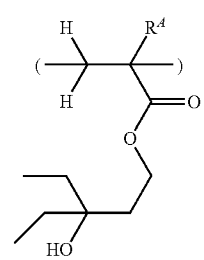

-continued
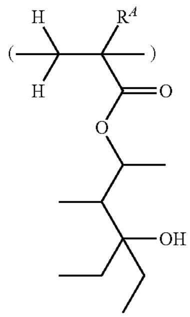
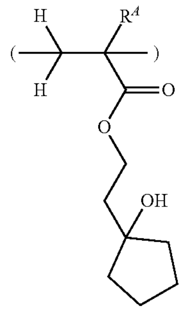
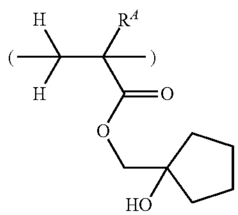
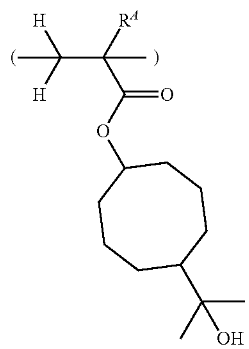
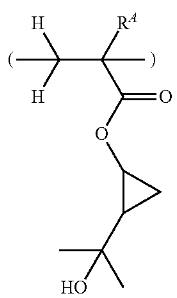
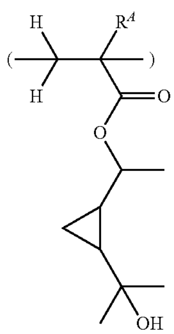
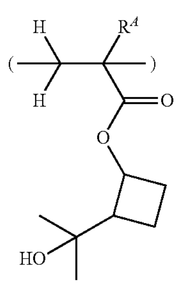
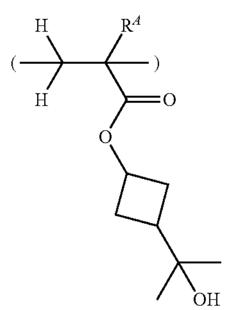
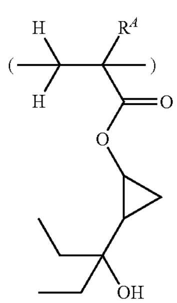
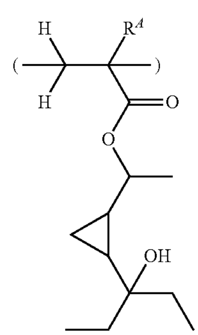
-continued
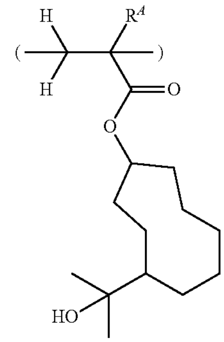
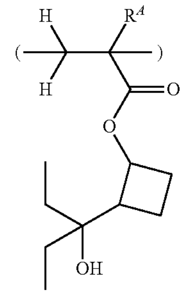
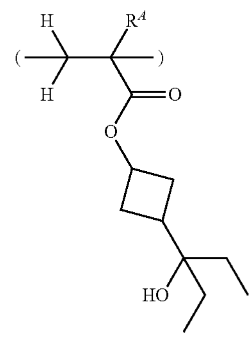
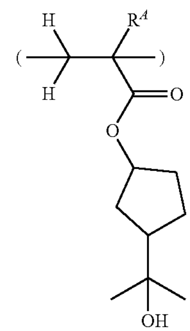
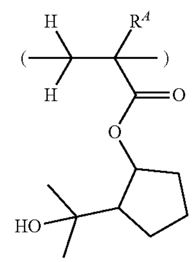
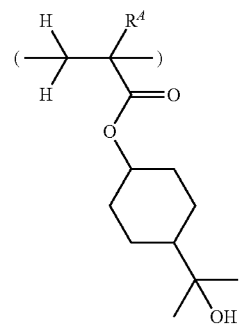
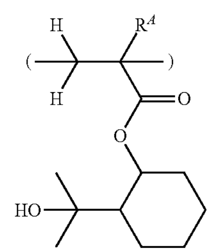
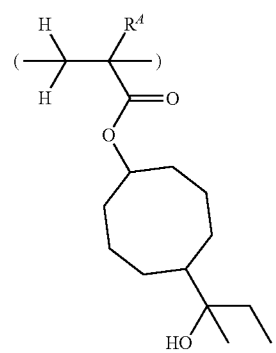
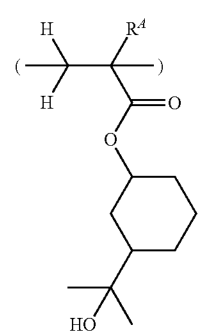
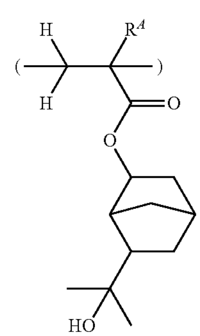

-continued
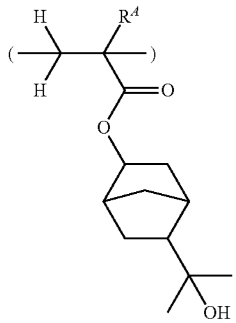
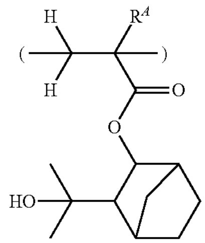
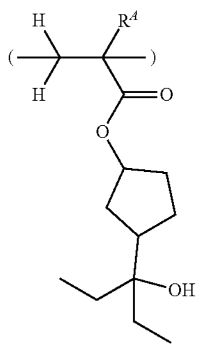
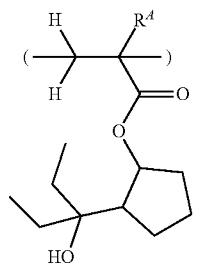
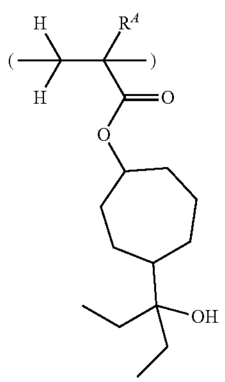
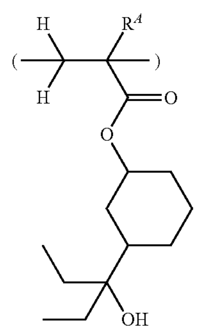
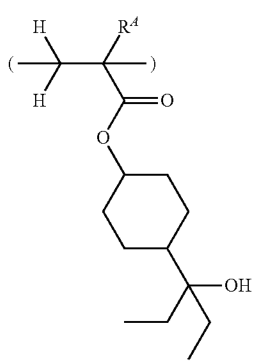
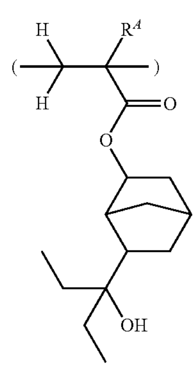
-continued
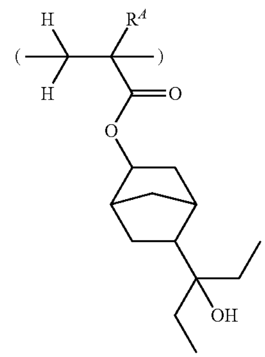
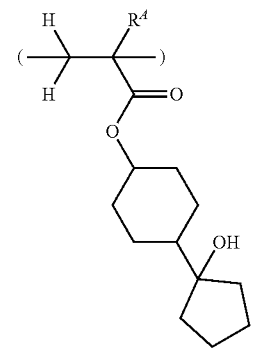
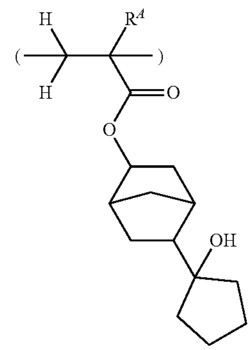
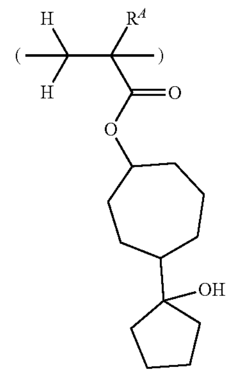
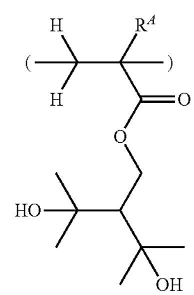
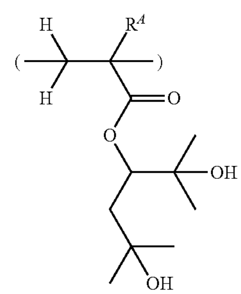
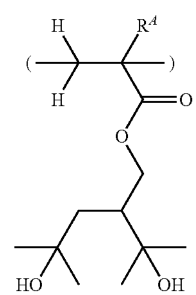
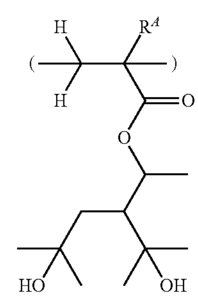
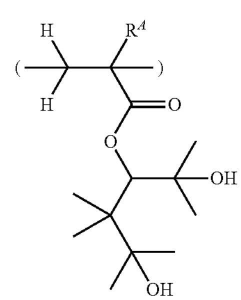
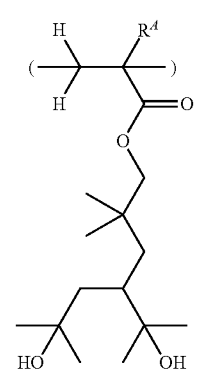

-continued
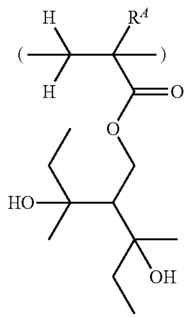
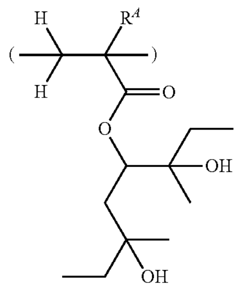
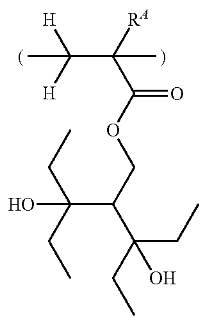
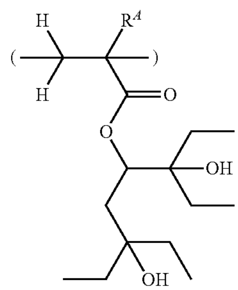
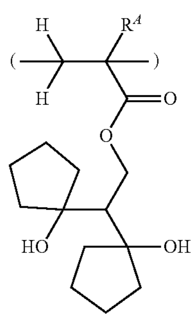
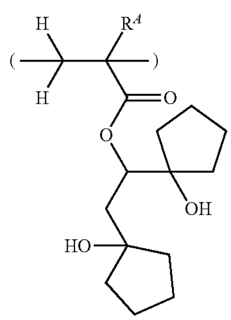
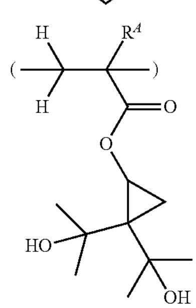
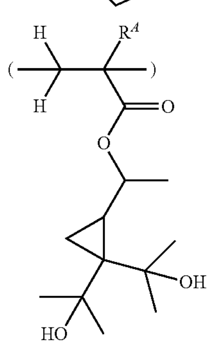
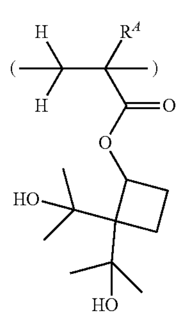
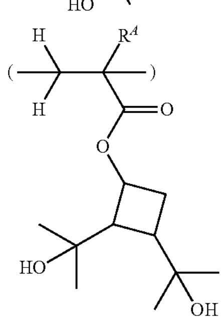
-continued
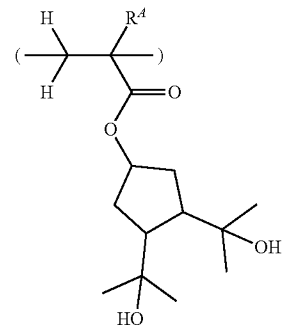
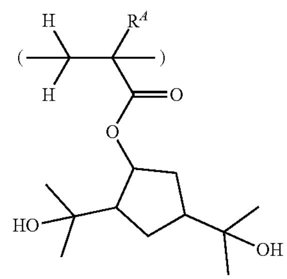
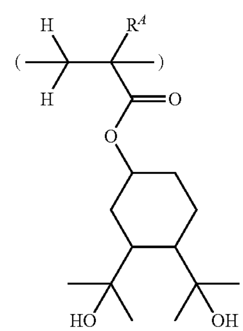
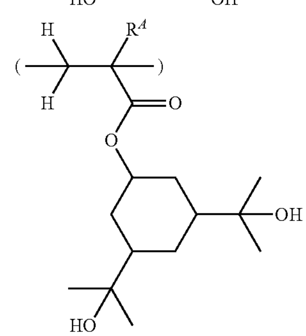
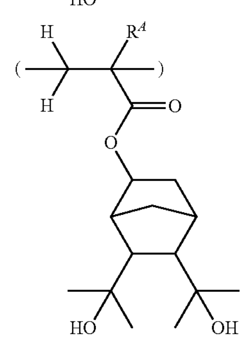
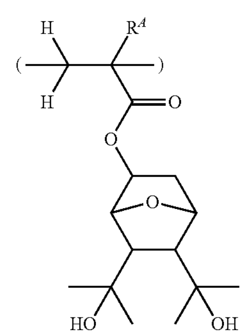

-continued
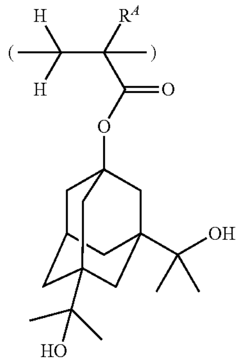
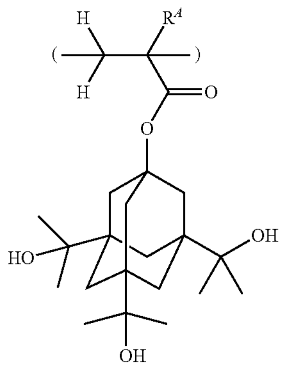
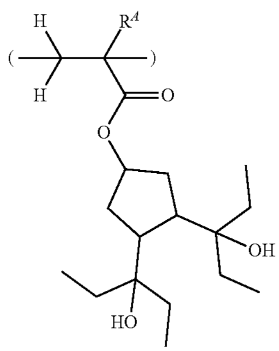
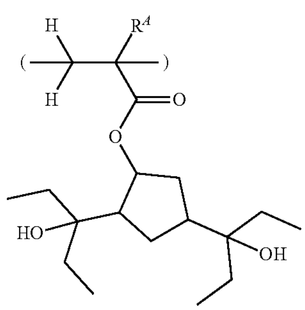
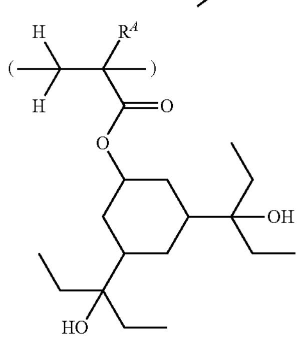
-continued
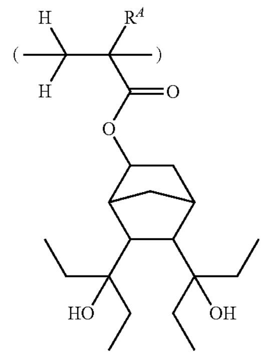
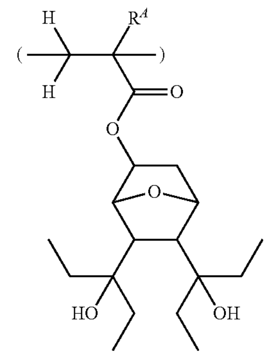
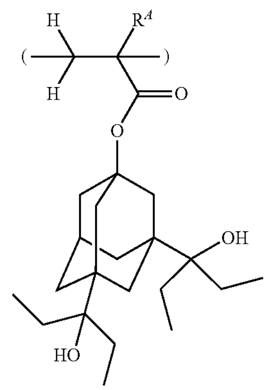
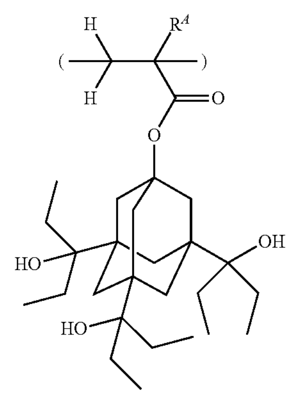
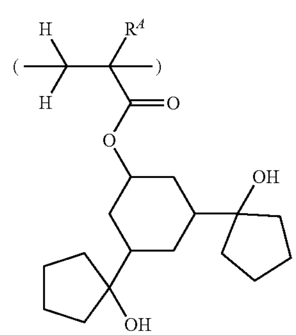

-continued
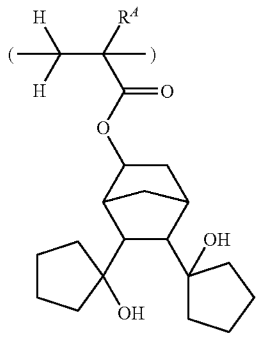
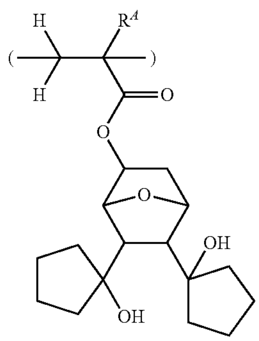
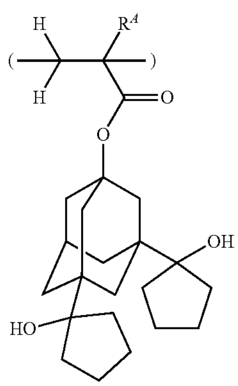
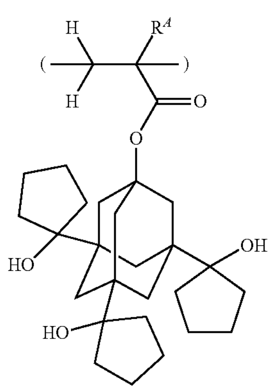
-continued
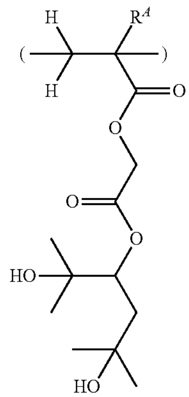
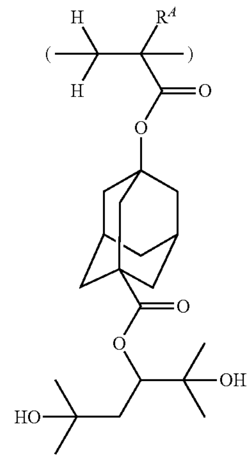
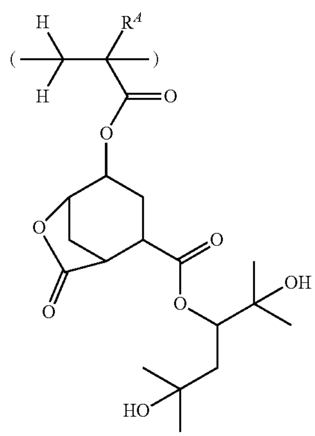
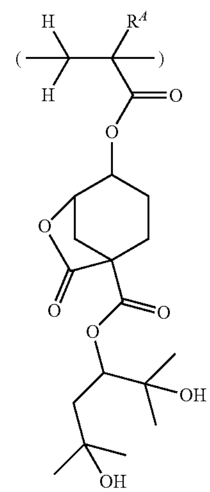
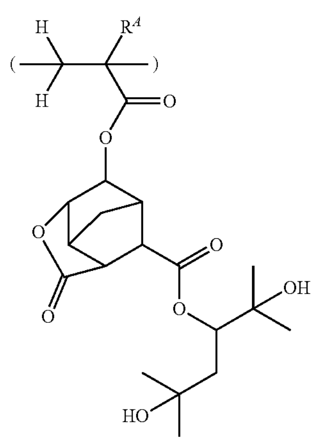

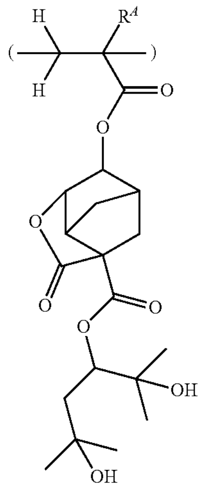
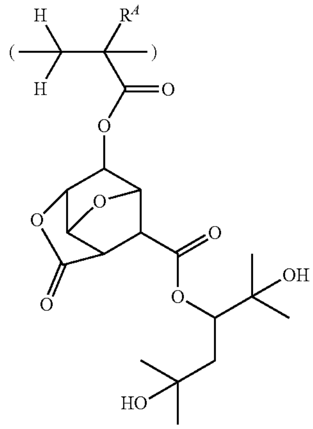
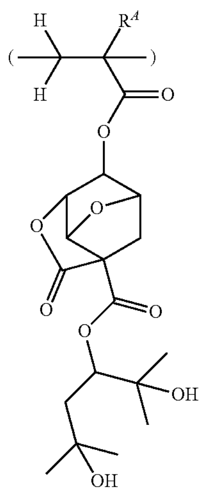
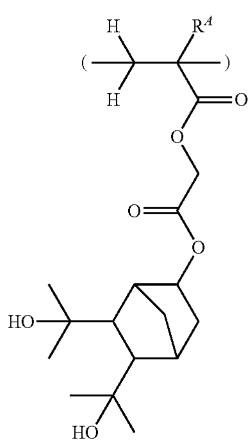
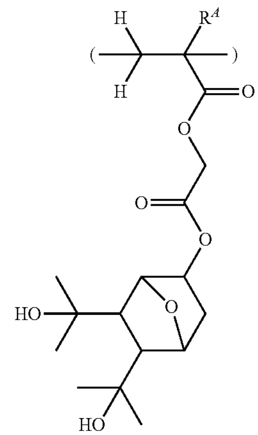
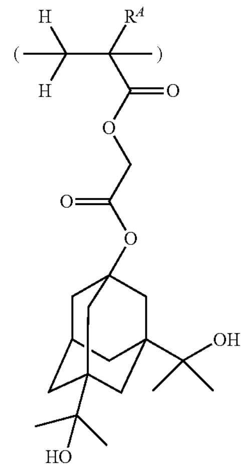
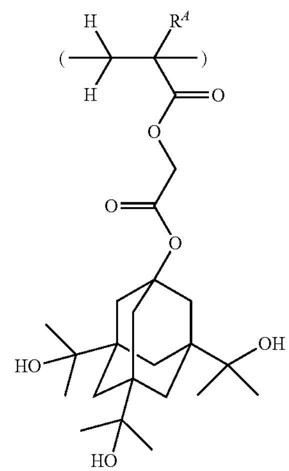
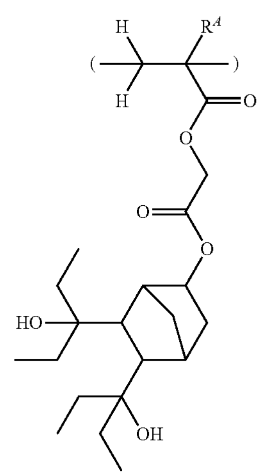

-continued
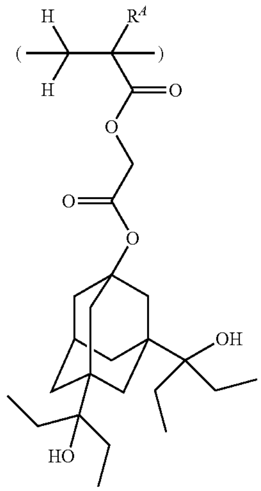
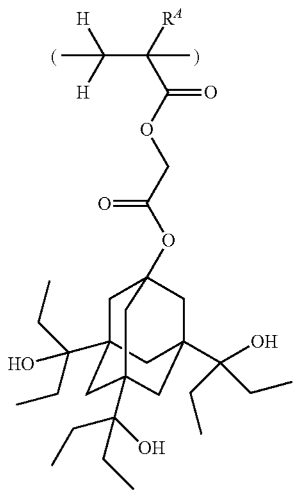
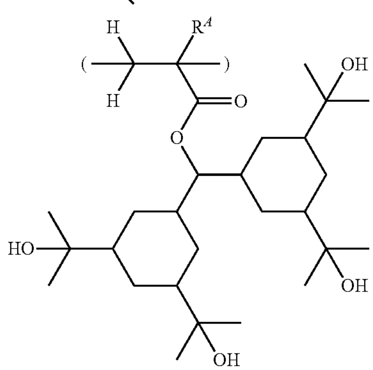
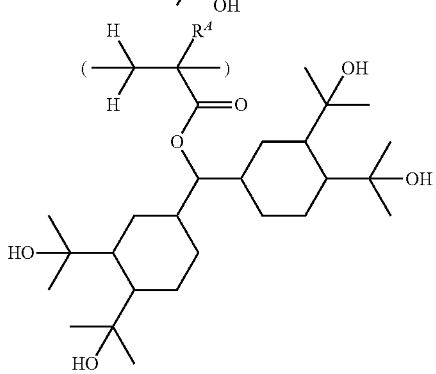
Examples of the recurring units having formula (4b) are given below, but not limited thereto. $R^A$ is as defined above.
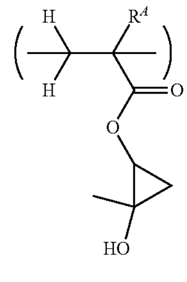
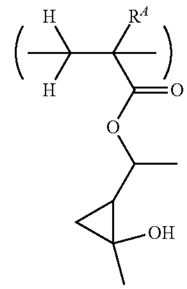
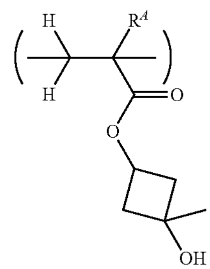
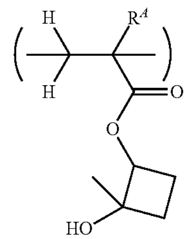
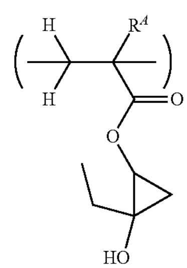
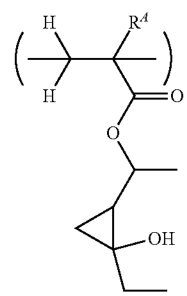
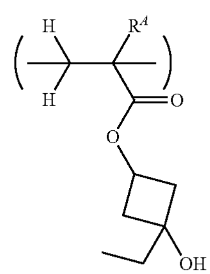
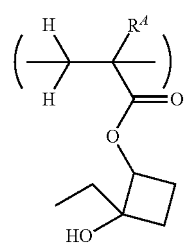
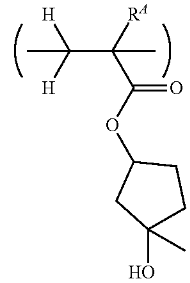
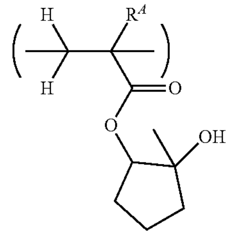

-continued
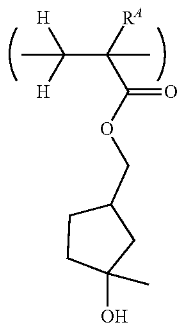
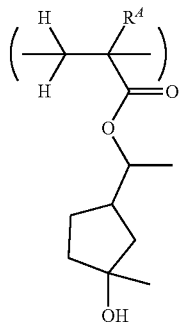
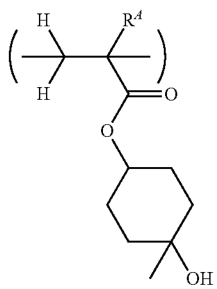
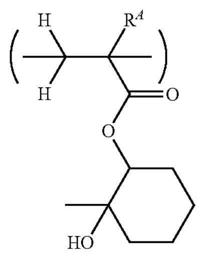
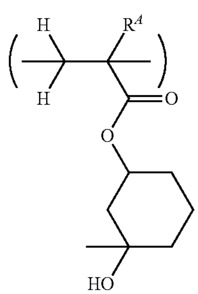
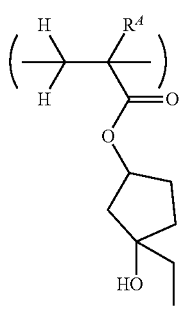
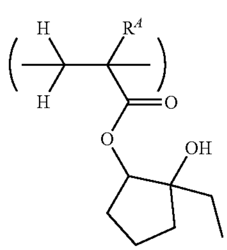
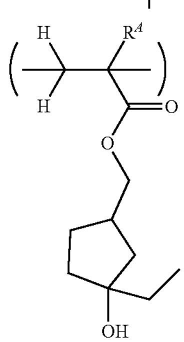
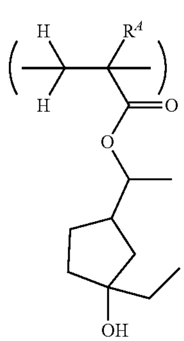
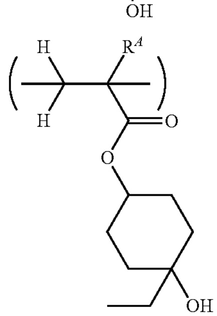
-continued
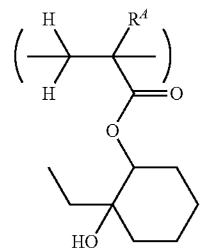
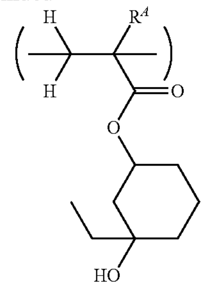
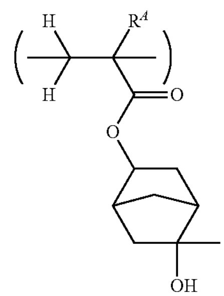
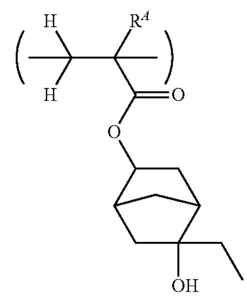
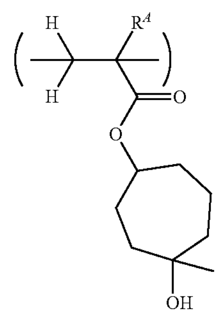
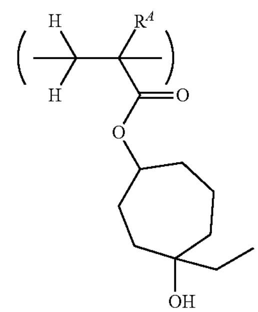
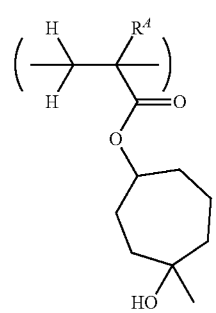
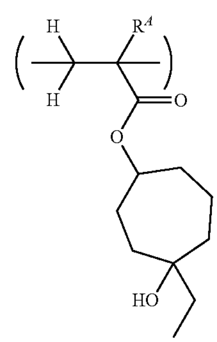
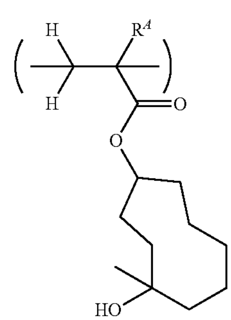
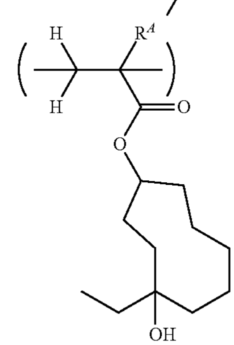

-continued
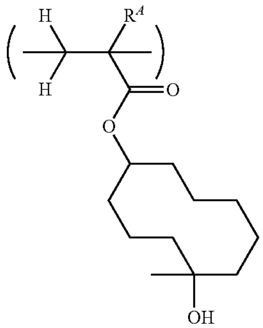
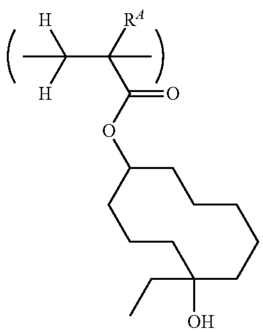
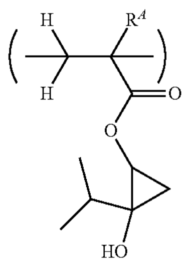
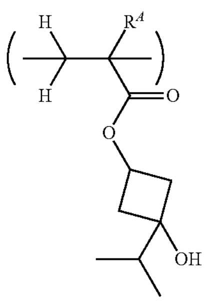
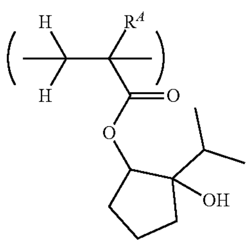
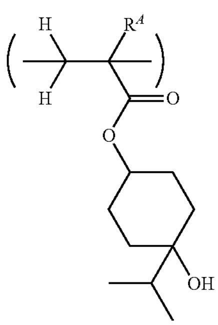
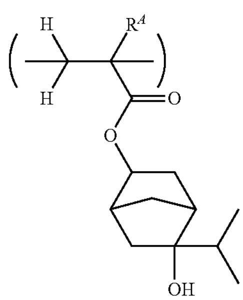
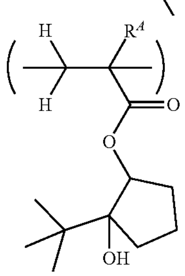
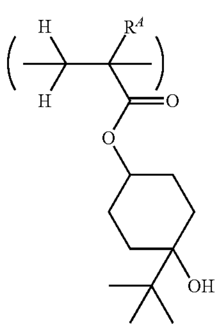
-continued
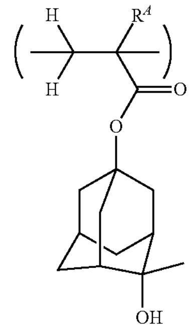
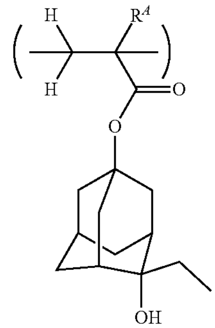
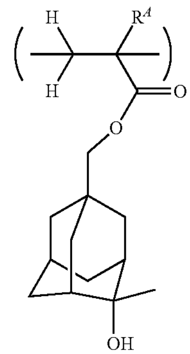
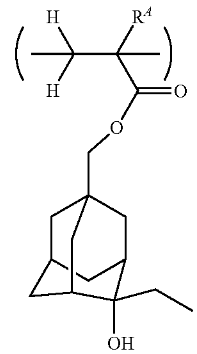
Examples of the recurring units having formula (4c) are given below, but not limited thereto. $R^A$ is as defined above.
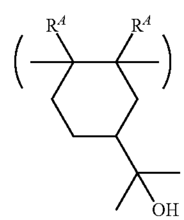
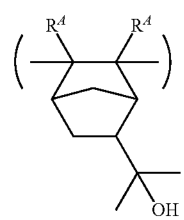
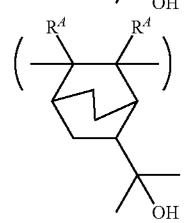
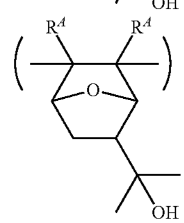
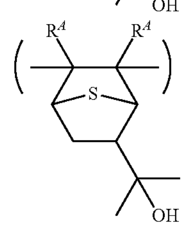
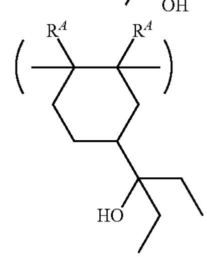
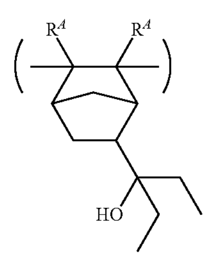
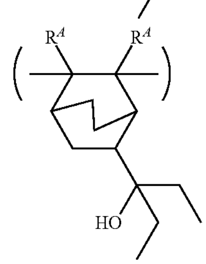

-continued
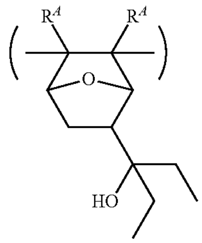
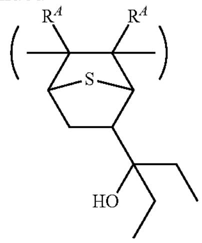
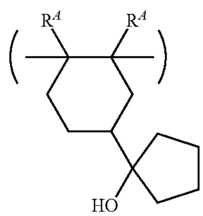
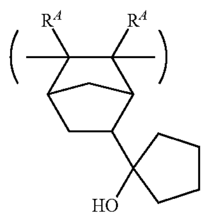
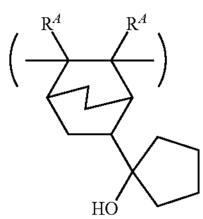
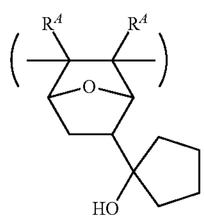
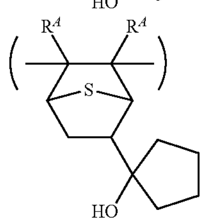
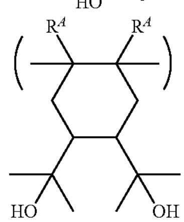
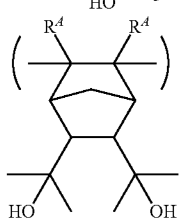
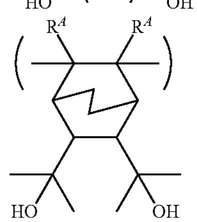
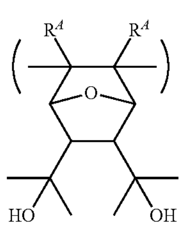
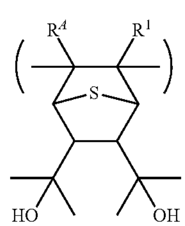
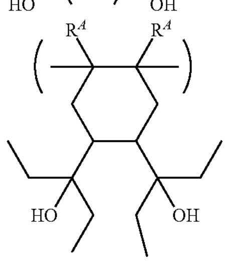
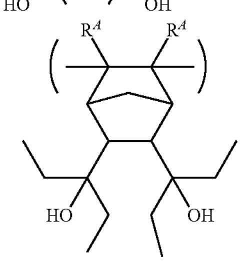
-continued
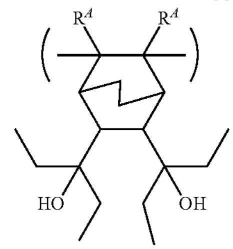
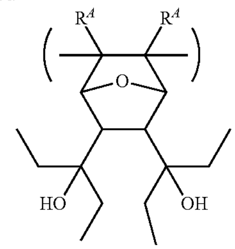
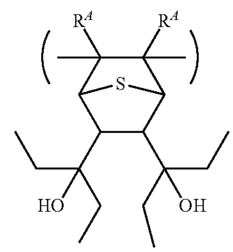
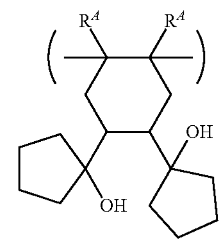
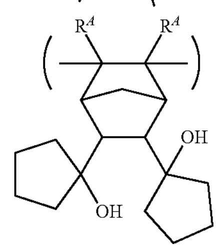
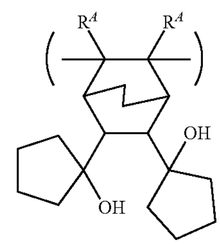
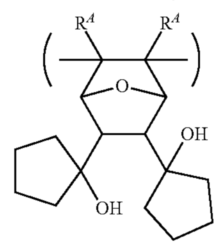
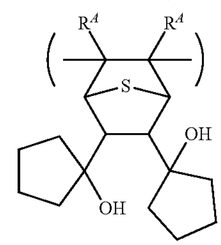
The inventive polymer may further comprise recurring units of at least one type selected from recurring units having the formulae (5a) to (5c).
(5a)
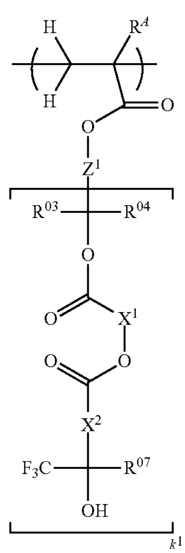

-continued (5b)

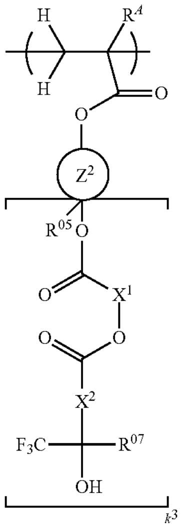

(5c)

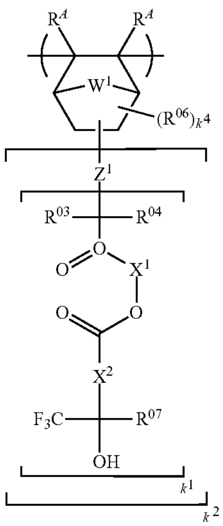

Herein $R^A$, $R^{03}$ to $R^{06}$, $W^1$, $Z^1$, $Z^2$ and $k^1$ to $k^4$ are as defined above. $R^{07}$ is hydrogen, methyl or trifluoromethyl. $X^1$ is a $C_1$-$C_{10}$ straight, branched or cyclic alkylene group. $X^2$ is a single bond, methylene or ethylidene. The carbon atom in $Z^1$ or $Z^2$ in bond with the ester oxygen atom in the polymer backbone in the formula is not tertiary carbon atom, excluding the case wherein the carbon atom in $Z^1$ or $Z^2$ is the carbon atom at the 1-position on an adamantane ring.

Now that recurring units having formula (5a), (5b) or (5c) are incorporated in addition to the recurring units containing a group of formula (2a) and/or recurring units containing a group of formula (2b), the dissolution rate in alkaline developer of the polymer or base resin in the unexposed region is further improved. The recurring unit having the formula (5a), (5b) or (5c) is a recurring unit having 1 to 4 acid labile groups containing a fluoroalcohol moiety having a high affinity to alkaline developer. Prior to exposure, the polymer has a high affinity to and solubility in alkaline developer due to the presence of fluoroalcohol moieties having high acidity. After exposure, fluoroalcohol moieties are lost in the exposed region, and the polymer in the exposed region experiences a substantial drop of solubility in alkaline developer and becomes insoluble in the developer.

Examples of the recurring units having formula (5a) are given below, but not limited thereto. $R^A$ is as defined above.

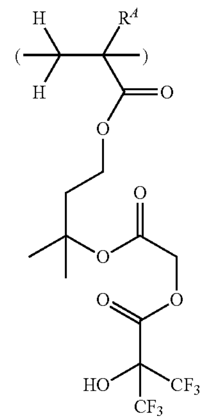

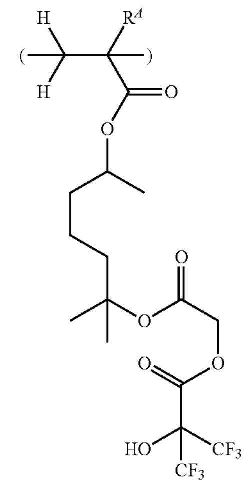

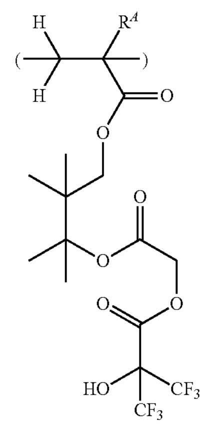

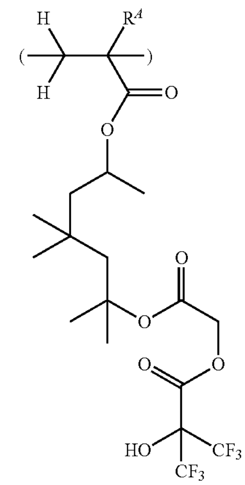

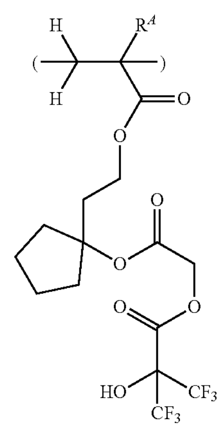

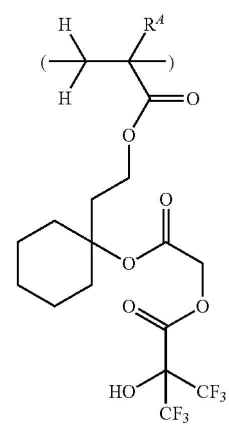

-continued
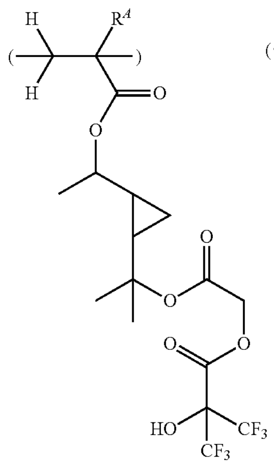
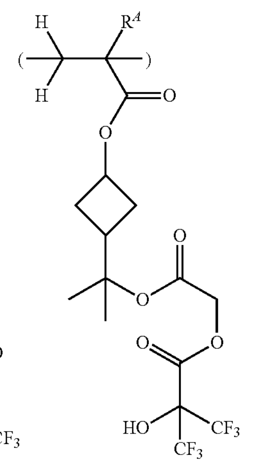
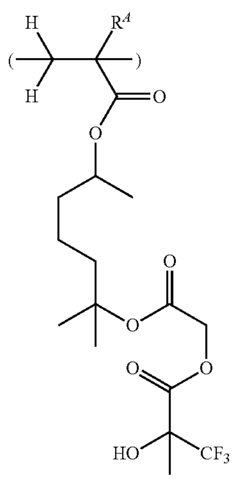
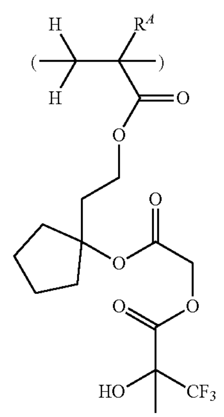
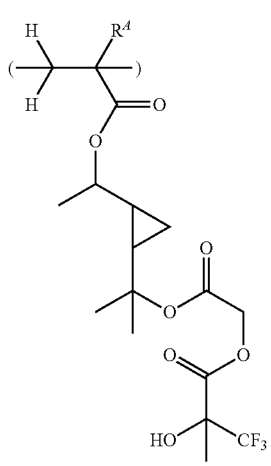
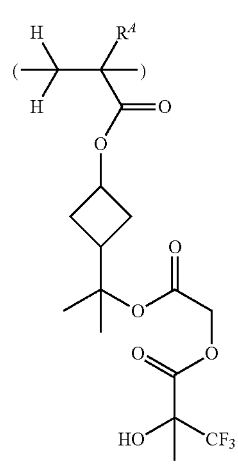
-continued
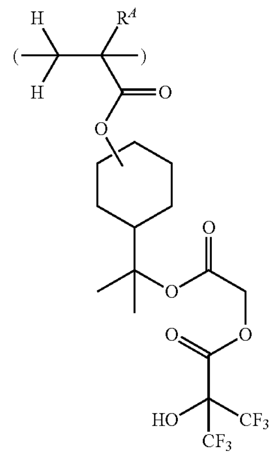
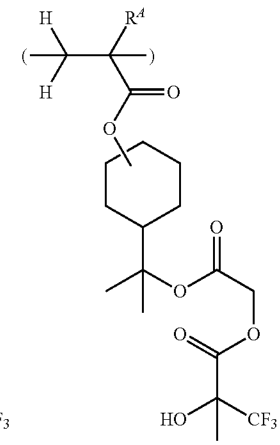
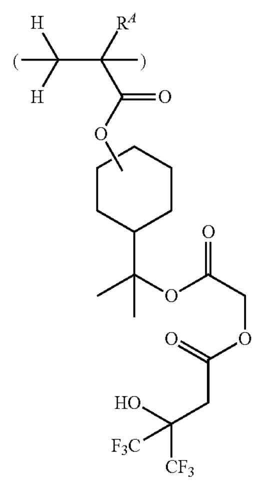
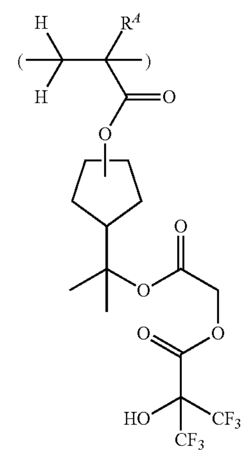
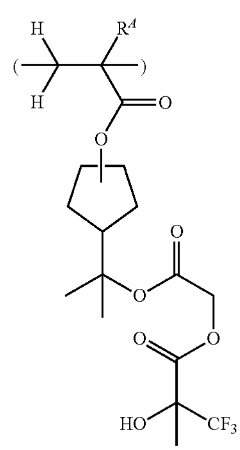
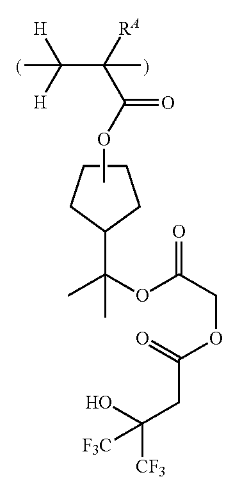

-continued
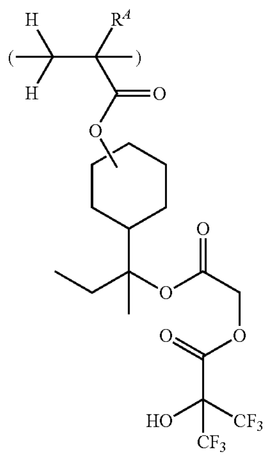
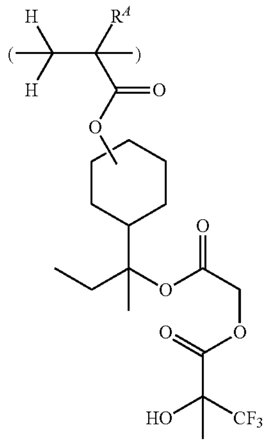
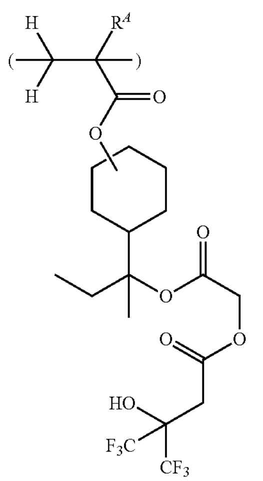
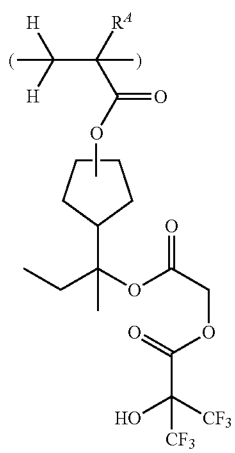
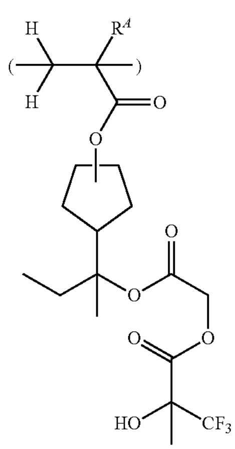
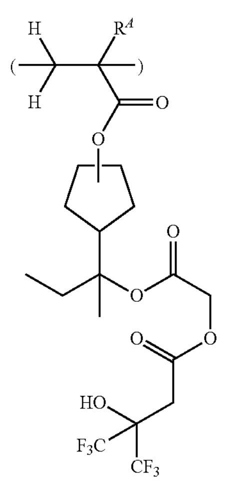
-continued
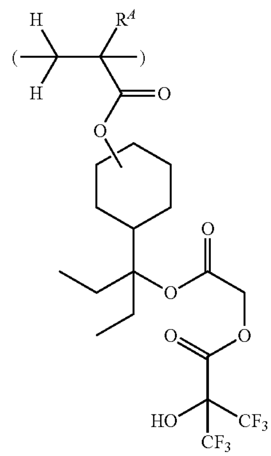
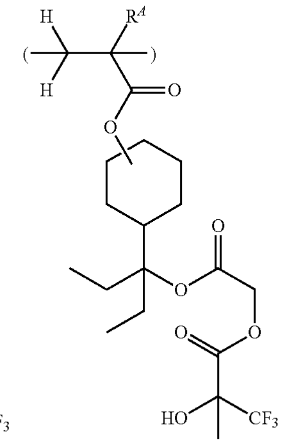
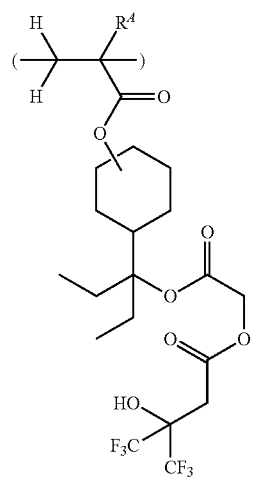
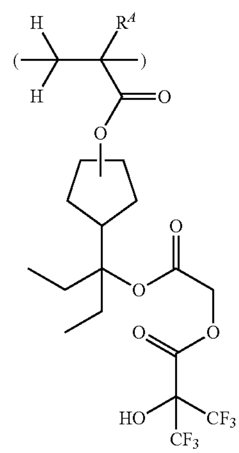
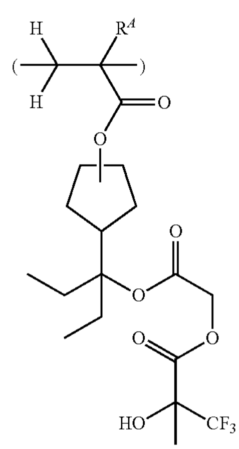
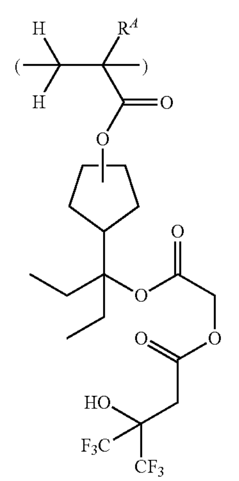

-continued
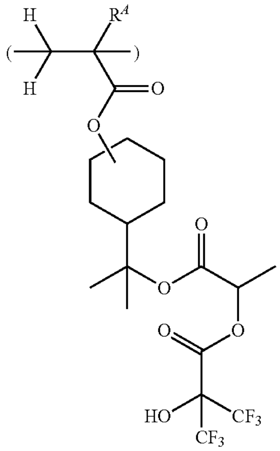
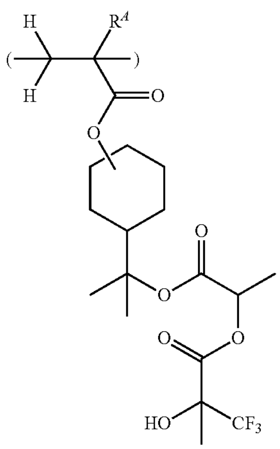
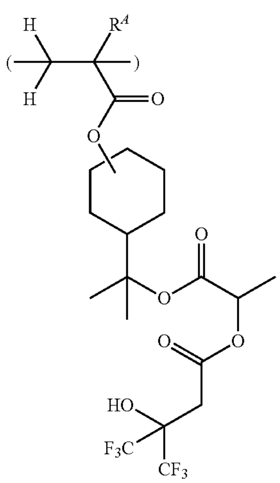
-continued
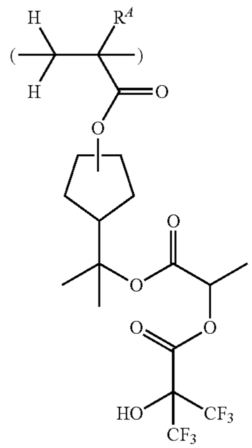
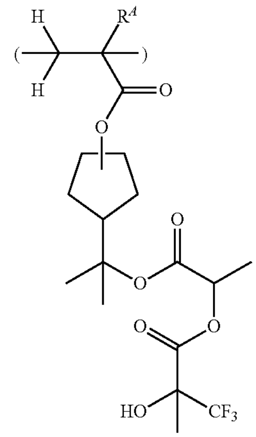
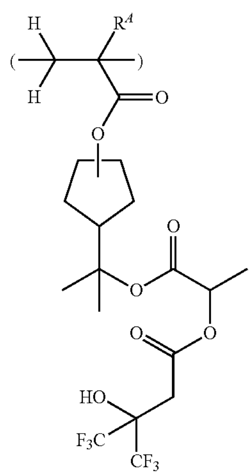
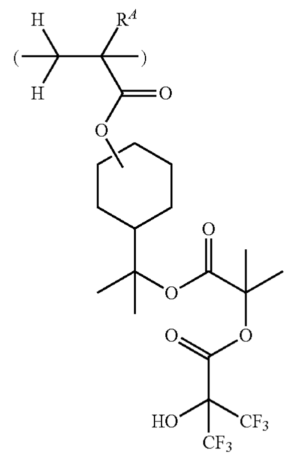
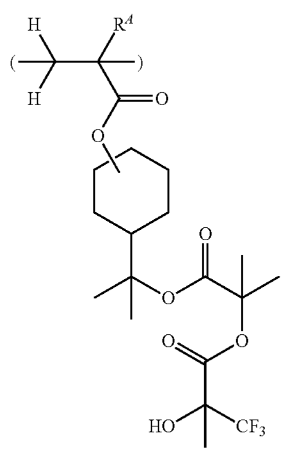

-continued
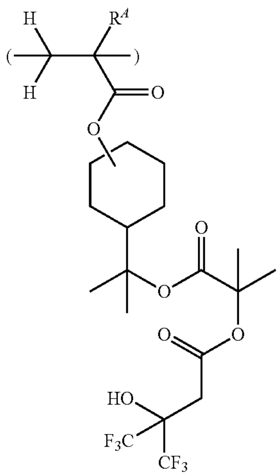
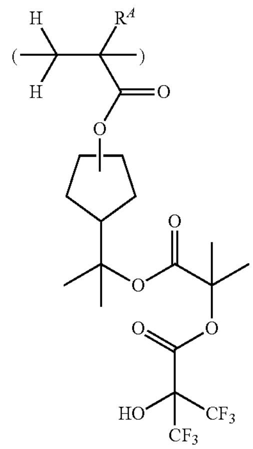
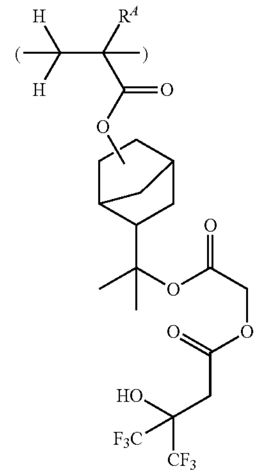
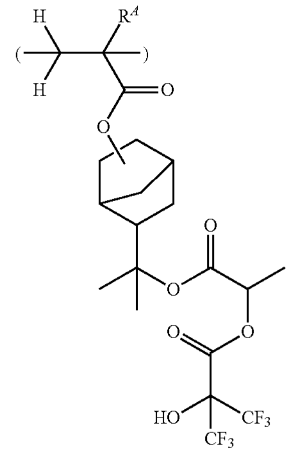
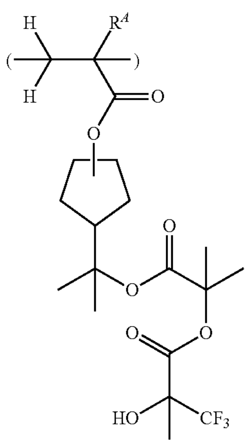
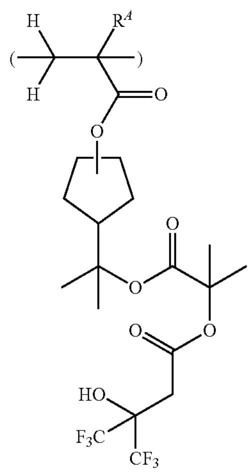
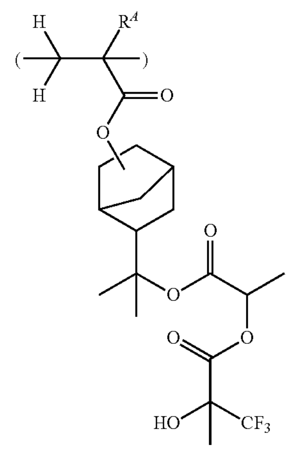
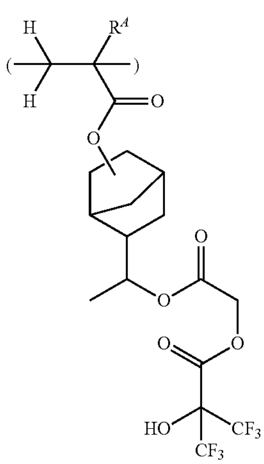
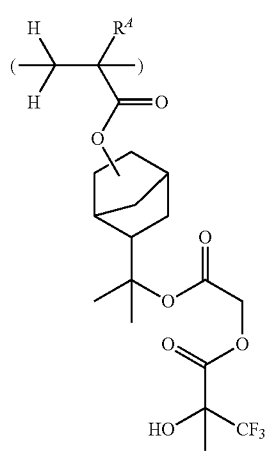
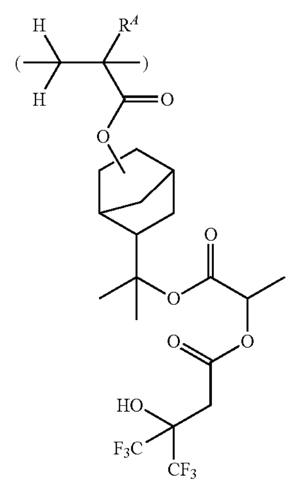

-continued
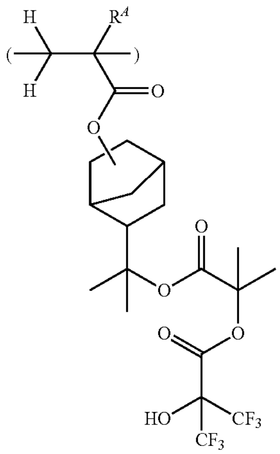
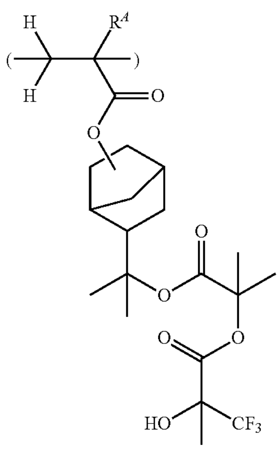
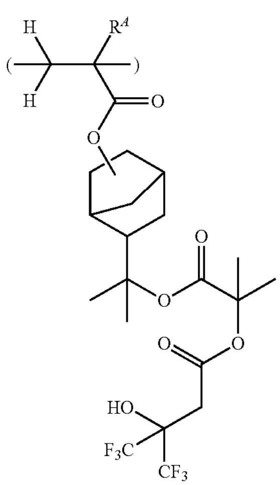
-continued
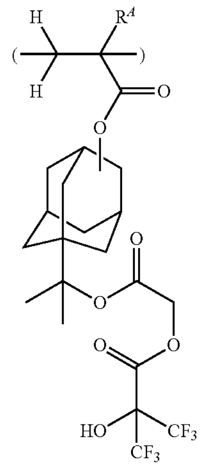
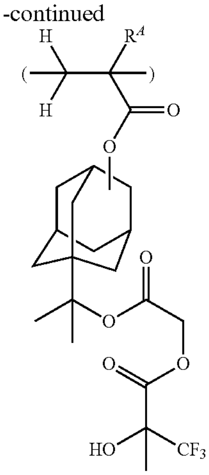
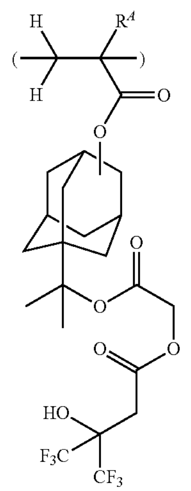
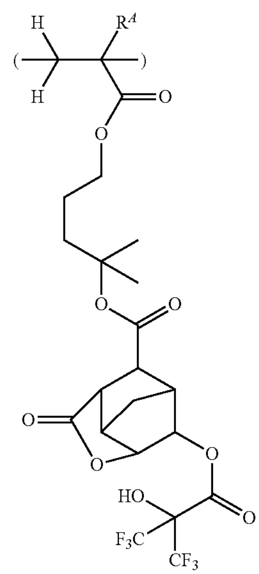
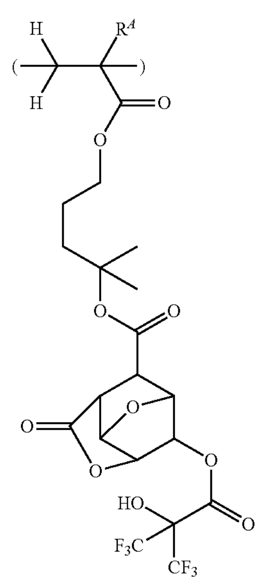
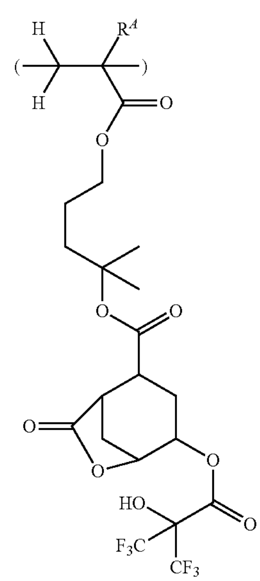

-continued
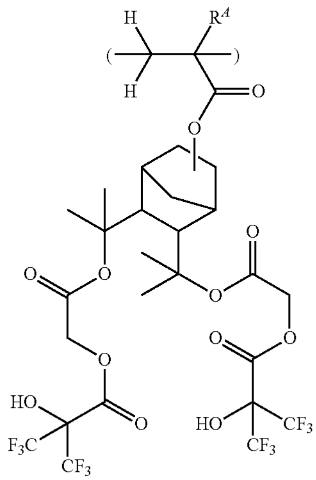
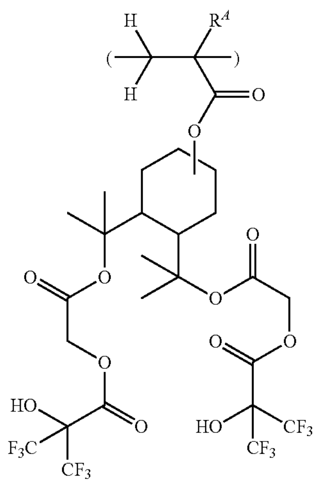
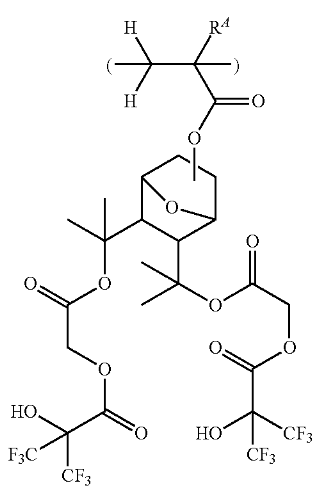
-continued
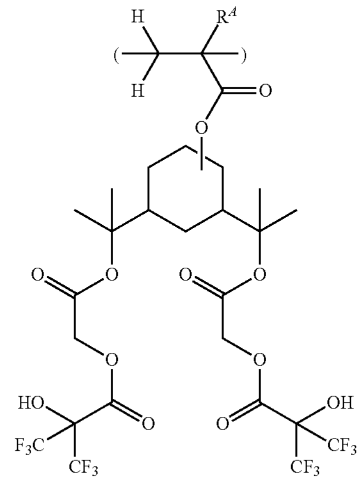
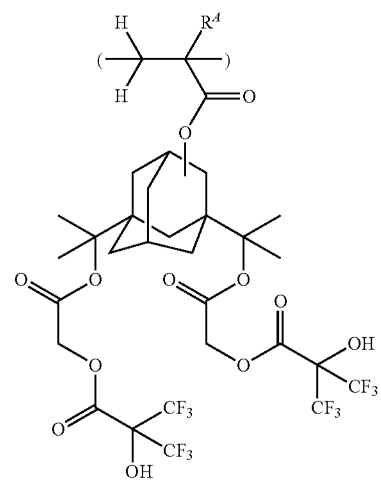
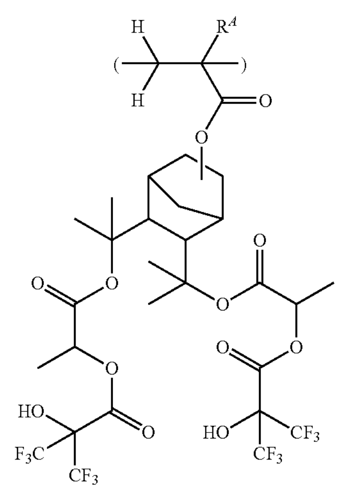

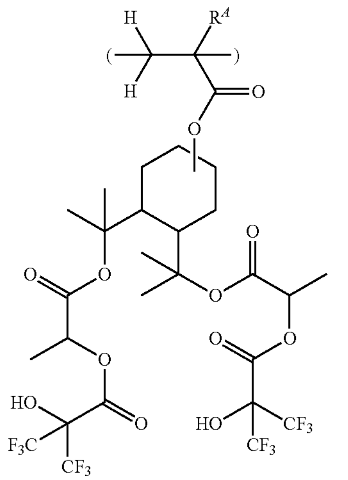
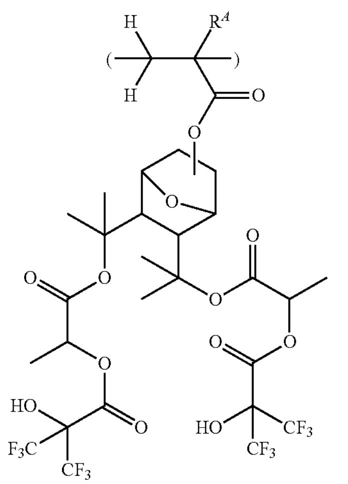
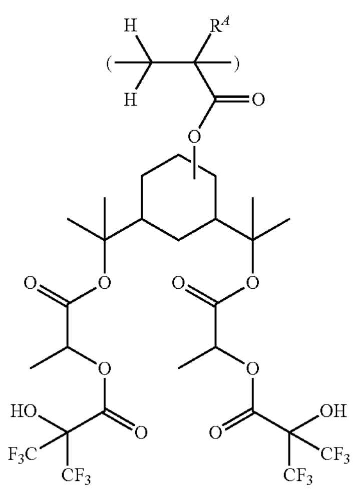
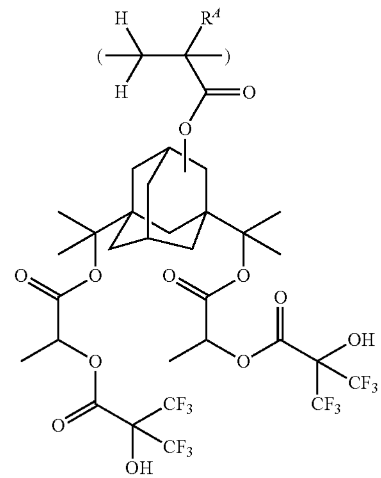
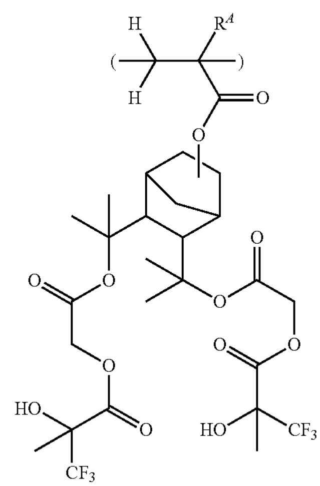
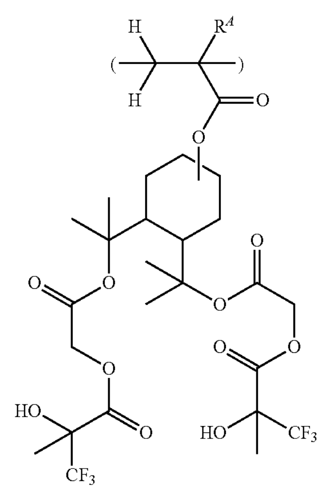

-continued
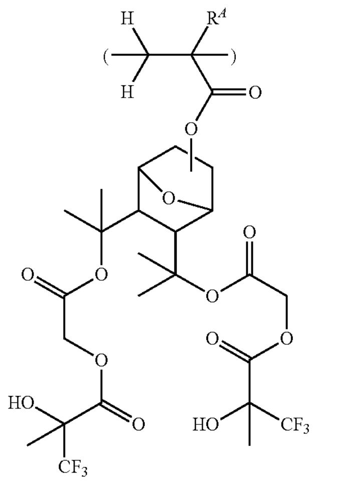
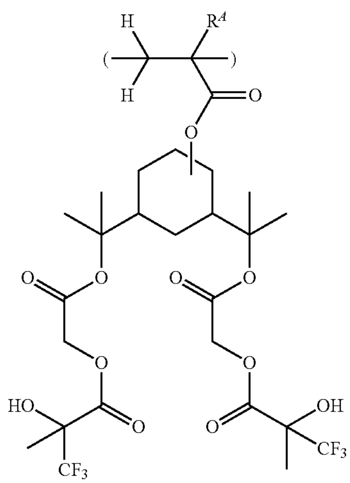
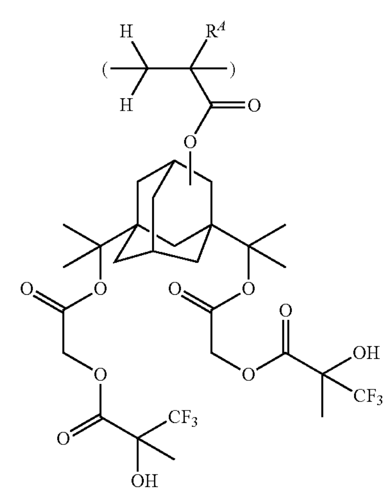
-continued
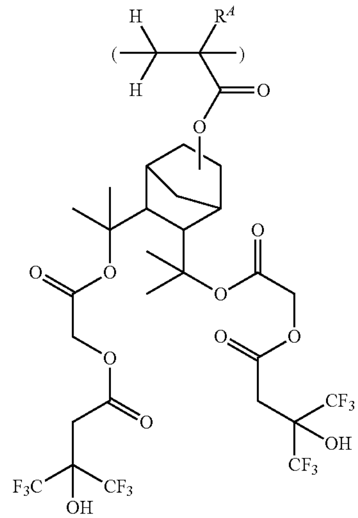
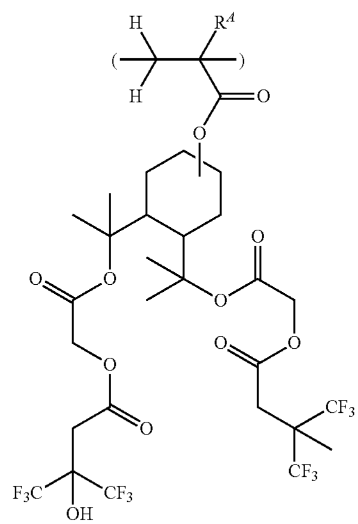
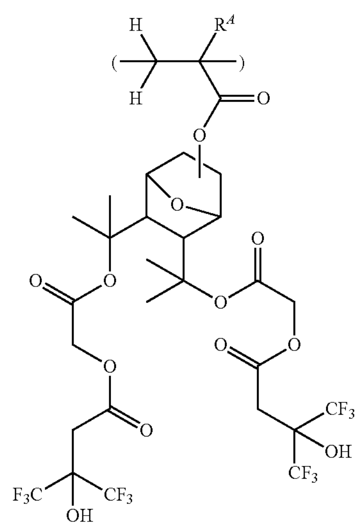

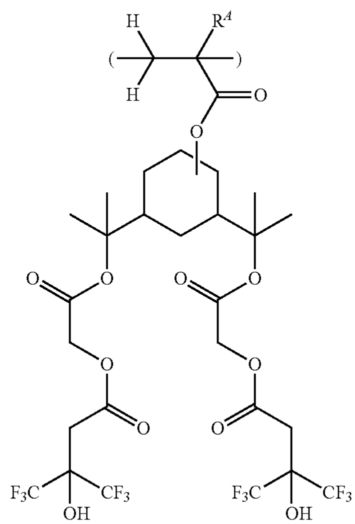
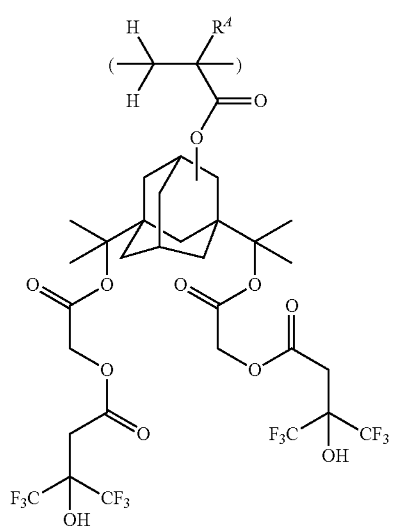
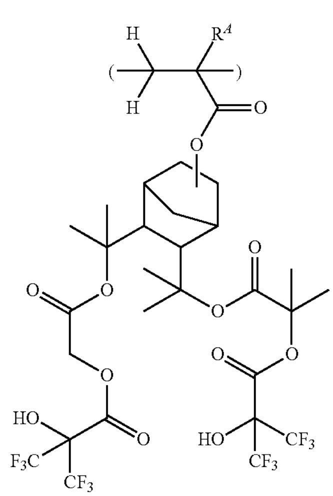
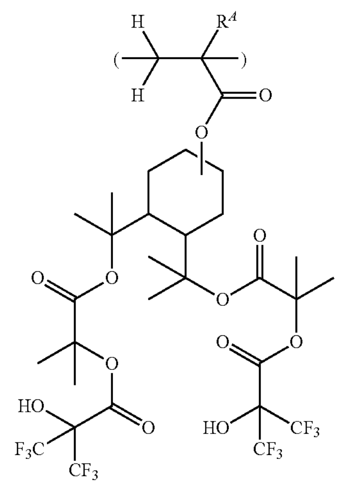
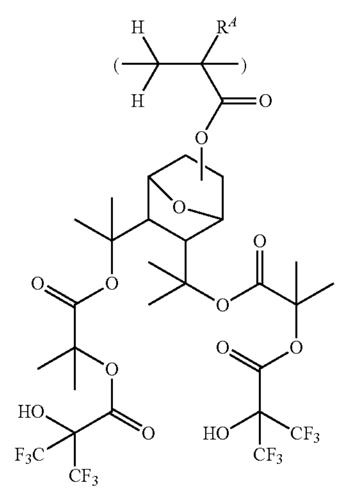
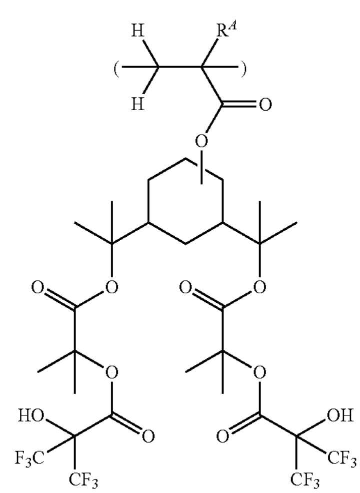

-continued
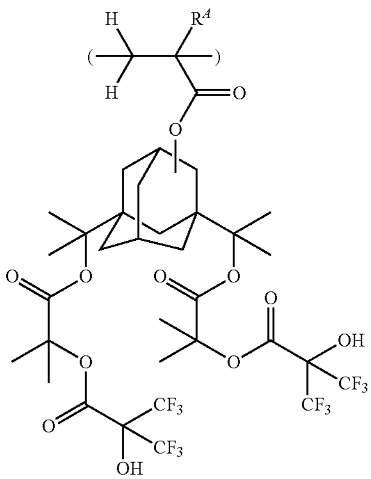
Examples of the recurring units having formula (5b) are given below, but not limited thereto. $R^A$ is as defined above.
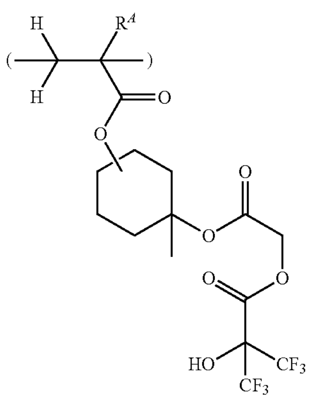
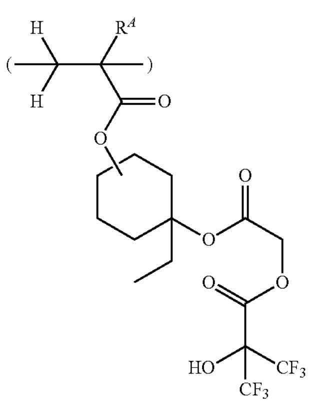
-continued
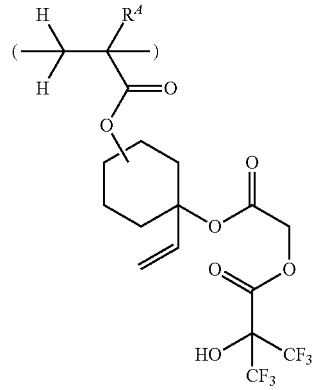
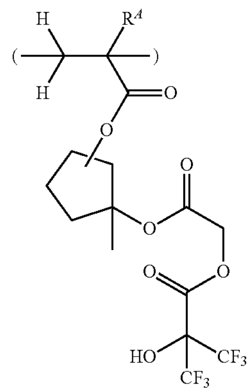
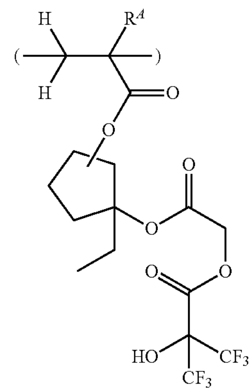
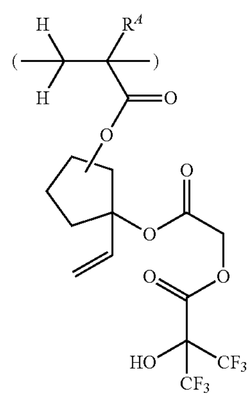
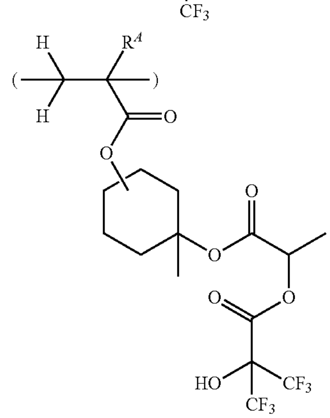

-continued
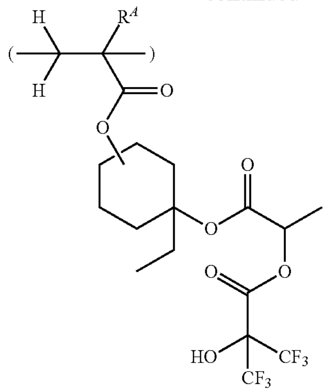
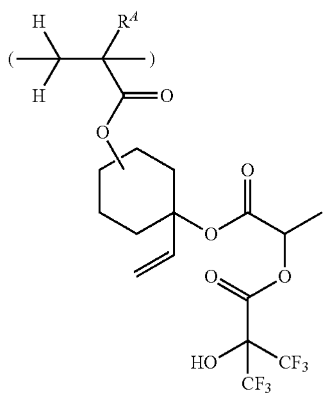
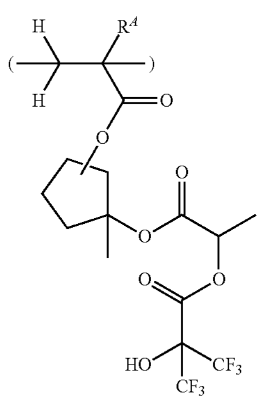
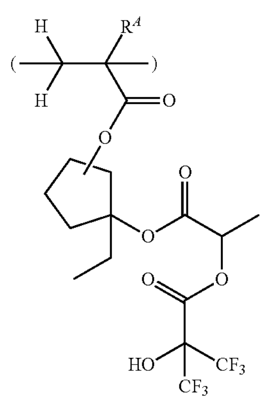
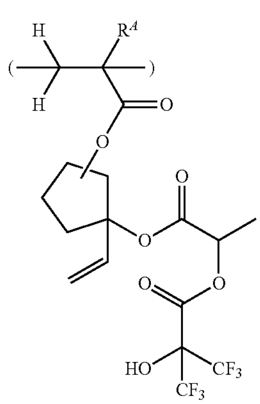
-continued
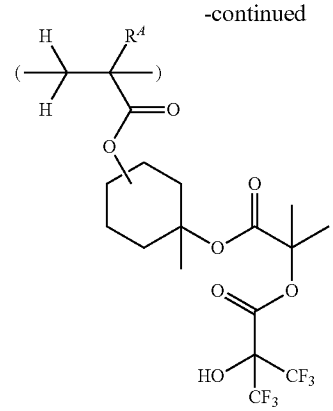
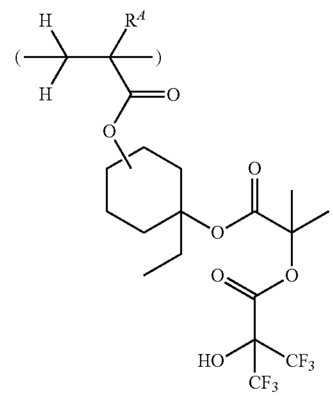
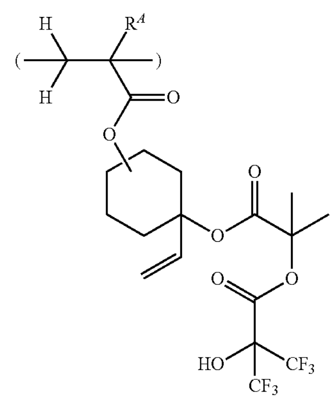
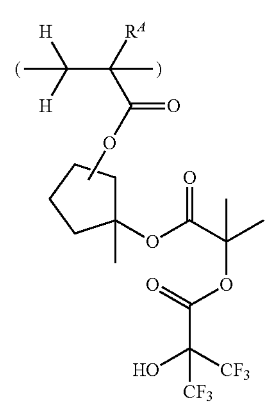
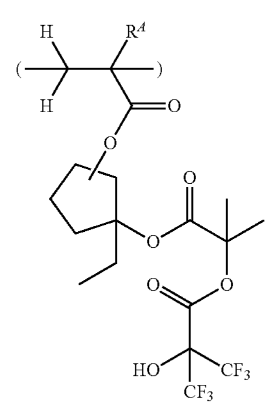

-continued
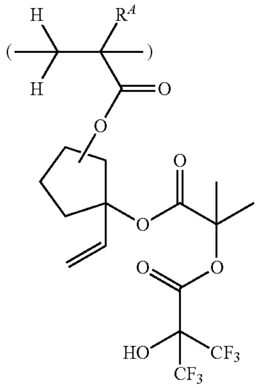
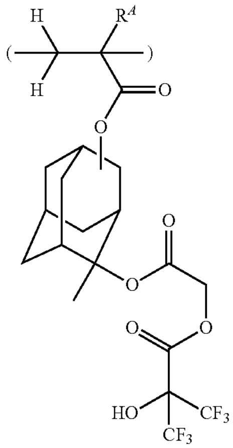
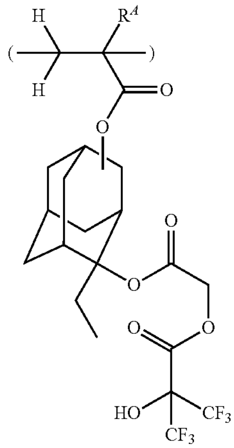
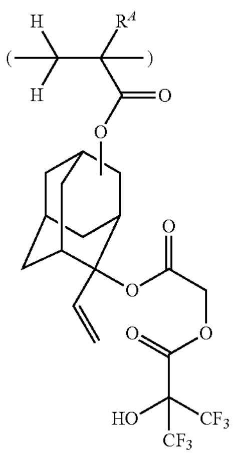
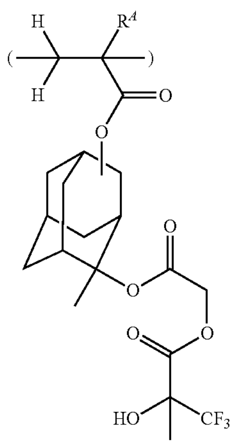
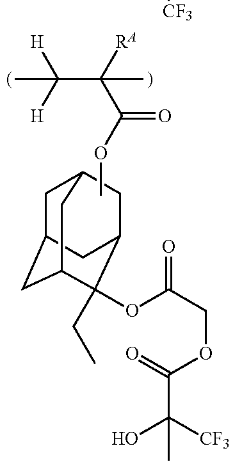
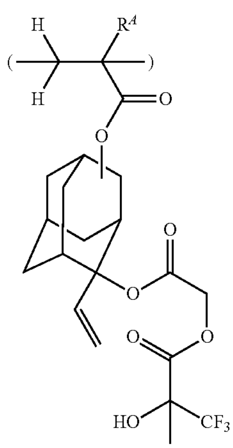
-continued
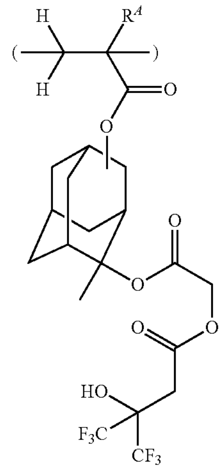
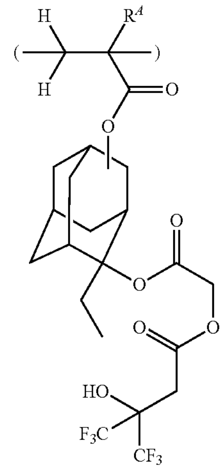
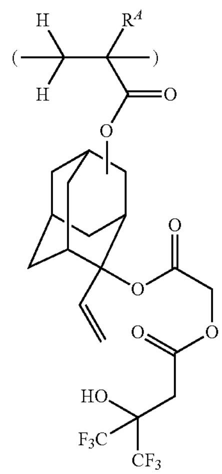
Examples of the recurring units having formula (5c) are given below, but not limited thereto. $R^A$ is as defined above.
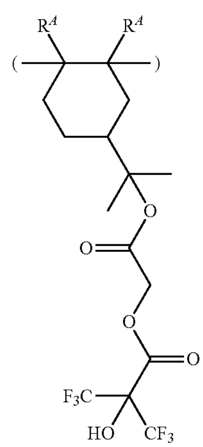
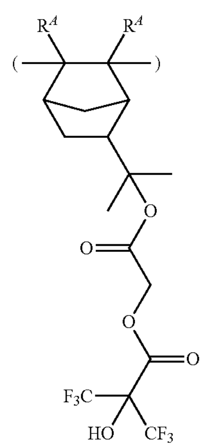

-continued
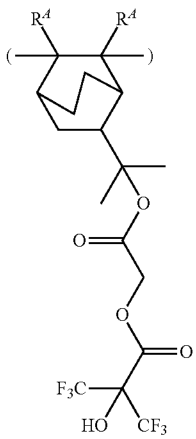
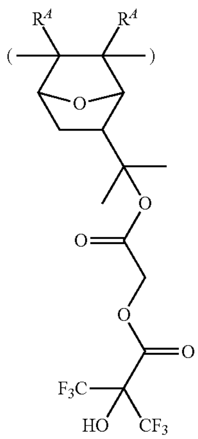
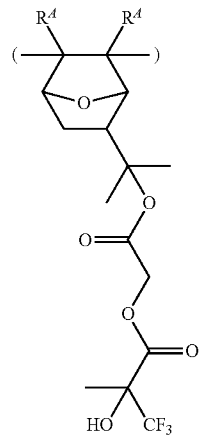
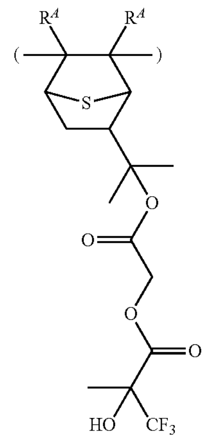
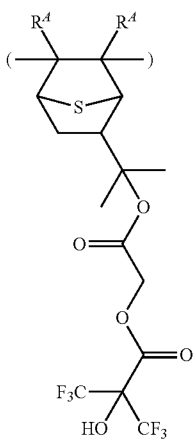
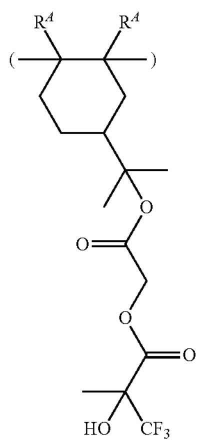
-continued
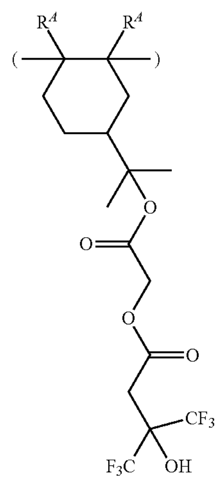
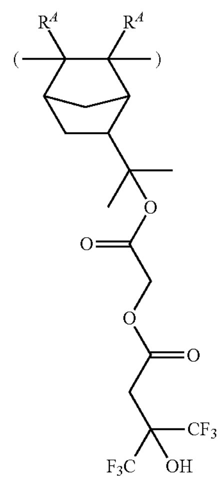
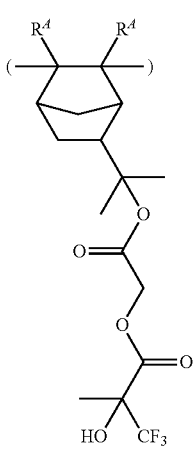
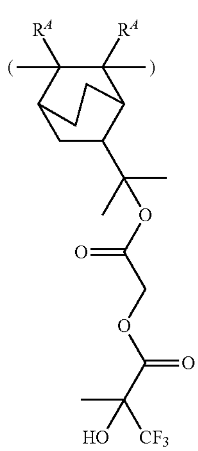
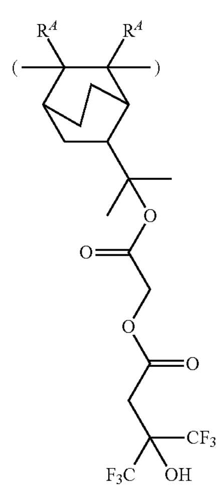
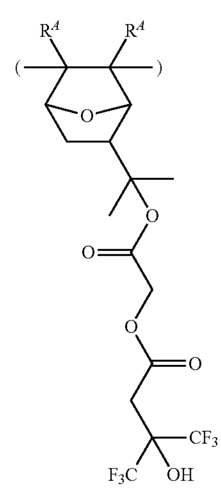

-continued
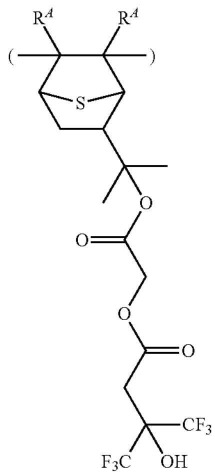
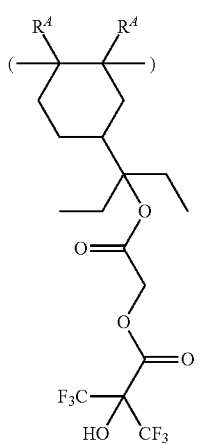
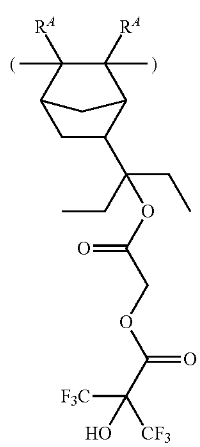
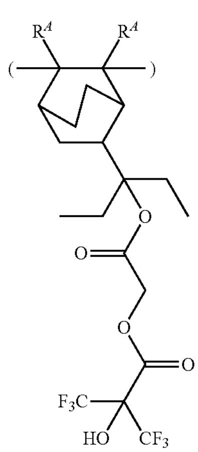
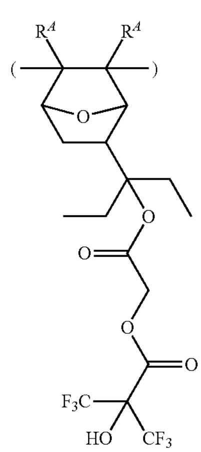
-continued
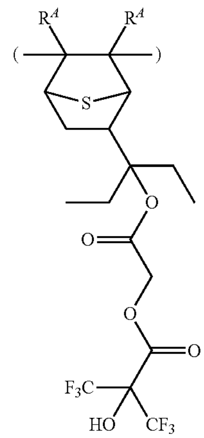
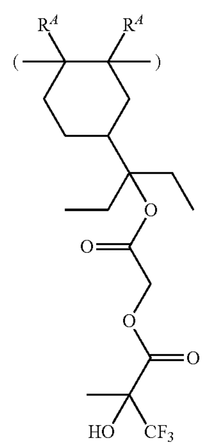
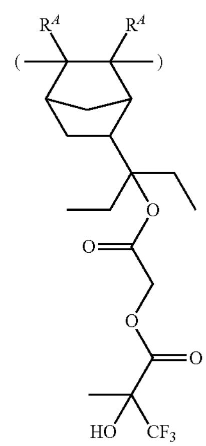
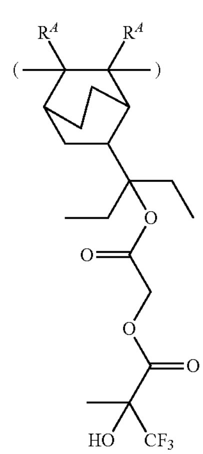
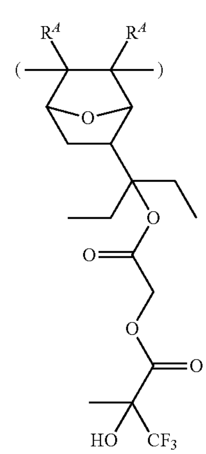

-continued
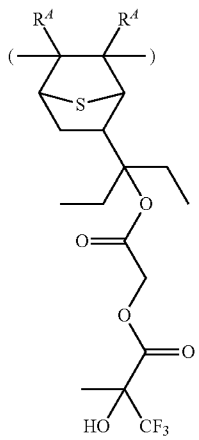
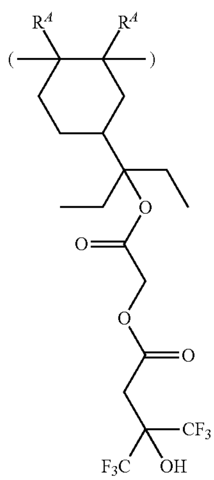
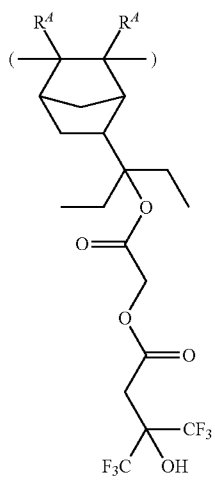
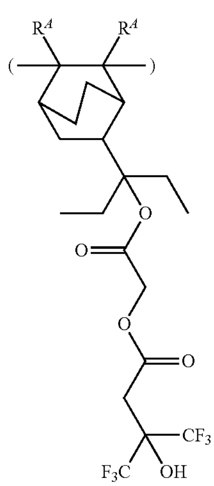
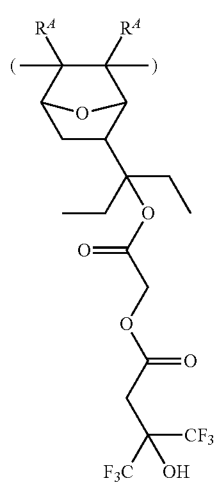
-continued
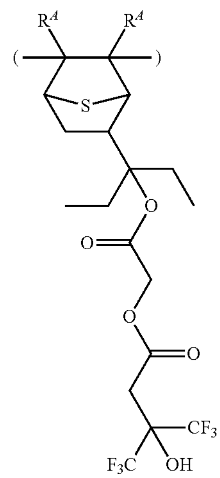
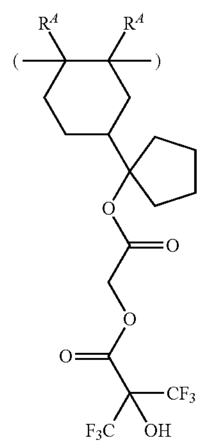
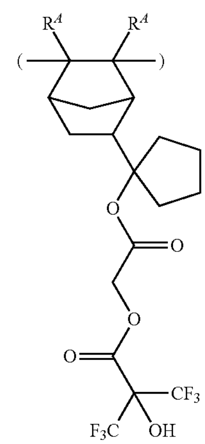
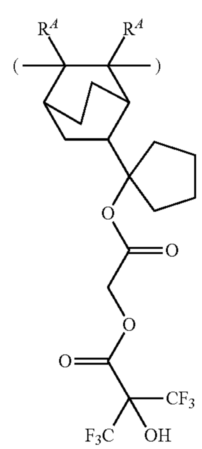
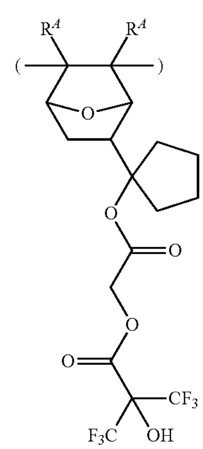

-continued
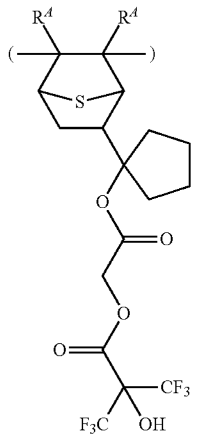
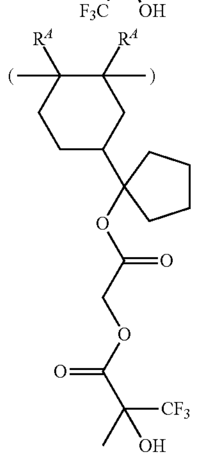
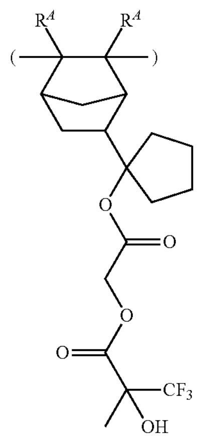
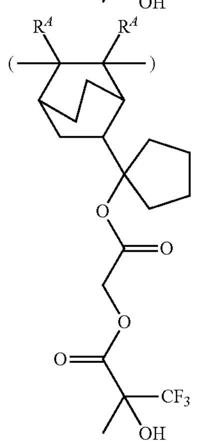
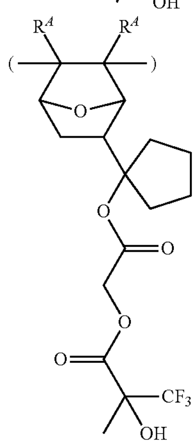
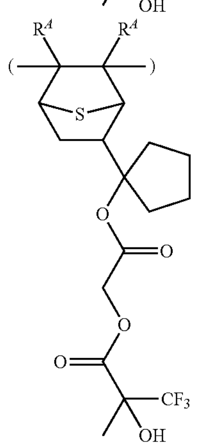
-continued
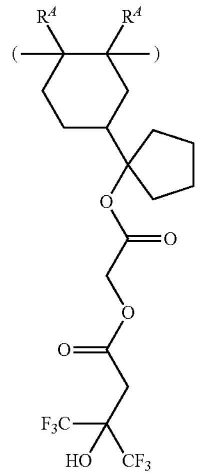
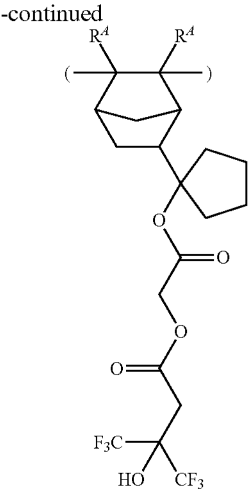
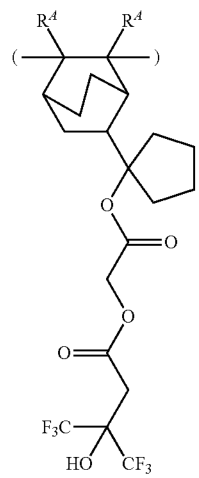
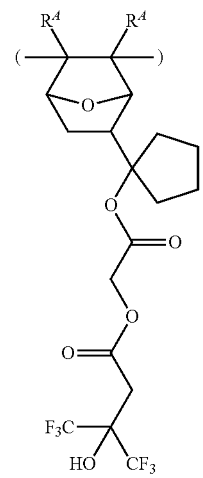
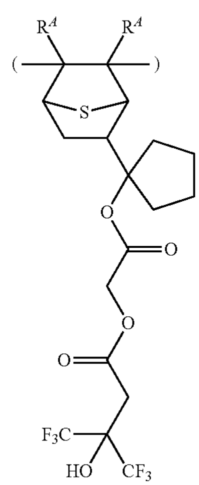
In the inventive polymer, recurring units of at least one type selected from recurring units having the formulae (6a) to (6d) may be further incorporated for the purposes of controlling solubility and improving adhesion to the substrate.

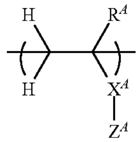

(6a)

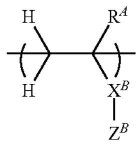

(6b)

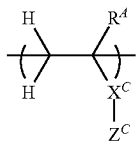

(6c)

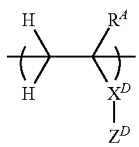

(6d)

Herein $R^A$ is as defined above. $Z^A$ is a $C_1$-$C_{20}$ fluoroalcohol-containing substituent group which is free of a structure undergoing a polarity switch under the action of acid. $Z^B$ is a $C_6$-$C_{20}$ phenolic hydroxyl-containing substituent group. $Z^C$ is a $C_1$-$C_{20}$ carboxyl-containing substituent group. $Z^D$ is a substituent group having a lactone structure, sultone structure, carbonate structure, cyclic ether structure, acid anhydride structure, alcoholic hydroxyl, alkoxycarbonyl, sulfonamide or carbamoyl moiety. $X^A$ to $X^D$ are each independently a single bond, methylene, ethylene, phenylene, fluorinated phenylene, naphthylene, —O—R—, or —C(═O)—Z—R—, wherein Z is —O— or —NH—, and R is a $C_1$-$C_6$ straight, branched or cyclic alkylene, $C_2$-$C_6$ straight, branched or cyclic alkenylene, phenylene or naphthylene group, which may contain a carbonyl, ester, ether or hydroxyl moiety.

The recurring unit of formula (6a) has a fluoroalcohol-containing substituent group having high affinity to alkaline aqueous solution. Preferred examples of the fluoroalcohol-containing unit include recurring units having a 1,1,1,3,3,3-hexafluoro-2-propanol residue and 2-hydroxy-2-trifluoromethyloxolane structure, as described in JP-A 2007-297590, JP-A 2008-111103, JP-A 2008-122932, and JP-A 2012-128067. Although these units have a tertiary alcoholic hydroxyl group or hemiacetal structure, they are not reactive with acid because of fluorine substitution.

Since the recurring units of formulae (6a) to (6d) are structural units having hydroxyl group's proton, the polymer becomes higher in alkaline solubility as the proportion of these units incorporated is increased. On the other hand, excessive incorporation of these units can adversely affect a polarity switch (or alkali insolubilizing effect) that is brought about by elimination reaction taking place in the recurring unit having a group of formula (2a) and/or (2b) with acid. Accordingly, the recurring units of formulae (6a) to (6d) are preferably incorporated in such proportions that the alkali solubility of the unexposed region may be supplemented and the alkali insolubilizing effect of the exposed region not be impaired.

Illustrative, non-limiting examples of the recurring unit having formula (6a) are shown below. Notably $R^A$ is as defined above.

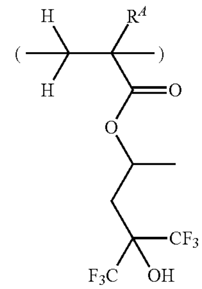

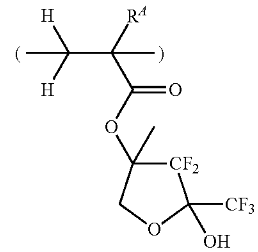

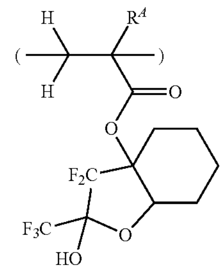

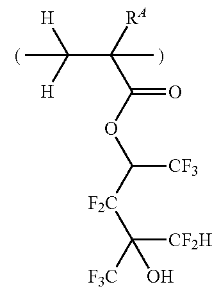

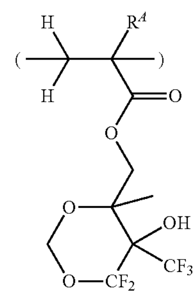

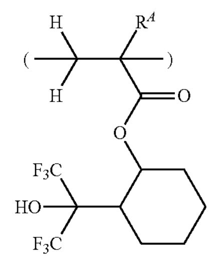

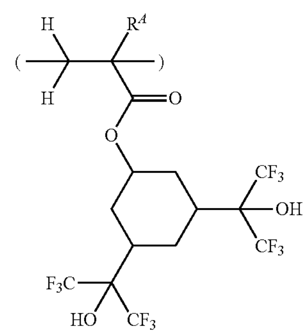

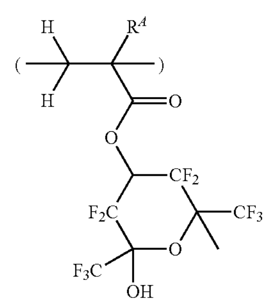

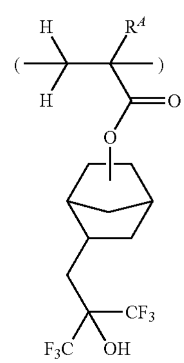

-continued
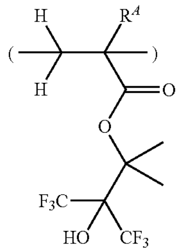
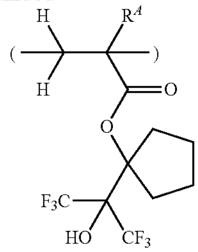
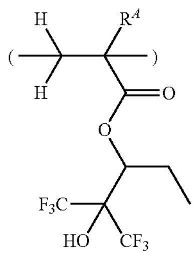
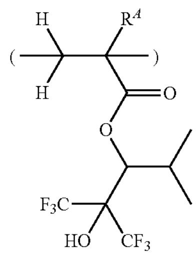
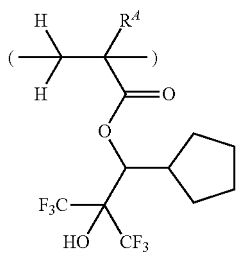
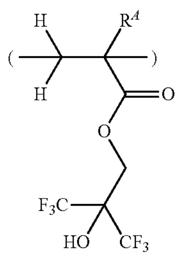
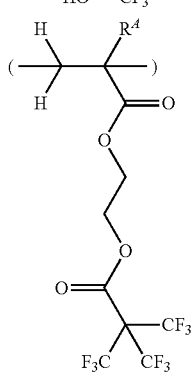
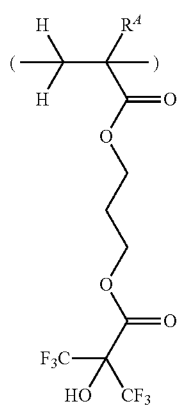
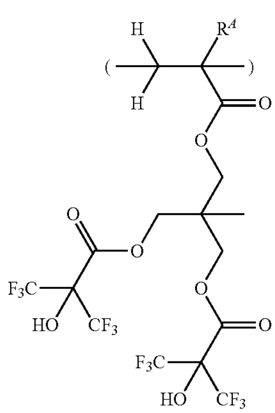
-continued
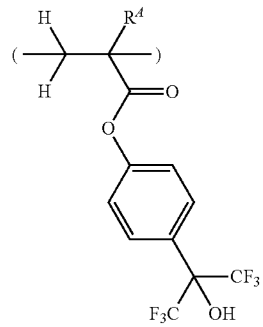
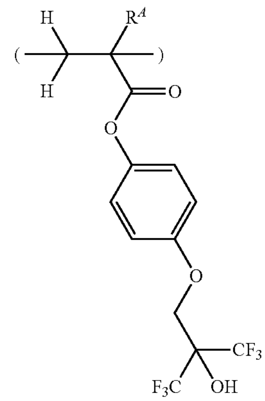
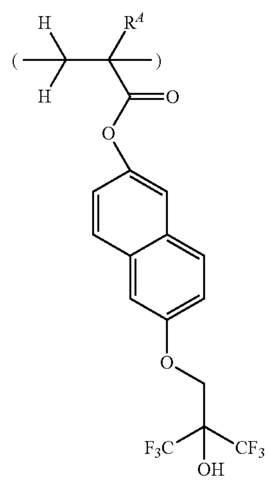
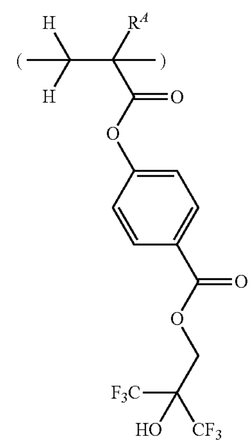
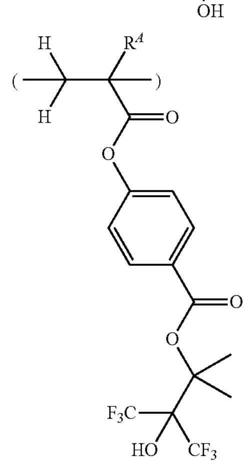
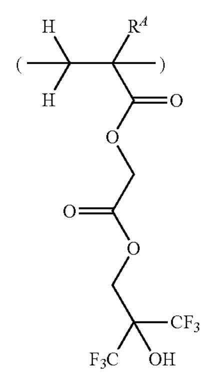
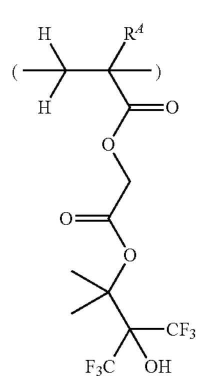
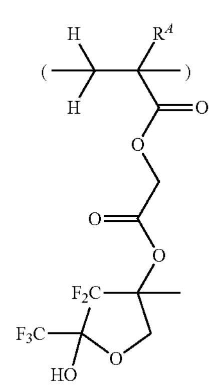

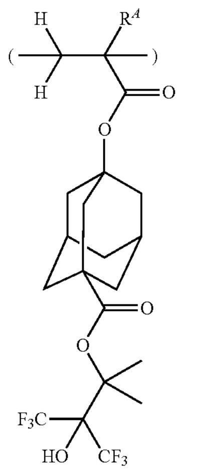
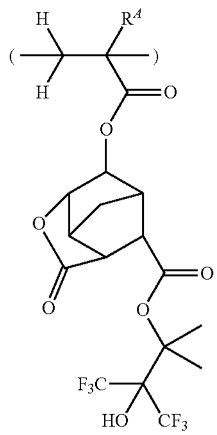
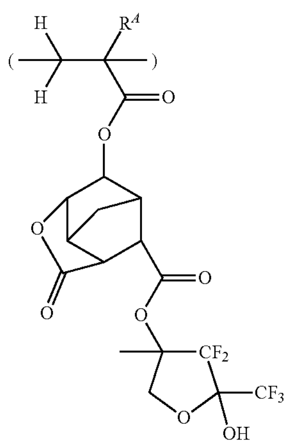
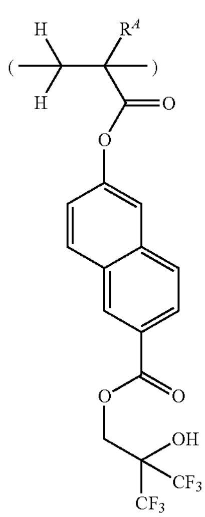
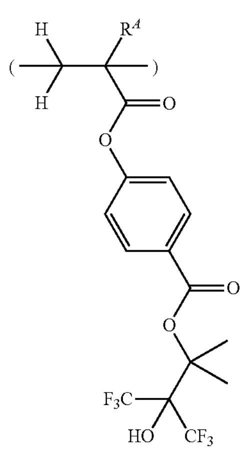
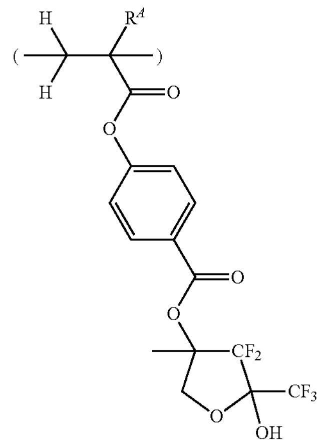
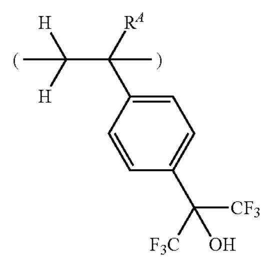
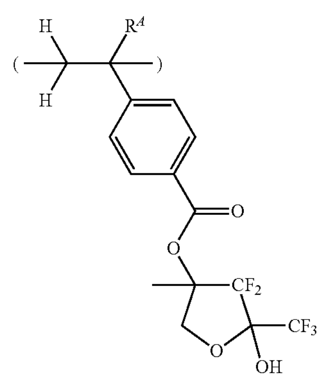
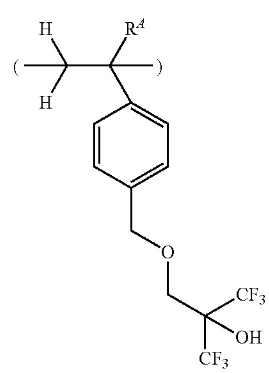

-continued
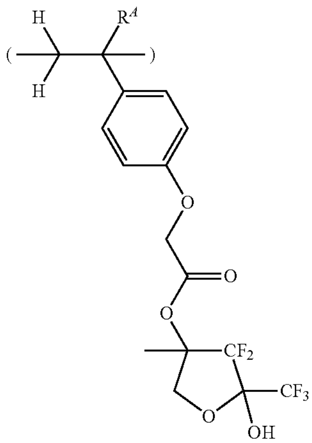
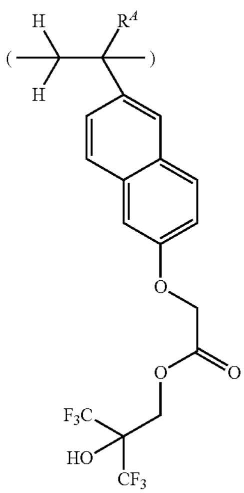
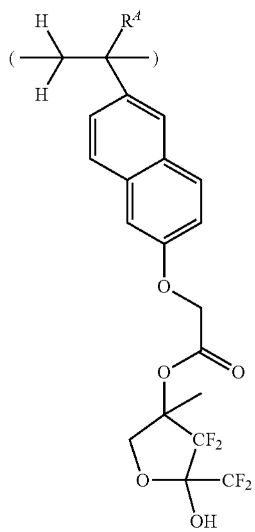
Illustrative, non-limiting examples of the recurring unit having formula (6b) are shown below. Notably $R^A$ is as defined above.
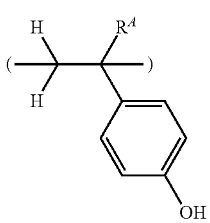
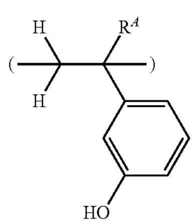
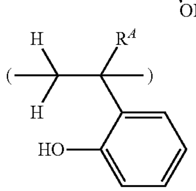
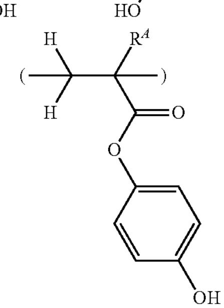
-continued
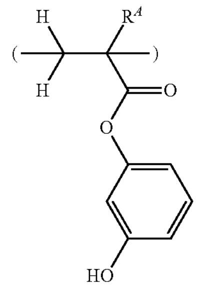
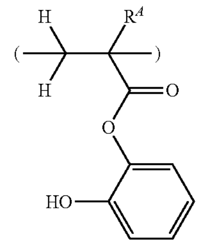
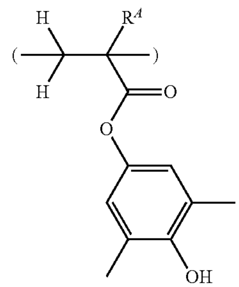
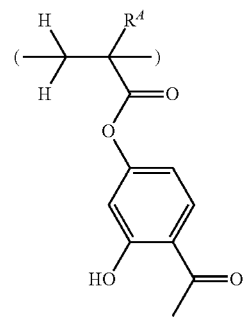
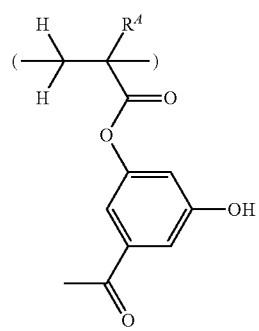
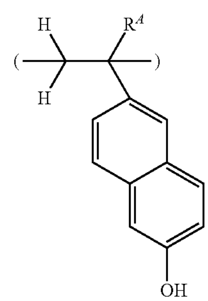
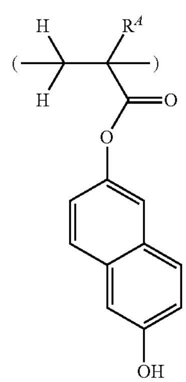
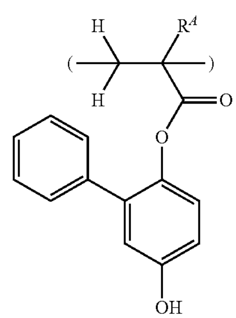
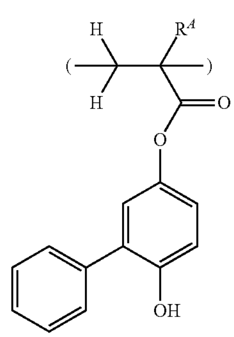
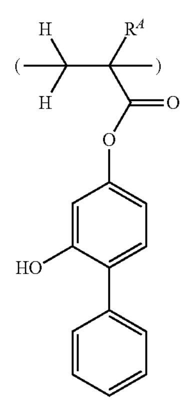

-continued

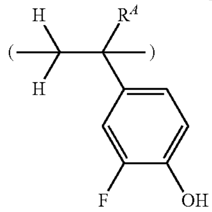

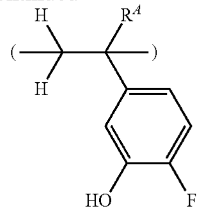

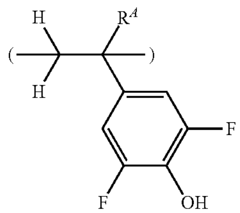

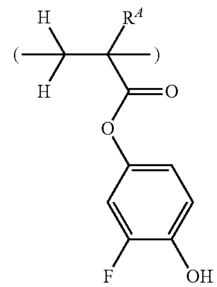

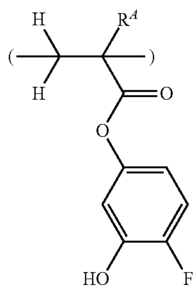

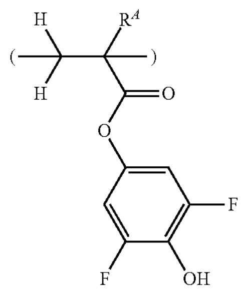

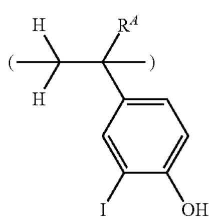

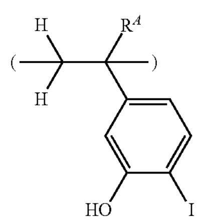

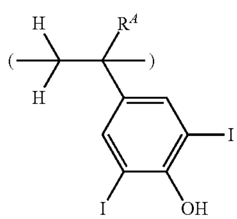

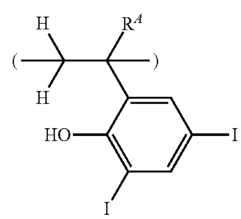

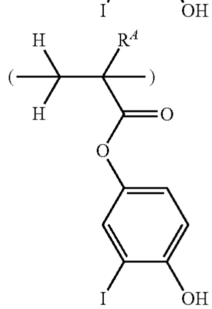

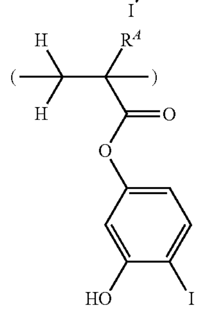

-continued

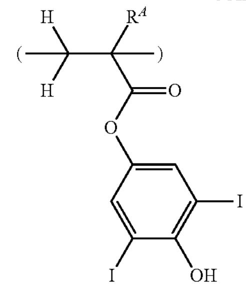

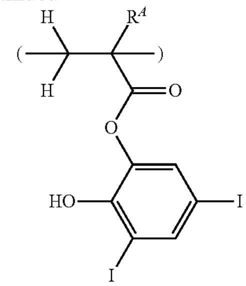

Illustrative, non-limiting examples of the recurring unit having formula (6c) are shown below. Notably $R^A$ is as defined above.

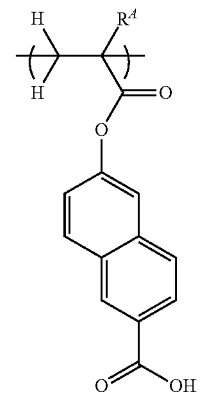

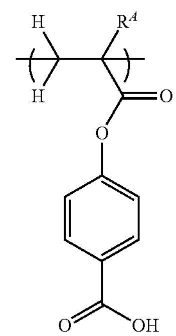

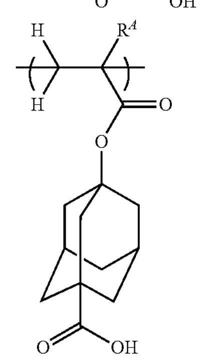

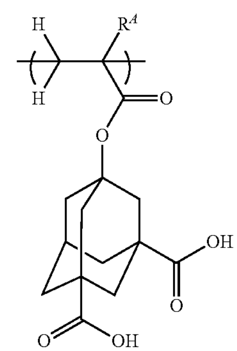

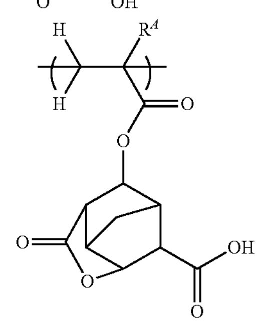

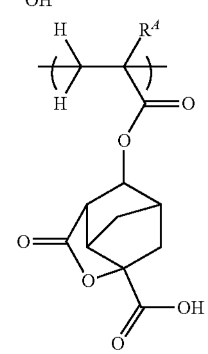

It is possible that the fluoroalcohol is protected with an acyl group or acid labile group in the polymer, so that the fluoroalcohol-containing unit corresponding to formula (6a) may be generated by hydrolysis in alkaline developer or deprotection with the acid generated after exposure. Suitable such recurring units include the units described in JP-A 2012-128067 (U.S. Pat. No. 8,916,331), specifically units in paragraphs [0036]-[0040] and units (2a), (2b) and (2f) in paragraph [0041].
Illustrative, non-limiting examples of the recurring unit having formula (6d) are shown below. Notably $R^A$ is as defined above.
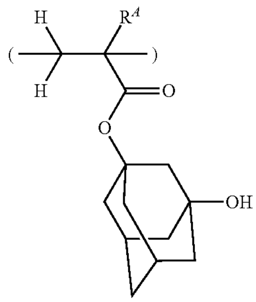
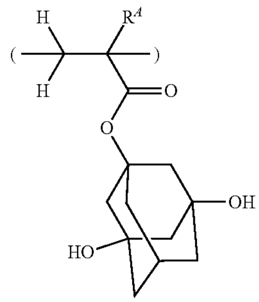
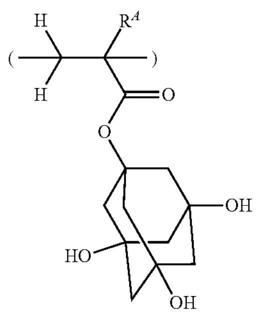
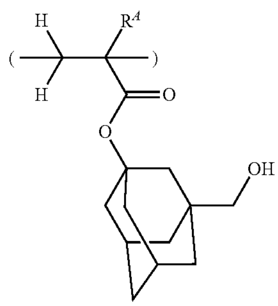
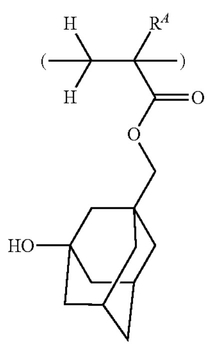
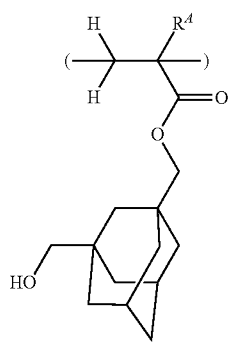
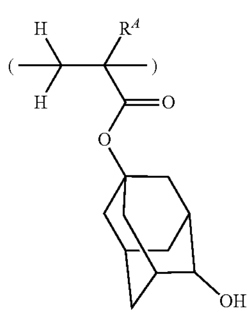
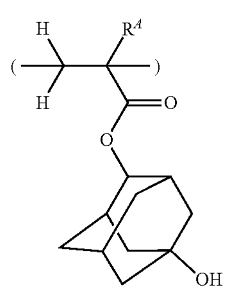
-continued
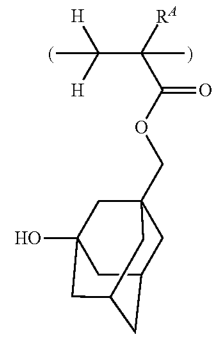
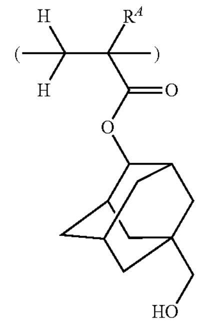
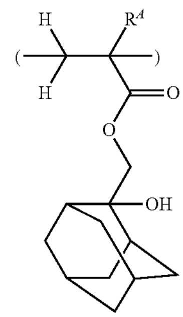
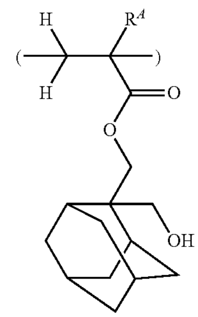
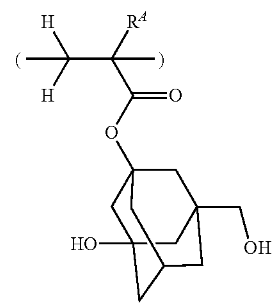
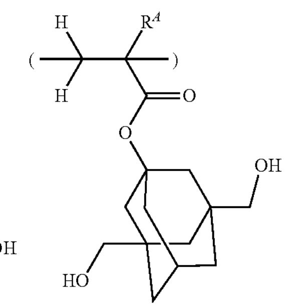
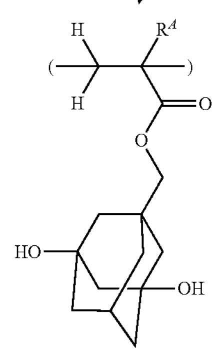
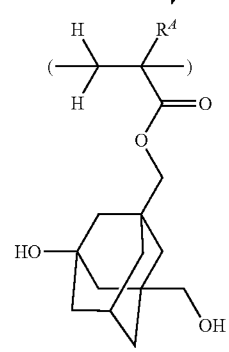
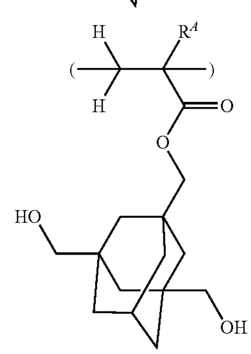
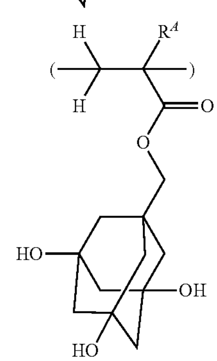

-continued
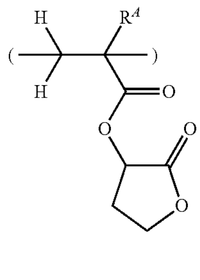
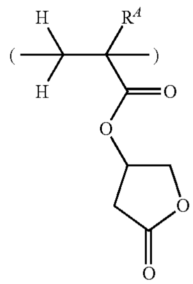
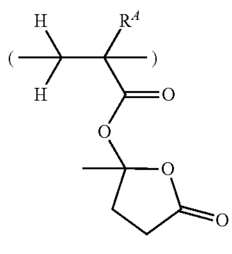
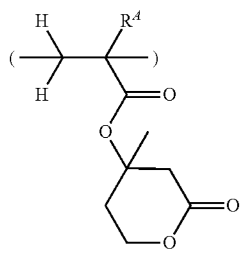
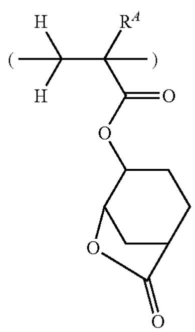
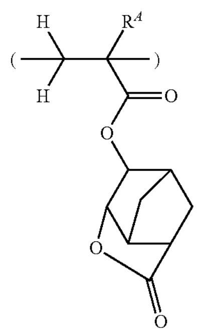
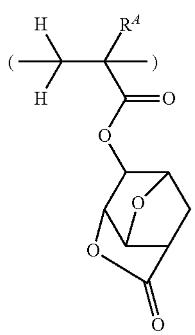
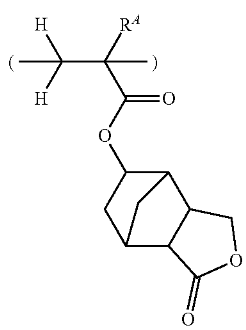
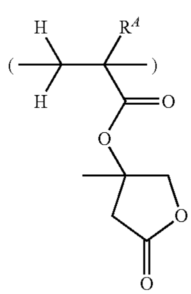
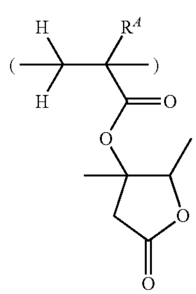
-continued
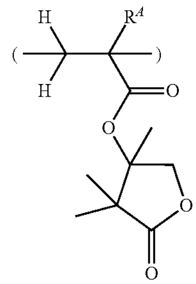
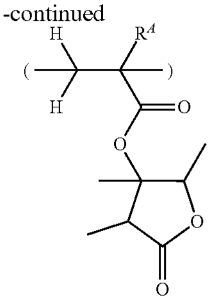
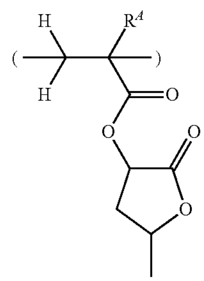
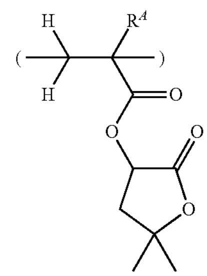
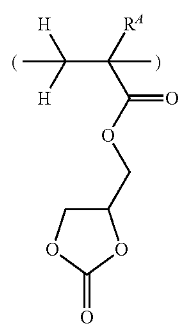
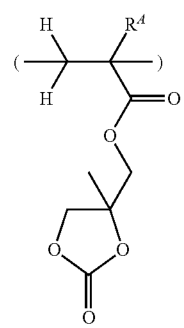
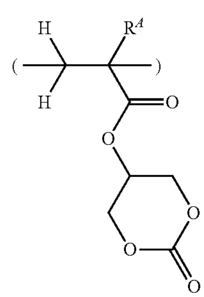
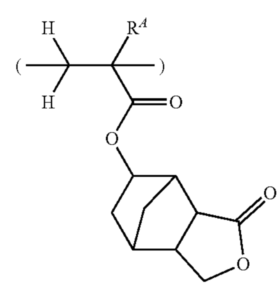
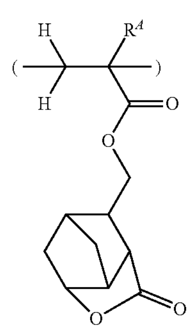
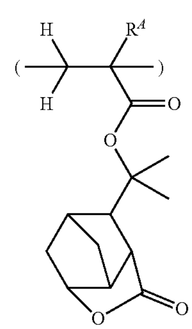

-continued
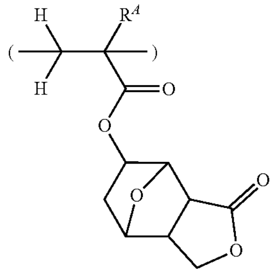
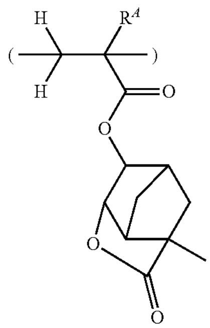
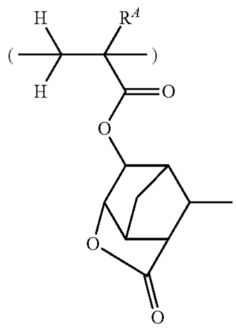
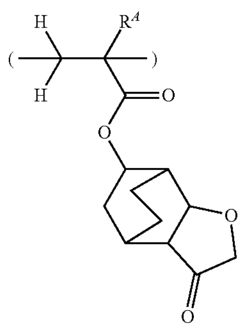
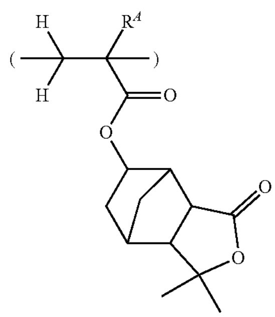
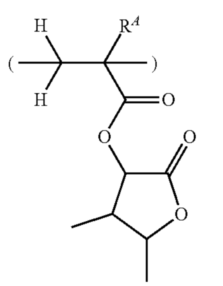
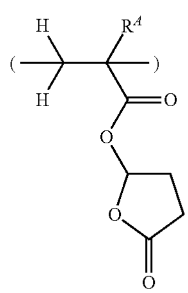
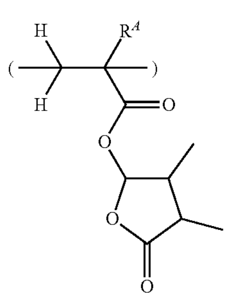
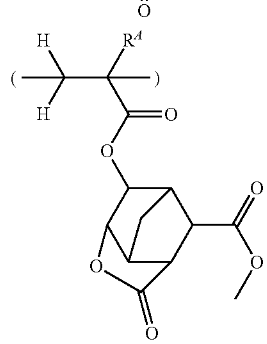
-continued
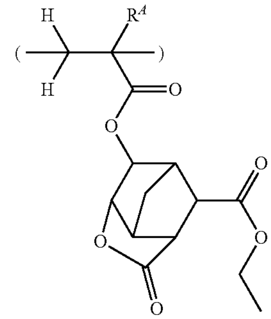
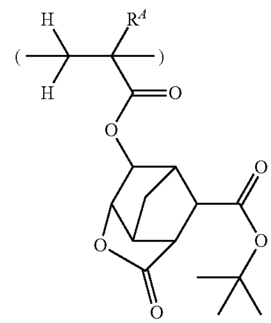
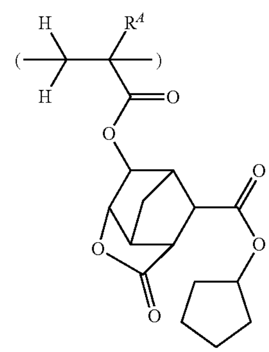
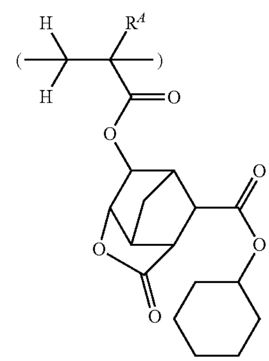
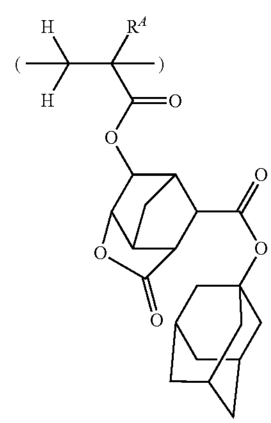

-continued
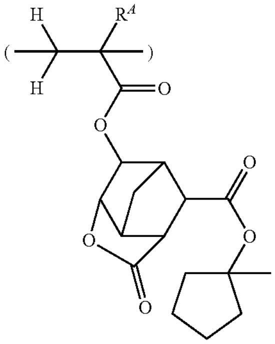
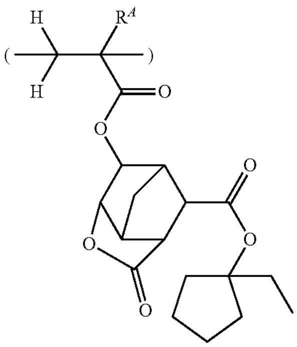
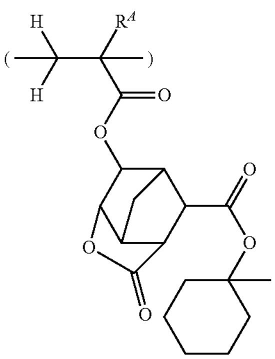
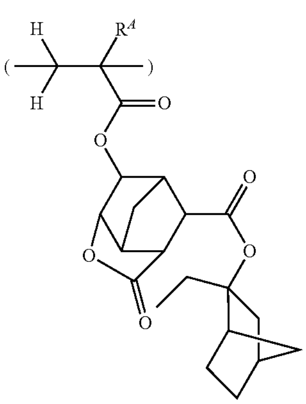
-continued
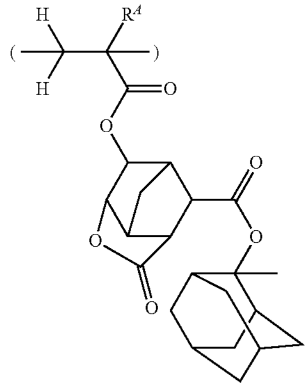
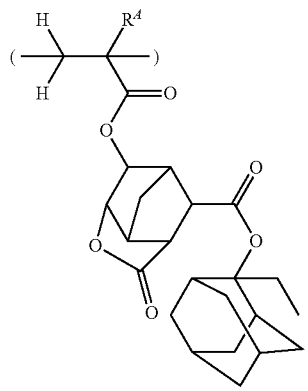
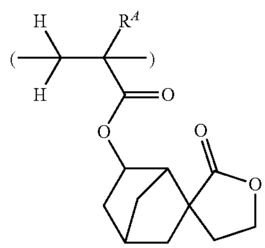
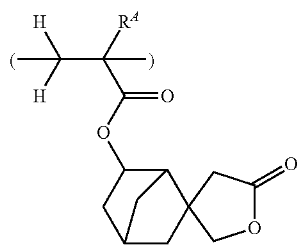
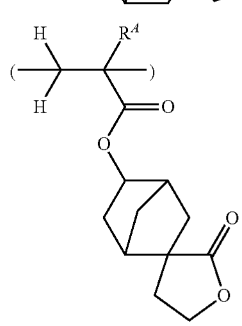
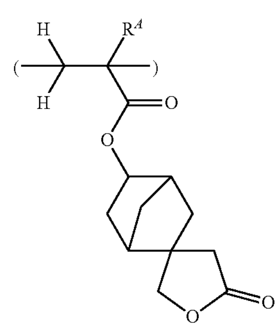

-continued
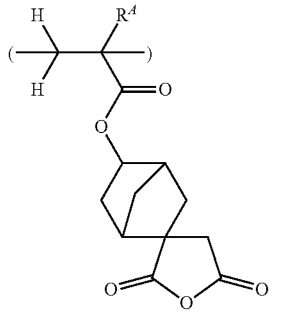
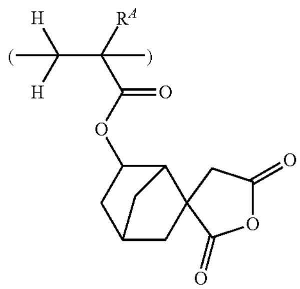
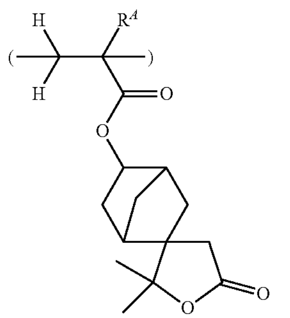
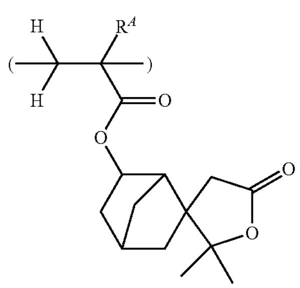
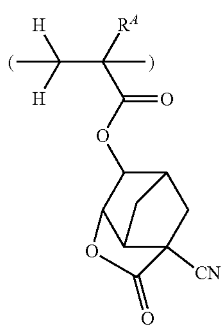
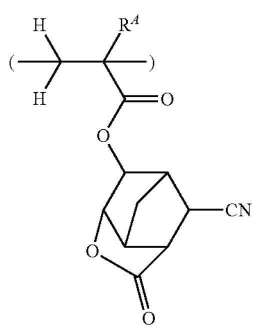
-continued
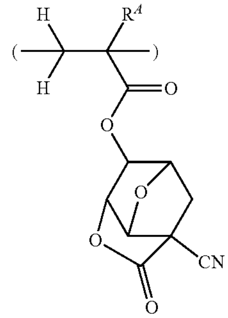
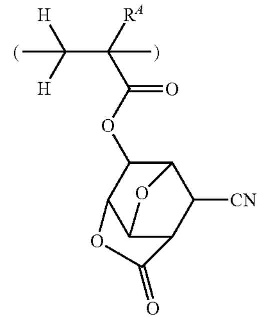
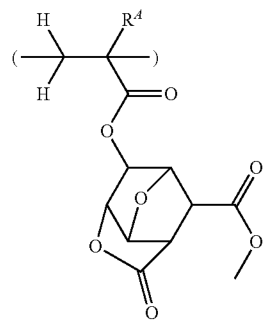
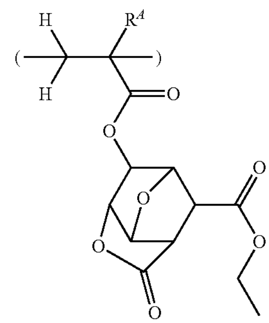
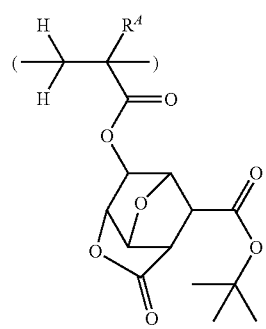
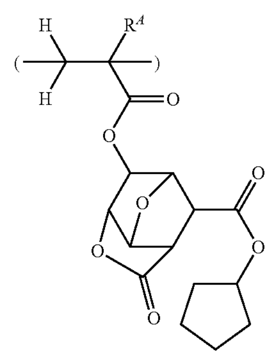
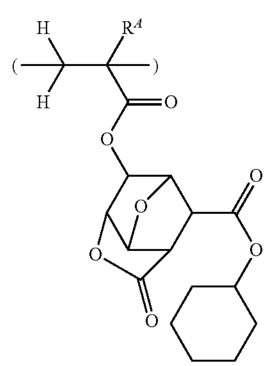
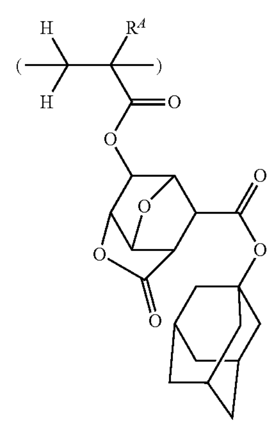

-continued
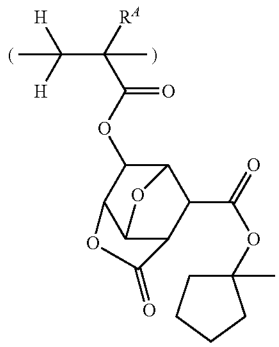
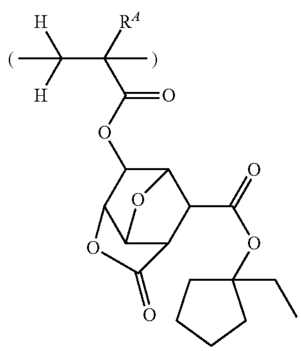
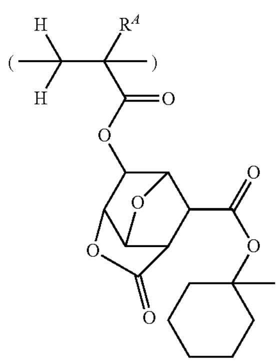
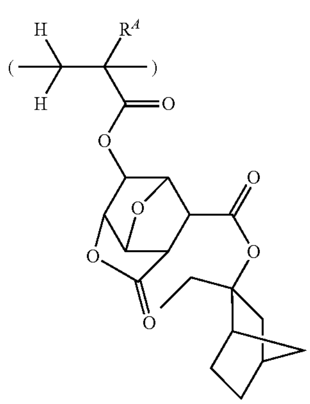
-continued
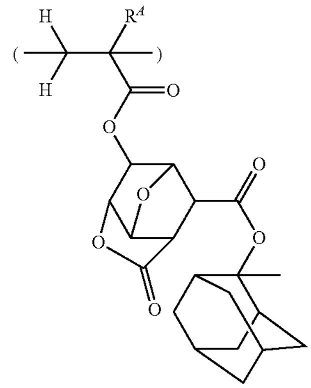
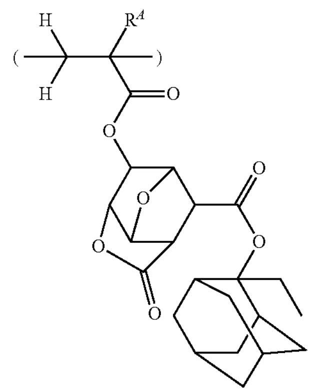
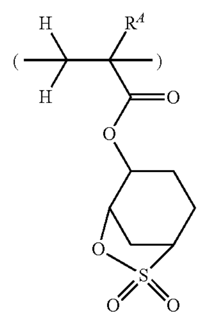
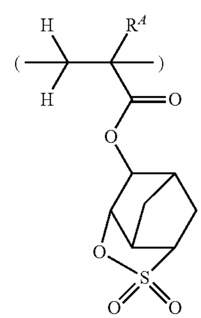
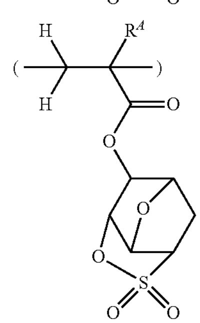
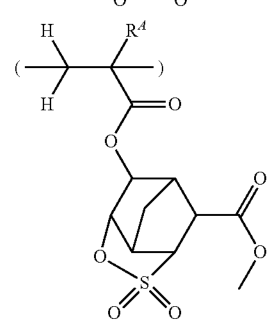
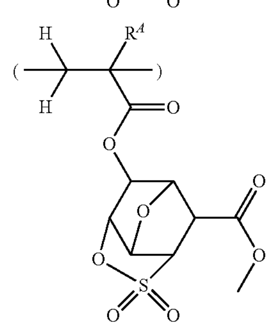
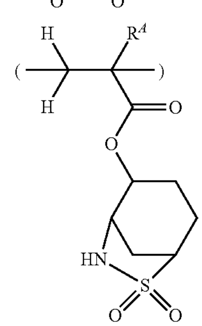

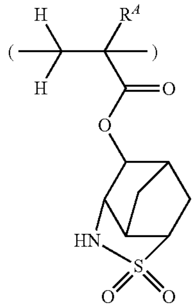
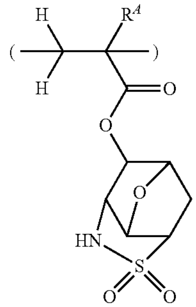
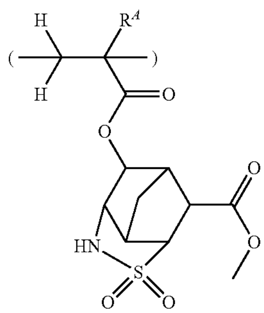
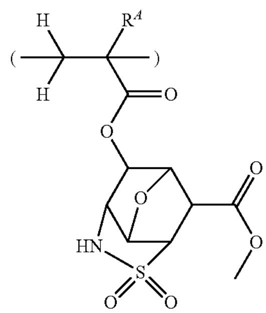
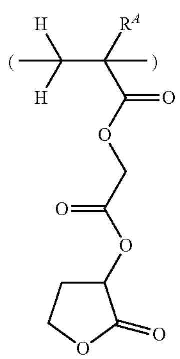
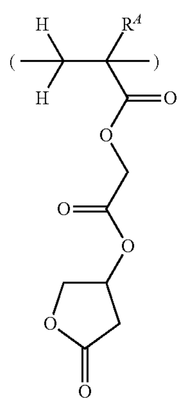
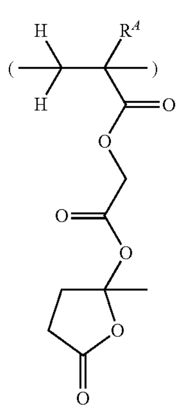
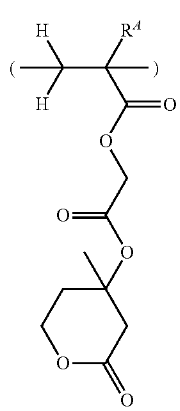
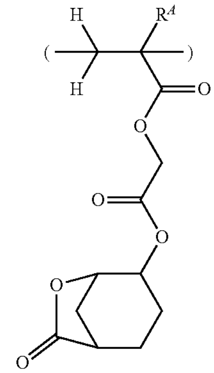
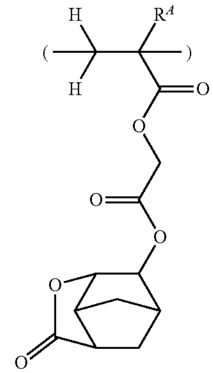
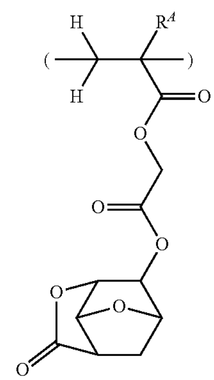
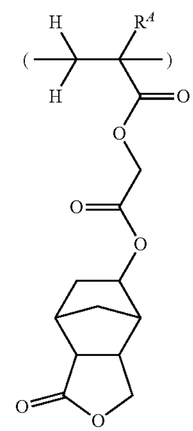
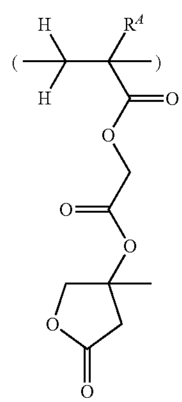
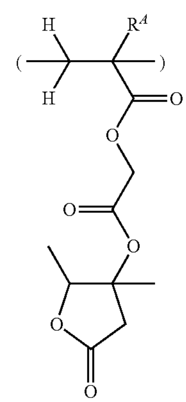
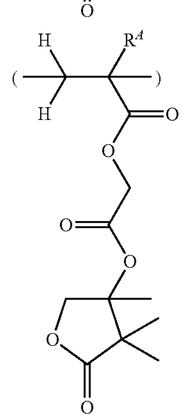
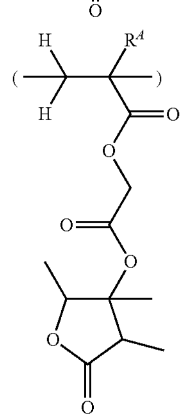

-continued
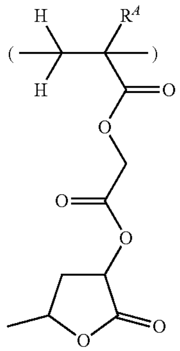
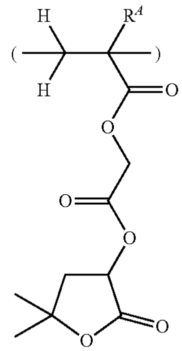
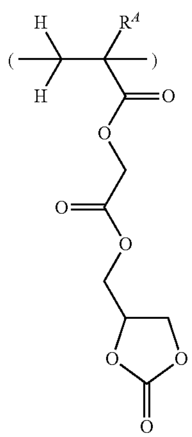
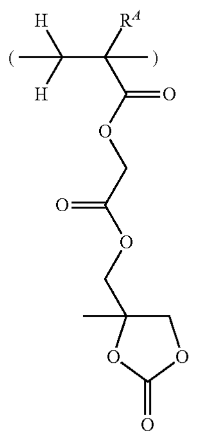
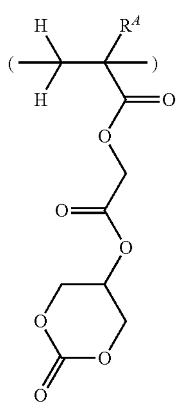
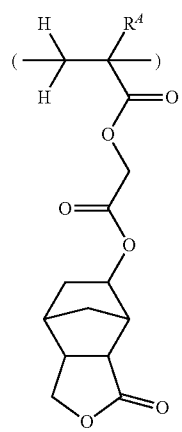
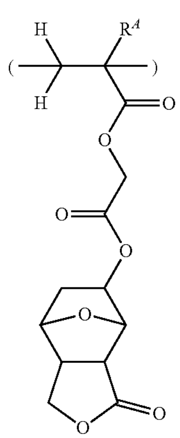
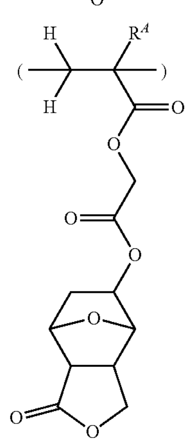
-continued
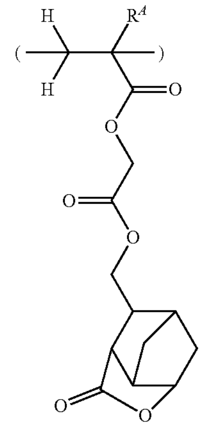
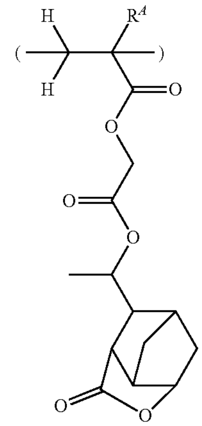
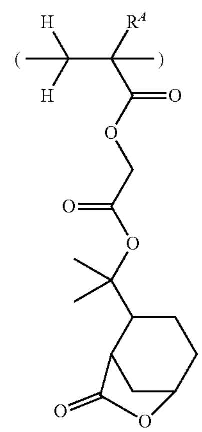
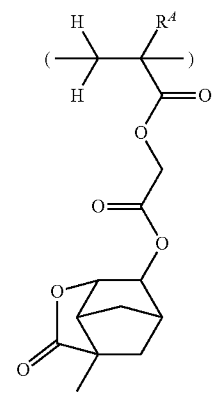
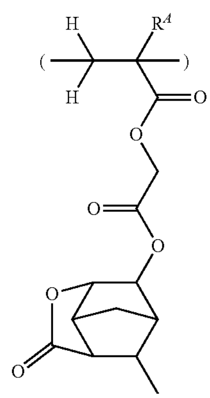
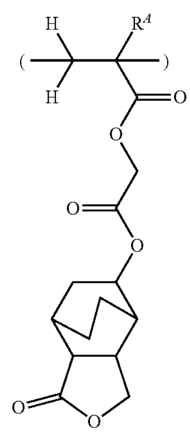
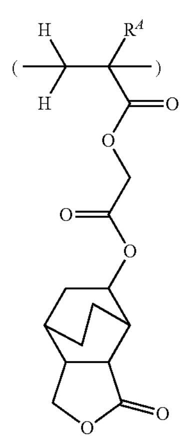
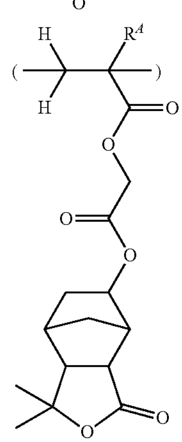

-continued
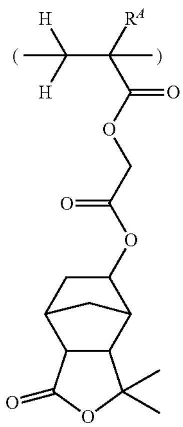
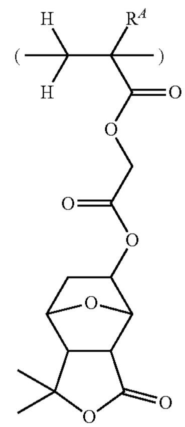
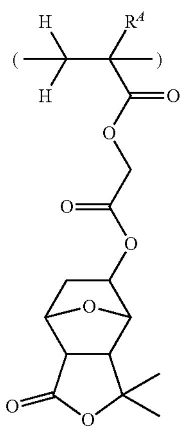
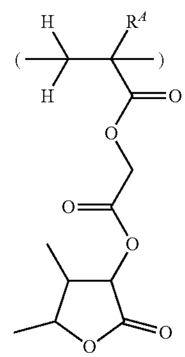
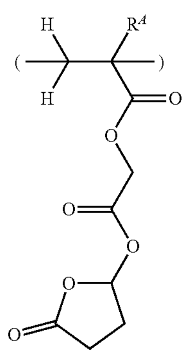
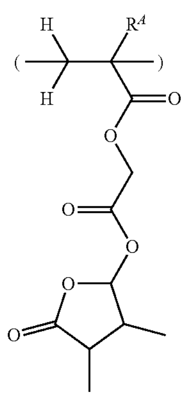
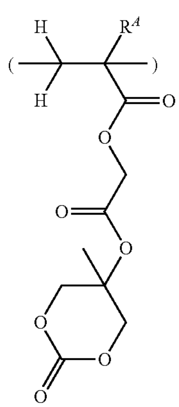
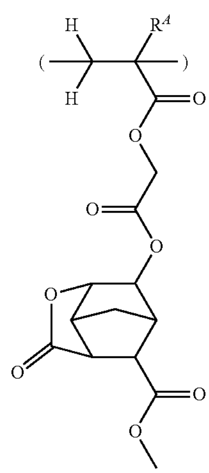
-continued
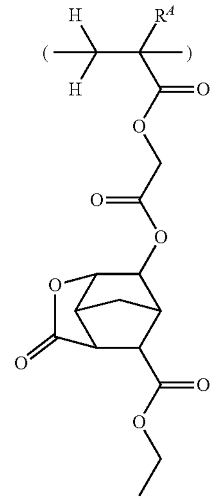
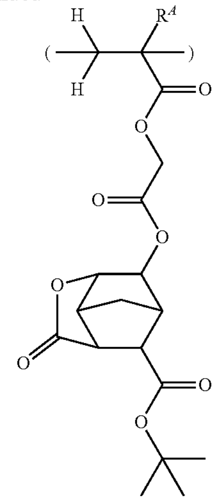
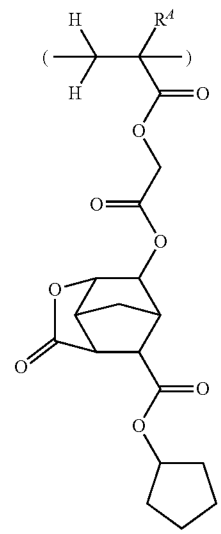
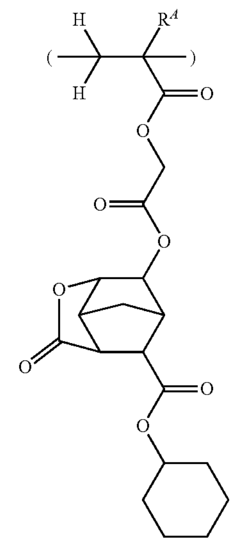
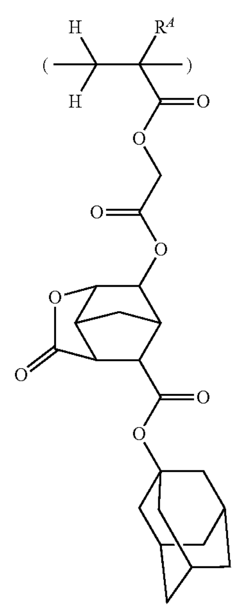
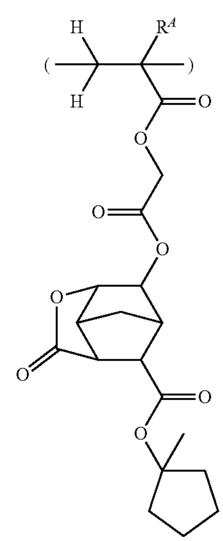

-continued
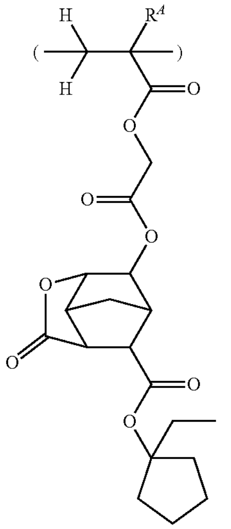
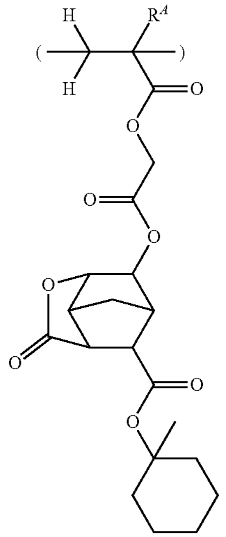
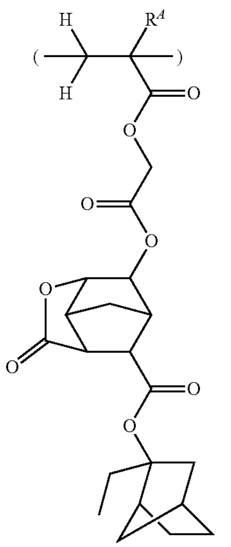
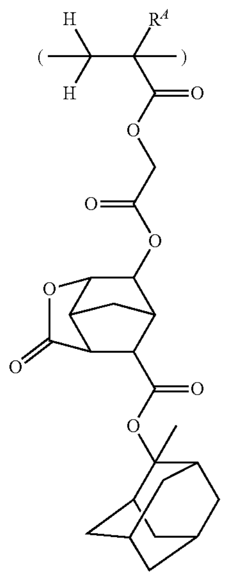
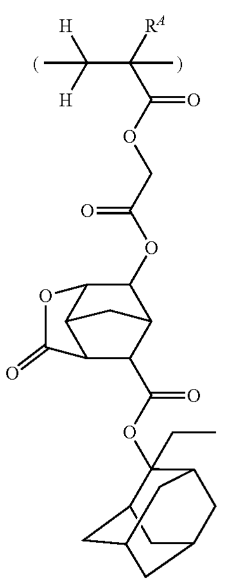
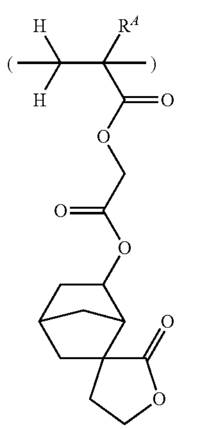
-continued
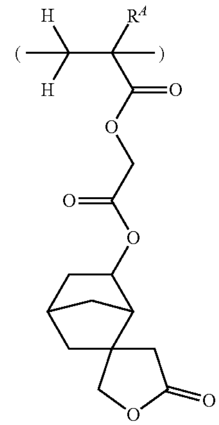
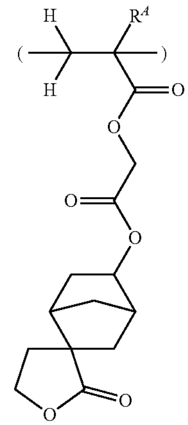
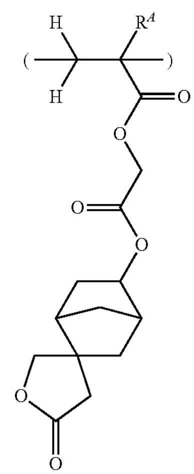
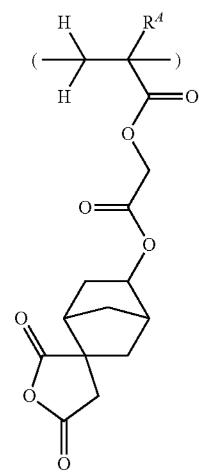
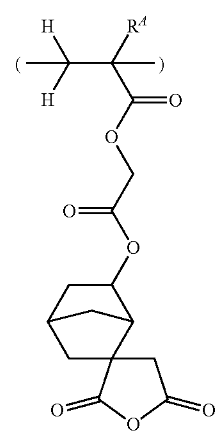
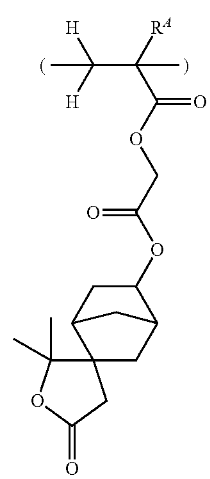

-continued
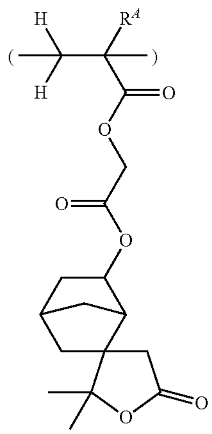
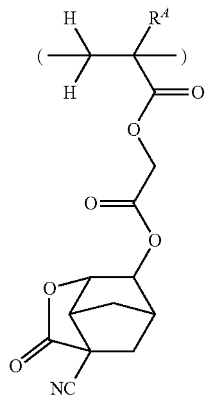
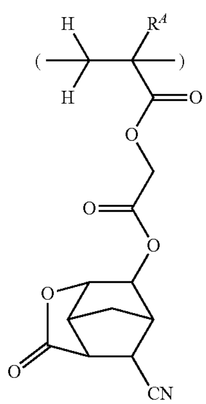
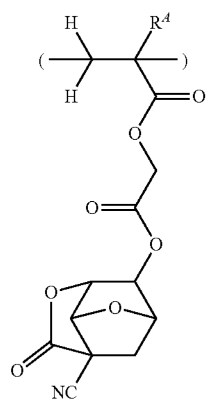
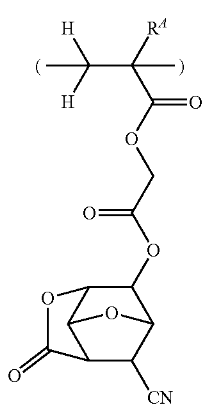
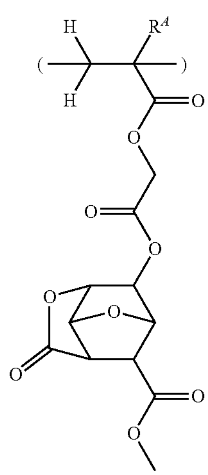
-continued
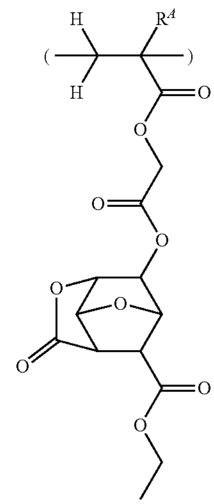
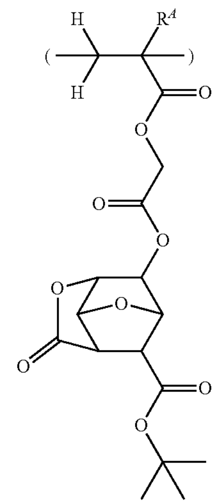
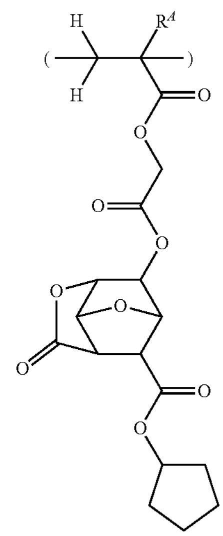
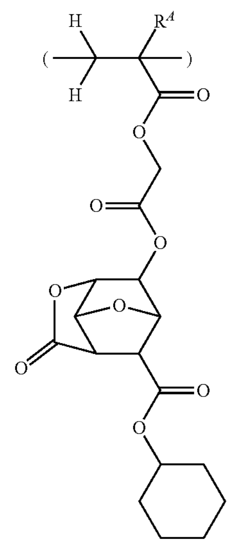
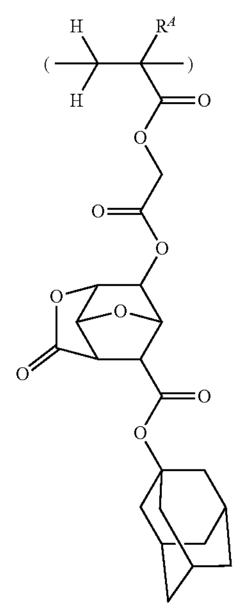
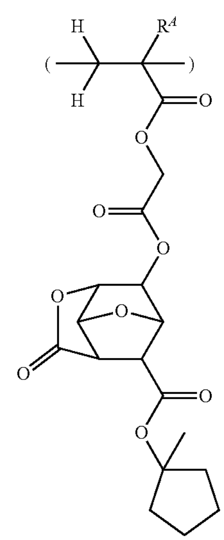

-continued
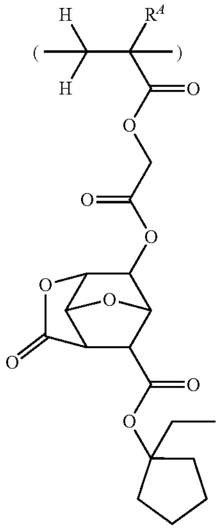
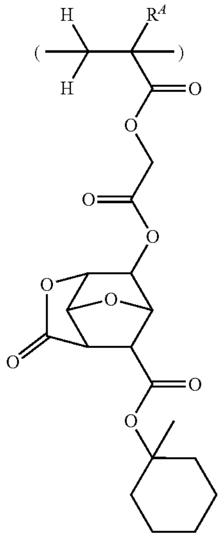
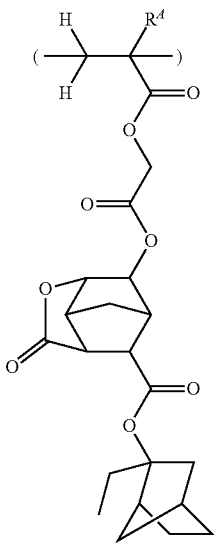
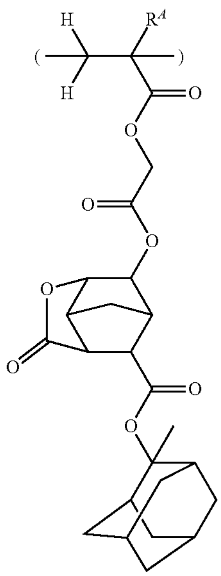
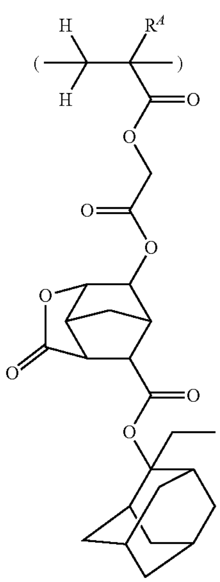
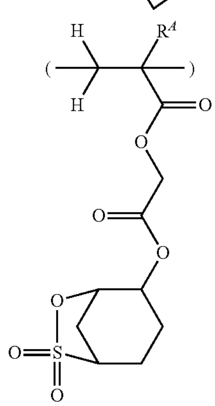
-continued
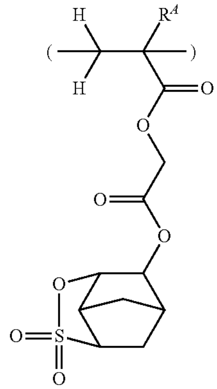
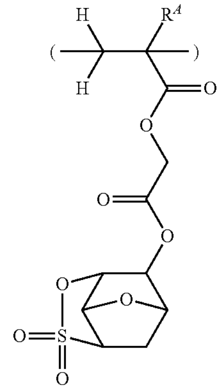
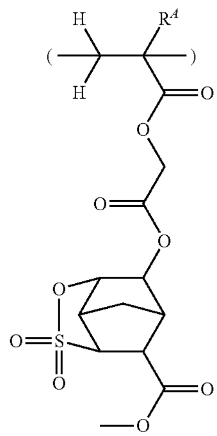
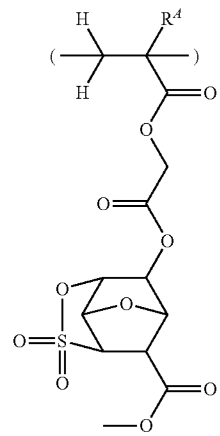
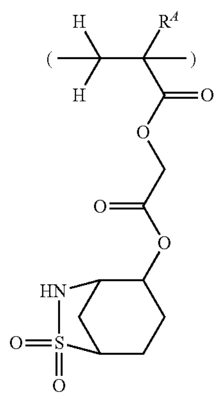
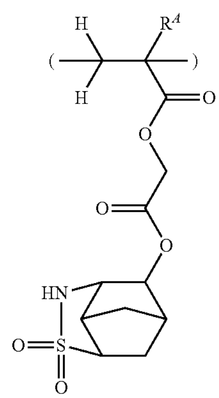
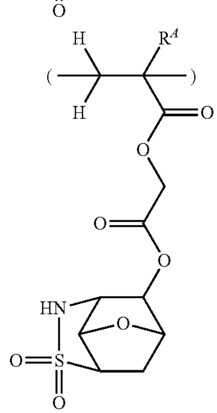
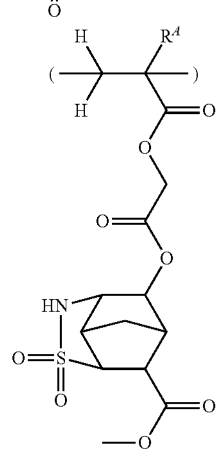

-continued

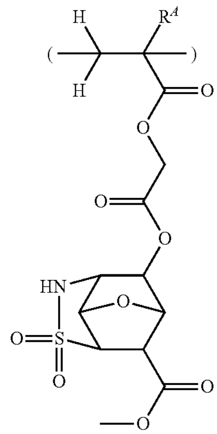

In addition to the foregoing units, the inventive polymer may further comprise recurring units of at least one type selected from recurring units having formulae (7a) to (7c).

(7a)

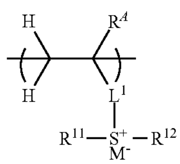

(7b)

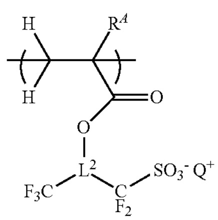

(7c)

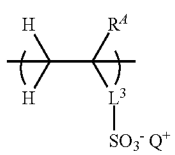

Herein $R^A$ is as defined above. $L^1$ is a single bond, phenylene group, —C(═O)-$L^{11}$-$L^{12}$- or —O-$L^{12}$-, wherein $L^{11}$ is —O— or —NH—, and $L^{12}$ is a $C_1$-$C_6$ straight, branched or cyclic alkylene group, $C_2$-$C_6$ straight, branched or cyclic alkenylene group, or phenylene group, which may contain a carbonyl moiety, ester bond, ether bond or hydroxyl moiety. $L^2$ is a single bond or -$L^{21}$-C(═O)—O—, wherein $L^{21}$ is a $C_1$-$C_{20}$ straight, branched or cyclic divalent hydrocarbon group which may contain a heteroatom. $L^3$ is a single bond, methylene, ethylene, phenylene, fluorinated phenylene, —C(═O)-$L^{31}$-$L^{32}$- or —O-$L^{32}$-, wherein $L^{31}$ is —O— or —NH—, and $L^{32}$ is a $C_1$-$C_6$ straight, branched or cyclic alkylene group, $C_2$-$C_6$ straight, branched or cyclic alkenylene group, or phenylene group, which may contain a carbonyl moiety, ester bond, ether bond or hydroxyl moiety. $M^-$ is a non-nucleophilic counter ion.

$Q^+$ is a sulfonium cation having the formula (7d) or an iodonium cation having the formula (7e).

(7d)

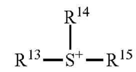

(7e)

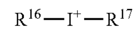

$R^{11}$ to $R^{17}$ are each independently a $C_1$-$C_{20}$ straight, branched or cyclic monovalent hydrocarbon group which may contain a heteroatom. $R^{11}$ and $R^{12}$ may bond together to form a ring with the sulfur atom to which they are attached. Any two of $R^{13}$, $R^{14}$ and $R^{15}$ may bond together to form a ring with the sulfur atom to which they are attached.

Suitable monovalent hydrocarbon groups include alkyl groups such as methyl, ethyl, n-propyl, isopropyl, n-butyl, t-butyl, cyclopropyl, cyclopentyl, cyclohexyl, cyclopropylmethyl, 4-methylcyclohexyl, cyclohexylmethyl, norbornyl, and adamantyl; alkenyl groups such as vinyl, allyl, propenyl, butenyl, hexenyl, and cyclohexenyl; aryl groups such as phenyl, naphthyl, and thienyl; and aralkyl groups such as benzyl, 1-phenylethyl, and 2-phenylethyl, with the aryl groups being preferred. Also included are substituted forms of the foregoing groups in which at least one hydrogen atom (one or more hydrogen atoms) is replaced by a moiety containing a heteroatom such as oxygen, sulfur, nitrogen or halogen, or in which a carbon atom is replaced by a moiety containing a heteroatom such as oxygen, sulfur or nitrogen, so that the group may contain a hydroxyl, cyano, carbonyl, sulfonyl moiety, ether bond, ester bond, sulfonic acid ester bond, carbonate bond, lactone ring, sultone ring, carboxylic acid anhydride, or haloalkyl moiety.

When $L^2$ is -$L^{21}$-C(═O)—O—, examples of the optionally heteroatom-containing, $C_1$-$C_{20}$ straight, branched or cyclic divalent hydrocarbon group represented by $L^{21}$ are shown below, but not limited thereto.

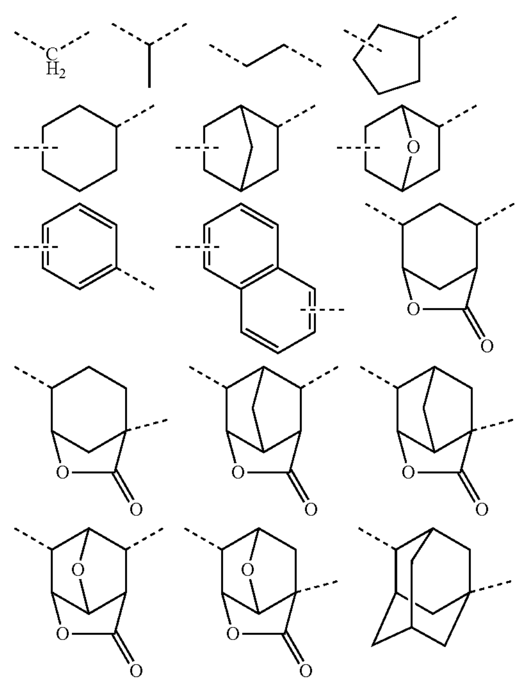

-continued

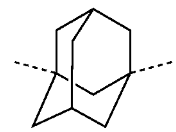

Where $R^{11}$ and $R^{12}$, taken together, form a ring with the sulfur atom, or where any two of $R^{13}$, $R^{14}$ and $R^{15}$, taken together, form a ring with the sulfur atom, examples of the ring are shown below, but not limited thereto.

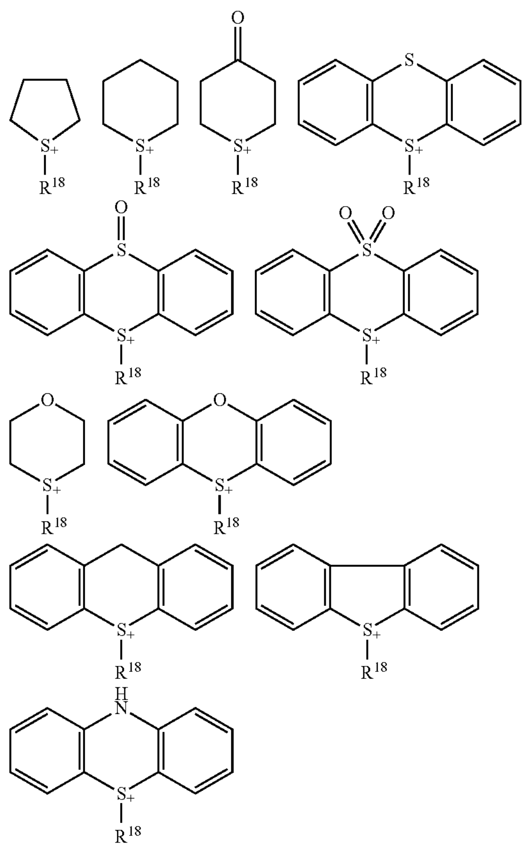

In the formulae, $R^{18}$ is a $C_1$-$C_{20}$ straight, branched or cyclic monovalent hydrocarbon group which may contain a heteroatom. Suitable monovalent hydrocarbon groups are as exemplified above for $R^{11}$ to $R^{17}$.

Illustrative, non-limiting examples of the sulfonium cation of formula (7d) are given below.

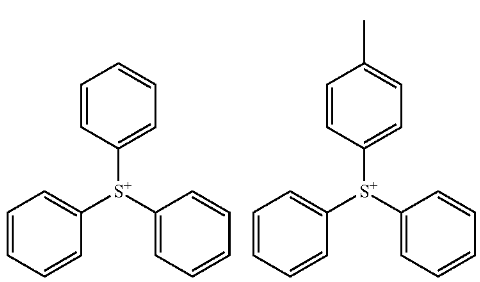

-continued

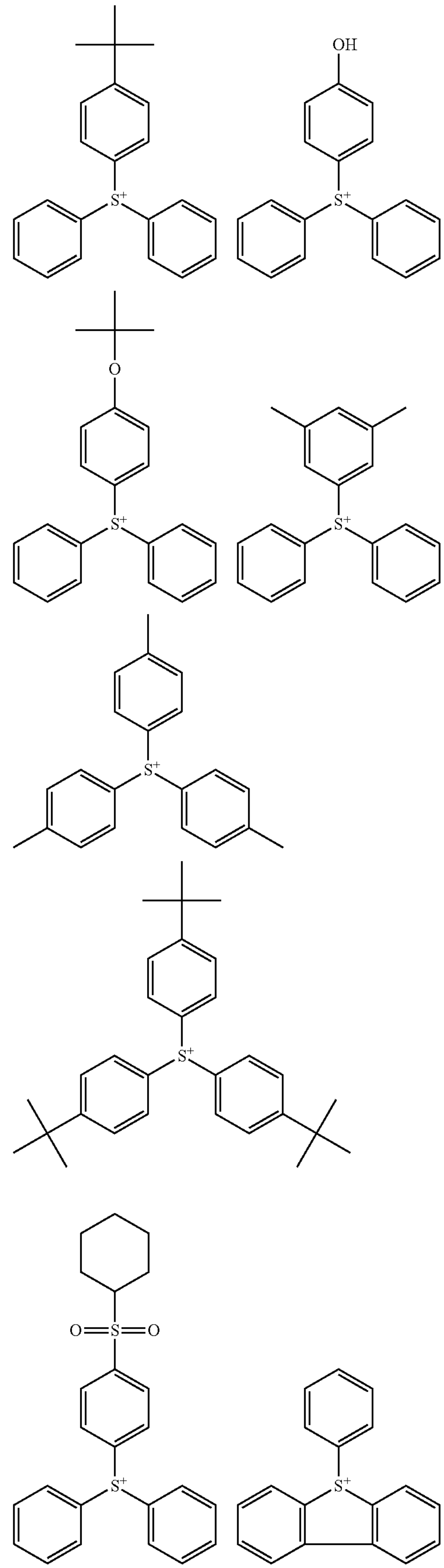

-continued
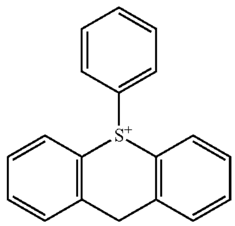
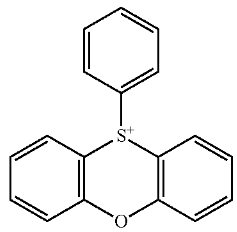
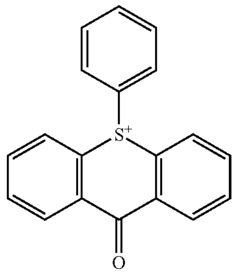
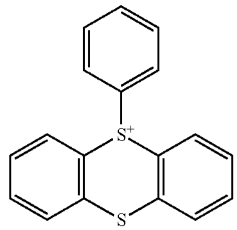
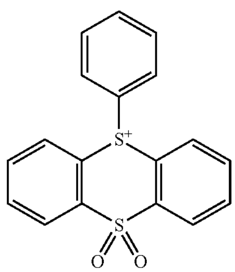
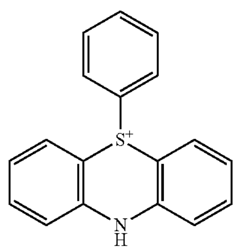
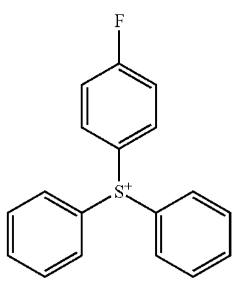
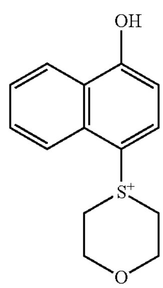
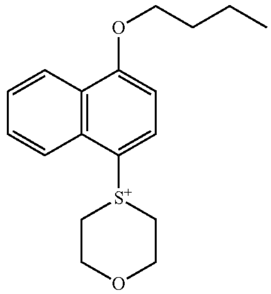
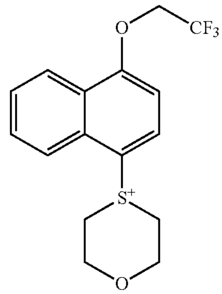
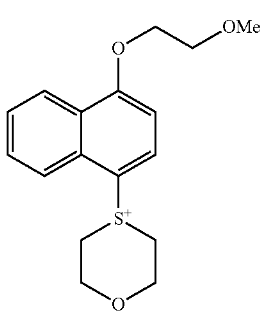
-continued
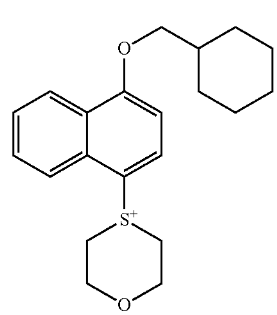
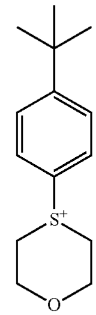
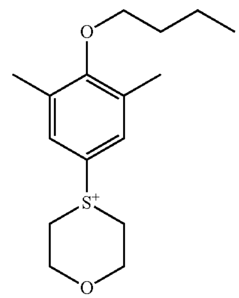
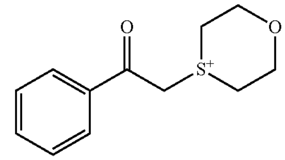
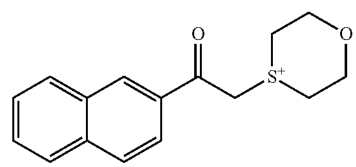
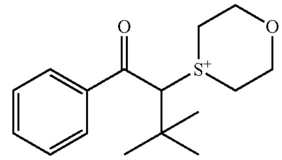
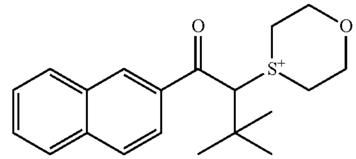
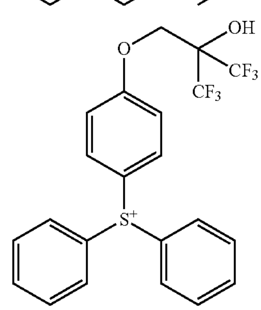
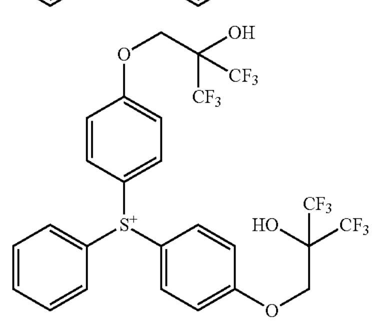

-continued

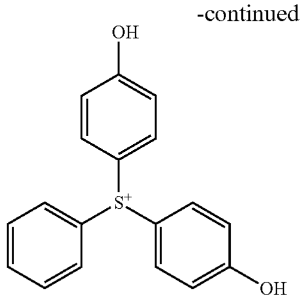

Illustrative, non-limiting examples of the iodonium cation of formula (7e) are given below.

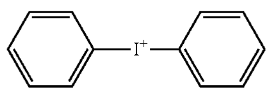

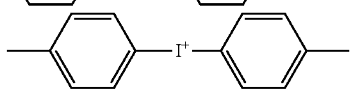

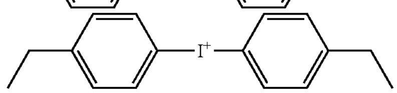

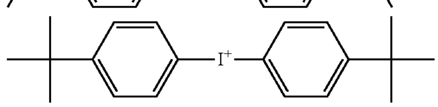

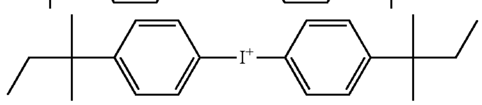

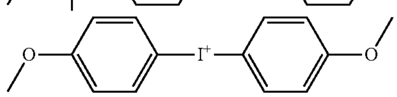

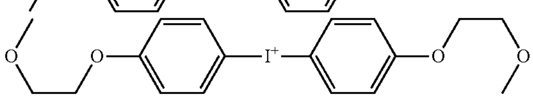

Examples of the non-nucleophilic counter ion represented by $M^-$ include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imidates such as bis(trifluoromethylsulfonyl)imide, bis(perfluoroethylsulfonyl)imide and bis(perfluorobutylsulfonyl)imide; and methidates such as tris(trifluoromethylsulfonyl)methide and tris(perfluoroethylsulfonyl) methide.

Also included are a sulfonate which is fluorinated at α-position as represented by the formula (F-1) and a sulfonate which is fluorinated at α- and β-positions as represented by the formula (F-2).

$$R^{19}—CF_2—SO_3^- \quad \text{(F-1)}$$

(F-2)

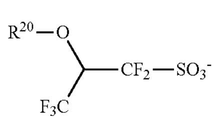

In formula (F-1), $R^{19}$ is hydrogen, or a $C_1$-$C_{20}$ straight, branched or cyclic alkyl group, $C_2$-$C_{20}$ straight, branched or cyclic alkenyl group or $C_6$-$C_{20}$ aryl group, which may have an ether, ester, carbonyl moiety, lactone ring or fluorine atom. In formula (F-2), $R^{20}$ is hydrogen, or a $C_1$-$C_{30}$ straight, branched or cyclic alkyl group, $C_2$-$C_{30}$ straight, branched or cyclic acyl group, $C_2$-$C_{20}$ straight, branched or cyclic alkenyl group, $C_6$-$C_{20}$ aryl group or $C_6$-$C_{20}$ aryloxy group, which may have an ether, ester, carbonyl moiety or lactone ring.

Examples of the recurring units having formula (7a) are given below, but not limited thereto. Notably $R^A$ is as defined above.

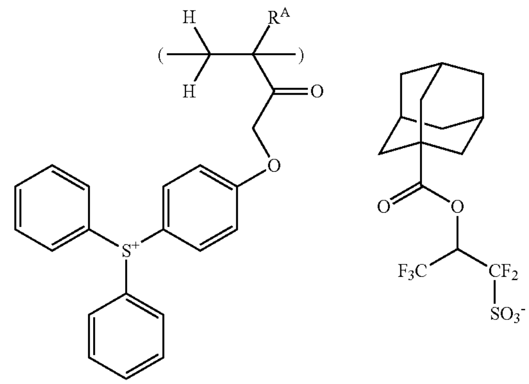

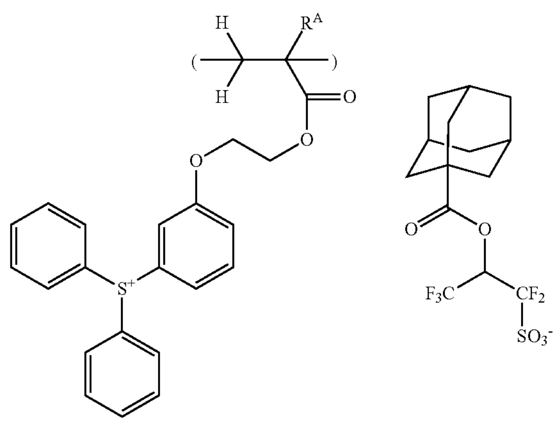

Examples of the recurring units having formula (7b) are given below, but not limited thereto. Notably $R^A$ is as defined above.

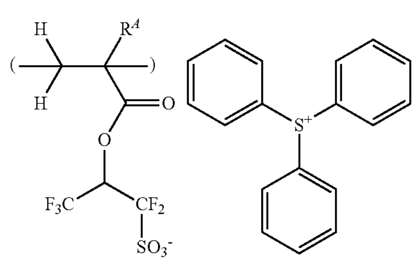

-continued
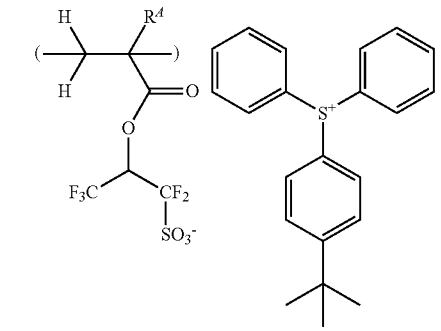
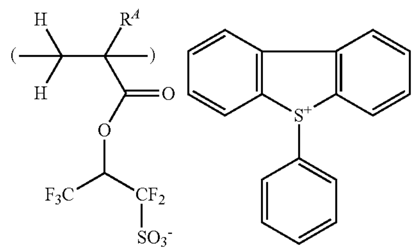
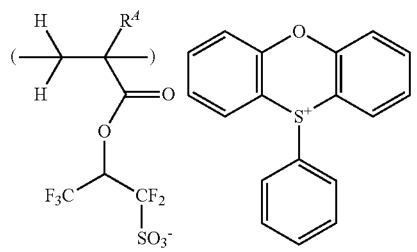
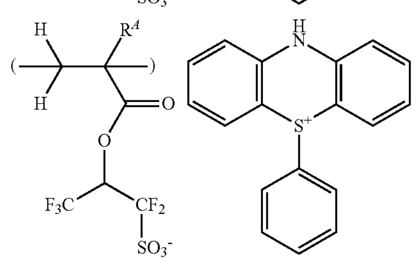
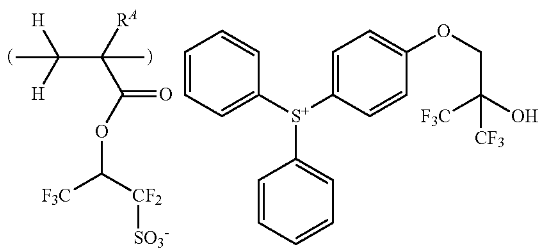
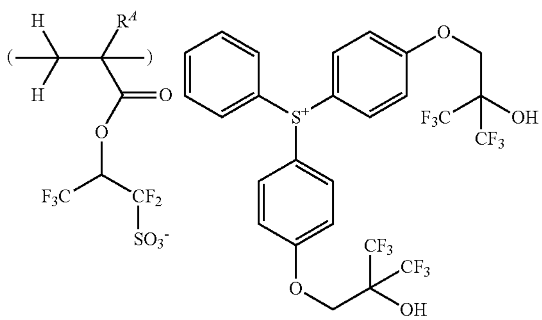
-continued
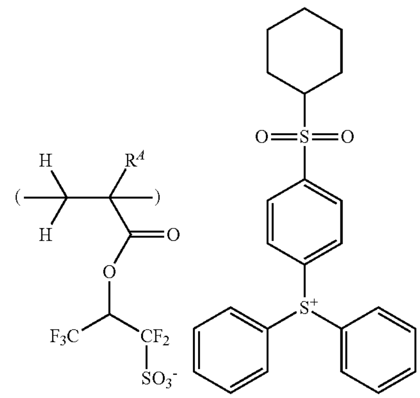
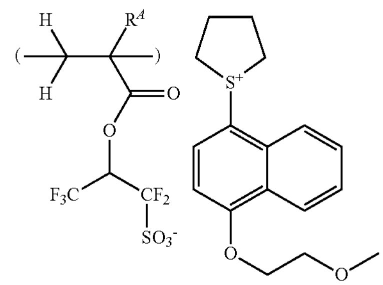
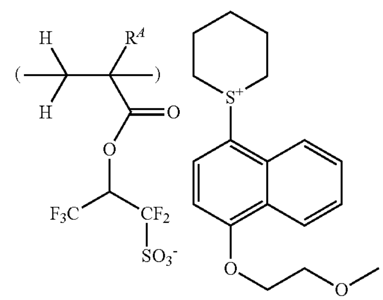
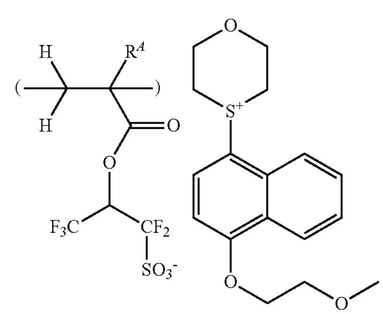
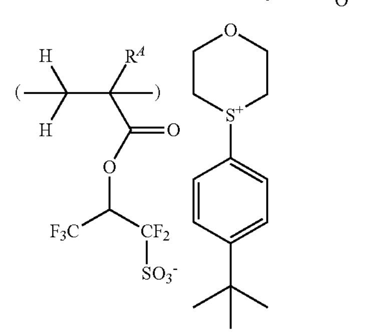

-continued
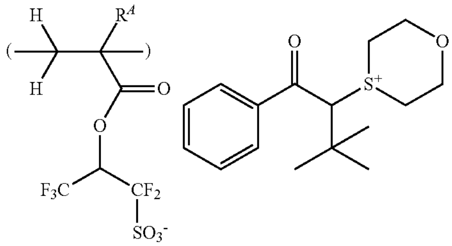
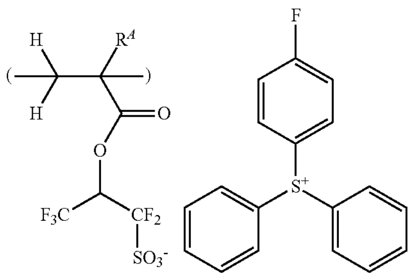
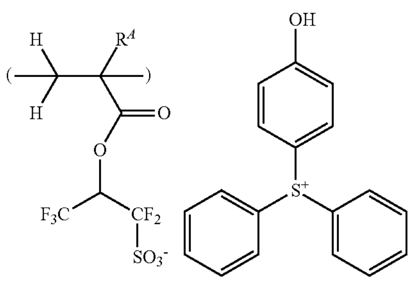
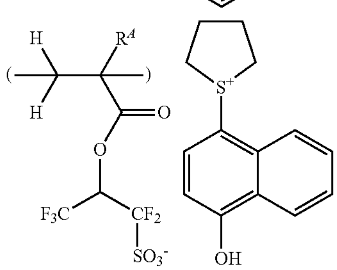
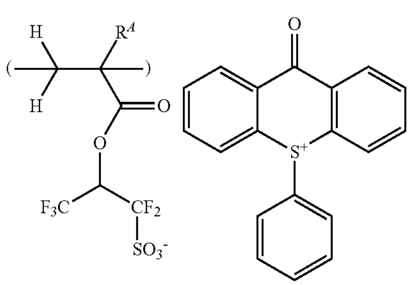
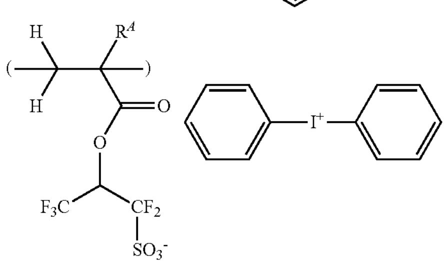
-continued
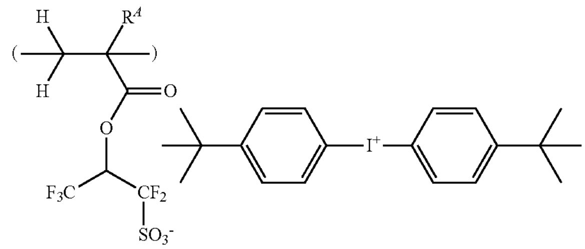
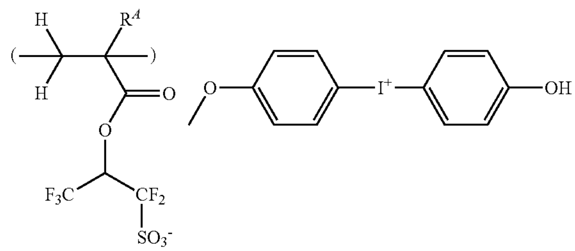
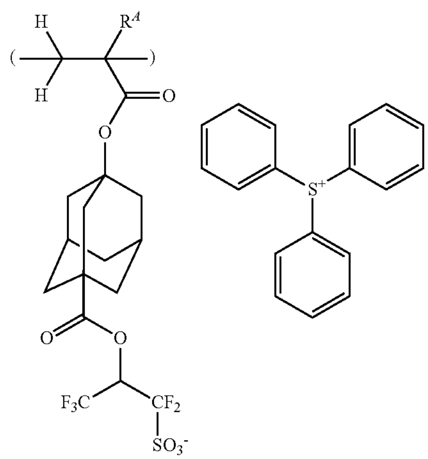
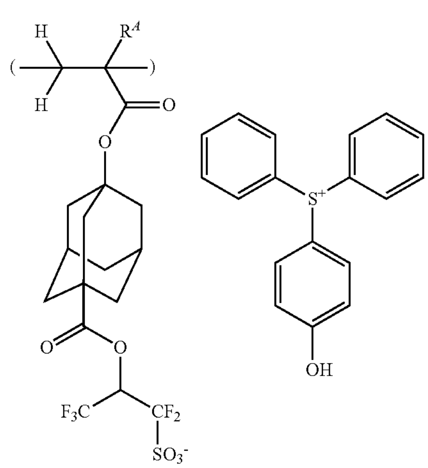

-continued
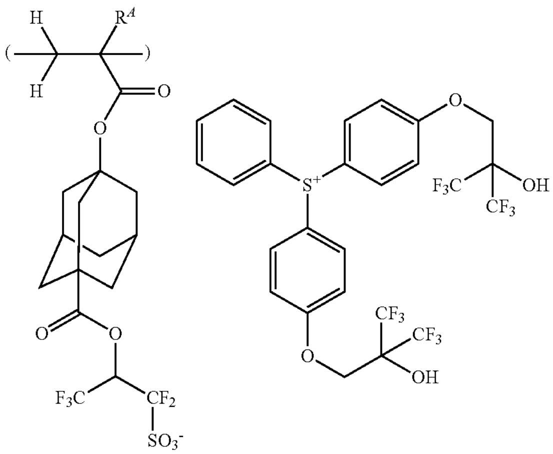
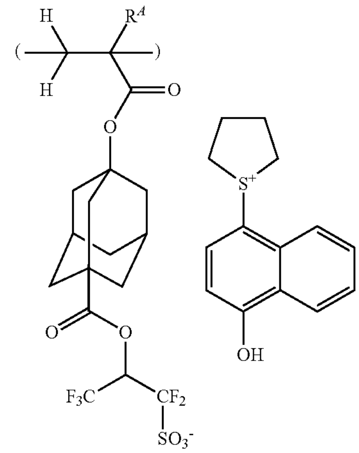
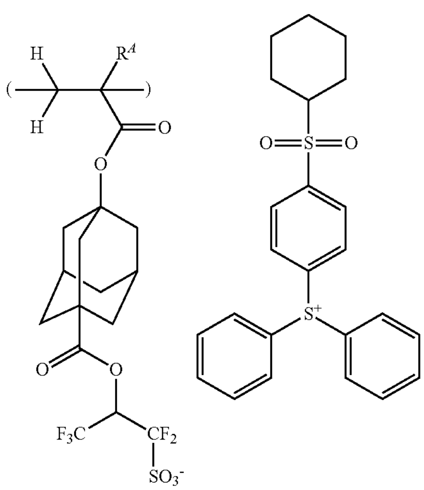
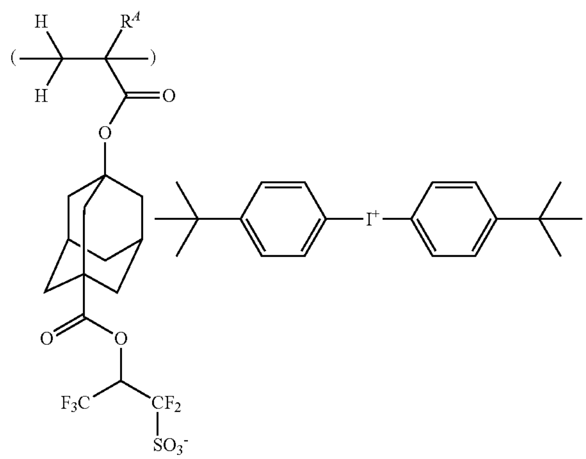
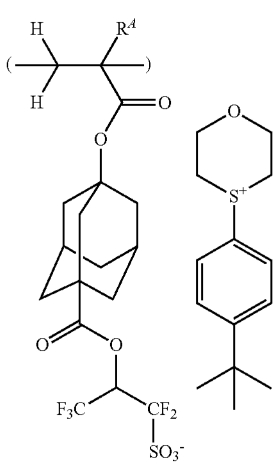
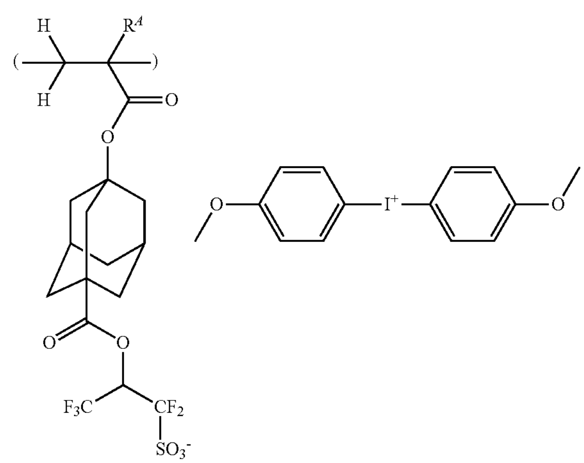

-continued
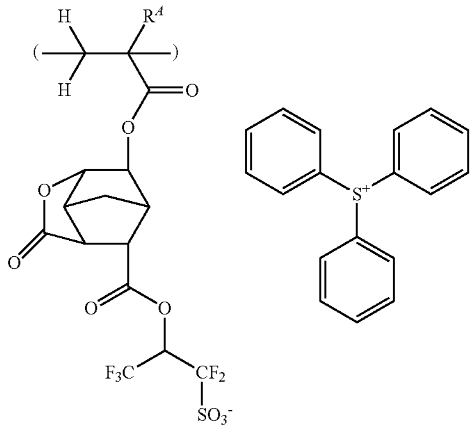
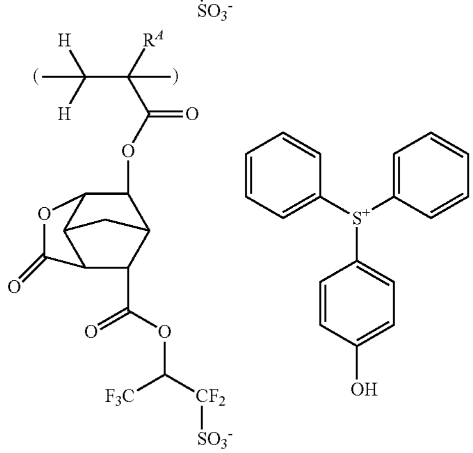
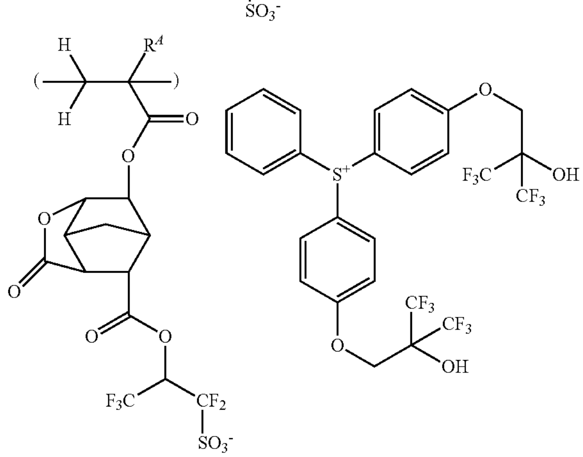
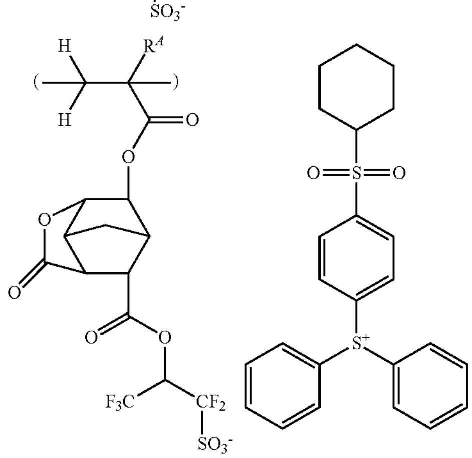
-continued
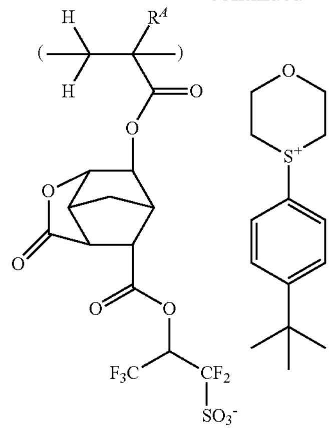
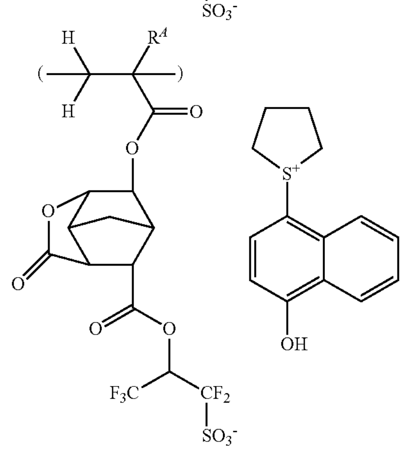
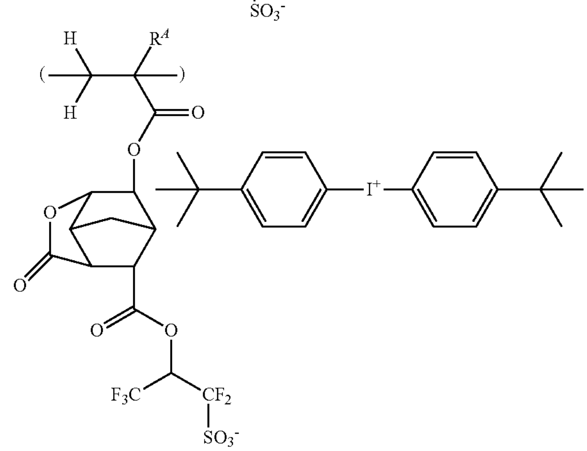
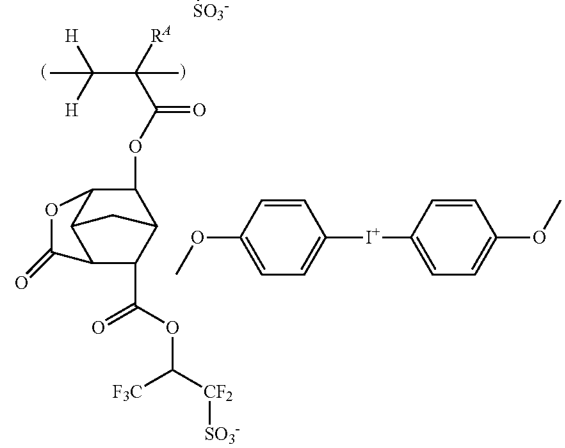

Examples of the recurring units having formula (7c) are given below, but not limited thereto. Notably $R^A$ is as defined above.

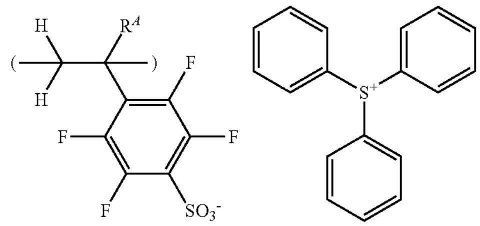

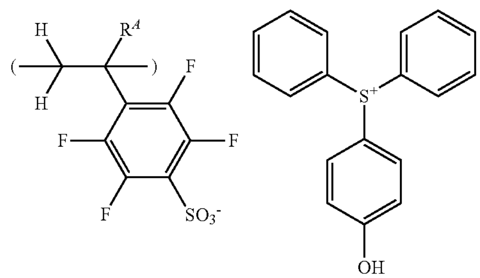

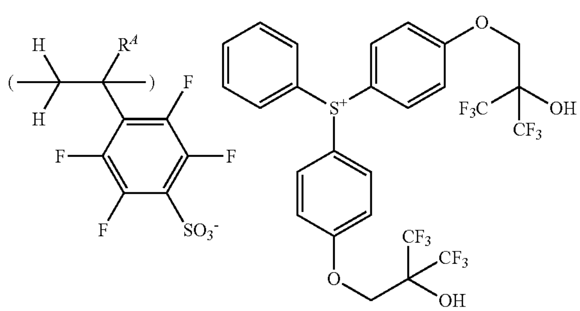

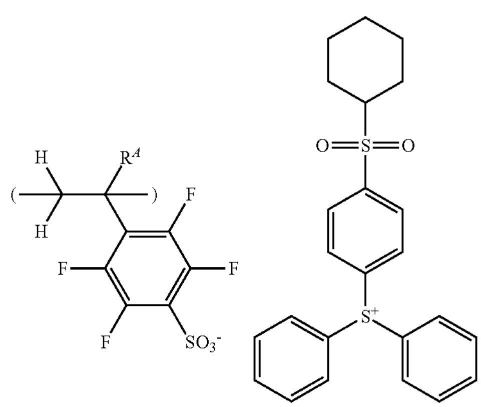

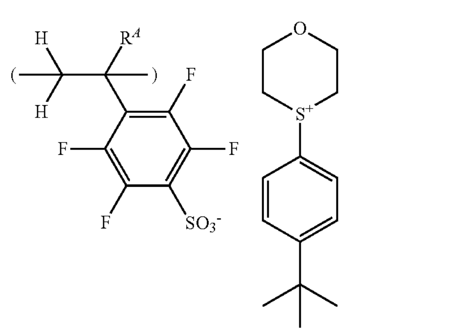

-continued

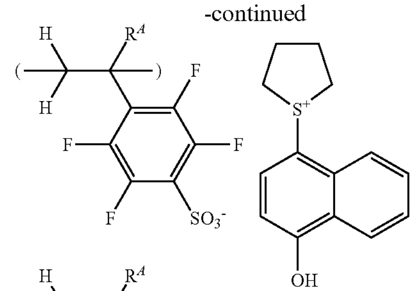

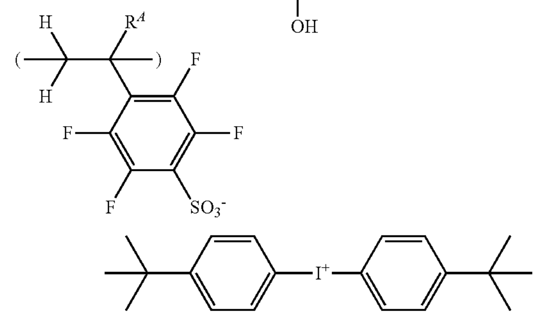

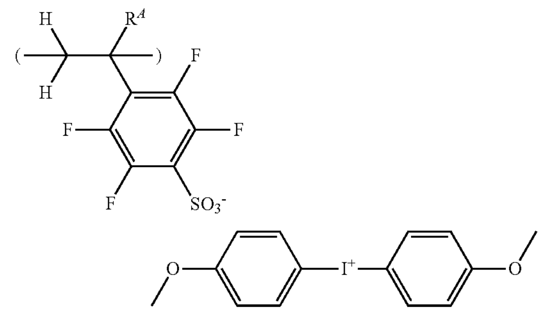

Besides the recurring units having a sulfonium cation or sulfonic acid anion bonded to the backbone as represented by formulae (7a) to (7c), the inventive polymer may further comprise recurring units having a sulfonic acid, imidic acid or methide acid anion bonded to the backbone or recurring units having a sulfonium cation bonded to the backbone as described in JP 5548473, paragraphs [0129]-[0151], or recurring units derived from a monomer containing a sulfonic acid anion as described in WO 2011/070947, paragraphs [0034]-[0038].

The inventive polymer may further comprise recurring units of at least one type selected from recurring units having the formula (8).

(8)

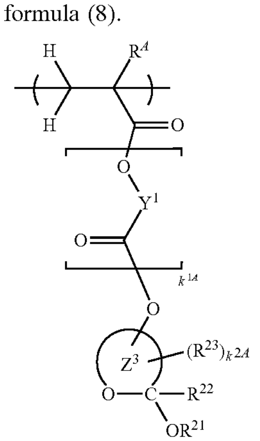

Herein $R^A$ is as defined above. $R^{21}$ to $R^{23}$ are each independently hydrogen or a $C_1$-$C_{15}$ straight, branched or cyclic monovalent hydrocarbon group in which any constituent —$CH_2$— moiety may be replaced by —O— or —C(═O)—. Y is each independently a $C_1$-$C_{15}$ straight, branched or cyclic divalent hydrocarbon group in which any constituent —$CH_2$— moiety may be replaced by —O— or —C(═O)—. The arc $Z^3$ is a divalent hydrocarbon group which bonds with the carbon and oxygen atoms in the formula to form a $C_4$-$C_{20}$ non-aromatic mono- or polycyclic ring having a hemiacetal structure, $k^{1A}$ is 0 or 1, and $k^{2A}$ is an integer of 0 to 3.

Of the recurring units having formula (8), units having the following formulae (8a) to (8c) are preferred.

(8a)

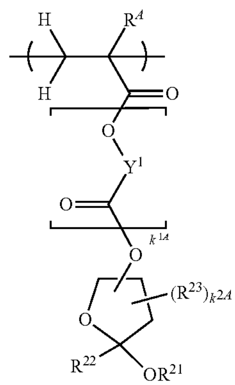

(8b)

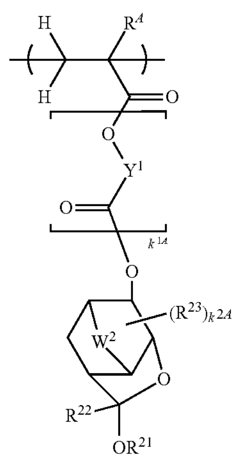

(8c)

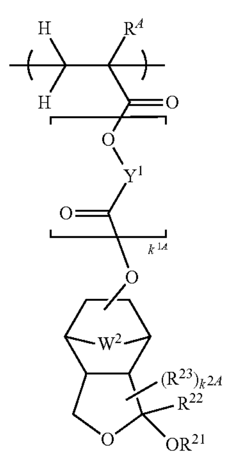

Herein $R^A$, $R^{21}$ to $R^{23}$, $Y^1$, $k^{1A}$ and $k^{2A}$ are as defined above, and $W^2$ is —$CH_2$— or —O—.

The recurring unit having formula (8) has a chemically active hemiacetal or acetal structure. As a typical example, reference is made to a recurring unit (8b-1) having formula (8b) wherein $k^{1A}$=$k^{2A}$=0. When recurring units of formulae (8b-1) and recurring units having a group of formula (2a) and/or (2b) are used as base resin components, it is expected that in the exposed region, acetal exchange readily occurs under the action of acid generated therein, to force conversion to a higher molecular weight compound as shown by the formula (8b-2) or (8b-3), eventually contributing to a substantial drop of solubility of the resin in alkaline developer after exposure.

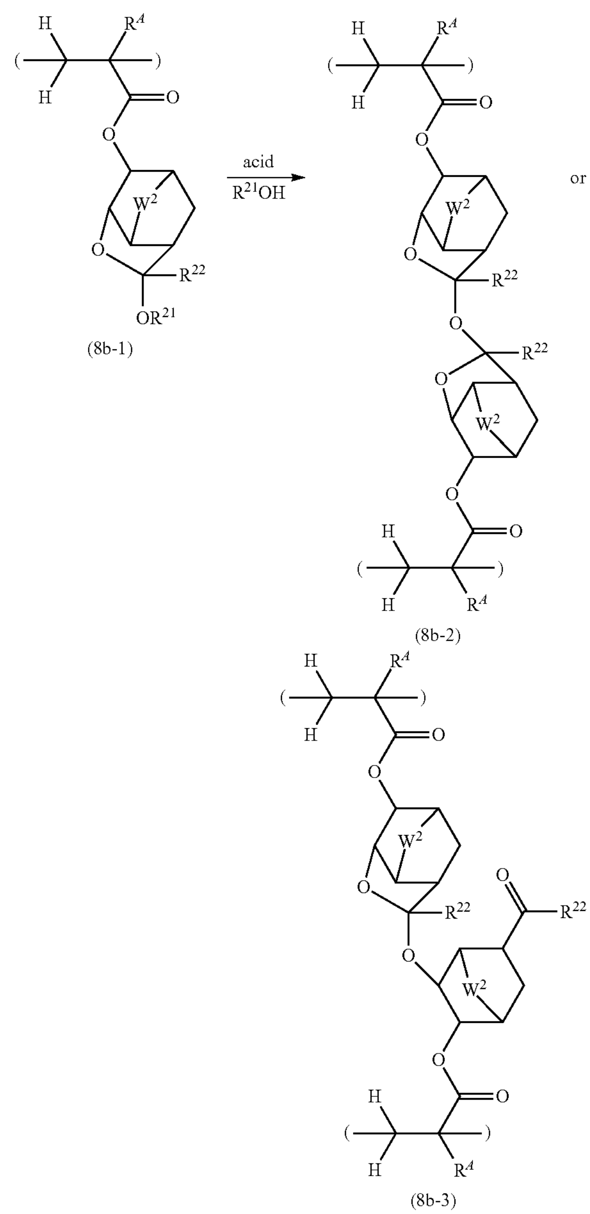

Herein $R^A$, $R^{21}$, $R^{22}$ and $W^2$ are as defined above.

Examples of the monomers from which the recurring units having formula (8) are derived are given below, but not limited thereto. Notably $R^A$ is as defined above.

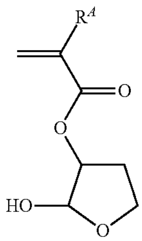
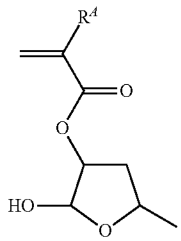
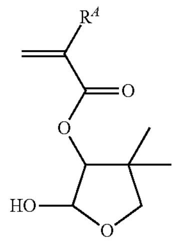
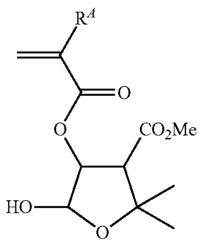
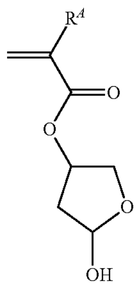
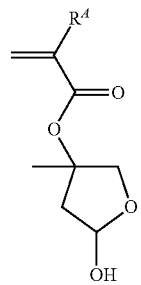
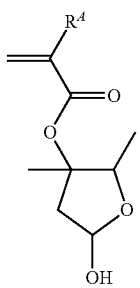
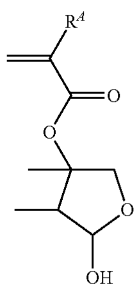
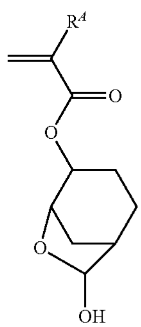
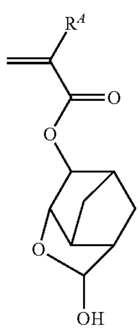
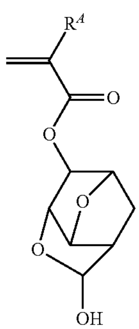
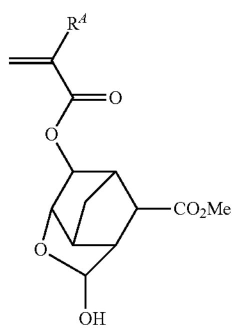
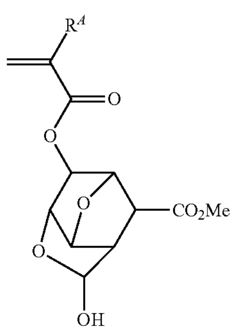
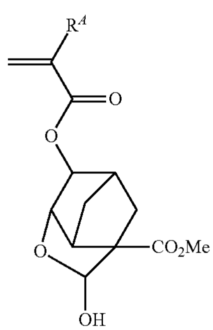
-continued
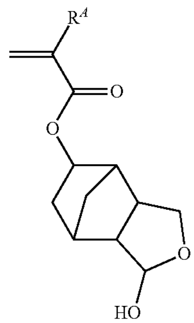
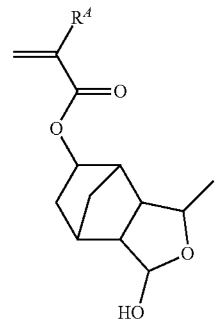
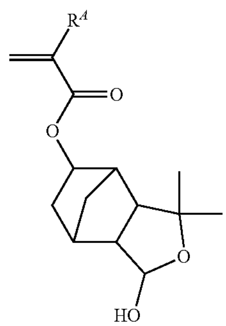
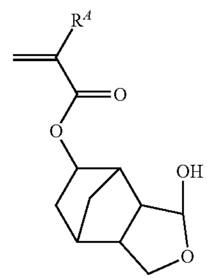
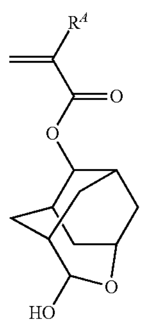
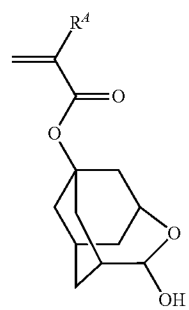
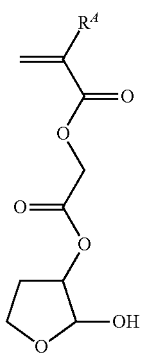
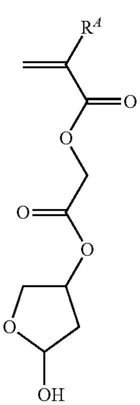
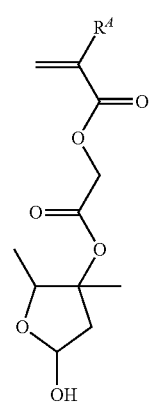
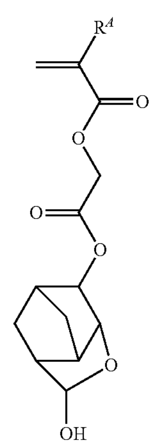

-continued

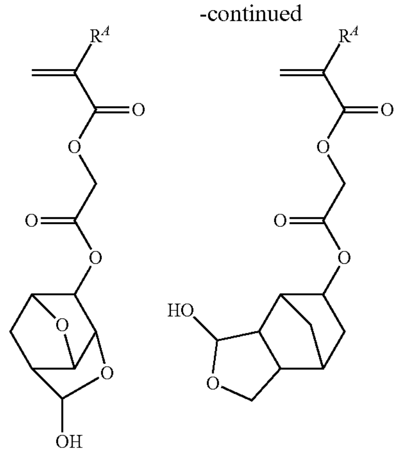

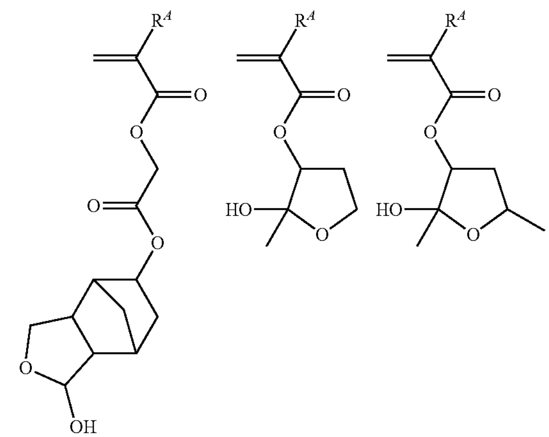

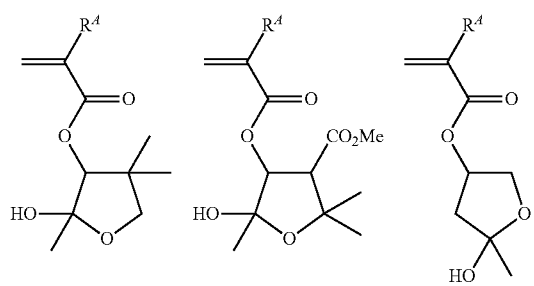

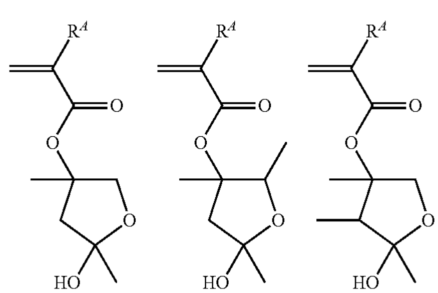

Furthermore, recurring units (g) having an oxirane or oxetane ring may be incorporated in the polymer. When recurring units (g) are copolymerized, it is expected that when the polymer is used in a resist composition, the exposed region of a resist film is crosslinked, leading to improvements in insolubilization in alkaline developer and etch resistance of negative pattern.

Examples of the monomers from which the recurring units (g) having an oxirane or oxetane ring are derived are shown below, but not limited thereto. Notably $R^A$ is as defined above.

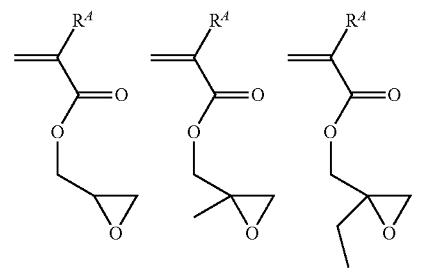

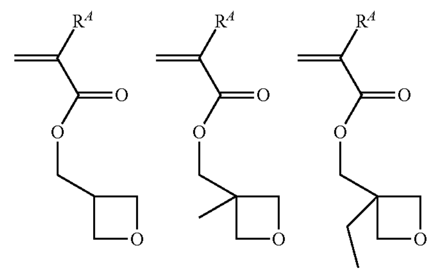

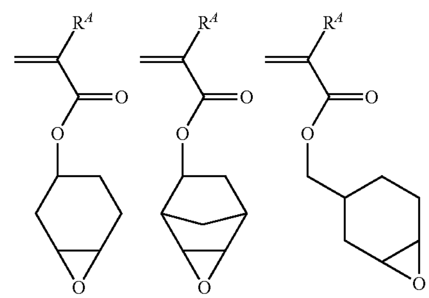

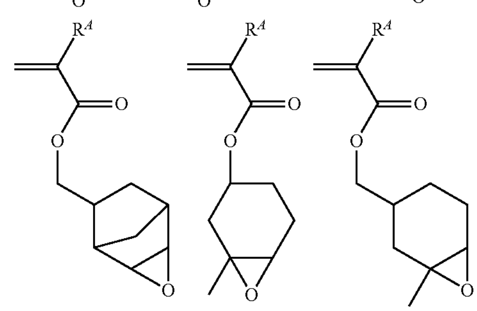

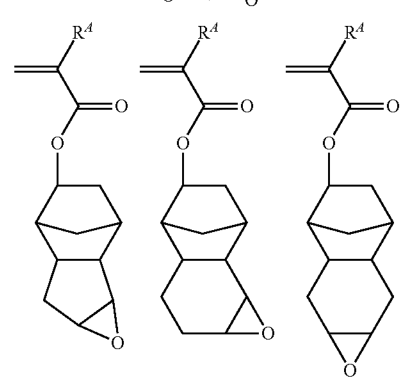

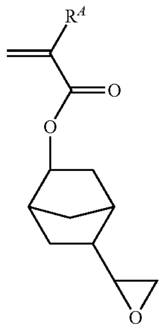
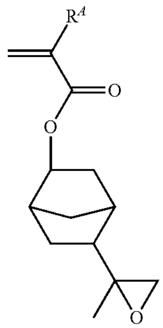
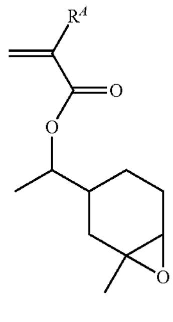
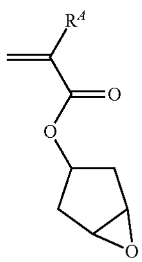
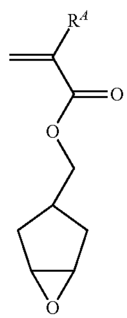
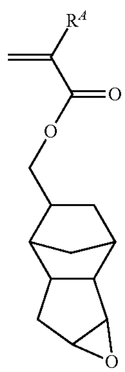
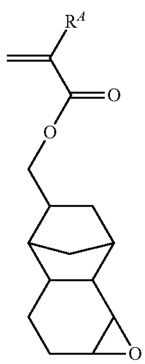
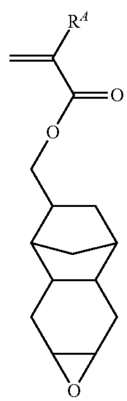
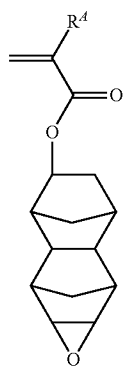
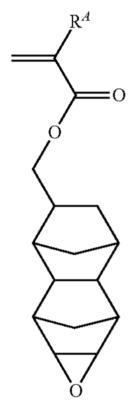
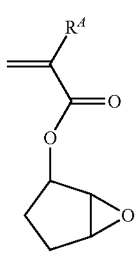
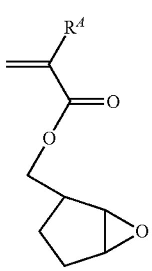
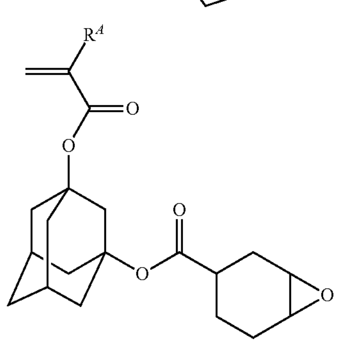
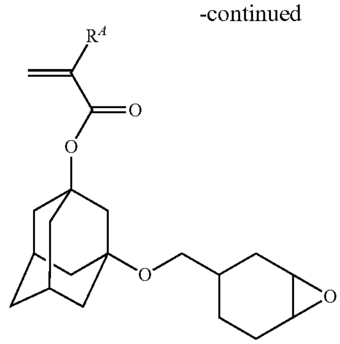
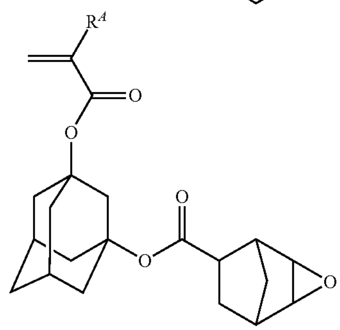
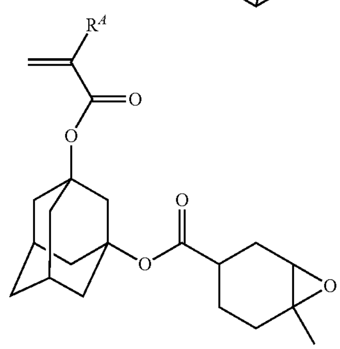
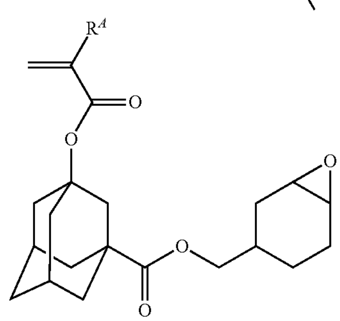
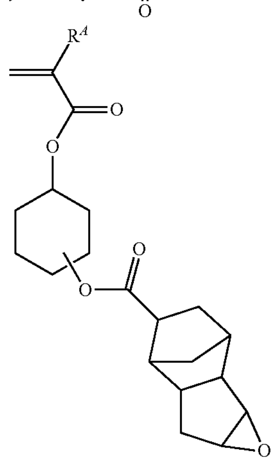

-continued
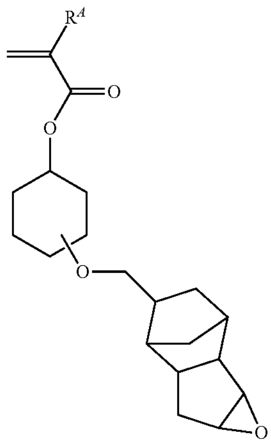
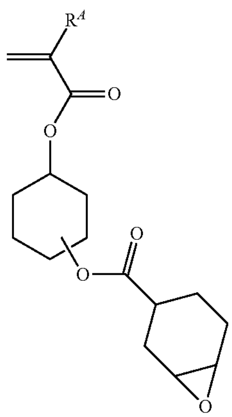
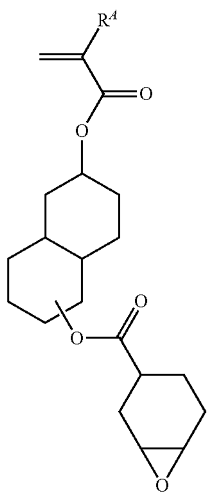
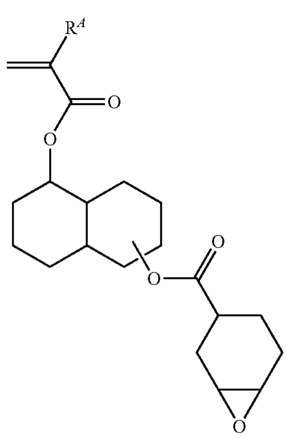
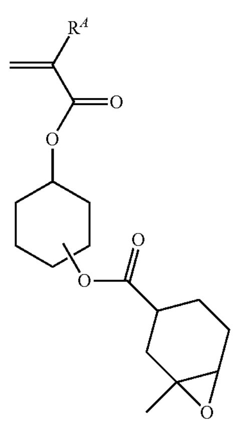
-continued
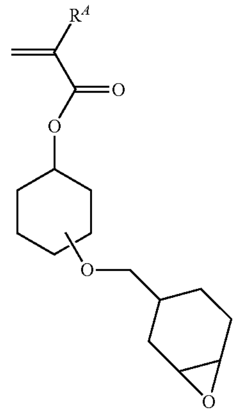
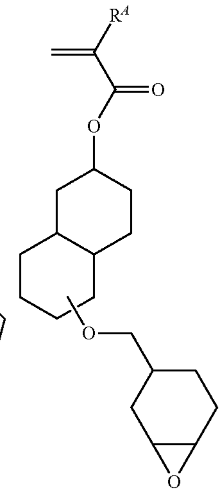
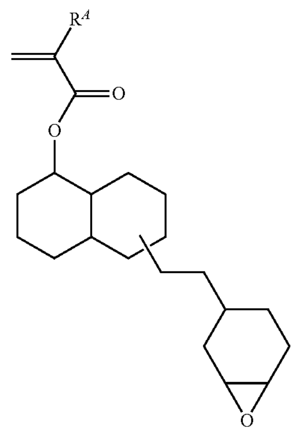
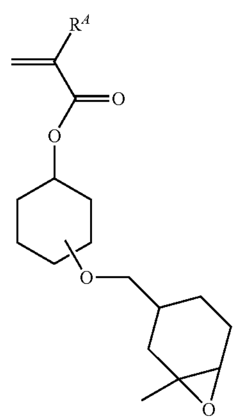
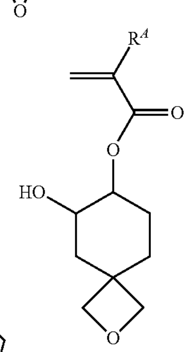
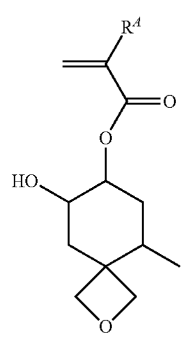
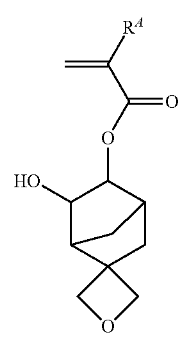

-continued

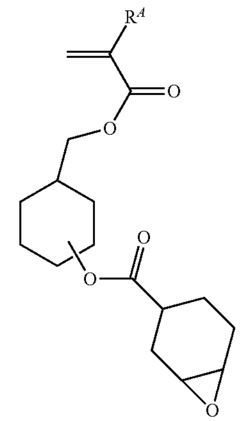

In addition to the foregoing units, the polymer may further comprise recurring units (h) derived from carbon-to-carbon double bond-bearing monomers. Examples include recurring units derived from substituted acrylic acid esters such as methyl methacrylate, methyl crotonate, dimethyl maleate and dimethyl itaconate, unsaturated carboxylic acids such as maleic acid, fumaric acid, and itaconic acid, cyclic olefins such as norbornene, norbornene derivatives, and tetracyclo[4.4.0.1$^{2,5}$.1$^{7,10}$]dodecene derivatives, unsaturated acid anhydrides such as itaconic anhydride, and other monomers shown below. Notably $R^A$ is as defined above.

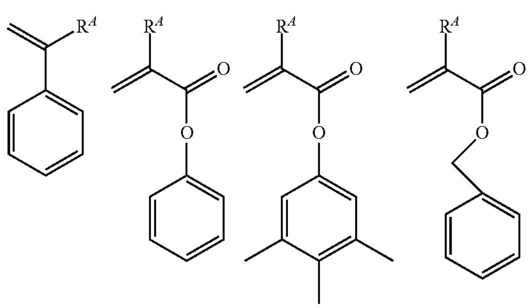

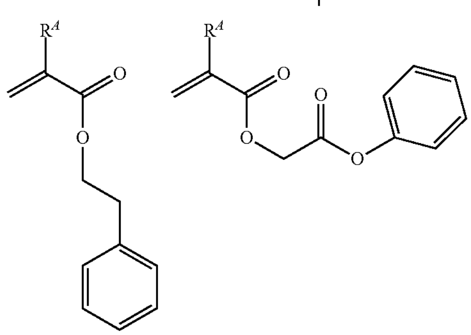

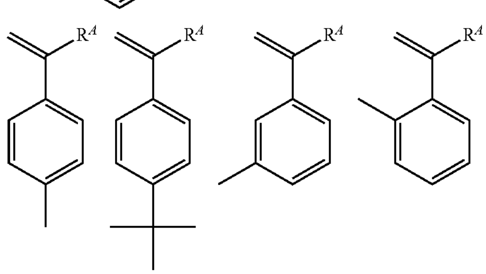

-continued

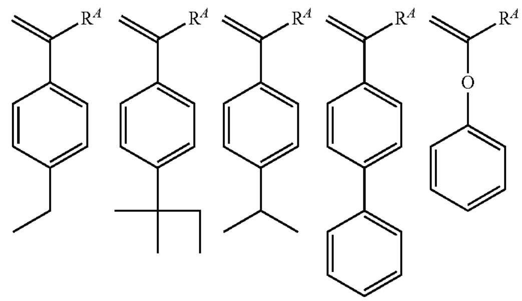

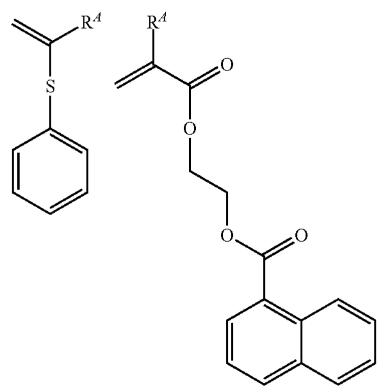

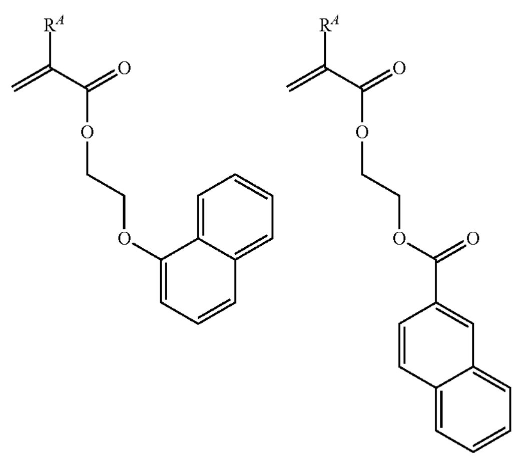

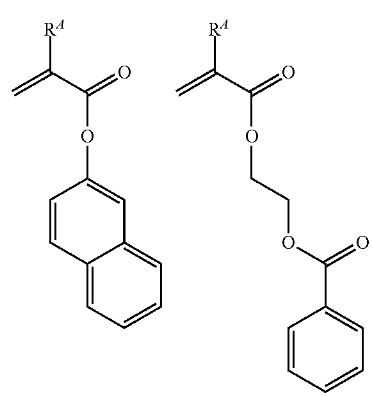

-continued
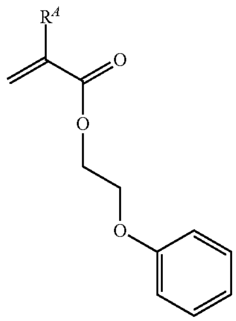
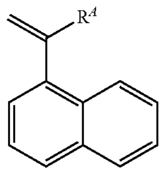
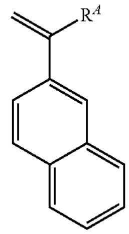
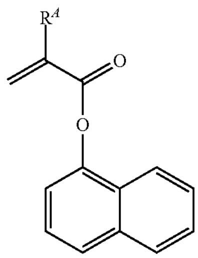
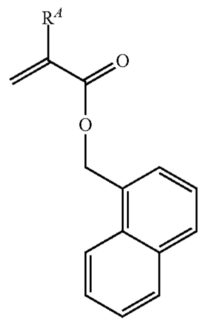
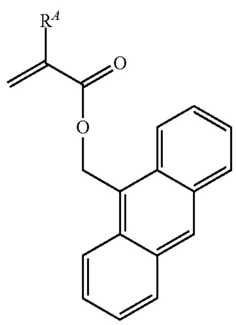
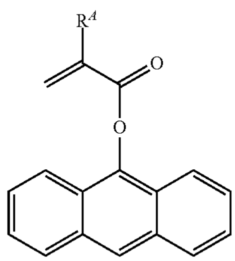
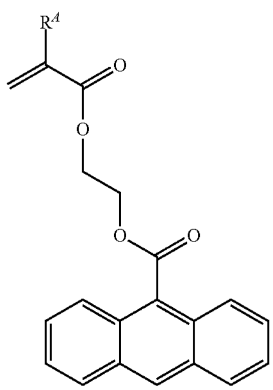
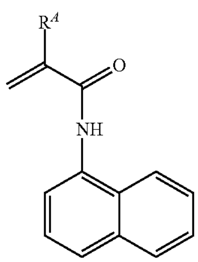
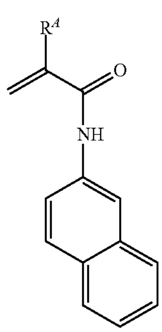
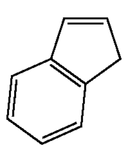
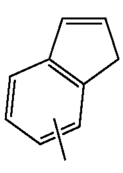
-continued
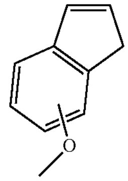
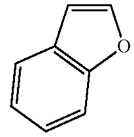
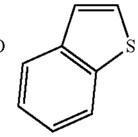
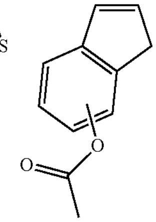
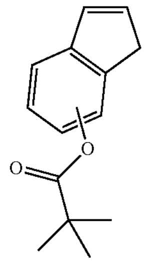
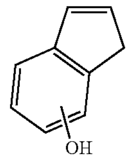
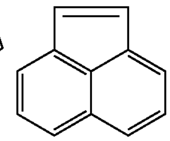
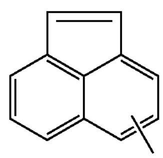
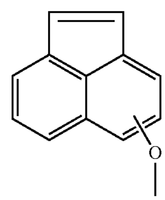
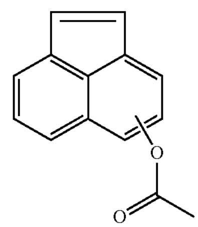
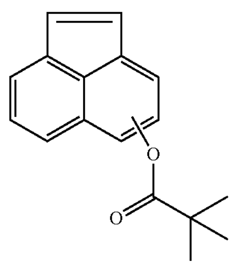
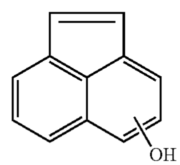
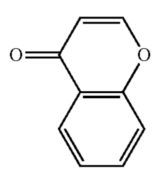
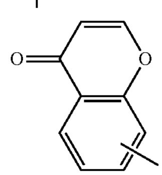
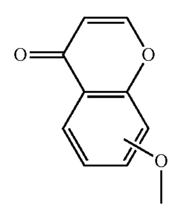
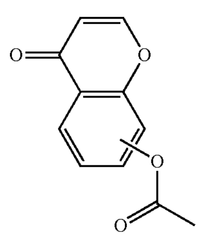
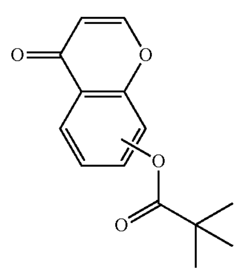
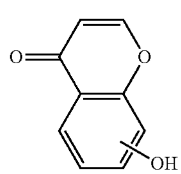
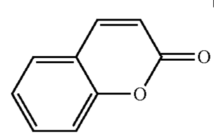

-continued

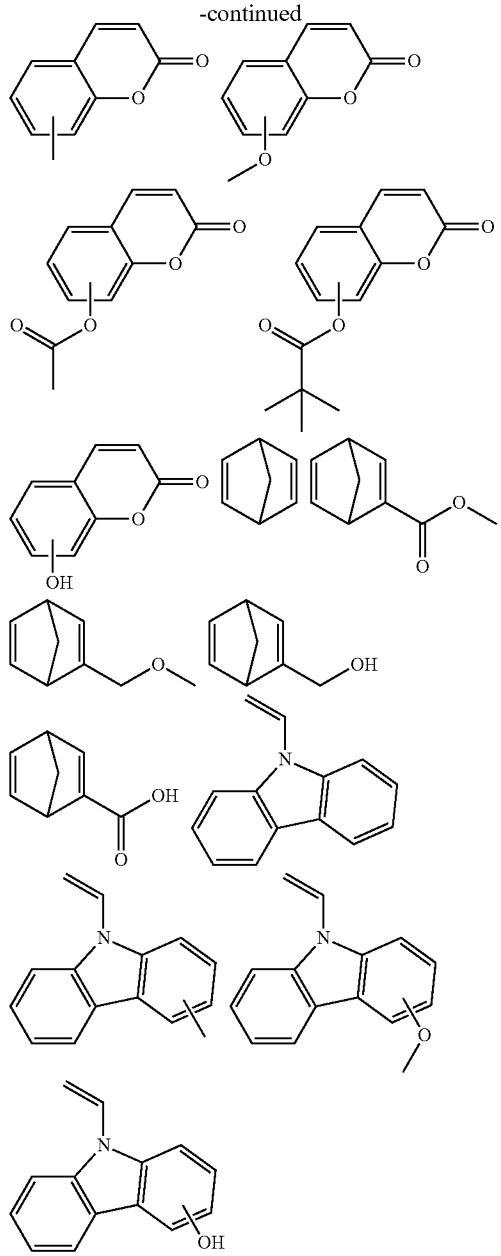

In the polymer, the recurring units derived from the inventive monomer and other monomers are preferably incorporated in the following molar fractions (mol %):

(I) more than 0 mol % to 100 mol %, preferably 5 to 80 mol %, and more preferably 10 to 60 mol % of recurring units of at least one type selected from units having a group of formula (2a) and/or (2b);

(II) 0 mol % to less than 100 mol %, preferably 0 to 90 mol %, and more preferably 0 to 80 mol % of recurring units of at least one type selected from units of formulae (4a) to (4c);

(III) 0 mol % to less than 100 mol %, preferably 0 to 90 mol %, and more preferably 0 to 80 mol % of recurring units of at least one type selected from units of formulae (5a) to (5c);

(IV) 0 mol % to less than 100 mol %, preferably 20 to 95 mol %, and more preferably 40 to 90 mol % of recurring units of at least one type selected from units of formulae (6a) to (6d);

(V) 0 to 30 mol %, preferably 0 to 20 mol %, and more preferably 0 to 10 mol % of recurring units of at least one type selected from units of formulae (7a) to (7c);

(VI) 0 to 30 mol %, preferably 0 to 20 mol %, and more preferably 0 to 10 mol % of recurring units of at least one type selected from units of formula (8); and (VII) 0 to 80 mol %, preferably 0 to 70 mol %, and more preferably 0 to 50 mol % of recurring units of at least one type selected from units (g) and (h).

The polymer may be synthesized by any desired methods, for example, by dissolving one or more monomers corresponding to the selected recurring units in an organic solvent, adding a radical polymerization initiator thereto, and heating to promote polymerization. Examples of the organic solvent which can be used for polymerization include toluene, benzene, tetrahydrofuran, diethyl ether, dioxane, cyclohexane, cyclopentane, methyl ethyl ketone (MEK), propylene glycol monomethyl ether (PGME), propylene glycol monomethyl ether acetate (PGMEA), and γ-butyrolactone (GBL). Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours.

When hydroxystyrene or hydroxyvinylnaphthalene is copolymerized, a copolymer may be obtained by dissolving hydroxystyrene or hydroxyvinylnaphthalene and another monomer(s) in an organic solvent, adding a radical polymerization initiator, and heating for polymerization. Alternatively, acetoxystyrene or acetoxyvinylnaphthalene is used instead of hydroxystyrene or hydroxyvinylnaphthalene, and after polymerization, the acetoxy group is deprotected by alkaline hydrolysis, for thereby converting the polymer product to polyhydroxystyrene or hydroxypolyvinylnaphthalene. For alkaline hydrolysis, aqueous ammonia, triethylamine, sodium methoxide or triethanolamine may be used. The reaction temperature is −20° C. to 100° C., preferably 0° C. to 60° C., and the reaction time is 0.2 to 100 hours, preferably 0.5 to 20 hours.

The polymer should preferably have a weight average molecular weight (Mw) in the range of 1,000 to 500,000, and more preferably 3,000 to 50,000, as measured versus polystyrene standards by GPC using tetrahydrofuran solvent. Outside the range, there may result an extreme decline of etch resistance, a failure to provide a differential dissolution rate before and after exposure, and a lowering of resolution. Also preferably, the polymer has a molecular weight distribution or dispersity (Mw/Mn) of 1.20 to 2.20, more preferably 1.30 to 1.80.

Resist Composition

The inventive polymer is advantageously used as a base resin in a resist composition. The resist composition comprising the inventive polymer has a very high sensitivity in that the dissolution rate in alkaline developer of the polymer in the exposed region is reduced by catalytic reaction. In addition, the resist film has a high dissolution contrast, resolution, exposure latitude, and process adaptability, and provides a good pattern profile after exposure, yet better etch resistance, and minimal proximity bias because of restrained acid diffusion. By virtue of these advantages, the composition is fully useful in commercial application and suited as a pattern-forming material for the fabrication of VLSIs. Particularly when an acid generator is included to formulate a chemically amplified resist composition capable of utilizing acid catalyzed reaction, the composition has a higher sensitivity and is further improved in the properties described above.

Acid Generator

The resist composition may include an acid generator (also referred to as acid generator of addition type) in order for the composition to function as a chemically amplified negative resist composition. Typical of the acid generator used herein is a photoacid generator (PAG) capable of generating an acid in response to actinic light or radiation.

Examples of the PAG include those described in JP-A 2008-111103, paragraphs [0122]-[0142] (U.S. Pat. No. 7,537,880). Preferred structures are also described in JP-A 2014-001259, paragraphs [0088]-[0092], JP-A 2012-041320, paragraphs [0015]-[0017], and JP-A 2012-106986, paragraphs [0015]-[0029]. These PAGs capable of generating partially fluorinated sulfonic acid are advantageously used in the ArF lithography because the generated acid has an appropriate strength and diffusion length.

Examples of the acid generated by the acid generator include sulfonic acids, imidic acids and methide acids. Of these, sulfonic acids which are fluorinated at α-position are most commonly used. Fluorination at α-position is not essential when the acid labile group used is an acetal group susceptible to deprotection.

Where the base resin contains recurring units of at least one type selected from formulae (7a) to (7c), the acid generator of addition type is not essential.

The preferred acid generators of addition type are those having the formulae (Z1) and (Z2).

(Z1)

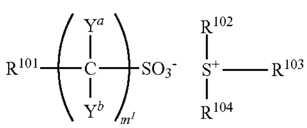

(Z2)

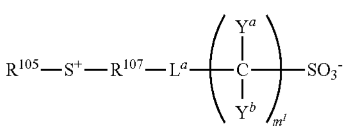

Herein $R^{101}$ is hydrogen, fluorine, or a $C_1$-$C_{35}$ straight, branched or cyclic monovalent hydrocarbon group which may contain a heteroatom. $Y^a$ and $Y^b$ are each independently hydrogen, fluorine, or trifluoromethyl, $m^1$ and $m^2$ are each independently an integer of 1 to 4. $R^{102}$, $R^{103}$, and $R^{104}$ are each independently a $C_1$-$C_{20}$ straight, branched or cyclic monovalent hydrocarbon group which may contain a heteroatom, or any two of $R^{102}$, $R^{103}$, and $R^{104}$ may bond together to form a ring with the sulfur atom to which they are attached. $R^{105}$ and $R^{106}$ are each independently a $C_1$-$C_{20}$ straight, branched or cyclic monovalent hydrocarbon group which may contain a heteroatom, or $R^{105}$ and $R^{106}$ may bond together to form a ring with the sulfur atom to which they are attached. $R^{107}$ is a $C_1$-$C_{20}$ straight, branched or cyclic divalent hydrocarbon group which may contain a heteroatom. $L^a$ is a single bond, ether bond or a $C_1$-$C_{20}$ straight, branched or cyclic divalent hydrocarbon group which may contain a heteroatom.

Suitable monovalent hydrocarbon groups include alkyl groups such as methyl, ethyl, n-propyl, isopropyl, n-butyl, t-butyl, cyclopropyl, cyclopentyl, cyclohexyl, cyclopropylmethyl, 4-methylcyclohexyl, cyclohexylmethyl, norbornyl, and adamantyl; alkenyl groups such as vinyl, allyl, propenyl, butenyl, hexenyl, and cyclohexenyl; aryl groups such as phenyl, naphthyl, and thienyl; and aralkyl groups such as benzyl, 1-phenylethyl, and 2-phenylethyl, with the aryl groups being preferred. Also included are substituted forms of the foregoing groups in which at least one hydrogen atom (one or more hydrogen atoms) is replaced by a moiety containing a heteroatom such as oxygen, sulfur, nitrogen or halogen, or in which a carbon atom is replaced by a moiety containing a heteroatom such as oxygen, sulfur or nitrogen, so that the group may contain a hydroxyl, cyano, carbonyl, sulfonyl moiety, ether bond, ester bond, sulfonic acid ester bond, carbonate bond, lactone ring, sultone ring, carboxylic acid anhydride, or haloalkyl moiety.

Of the acid generators of addition type having formula (Z1), those having the following formula (Z3) are preferred. Of the acid generators of addition type having formula (Z2), those having the following formula (Z4) are preferred.

(Z3)

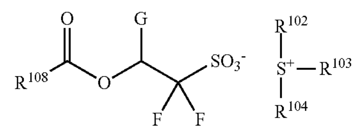

(Z4)

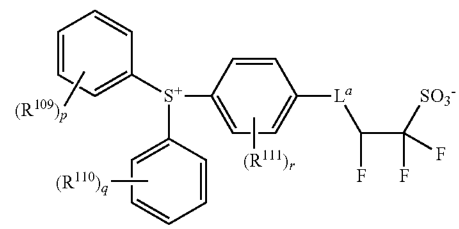

Herein $R^{102}$, $R^{103}$, $R^{104}$, and $L^a$ are as defined above. G is hydrogen or trifluoromethyl. $R^{108}$ is a $C_1$-$C_{35}$ straight, branched or cyclic monovalent hydrocarbon group which may contain a heteroatom. $R^{109}$, $R^{110}$, and $R^{111}$ are each independently hydrogen or a $C_1$-$C_{20}$ straight, branched or cyclic monovalent hydrocarbon group which may contain a heteroatom. Each of p and q is an integer of 0 to 5, r is an integer of 0 to 4.

When the acid generator of addition type is one having formula (Z3) or (Z4), preferably formula (Z3) or (Z4) wherein G is trifluoromethyl, a pattern with improved properties, for example, a line-and-space pattern having low roughness (LWR) and improved control of acid diffusion length or a hole pattern having improved roundness and dimensional control can be formed.

Illustrative, non-limiting examples of the acid generators having formula (Z1) are shown below.

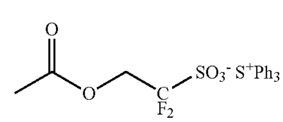

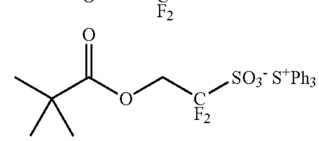

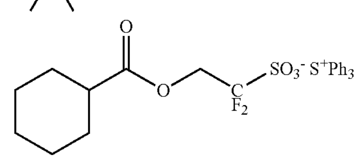

-continued
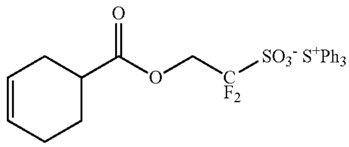
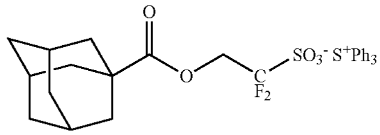
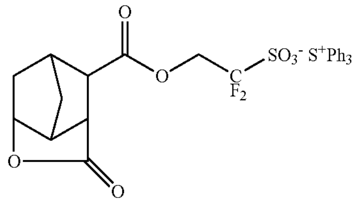
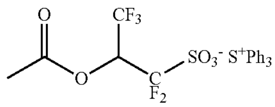
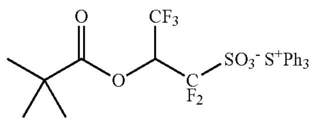
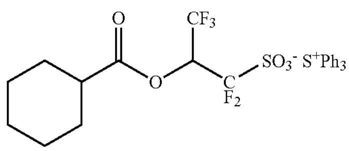
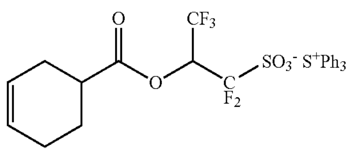
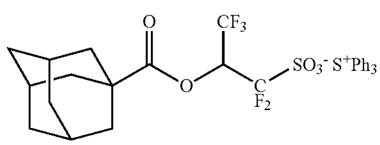
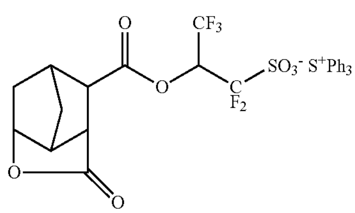
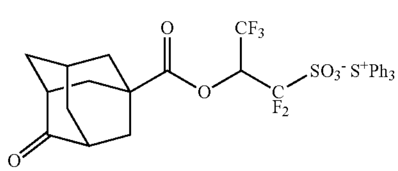
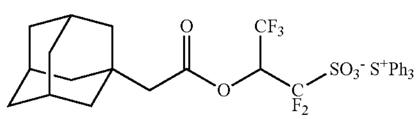
-continued
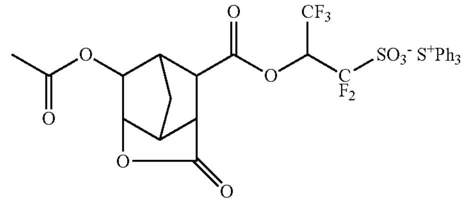
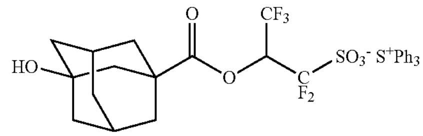
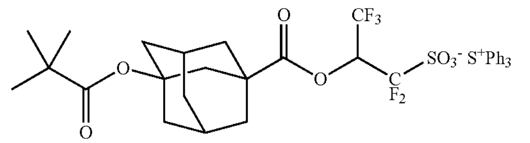
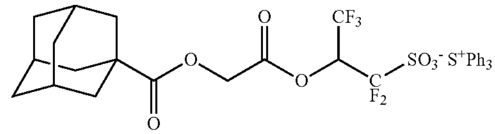
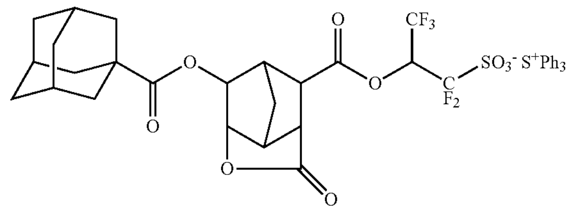
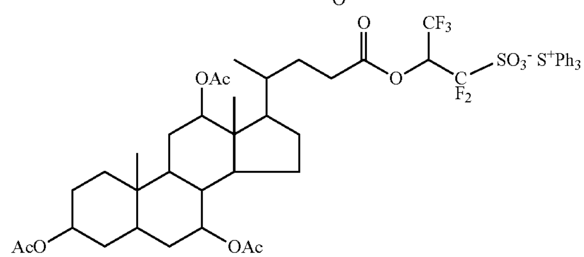
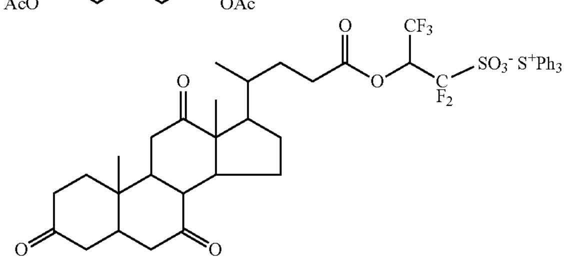
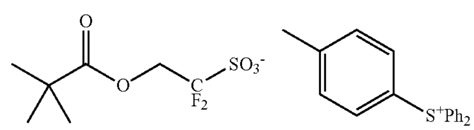
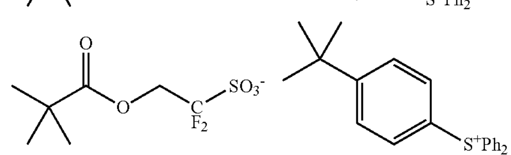
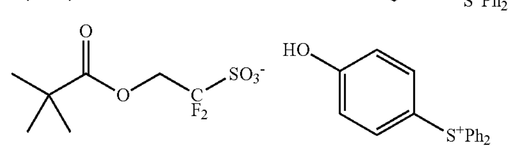

-continued
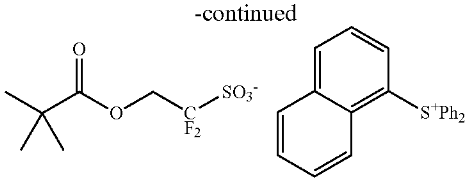
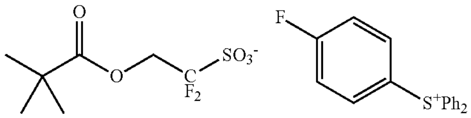
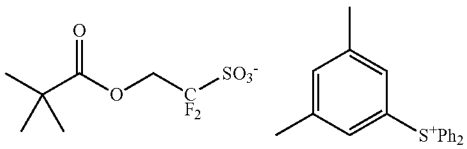
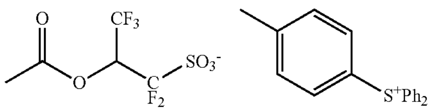
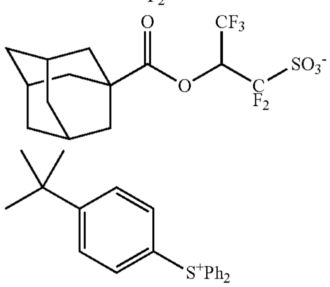
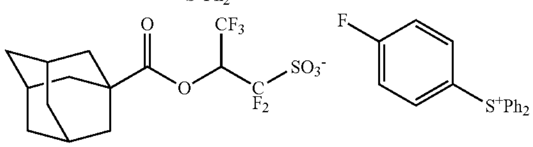
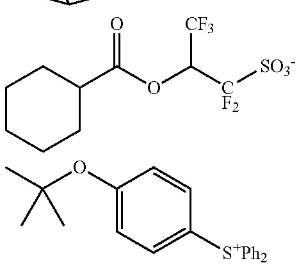
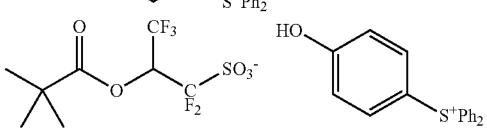
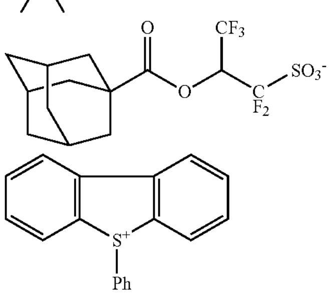
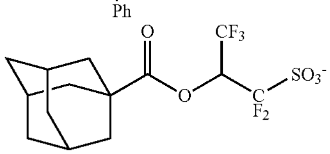
-continued
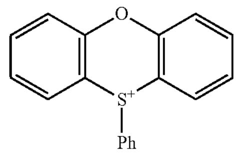
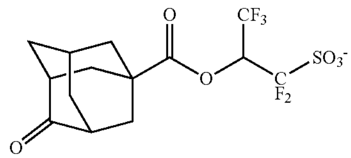
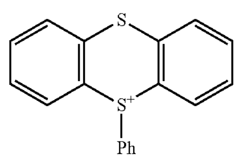
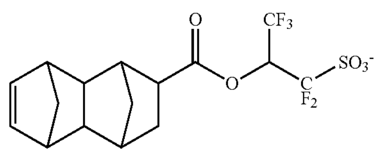
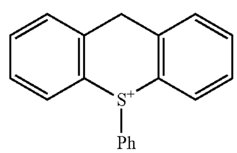
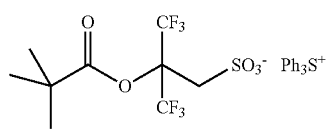
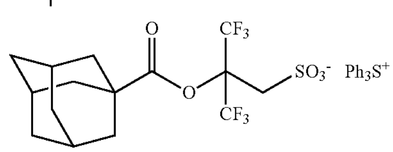
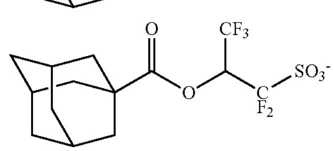
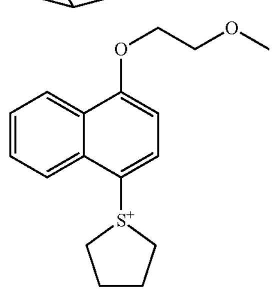
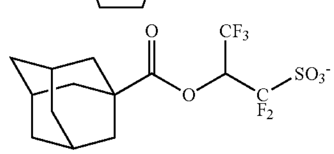

-continued
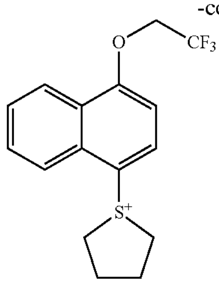
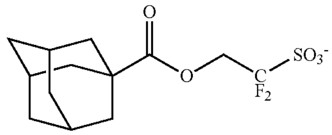
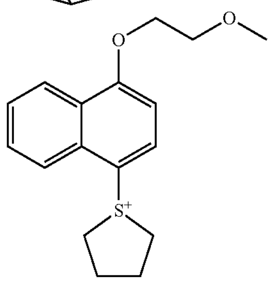
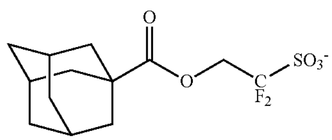
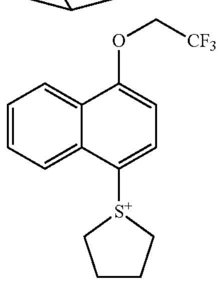
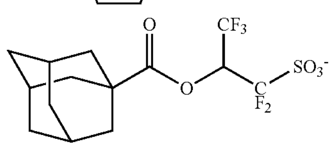
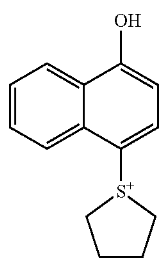
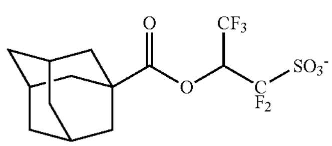
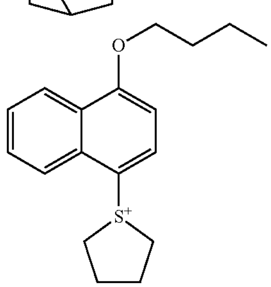
-continued
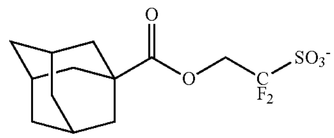
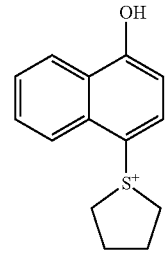
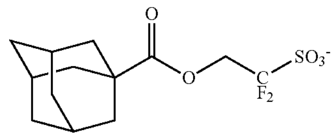
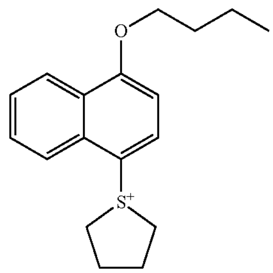
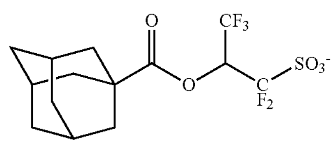
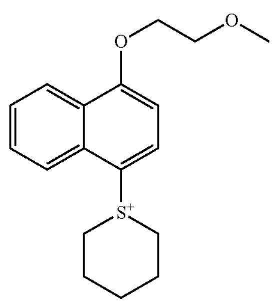
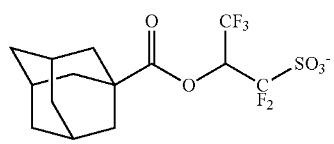
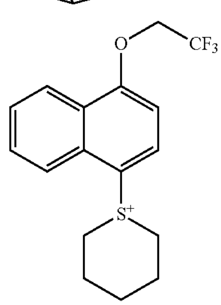
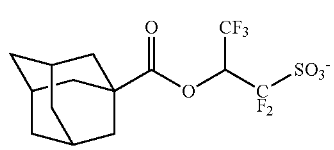

-continued
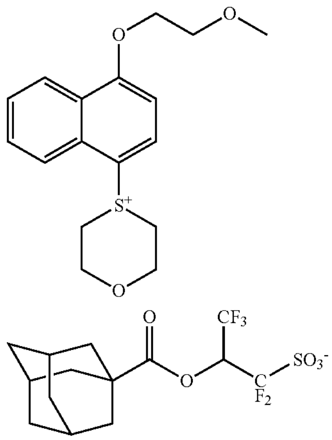
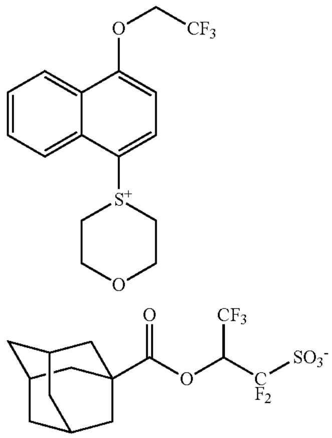
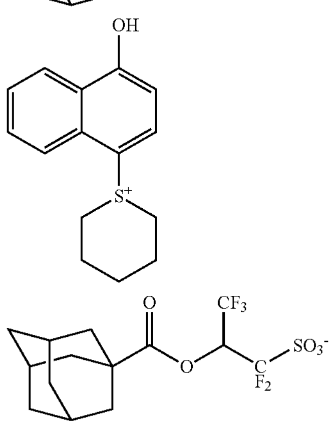
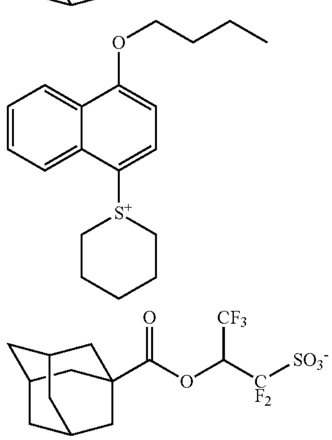
-continued
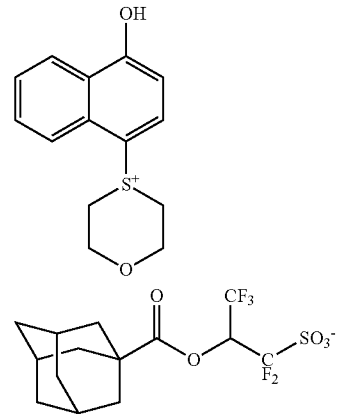
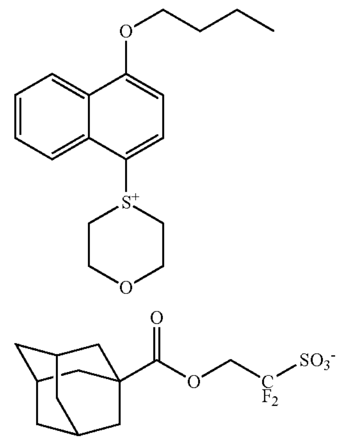
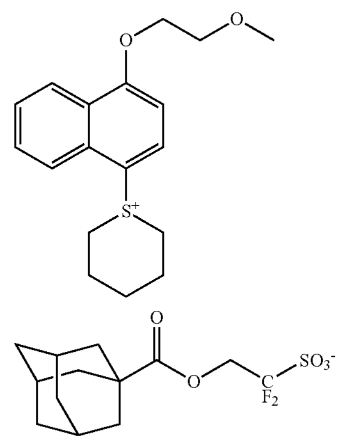
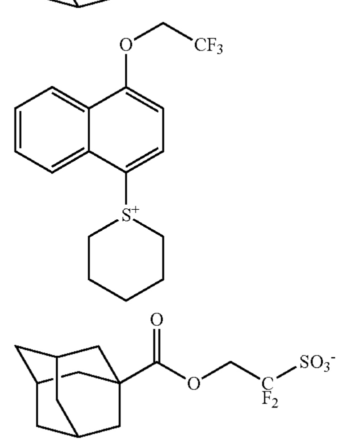

-continued
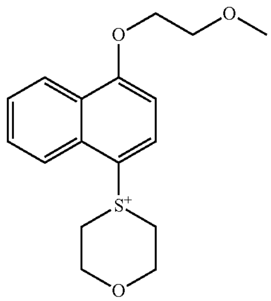
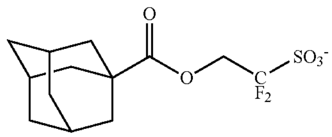
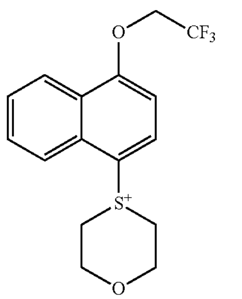
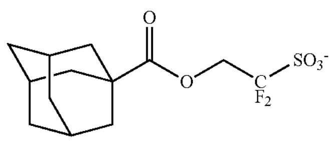
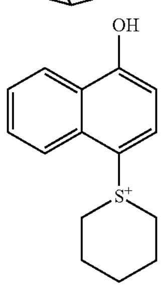
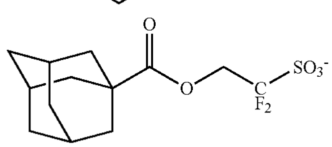
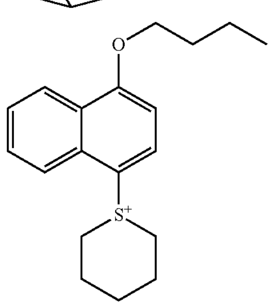
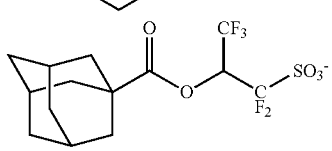
-continued
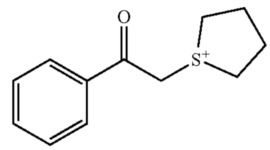
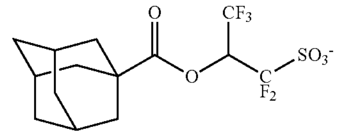
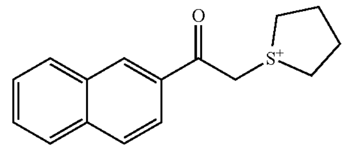
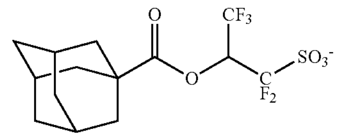
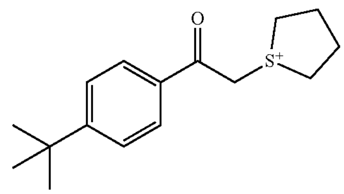
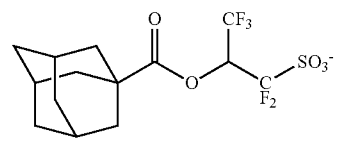
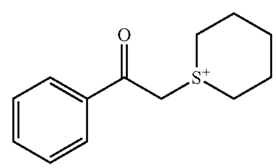
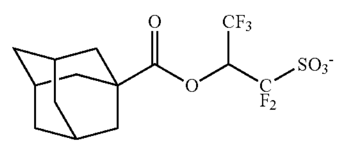
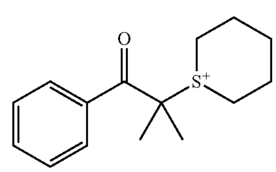
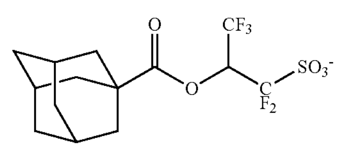
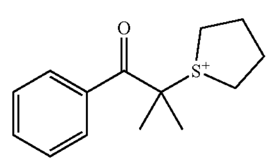

-continued
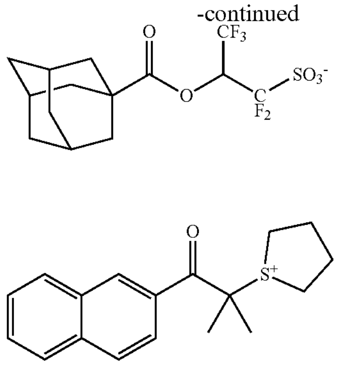
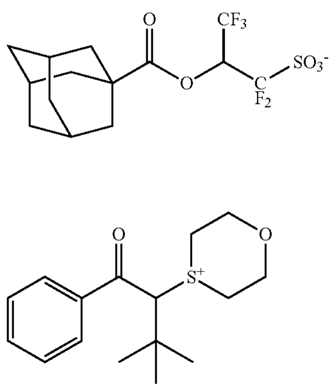
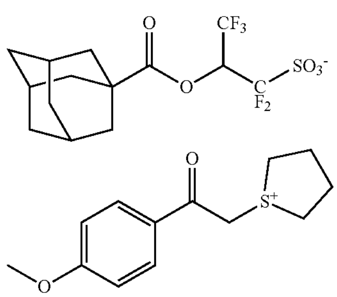
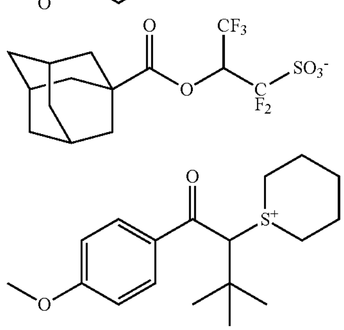
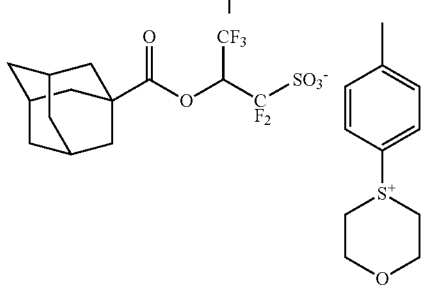
-continued
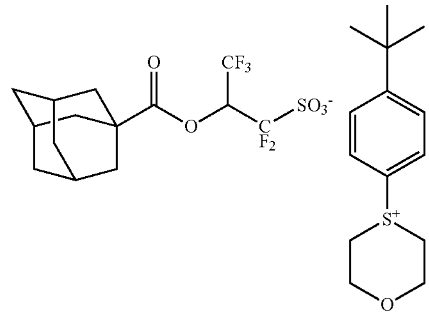
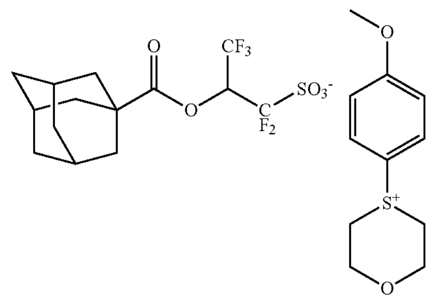
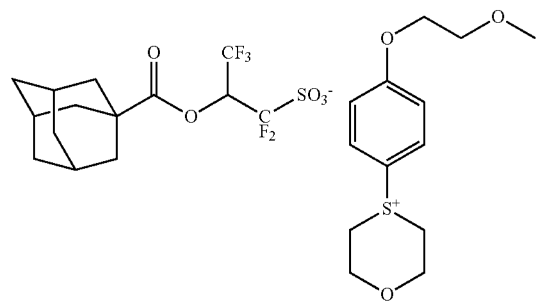
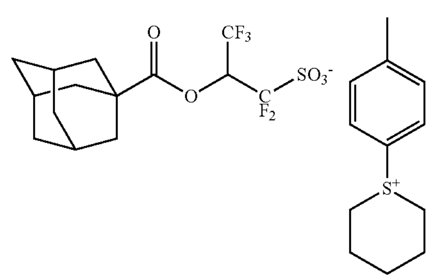
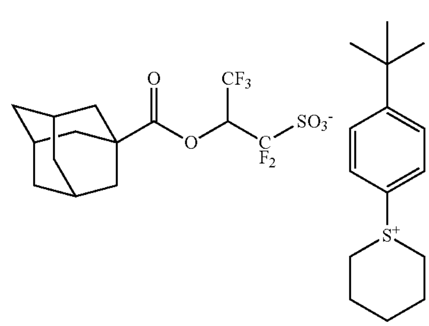

-continued
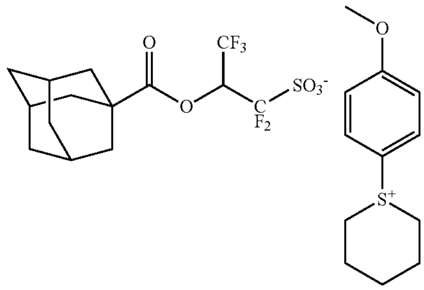
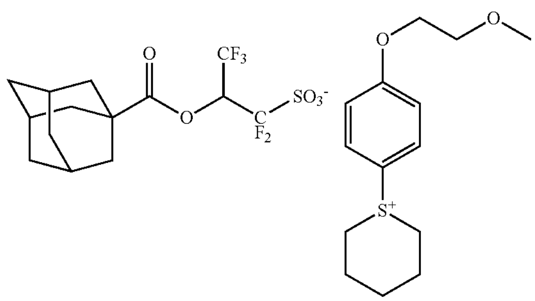
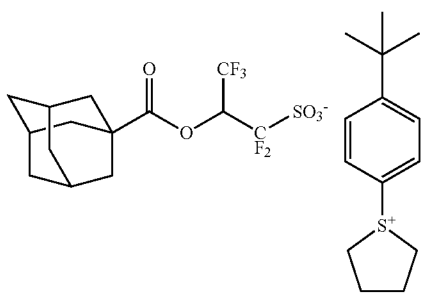
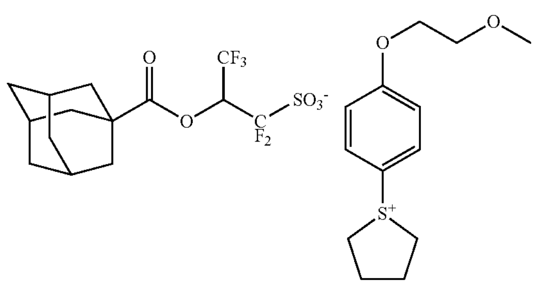
Illustrative, non-limiting examples of the acid generators having formula (Z2) are shown below. G is as defined above.
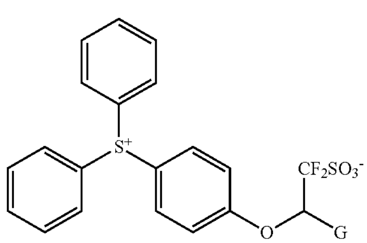
-continued
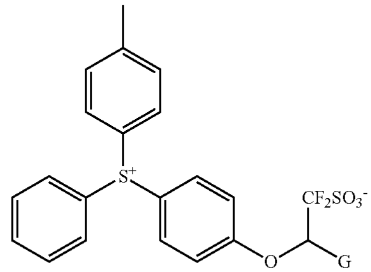
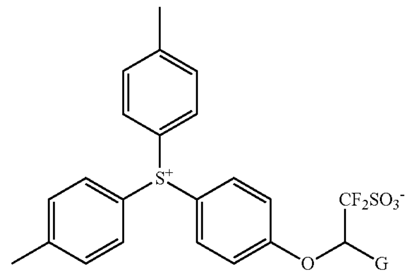
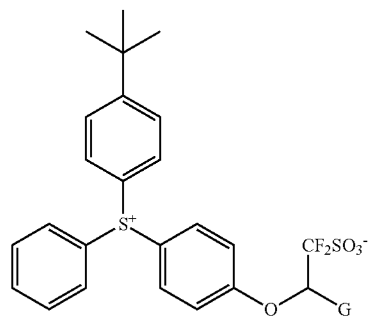
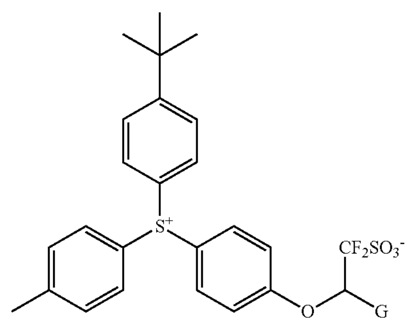
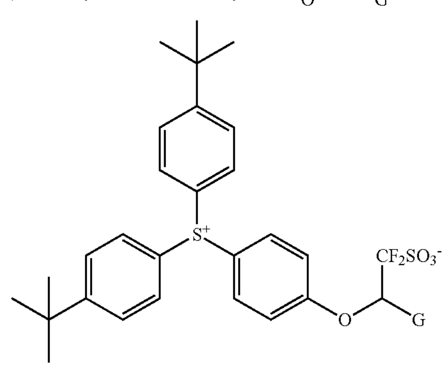

-continued
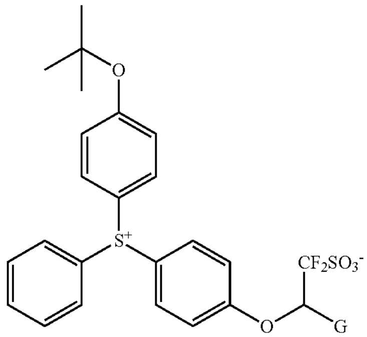
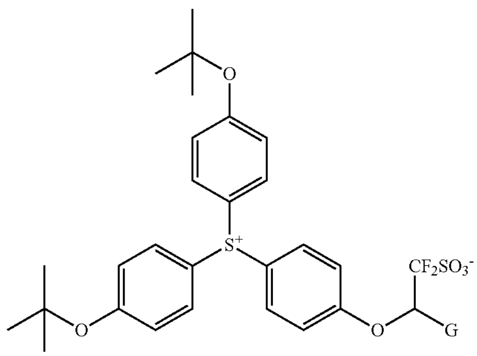
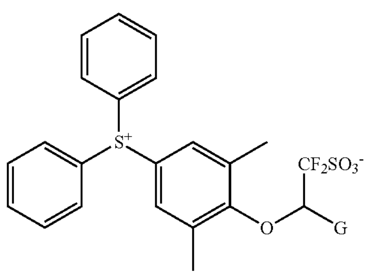
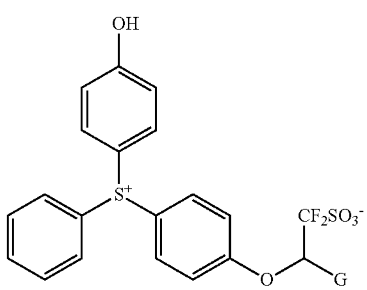
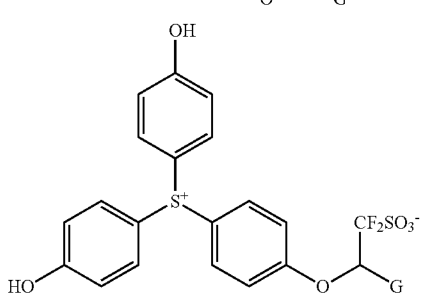
-continued
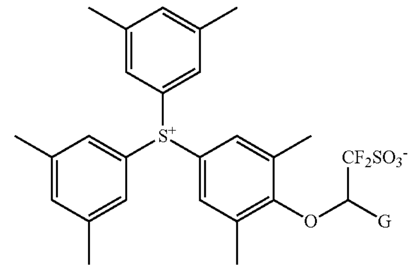
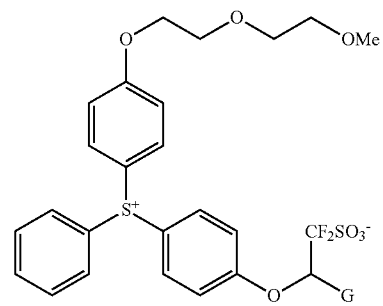
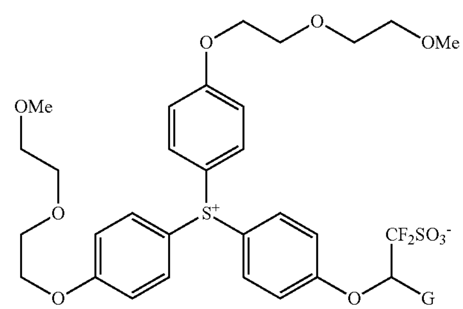
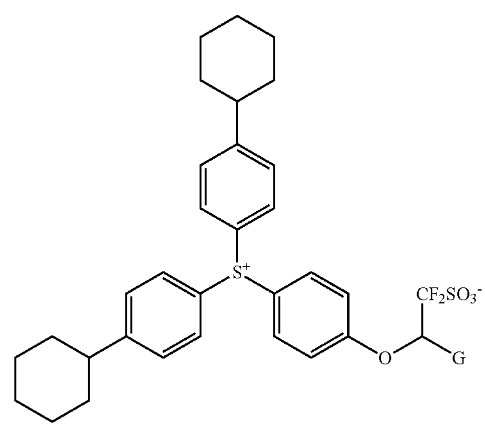
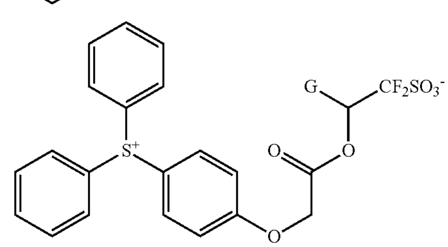

-continued

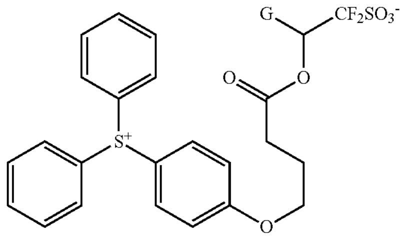

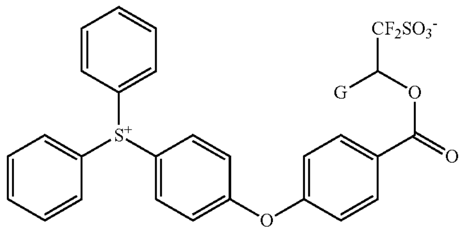

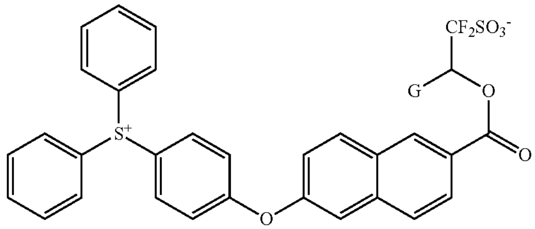

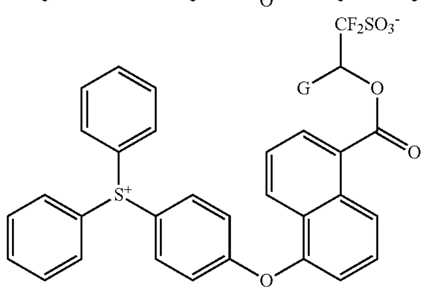

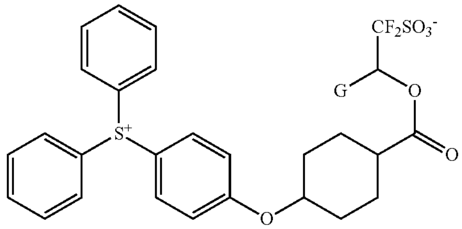

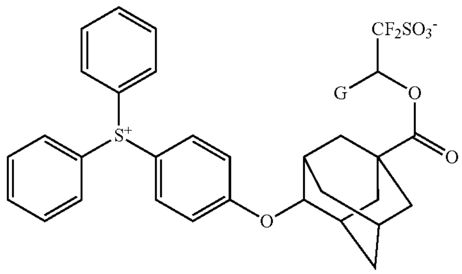

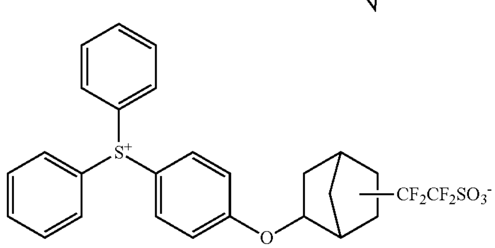

-continued

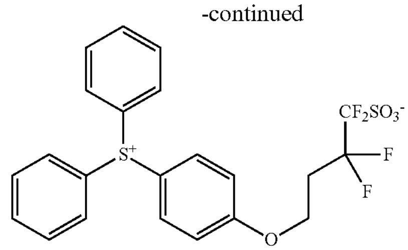

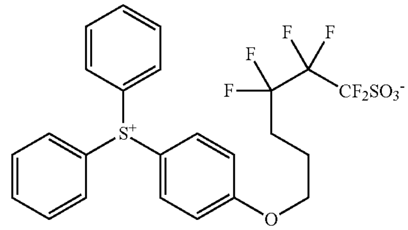

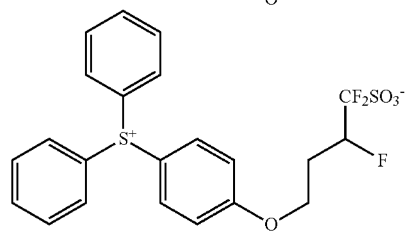

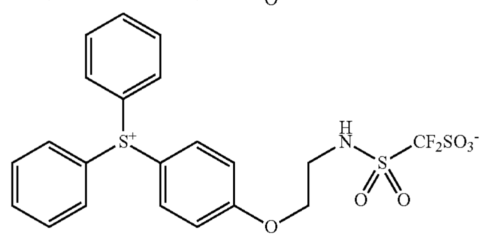

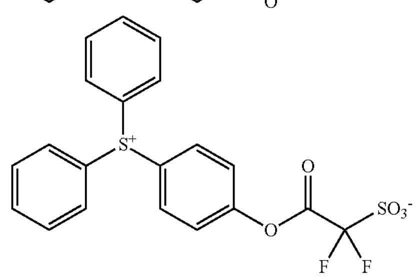

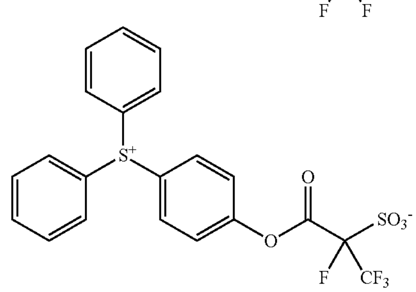

The acid generator of addition type may be used in an amount of 0 to 30 parts, preferably 0.5 to 30 parts, more preferably 1 to 20 parts by weight per 100 parts by weight of the base resin.

Organic Solvent

The resist composition may contain an organic solvent. Suitable organic solvents include ketones such as cyclohexanone, cyclopentanone, methyl-2-n-pentyl ketone, and diacetone alcohol; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, methyl lactate, ethyl lactate, n-butyl lactate, ethyl pyruvate, butyl acetate, methyl 3-methoxypropionate, ethyl 3-ethoxypropionate, t-butyl acetate, t-butyl propionate, propylene glycol mono-t-butyl ether acetate, methyl 2-hydroxyisobutyrate, isopropyl 2-hydroxyisobutyrate, isobutyl 2-hydroxyisobutyrate, and n-butyl 2-hydroxyisobutyrate; and lactones such as α-butyrolactone, which may be used alone or in admixture.

The organic solvent is preferably used in an amount of 50 to 10,000 parts, more preferably 100 to 5,000 parts by weight per 100 parts by weight of the base resin.

Quencher

To the resist composition, an amine compound may be added as quencher, if desired. As used herein, the quencher is a compound capable of holding down the diffusion rate of acid when the acid generated from PAG diffuses in the resist film. Addition of the quencher is effective for suppressing the diffusion rate, achieving a further improvement in resolution.

Examples of the quencher used herein include primary, secondary, and tertiary amine compounds as described in JP-A 2008-111103 (U.S. Pat. No. 7,537,880), paragraphs [0146]-[0164], specifically amine compounds having a hydroxyl, ether, ester, lactone, cyano or sulfonic ester group, and primary or secondary amine compounds protected with a carbamate group as described in JP 3790649. Such protected amine compounds are effective when the resist composition contains a base-labile component.

An onium salt having the formula (xa) or (xb) may also be useful as the quencher.

$$R^{q1}—SO_3^-Mq^+ \quad (xa)$$

$$R^{q2}—CO_2^-Mq^+ \quad (xb)$$

Herein $R^{q1}$ is hydrogen or a $C_1$-$C_{40}$ straight, branched or cyclic monovalent hydrocarbon group which may contain a heteroatom. Notably, those groups wherein the hydrogen atom bonded to the carbon atom at α- and/or β-position relative to the sulfo group is replaced by fluorine or fluoroalkyl are excluded. $R^{q2}$ is hydrogen or a $C_1$-$C_{40}$ straight, branched or cyclic monovalent hydrocarbon group which may contain a heteroatom.

$R^{q1}$ is hydrogen or a monovalent hydrocarbon group, examples of which include methyl, ethyl, propyl, isopropyl, n-butyl, s-butyl, t-butyl, t-pentyl, n-pentyl, n-hexyl, n-octyl, n-nonyl, n-decyl, cyclopentyl, cyclohexyl, 2-ethylhexyl, cyclopentylmethyl, cyclopentylethyl, cyclopentylbutyl, cyclohexylmethyl, cyclohexylethyl, cyclohexylbutyl, norbornyl, oxanorbornyl, tricyclo[5.2.1.0$^{2,6}$]decanyl, adamantyl, phenyl, naphthyl and anthracenyl. In these hydrocarbon groups, one or more hydrogen atoms may be replaced by a moiety containing a heteroatom such as oxygen, sulfur, nitrogen or halogen, or a carbon atom may be replaced by a moiety containing a heteroatom such as oxygen, sulfur or nitrogen, so that the group may contain a hydroxyl, cyano, carbonyl, ether bond, ester bond, sulfonic acid ester bond, carbonate bond, lactone ring, sultone ring, carboxylic anhydride or haloalkyl moiety.

$R^{q2}$ is hydrogen or a $C_1$-$C_{40}$ straight, branched or cyclic monovalent hydrocarbon group, examples of which include the substituent groups exemplified above for $R^{q1}$ as well as fluorinated alkyl groups such as trifluoromethyl and trifluoroethyl, and fluorinated aryl groups such as pentafluorophenyl and 4-trifluoromethylphenyl.

Examples of the anion moiety in formula (xa) include the following structures, but are not limited thereto.

$CH_3SO_3^-$ $CH_3CH_2SO_3^-$

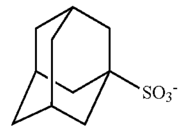

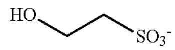

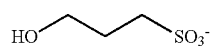

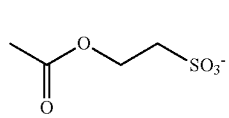

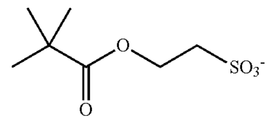

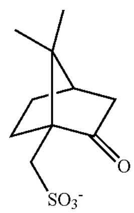

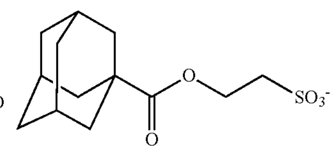

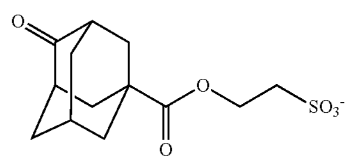

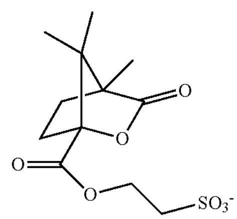

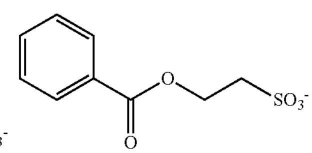

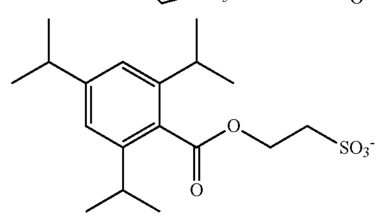

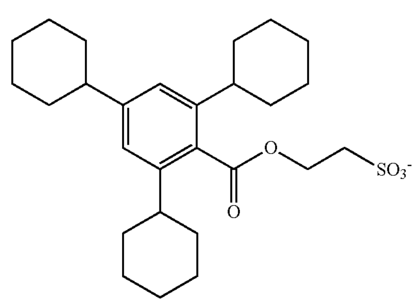

-continued
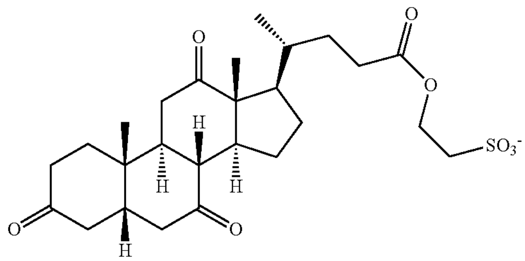
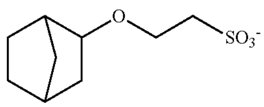
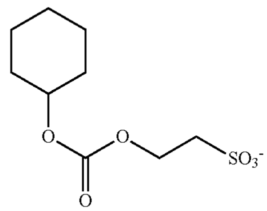
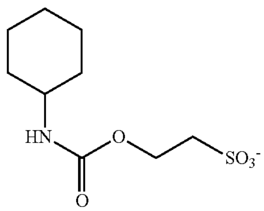
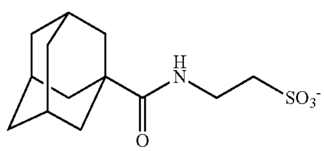
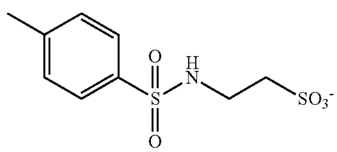
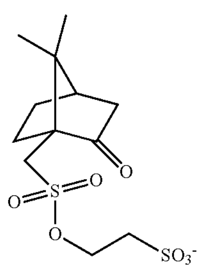
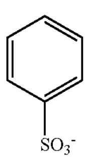
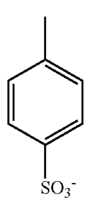
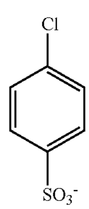
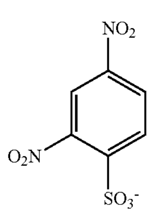
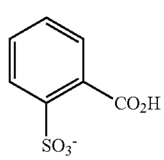
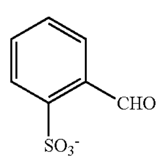
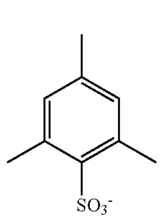
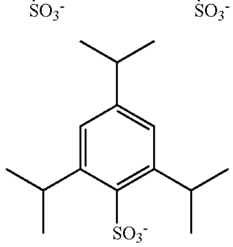
-continued
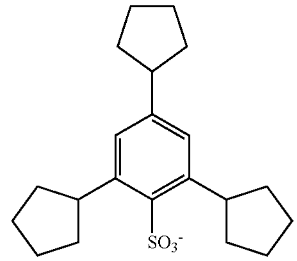
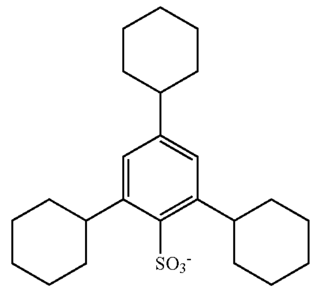
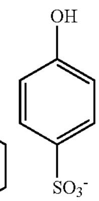
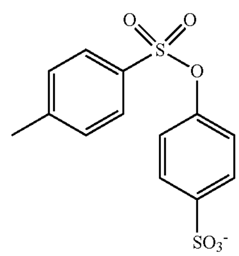
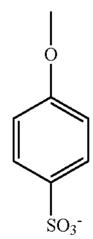
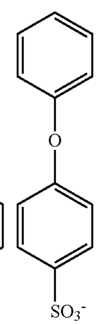
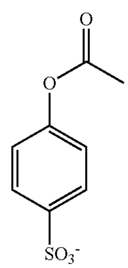
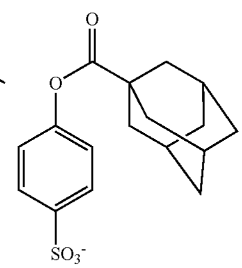
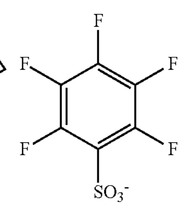
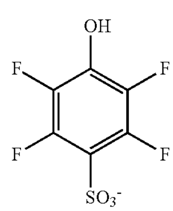
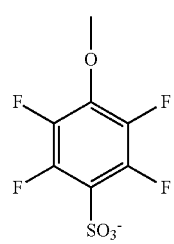
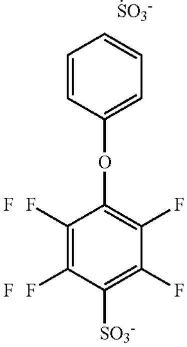
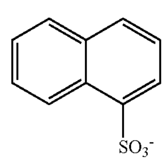
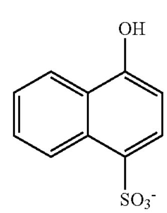
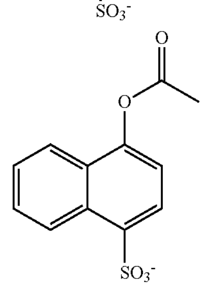

-continued
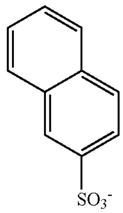
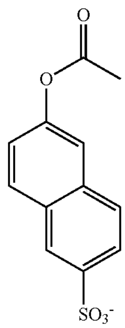
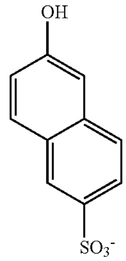
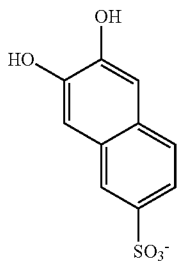
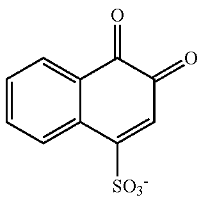
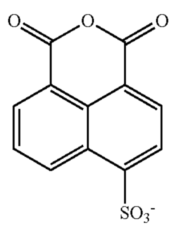
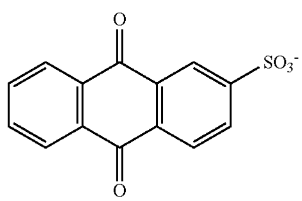
-continued
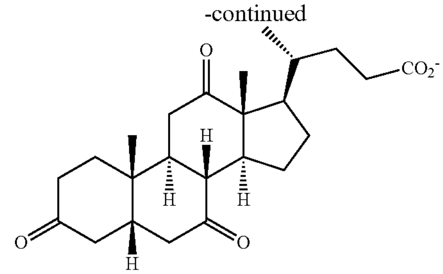
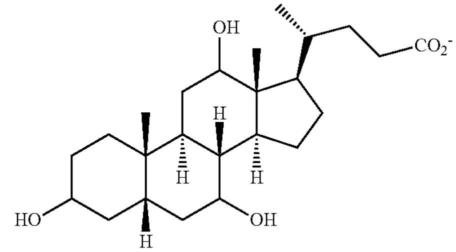
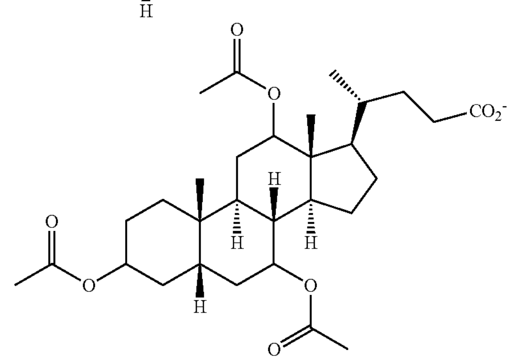
Examples of the anion moiety in formula (xb) include the following structures, but are not limited thereto.
$CH_3CO_2^-$ $CH_3CH_2CO_2^-$ $CH_3CH(CH_3)CO_2^-$
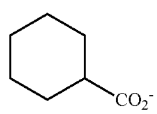
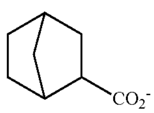
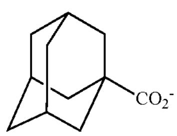
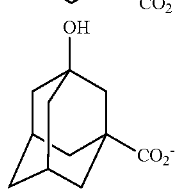
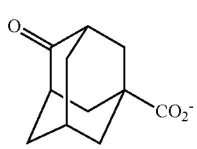
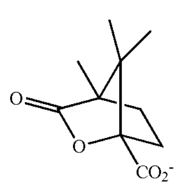
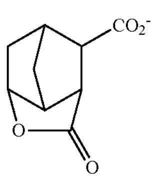
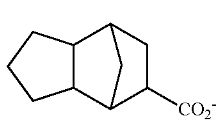
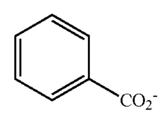
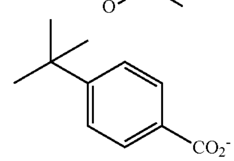
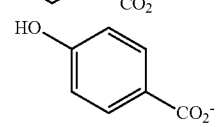
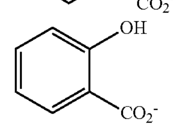
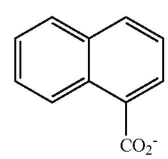
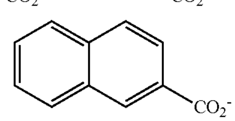
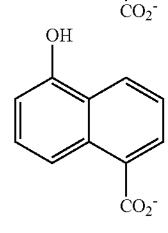
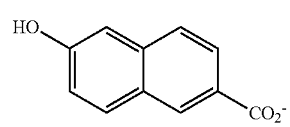
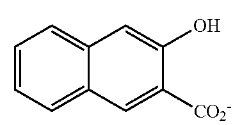
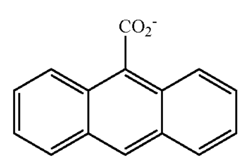
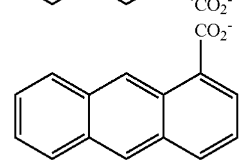

-continued

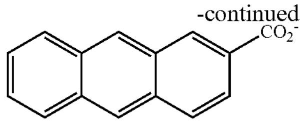

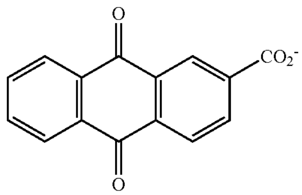

$CF_3CO_2^-$ $CF_3CH_2CO_2^-$ $CF_3CF_2CO_2^-$ $CF_3C(CF_3)(OH)CO_2^-$

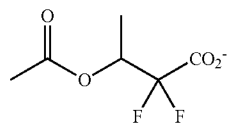

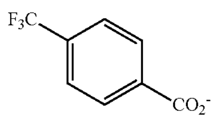

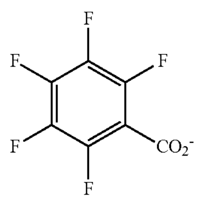

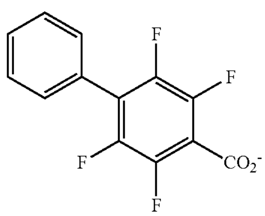

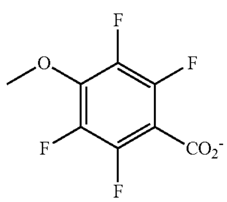

In formulae (xa) and (xb), $Mq^+$ is an onium cation having the formula (xc), (xd) or (xe).

$$R^{201}-S^+(-R^{203})-R^{202} \quad \text{(xc)}$$

$$R^{204}-I^+-R^{205} \quad \text{(xd)}$$

$$R^{206}-N^+(R^{207})(R^{208})-R^{209} \quad \text{(xe)}$$

Herein $R^{201}$ to $R^{209}$ are each independently a $C_1$-$C_{40}$ straight, branched or cyclic monovalent hydrocarbon group which may contain a heteroatom, or a pair of $R^{201}$ and $R^{202}$, or $R^{206}$ and $R^{207}$ may bond together to form a ring with the sulfur or nitrogen atom to which they are attached. Examples of monovalent hydrocarbon groups $R^{201}$ to $R^{209}$ are as exemplified above for $R^{q1}$ in formula (xa).

Examples of the onium cation having formula (xc) include the following structures, but are not limited thereto.

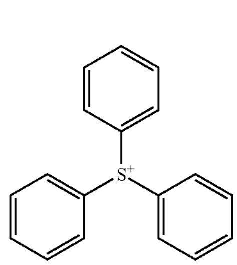

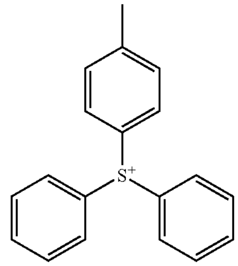

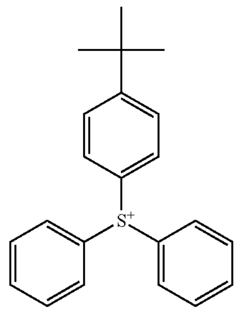

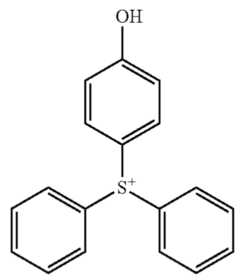

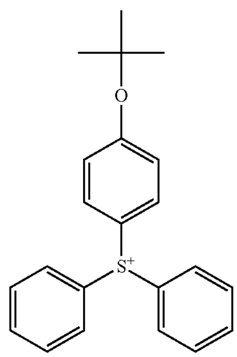

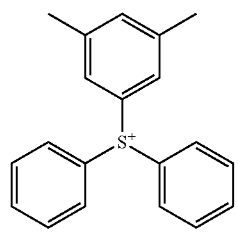

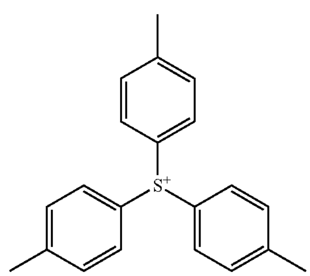

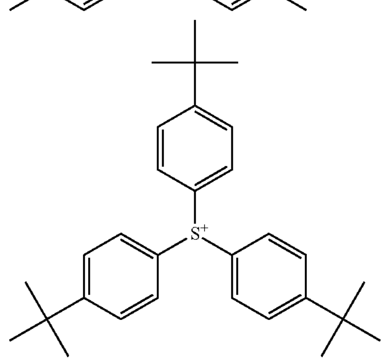

-continued
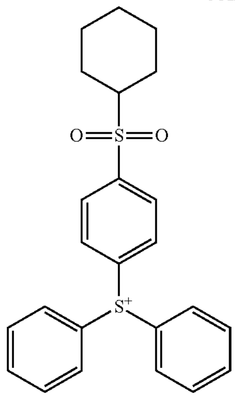
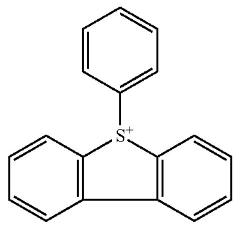
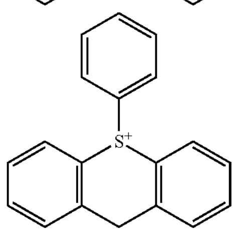
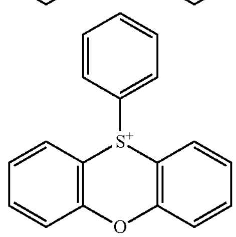
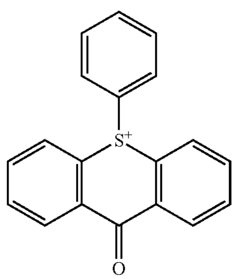
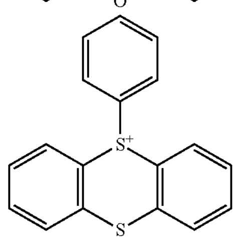
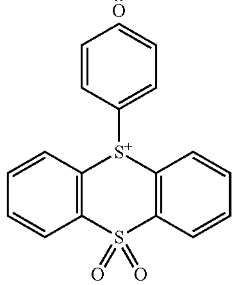
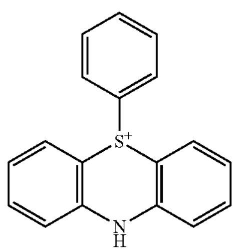
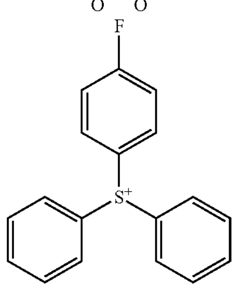
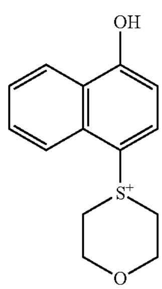
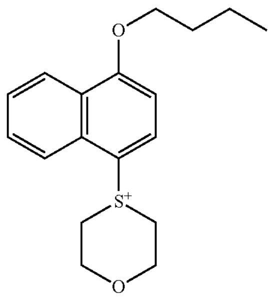
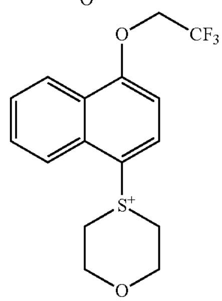
-continued
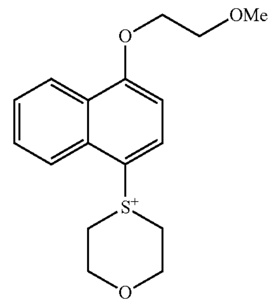
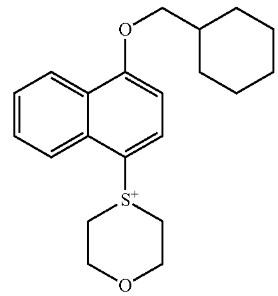
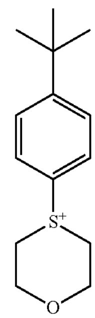
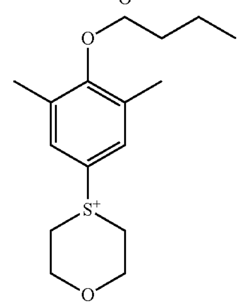
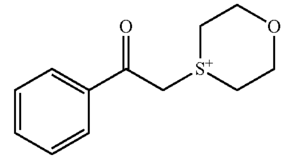
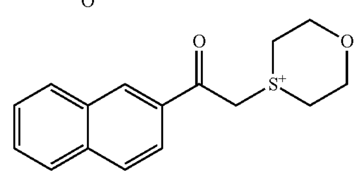
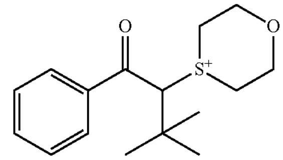
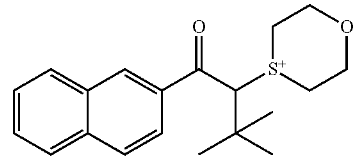
Examples of the onium cation having formula (xd) include the following structures, but are not limited thereto.
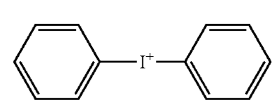
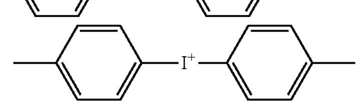

-continued

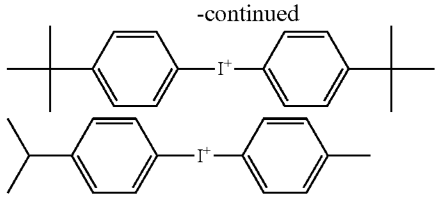

Examples of the onium cation having formula (xe) include the following structures, but are not limited thereto.

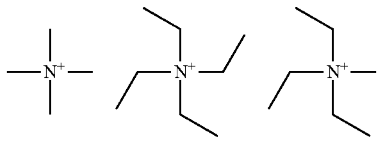

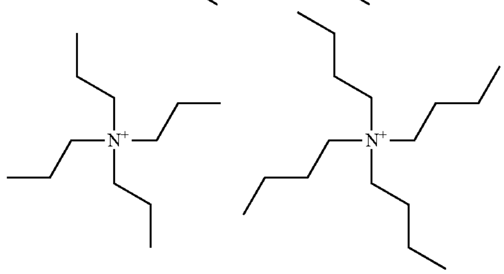

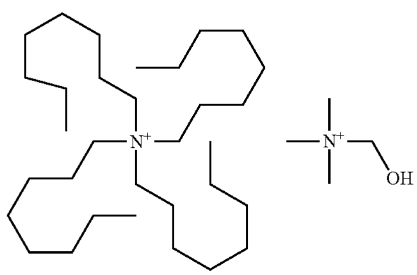

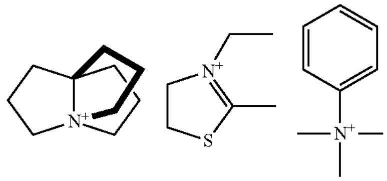

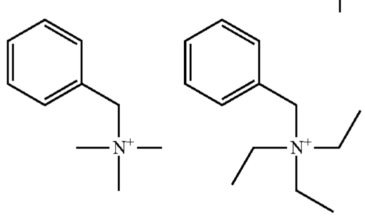

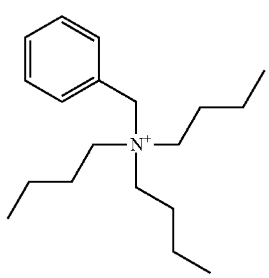

Examples of the onium salt having formula (xa) or (xb) include any combinations of the anion with the cation, both exemplified above. These onium salts may be readily prepared via ion exchange reaction by any well-known organic chemistry techniques. With respect to the ion exchange reaction, reference may be made to JP-A 2007-145797.

The onium salt having formula (xa) or (xb) functions as the acid diffusion regulator or quencher in the resist composition because the counter anion of the onium salt is a conjugated base of weak acid. As used herein, the weak acid indicates an acidity insufficient to deprotect an acid labile group from an acid labile group-containing unit in the base resin. The onium salt having formula (xa) or (xb) functions as a quencher when used in combination with an onium salt type PAG having a conjugated base of a strong acid, typically a sulfonic acid which is fluorinated at α-position as the counter anion. In a system using a mixture of an onium salt capable of generating a strong acid (e.g., α-position fluorinated sulfonic acid) and an onium salt capable of generating a weak acid (e.g., α-position non-fluorinated sulfonic acid or carboxylic acid), if the strong acid generated from the PAG upon exposure to high-energy radiation collides with the unreacted onium salt having a weak acid anion, then a salt exchange occurs whereby the weak acid is released and an onium salt having a strong acid anion is formed. In this course, the strong acid is exchanged into the weak acid having a low catalysis, incurring apparent deactivation of the acid for enabling to control acid diffusion.

If a PAG capable of generating a strong acid is an onium salt, an exchange from the strong acid generated upon exposure to high-energy radiation to a weak acid as above can take place, but it scarcely happens that the weak acid generated upon exposure to high-energy radiation collides with the unreacted onium salt capable of generating a strong acid to induce a salt exchange. This is because of a likelihood of an onium cation forming an ion pair with a stronger acid anion.

A compound having the formula (YA) may be used as an onium salt of weak acid.

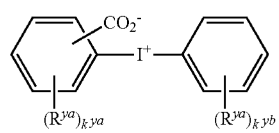

(YA)

Herein $R^{ya}$ and $R^{yb}$ are each independently a $C_1$-$C_{12}$ monovalent hydrocarbon group, nitro, $C_2$-$C_{12}$ acyl, $C_1$-$C_{12}$ alkoxy or $C_2$-$C_{12}$ acyloxy group, $k^{ya}$ and $k^{yb}$ each are an integer of 0 to 4.

Examples of the onium salt of weak acid having formula (YA) are given below, but not limited thereto.

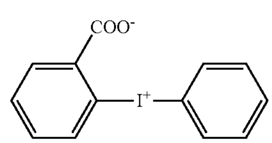

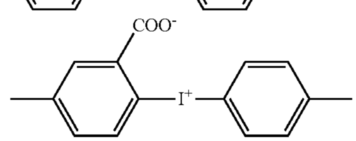

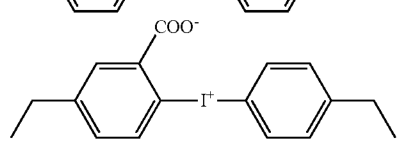

-continued

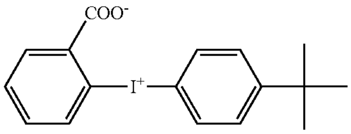
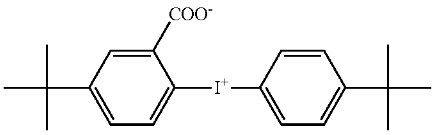
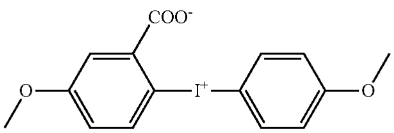
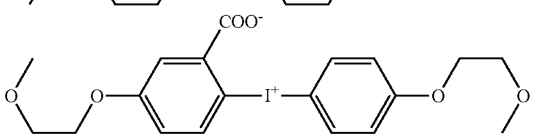
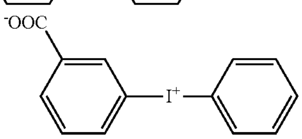
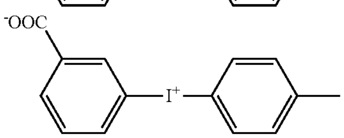
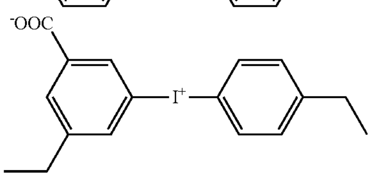
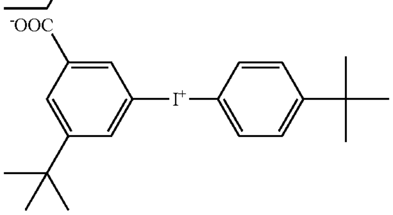
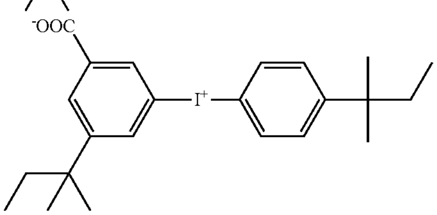
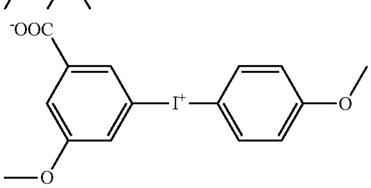
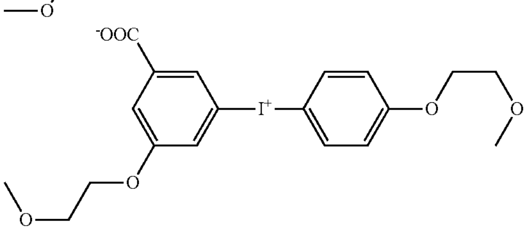

-continued

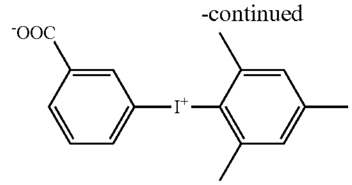
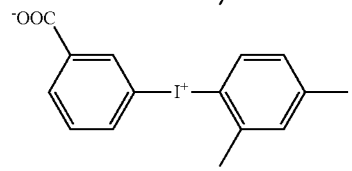
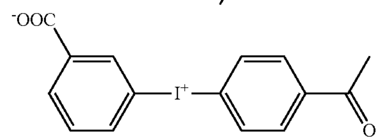
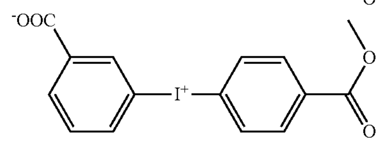
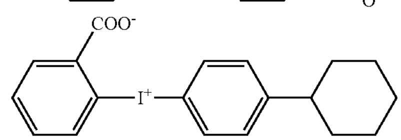
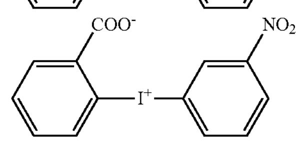
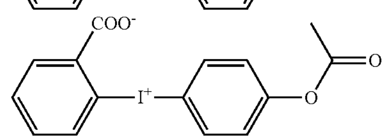

An amount of the quencher is 0 to 100 parts, preferably 0.001 to 100 parts, more preferably 0.001 to 50 parts by weight per 100 parts by weight of the base resin.

Surfactant

The resist composition may further contain a surfactant. Useful surfactants are described in JP-A 2008-111103, paragraphs [0165]-[0166]. Addition of a surfactant may improve or control the coating characteristics of the resist composition. The amount of the surfactant may be selected as appropriate for a particular purpose.

Dissolution Regulator

The resist composition may further contain a dissolution regulator. Useful dissolution regulators are described in JP-A 2008-122932, paragraphs [0155]-[0178]. Inclusion of a dissolution regulator may lead to an increased difference in dissolution rate between exposed and unexposed regions and a further improvement in resolution. An amount of the dissolution regulator is preferably 0 to 50 parts, more preferably 0 to 40 parts by weight per 100 parts by weight of the base resin.

The resist composition may further contain an acetylene alcohol. Useful acetylene alcohols are described in JP-A 2008-122932, paragraphs [0179]-[0182]. The amount of the acetylene alcohol may be selected as appropriate for a particular purpose.

Water Repellency Improver

To the resist composition, a polymeric additive may be added for improving the water repellency on surface of a resist film as spin coated. This water repellency improver may be used in the topcoatless immersion lithography. The water repellency improver has a specific structure with a 1,1,1,3,3,3-hexafluoro-2-propanol residue and is described in JP-A 2007-297590, JP-A 2008-111103, JP-A 2008-122932, JP-A 2012-128067, and JP-A 2013-057836.

Preferred as the water repellency improver are a homopolymer consisting of fluorine-containing units of one type, a copolymer consisting of fluorine-containing units of more than one type, and a copolymer consisting of fluorine-containing units and other units. Suitable fluorine-containing units and other units are shown below, but not limited thereto. Notably $R^B$ is hydrogen or methyl.

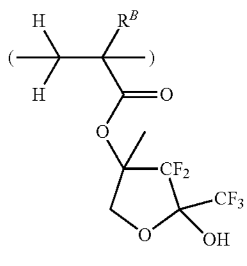
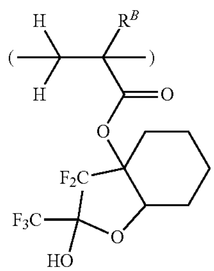
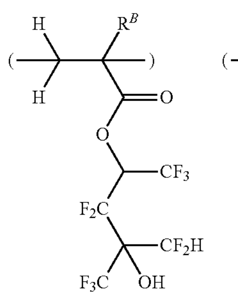
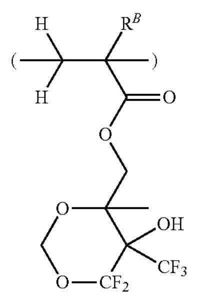
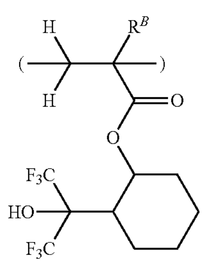
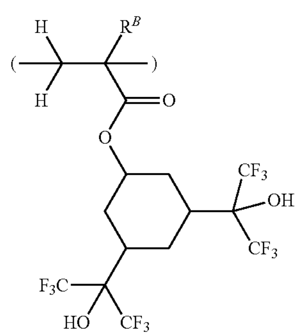
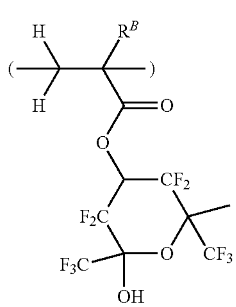
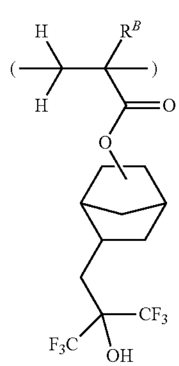

-continued

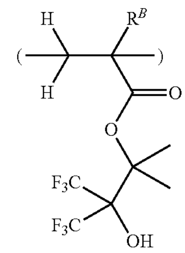
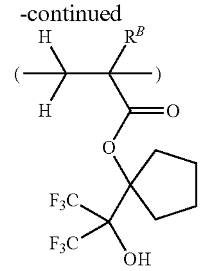
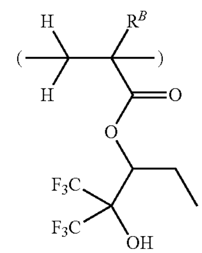
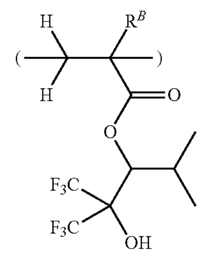
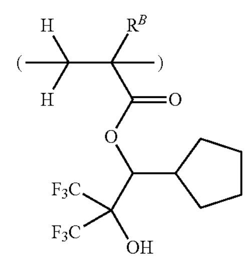
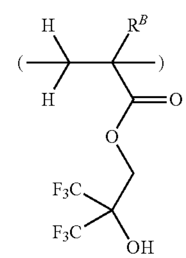
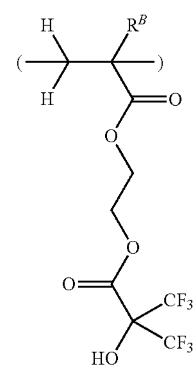
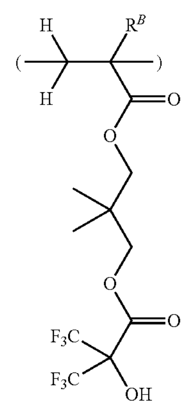
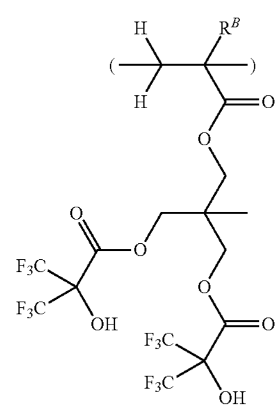
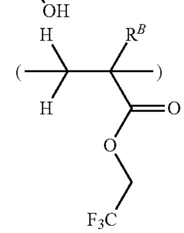

-continued
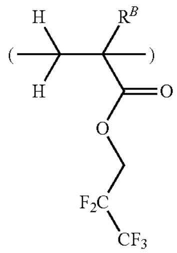
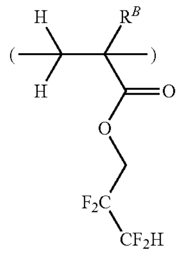
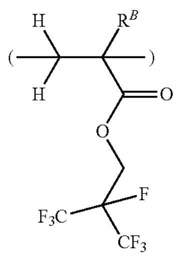
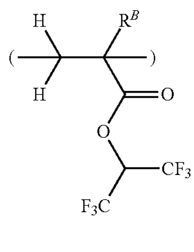
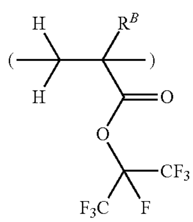
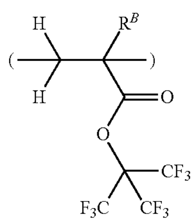
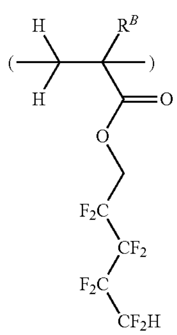
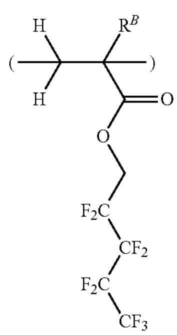
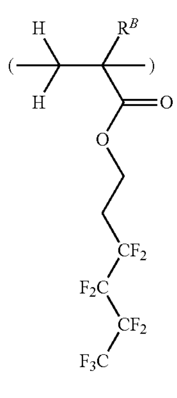
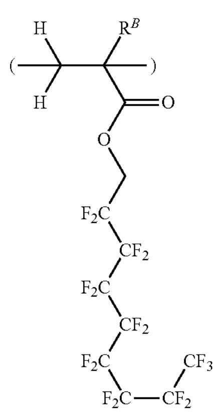
-continued
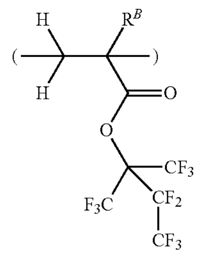
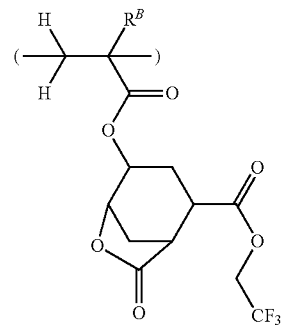
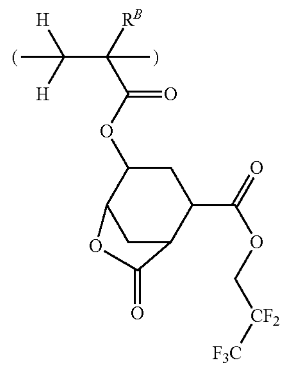
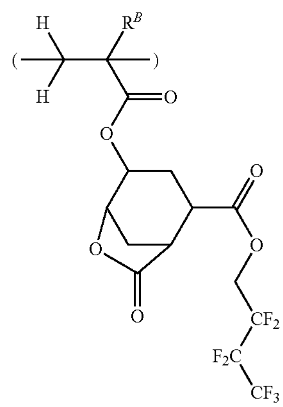
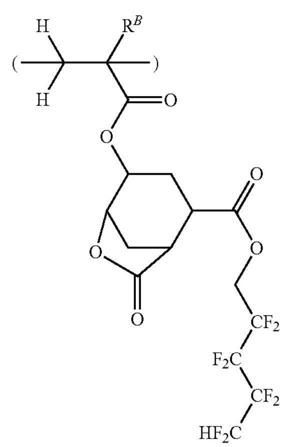

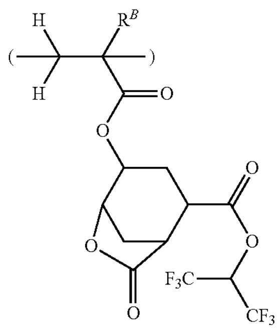
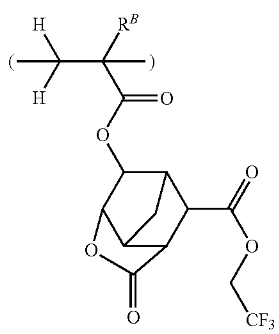
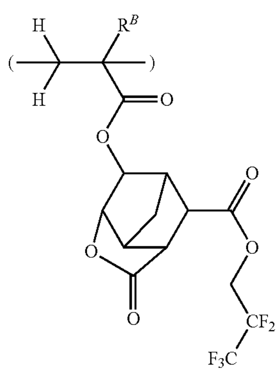
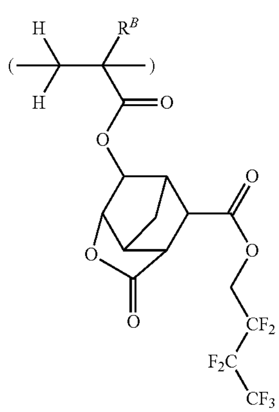
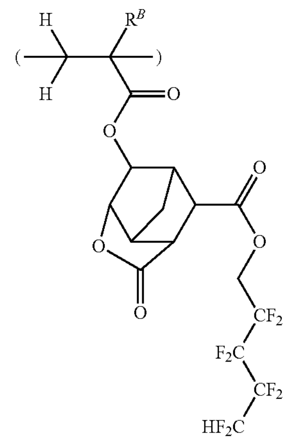
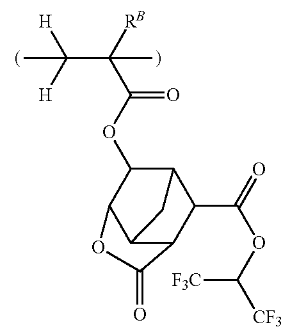
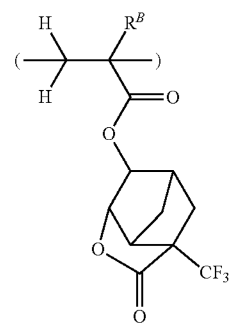
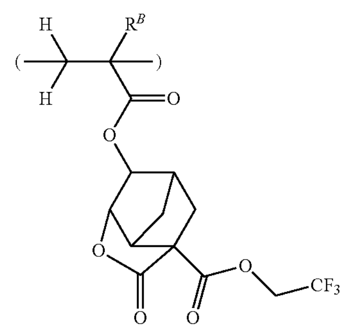
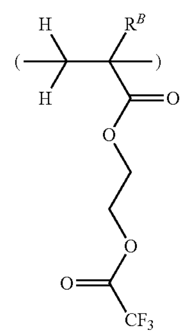
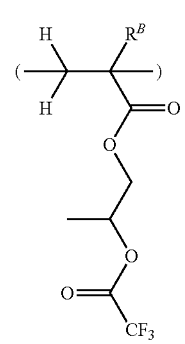
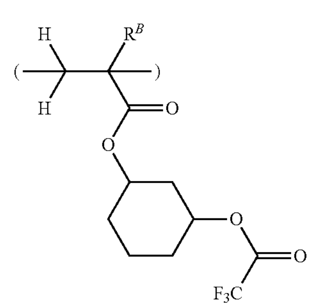

-continued
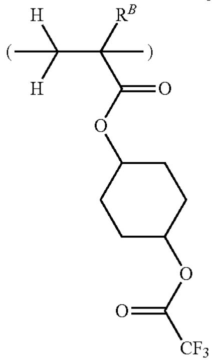
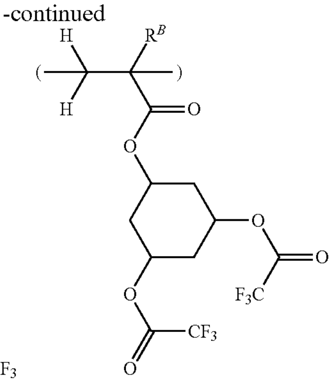
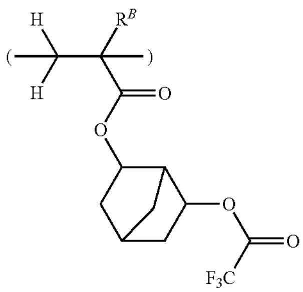
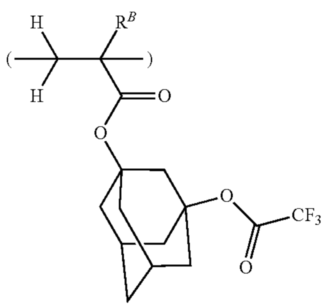
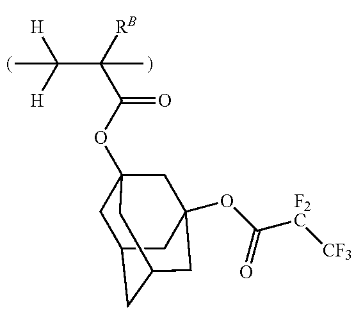
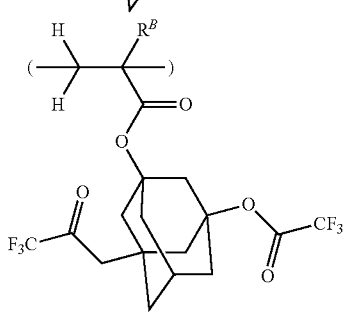
-continued
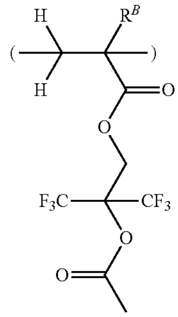
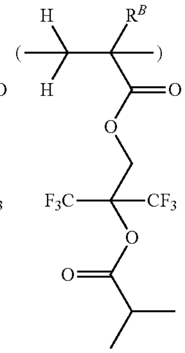
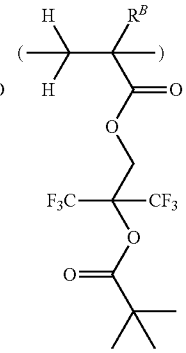
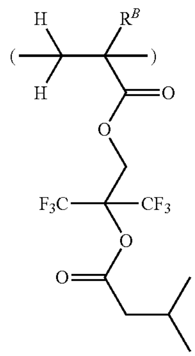
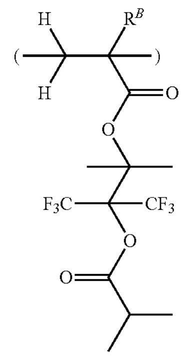
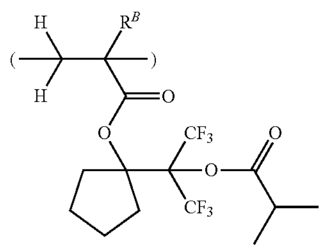
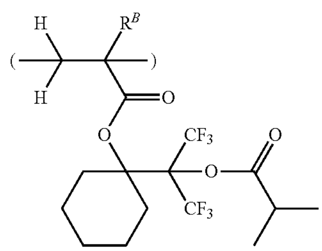
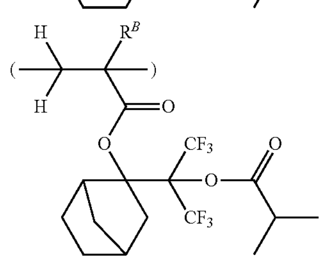
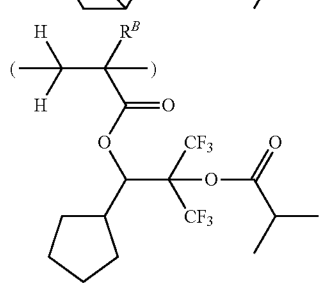

-continued
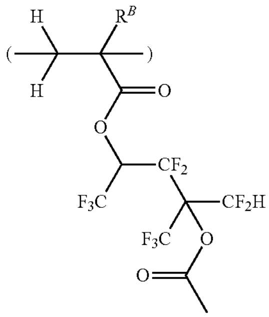
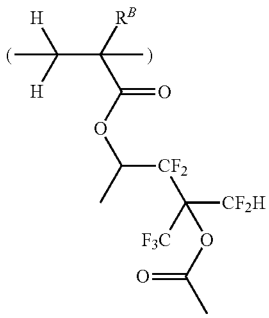
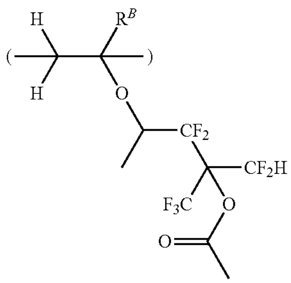
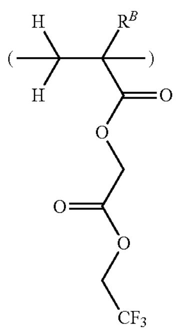
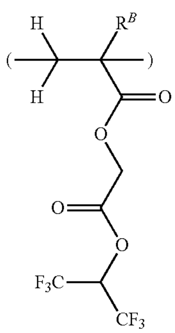
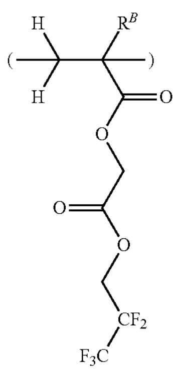
lp;1p
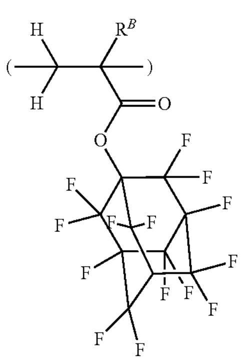
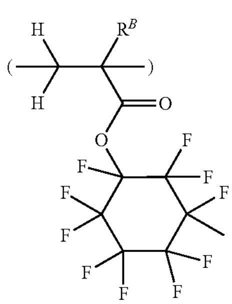
-continued
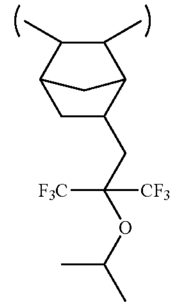
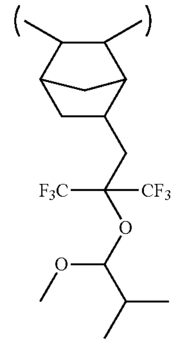
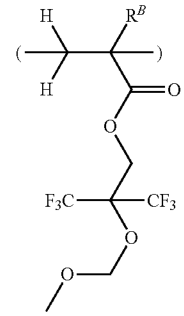
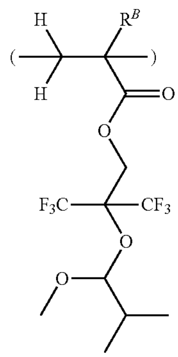
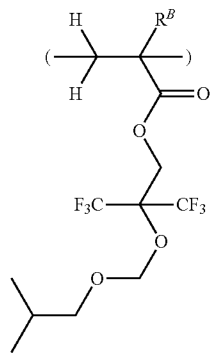
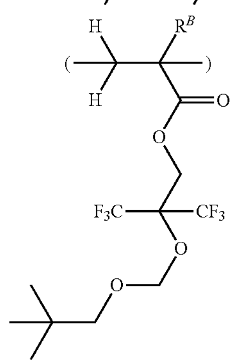
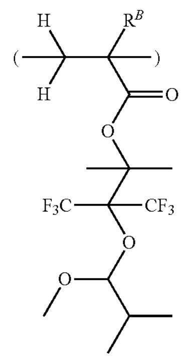
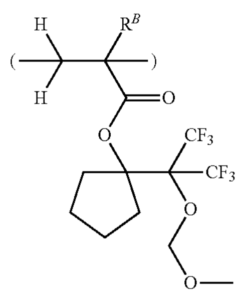
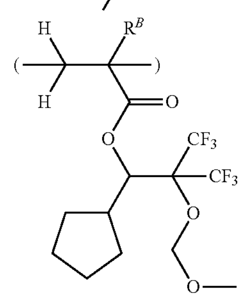
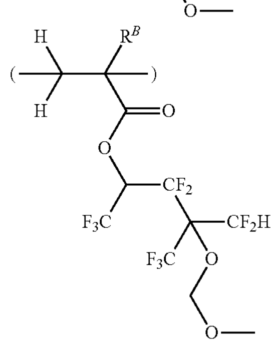
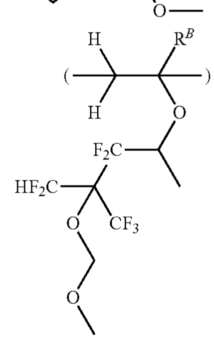

-continued
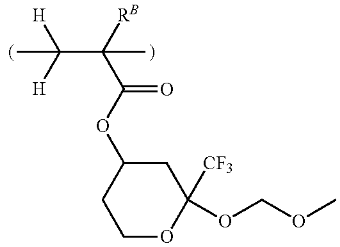
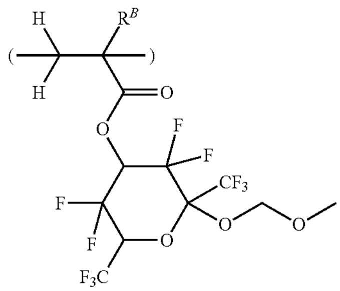
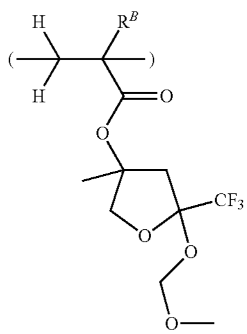
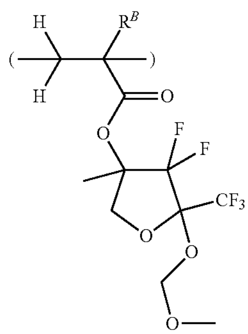
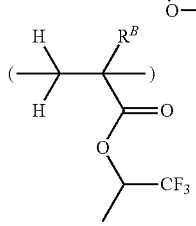
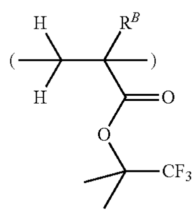
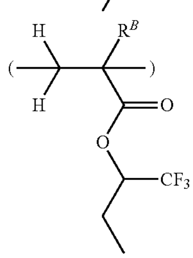
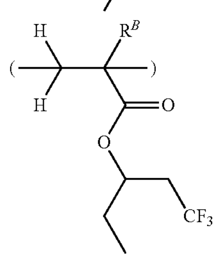
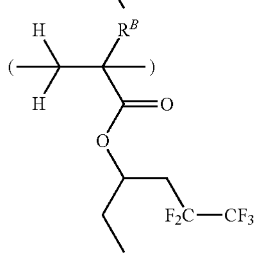
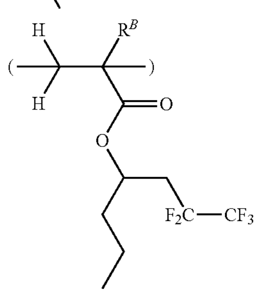
-continued
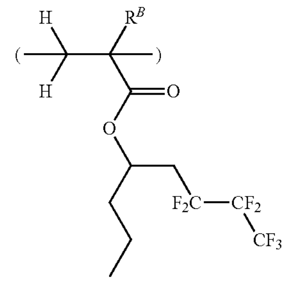
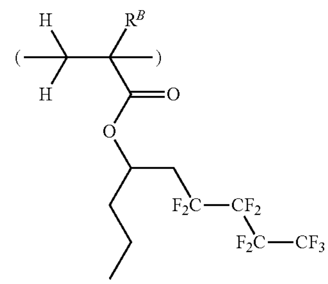
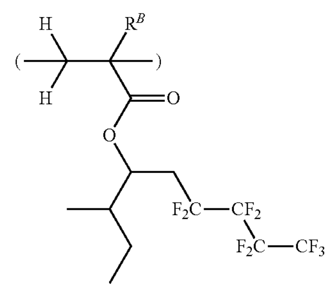
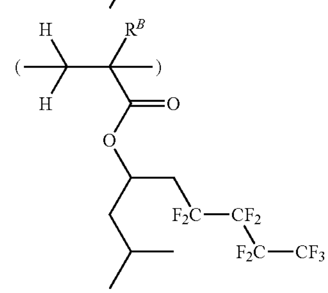
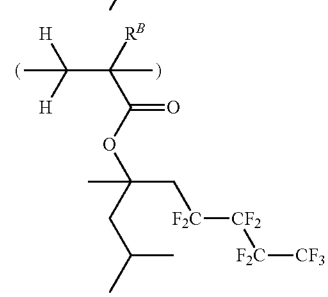
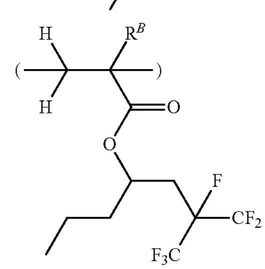

-continued
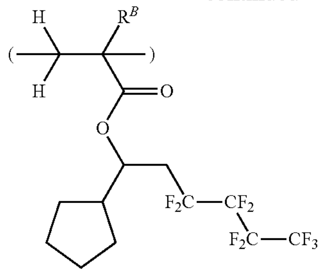
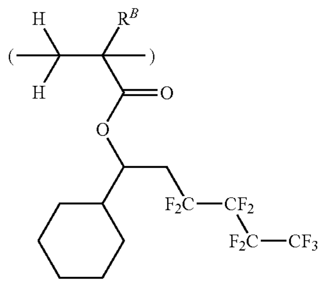
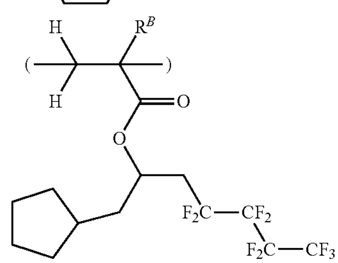
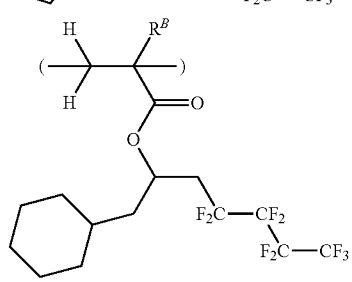
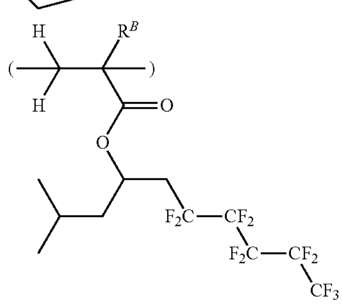
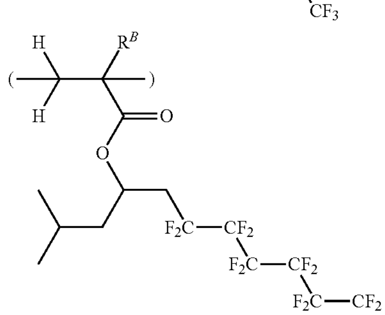
-continued
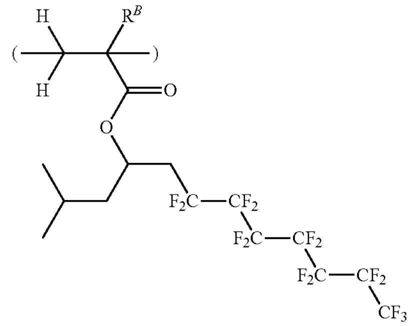
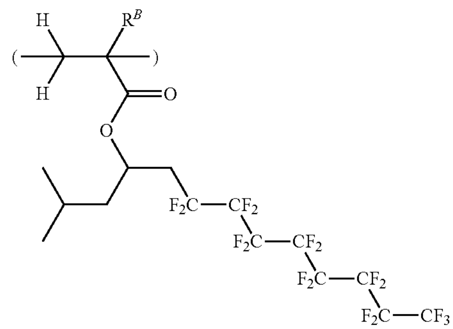
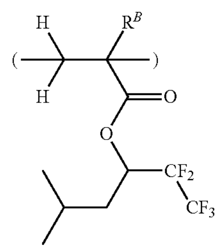
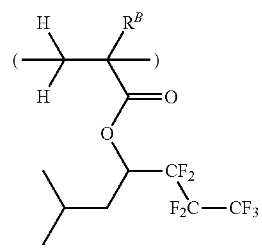
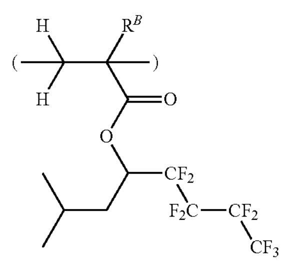
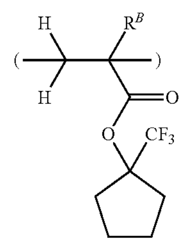
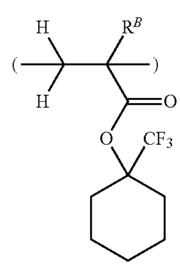
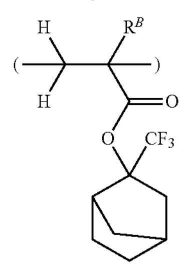
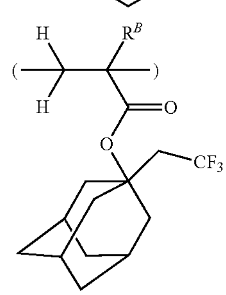
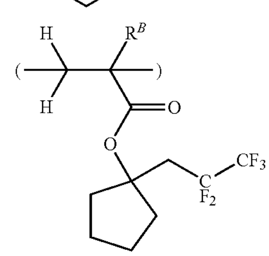

-continued
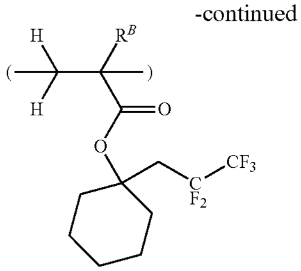
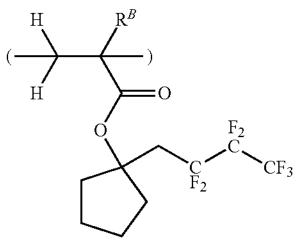
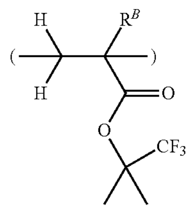
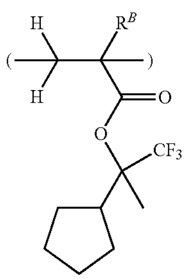
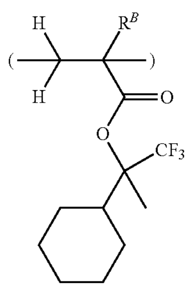
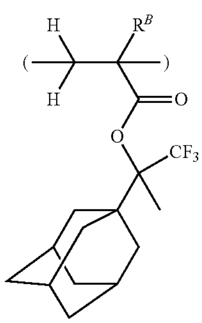
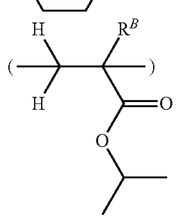
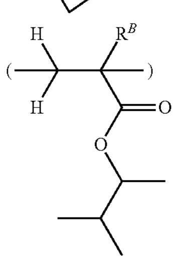
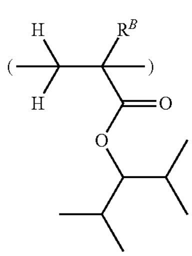
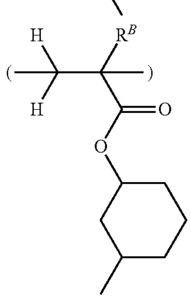
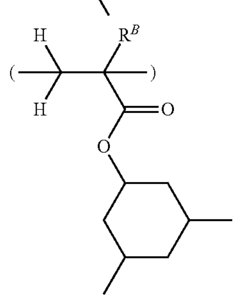
-continued
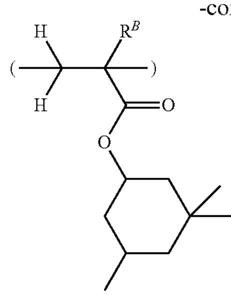
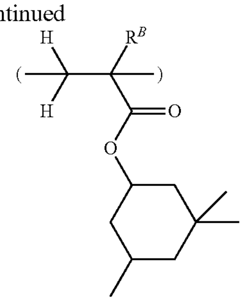
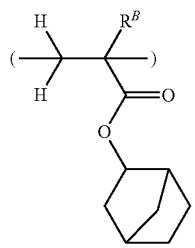
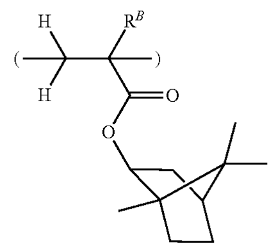
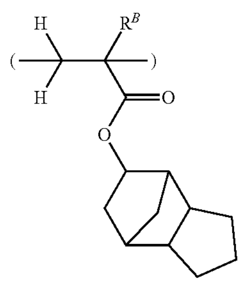
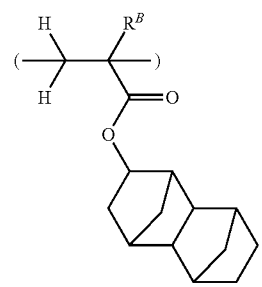
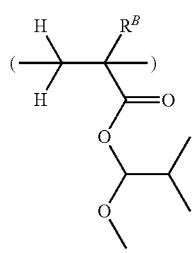
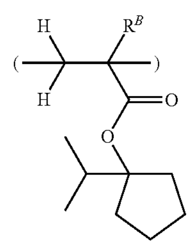
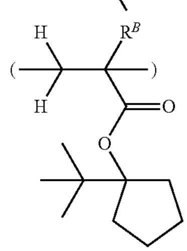
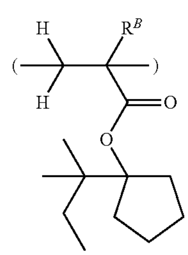
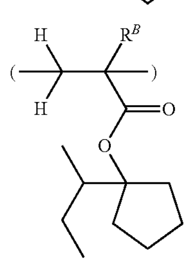
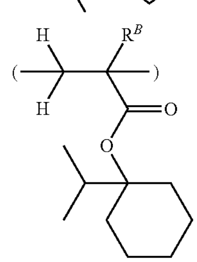

-continued

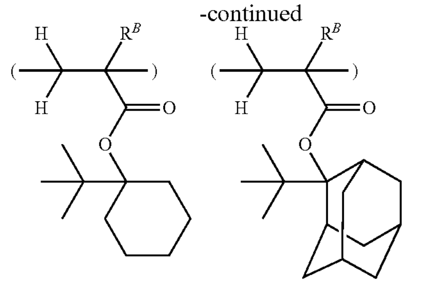

The water repellency improver to be added to the resist composition should be soluble in alkaline aqueous solution as the developer. The water repellency improver of specific structure with a 1,1,1,3,3,3-hexafluoro-2-propanol residue is well soluble in the developer. A polymer having an amino group or amine salt copolymerized as recurring units may serve as the water repellent additive and is effective for preventing evaporation of acid during PEB, any hole pattern opening failure after development, and bridging of a line-and-space pattern. An amount of the water repellency improver is 0 to 20 parts, preferably 0.1 to 20 parts, more preferably 0.5 to 10 parts by weight per 100 parts by weight of the base resin.

Crosslinker

The resist composition may further contain a crosslinker, which invites crosslinking reaction to facilitate formation of a negative pattern via a polarity switch of the inventive polymer. Suitable crosslinkers are described in JP-A 2006-145755. The crosslinker is preferably used in such an amount as not to interfere with high resolution performance due to a polarity switch and solubility change induced by dehydration reaction of the recurring unit derived from the inventive monomer. An amount of the crosslinker is 0 to 30 parts, preferably 1 to 30 parts, more preferably 3 to 20 parts by weight per 100 parts by weight of the base resin.

Process

The resist composition comprising the inventive polymer, typically chemically amplified resist composition comprising the inventive polymer, an acid generator, a quencher and other components in an organic solvent is used in the fabrication of various integrated circuits. Pattern formation using the resist composition may be performed by well-known lithography processes. The process generally involves coating, prebaking, exposure, PEB, and development. If necessary, any additional steps may be added.

The negative resist composition is first applied onto a substrate on which an integrated circuit is to be formed (e.g., Si, $SiO_2$, SiN, SiON, TiN, WSi, BPSG, SOG, or a multilayer film including silicon-containing antireflective coating or organic hydrocarbon film) or a substrate on which a mask circuit is to be formed (e.g., Cr, CrO, CrON, $MoSi_2$, or $SiO_2$) by a suitable coating technique such as spin coating, roll coating, flow coating, dipping, spraying or doctor coating. The coating is prebaked on a hot plate preferably at a temperature of 60 to 150° C. for 10 seconds to 30 minutes, more preferably at 80 to 120° C. for 30 seconds to 20 minutes. The resulting resist film is generally 0.01 to 2 m thick.

The resist film is then exposed to a desired pattern of high-energy radiation such as UV, deep-UV, EB, x-ray, excimer laser light, γ-ray, synchrotron radiation, EUV or soft x-ray, directly or through a mask. The exposure dose is preferably about 1 to 200 mJ/$cm^2$, more preferably about 10 to 100 mJ/$cm^2$, or about 0.1 to 100 μC/$cm^2$, more preferably about 0.5 to 50 μC/$cm^2$. The resist film is further baked (PEB) on a hot plate preferably at 60 to 150° C. for 10 seconds to 30 minutes, more preferably at 80 to 120° C. for 30 seconds to 20 minutes.

Thereafter the resist film is developed in an alkaline developer for 3 seconds to 3 minutes, preferably 5 seconds to 2 minutes by conventional techniques such as dip, puddle and spray techniques. A typical developer is a 0.1 to 10 wt %, preferably 2 to 5 wt % aqueous solution of tetramethylammonium hydroxide (TMAH), tetraethylammonium hydroxide (TEAH), tetrapropylammonium hydroxide (TPAH), or tetrabutylammonium hydroxide (TBAH). The resist film in the exposed region is not dissolved in the developer whereas the resist film in the unexposed region is dissolved. In this way, the desired negative pattern is formed on the substrate. After the development step, the patterned resist film is rinsed with water, preferably for 3 seconds to 3 minutes, more preferably 5 seconds to 2 minutes, by conventional techniques such as dip, puddle and spray techniques. It is appreciated that the resist composition of the invention is best suited for micro-patterning using such high-energy radiation as KrF and ArF excimer laser, EB, EUV, soft x-ray, x-ray, γ-ray and synchrotron radiation.

A hole or trench pattern after development may be shrunk by the thermal flow, RELACS® or DSA process. A hole pattern is shrunk by coating a shrink agent thereto, and baking such that the shrink agent may undergo crosslinking at the resist surface as a result of the acid catalyst diffusing from the resist layer during bake, and the shrink agent may attach to the sidewall of the hole pattern. The bake is preferably at a temperature of 70 to 180° C., more preferably 80 to 170° C., for a time of 10 to 300 seconds. The extra shrink agent is stripped and the hole pattern is shrunk.

EXAMPLE

Examples of the invention are given below by way of illustration and not by way of limitation. The abbreviation "pbw" is parts by weight, THF stands for tetrahydrofuran, PGME for propylene glycol monomethyl ether, and NMP for N-methyl-2-pyrrolidone. For all polymers, Mw and Mn are determined versus polystyrene standards by GPC using THF solvent, and dispersity Mw/Mn is computed therefrom.

[1] Synthesis of Polymerizable Monomers

Example 1

Synthesis of Monomer 1

Monomer 1 was synthesized according to the following scheme.

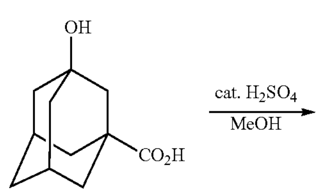

Reactant 1

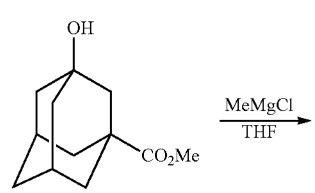

Intermediate 1

-continued

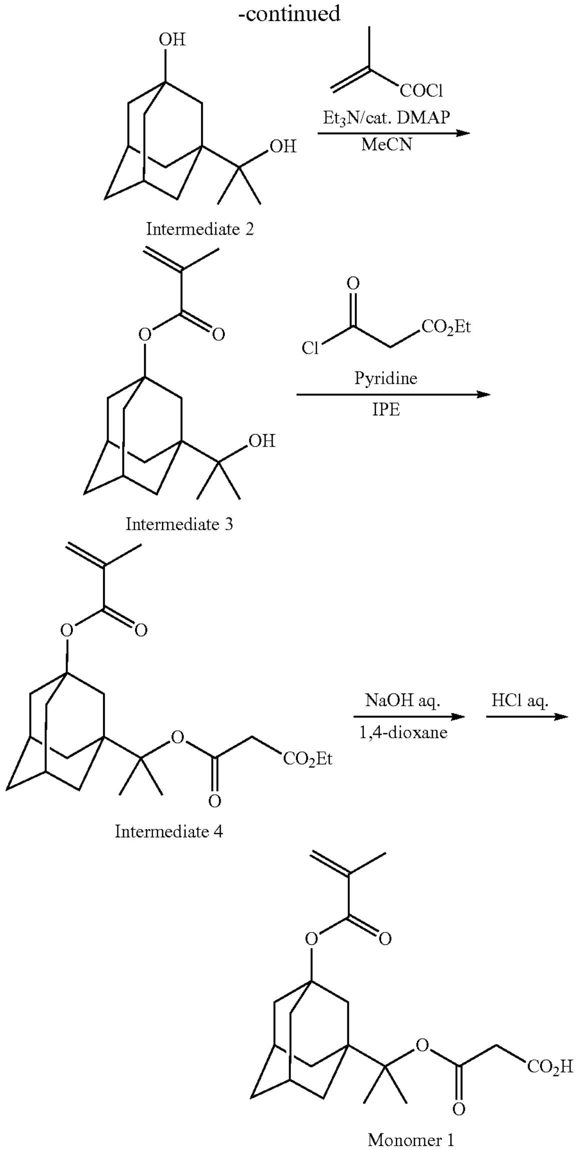

Example 1-1

Synthesis of Intermediate 1

In nitrogen atmosphere, 210 g of Reactant 1 was dissolved in 800 mL of methanol. Then, 4.9 g of sulfuric acid was added as catalyst to the solution, which was heated under reflux for 12 hours. The reaction solution was cooled, after which 17.6 g of 25 wt % sodium hydroxide aqueous solution was added to quench the reaction. Methanol was distilled off, after which the residue was dissolved in 200 mL of ethyl acetate. This was followed by ordinary aqueous workup, solvent distillation, and vacuum distillation, obtaining 205 g (yield 97%) of Intermediate 1 as colorless transparent oily matter. Intermediate 1 was used in the subsequent reaction without further purification.

Example 1-2

Synthesis of Intermediate 2

In nitrogen atmosphere, 1,300 mL of a THF solution of methylmagnesium chloride (3.0 mol/L) was diluted with 3,200 mL of THF. A solution of 205 g of Intermediate 1 in 400 mL of THF was added dropwise to the dilution at 25-45° C., which was stirred at 60° C. for 2.5 hours. Once the reaction solution was ice cooled, a mixture of 390 g of ammonium chloride and 3,260 g of 3.0 wt % hydrochloric acid aqueous solution was added dropwise to quench the reaction. This was followed by ordinary aqueous workup, solvent distillation, vacuum distillation, and recrystallization from a 20/1 mixture of hexane and acetone, obtaining 173 g (yield 84%) of Intermediate 2 as white crystal.

Example 1-3

Synthesis of Intermediate 3

In nitrogen atmosphere, 71 g of methacrylic acid chloride was added dropwise to a solution of 89 g of Intermediate 2, 86 g of triethylamine, and 5.17 g of dimethylaminopyridine in 430 mL of acetonitrile at 35-45° C. The solution was aged at 60° C. for 12 hours. Once the reaction solution was ice cooled, 600 mL of saturated sodium bicarbonate aqueous solution was added dropwise to quench the reaction. This was followed by extraction with 450 mL of toluene, ordinary aqueous workup, solvent distillation, and purification by silica gel column chromatography, obtaining 108 g (yield 92%) of Intermediate 3 as yellow oily matter.

The product was analyzed by IR and $^1$H-NMR spectroscopy, with the results shown below.

IR (D-ATR): ν=3521, 2975, 2914, 2864, 1711, 1635, 1452, 1375, 1328, 1312, 1302, 1178, 1106, 1079, 1051, 1009, 996, 985, 940, 913, 878, 863, 815, 761, 647, 574 $cm^{-1}$ $^1$H-NMR (600 MHz in DMSO-d6):

δ=5.91 (1H, s), 5.56 (1H, s), 4.00 (1H, s), 2.18 (2H, s), 2.04 (2H, d), 1.93 (2H, d), 1.90 (2H, s), 1.81 (3H, s), 1.59-1.49 (6H, m), 1.41 (6H, s) ppm Example 1-4

Synthesis of Intermediate 4

In nitrogen atmosphere, 25 g of ethylmalonyl chloride was added dropwise to a solution of 36 g of Intermediate 3 and 14 g of pyridine in 180 mL of diisopropyl ether (IPE) at an internal temperature below 20° C. The solution was aged at room temperature for 4 hours. Once the reaction solution was ice cooled, 150 mL of water was added dropwise to quench the reaction. This was followed by extraction with 100 mL of a 2/1 mixture of toluene and ethyl acetate, ordinary aqueous workup, solvent distillation, and purification by silica gel column chromatography, obtaining 47 g (yield 92%) of Intermediate 4 as colorless oily matter.

The product was analyzed by IR and $^1$H-NMR spectroscopy, with the results shown below.

IR (D-ATR): ν=2988, 2916, 2866, 1747, 1730, 1636, 1455, 1411, 1388, 1369, 1328, 1314, 1301, 1275, 1225, 1171, 1131, 1083, 1035, 1010, 943, 907, 861, 814, 779, 590 $cm^{-1}$ $^1$H-NMR (600 MHz in DMSO-d6):

δ=5.92 (1H, s), 5.58 (1H, s), 4.08 (2H, q), 3.37 (2H, s), 2.21 (2H, s), 2.10 (2H, d), 1.95-1.92 (4H, m), 1.81 (3H, s), 1.55-1.47 (6H, m), 1.41 (6H, s), 1.18 (3H, t) ppm Example 1-5

Synthesis of Monomer 1

In nitrogen atmosphere, a solution of 45 g of Intermediate 4 in 200 g of 1,4-dioxane was ice cooled, and 18.2 g of 25 wt % sodium hydroxide aqueous solution was added dropwise. The solution was aged at room temperature for 3 hours. Toluene (200 mL) was added to the solution. A water layer was taken out by separatory operation and washed 3 times. After washing, 21.2 g of 20 wt % hydrochloric acid aqueous solution was added to the water layer, followed by extraction with 200 mL of ethyl acetate. The organic layer was subjected to ordinary aqueous workup, solvent distillation, and recrystallization from a 30/1 mixture of hexane and ethyl acetate, obtaining 27 g (yield 78%) of Monomer 1 as white crystal.

The target compound was analyzed by IR and $^{1}$H-NMR spectroscopy, with the results shown below.

IR (D-ATR): ν=2996, 2938, 2920, 2865, 2682, 2628, 1735, 1711, 1635, 1456, 1440, 1402, 1387, 1373, 1365, 1340, 1324, 1303, 1280, 1262, 1224, 1200, 1186, 1149, 1128, 1082, 1053, 1011, 1001, 950, 911, 872, 839, 819, 765, 741, 701, 676, 666, 599 cm$^{-1}$ $^{1}$H-NMR (600 MHz in DMSO-d6):

δ=12.66 (1H, brs), 5.92 (1H, s), 5.58 (1H, s), 3.25 (2H, s), 2.21 (2H, s), 2.10 (2H, d), 1.95-1.93 (4H, m), 1.81 (3H, s), 1.59-1.49 (6H, m), 1.41 (6H, s) ppm

Example 2

Synthesis of Monomer 2

Monomer 2 was synthesized according to the following scheme.

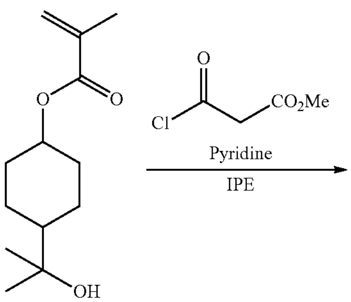

Reactant 2

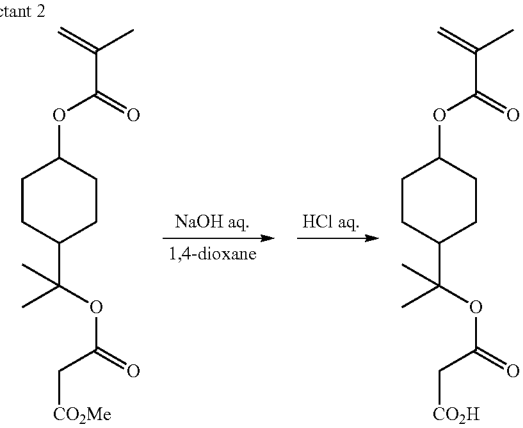

Intermediate 5 Monomer 2

Example 2-1

Synthesis of Intermediate 5

In nitrogen atmosphere, 25 g of methylmalonyl chloride was added dropwise to a solution of 38 g of Reactant 2 (isomer ratio 78/22) and 15 g of pyridine in 150 mL of IPE at an internal temperature below 20° C. The solution was aged at room temperature for 4 hours. Once the reaction solution was ice cooled, 150 mL of water was added dropwise to quench the reaction. This was followed by extraction with 100 mL of a 2/1 mixture of toluene and ethyl acetate, ordinary aqueous workup, solvent distillation, and purification by silica gel column chromatography, obtaining 48 g (yield 89%) of Intermediate 5 as yellow oily matter.

The product was analyzed by IR spectroscopy and the main isomer thereof by $^{1}$H-NMR spectroscopy, with the results shown below.

IR (D-ATR): ν=2982, 2950, 2869, 1752, 1731, 1716, 1637, 1438, 1408, 1386, 1371, 1335, 1319, 1294, 1234, 1163, 1126, 1025, 945, 910, 871, 815, 765, 653, 591 cm$^{-1}$ $^{1}$H-NMR (600 MHz in DMSO-d6):

δ=6.03 (1H, s), 5.65 (1H, s), 4.96 (1H, m), 3.62 (3H, s), 3.38 (2H, s), 1.88-1.85 (6H, m), 1.76 (1H, m), 1.56-1.49 (3H, m), 1.37 (6H, s), 1.36-1.29 (2H, m) ppm

Example 2-2

Synthesis of Monomer 2

In nitrogen atmosphere, a solution of 33 g of Intermediate 5 in 125 g of 1,4-dioxane was ice cooled, and 17.6 g of 25 wt % sodium hydroxide aqueous solution was added dropwise. The solution was aged at room temperature for 3 hours. Toluene (150 mL) was added to the solution. A water layer was taken out by separatory operation and washed 3 times. After washing, 20.5 g of 20 wt % hydrochloric acid aqueous solution was added to the water layer, followed by extraction with 150 mL of ethyl acetate. The organic layer was subjected to ordinary aqueous workup, solvent distillation, and purification by silica gel column chromatography, obtaining 30 g (yield 79%) of Monomer 2 (isomer ratio 80/20) as yellow oily matter.

The main isomer of the target compound was analyzed by $^{1}$H-NMR spectroscopy, with the results shown below.

$^{1}$H-NMR (600 MHz in DMSO-d6):

δ=12.64 (1H, brs), 6.03 (1H, s), 5.65 (1H, s), 4.96 (1H, m), 3.23 (2H, s), 1.90-1.85 (7H, m), 1.56-1.48 (3H, m), 1.38 (6H, s), 1.36-1.31 (2H, m) ppm

Example 3

Synthesis of Monomer 3

Monomer 3 was synthesized according to the following scheme.

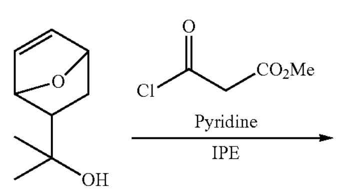

Reactant 3

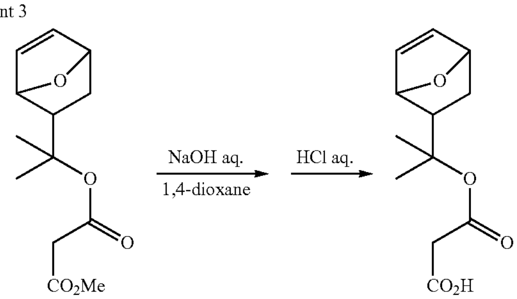

Intermediate 6 Monomer 3

Example 3-1

Synthesis of Intermediate 6

In nitrogen atmosphere, 16.8 g of methylmalonyl chloride was added dropwise to a solution of 17 g of Reactant 3 (isomer ratio 70/30) and 9.4 g of pyridine in 80 mL of IPE at an internal temperature below 20° C. The solution was aged at room temperature for 4 hours. Once the reaction solution was ice cooled, 150 mL of water was added dropwise to quench the reaction. This was followed by extraction with 100 mL of a 1/1 mixture of toluene and ethyl acetate, ordinary aqueous workup, solvent distillation, and purification by silica gel column chromatography, obtaining 29 g (yield 74%) of Intermediate 6 (isomer ratio 70/30) as yellow oily matter.

The product was analyzed by IR spectroscopy and the main isomer thereof by $^{1}$H-NMR spectroscopy, with the results shown below.

IR (D-ATR): ν=2998, 2953, 1747, 1728, 1437, 1411, 1388, 1370, 1335, 1282, 1201, 1143, 1121, 1020, 962, 898, 848, 803, 745, 717, 698, 589, 542 cm$^{-1}$ $^{1}$H-NMR (600 MHz in DMSO-d6):

δ=6.29 (1H, dd), 6.22 (1H, dd), 4.81 (1H, dd), 4.80 (1H, dd), 3.62 (3H, s), 3.32 (2H, s), 2.36 (1H, ddd), 1.84 (1H, ddd), 1.41 (3H, s), 1.35 (3H, s), 1.01 (1H, dd) ppm

Example 3-2

Synthesis of Monomer 3

In nitrogen atmosphere, a solution of 24 g of Intermediate 6 in 100 g of 1,4-dioxane was ice cooled, and 17.9 g of 25 wt % sodium hydroxide aqueous solution was added dropwise. The solution was aged at room temperature for 3 hours. Toluene (100 mL) was added to the solution. A water layer was taken out by separatory operation and washed 3 times. After washing, 20.9 g of 20 wt % hydrochloric acid aqueous solution was added to the water layer, followed by extraction with 100 mL of ethyl acetate. The organic layer was subjected to ordinary aqueous workup, solvent distillation, and purification by silica gel column chromatography, obtaining 17 g (yield 75%) of Monomer 3 (isomer ratio 70/30) as yellow oily matter.

The target compound was analyzed by IR spectroscopy, and the main isomer thereof by $^{1}$H-NMR spectroscopy, with the results shown below.

IR (D-ATR): ν=2999, 1732, 1456, 1388, 1372, 1324, 1239, 1202, 1145, 1124, 1030, 999, 967, 897, 847, 837, 803, 750, 718, 696, 666, 591 cm$^{-1}$ $^{1}$H-NMR (600 MHz in DMSO-d6):

δ=12.65 (1H, brs), 6.31 (1H, dd), 6.22 (1H, dd), 4.82 (1H, dd), 4.81 (1H, dd), 3.18 (2H, s), 2.36 (1H, ddd), 1.84 (1H, ddd), 1.41 (3H, s), 1.34 (3H, s), 1.02 (1H, dd) ppm

Example 4

Synthesis of Monomers 4 to 11

Monomers 4 to 11 shown below were synthesized using the corresponding reactants.

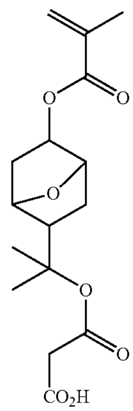
Monomer 4

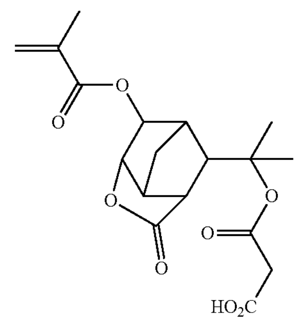
Monomer 5

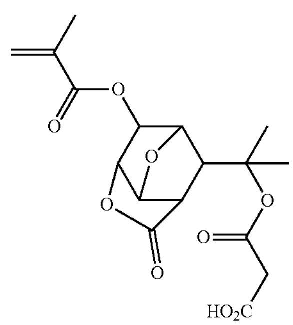
Monomer 6

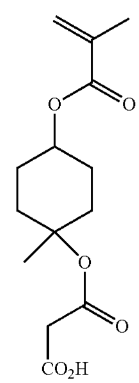
Monomer 7

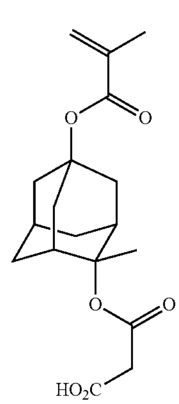
Monomer 8

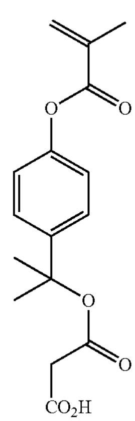
Monomer 9

-continued

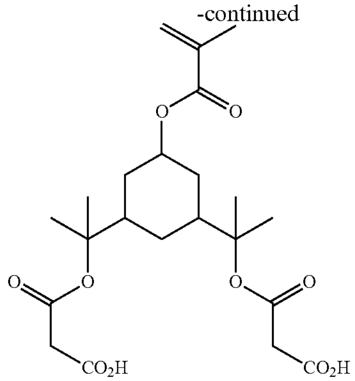

Monomer 10

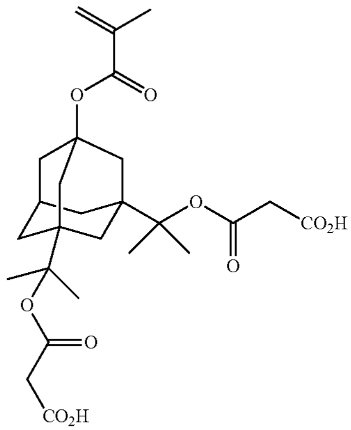

Monomer 11

[2] Synthesis of Polymers

Example 5

Polymer 1

Each of polymers (Polymers 1 to 21 and Comparative Polymers 1 to 12) for use in resist compositions was prepared by combining monomers in PGME solvent, effecting copolymerization reaction, crystallizing from water, washing with water several times, isolation and drying. The polymer was analyzed for composition by $^{1}$H-NMR and $^{13}$C-NMR spectroscopy.

Example 5-1: Polymer 1

Polymer 1

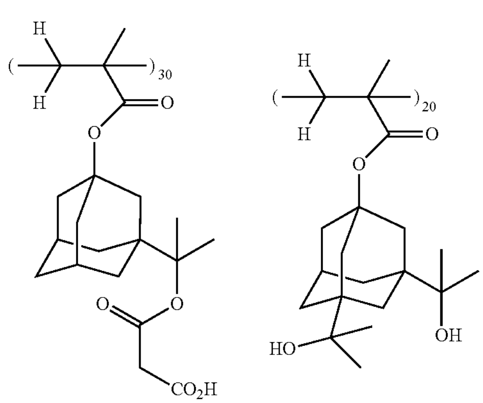

-continued

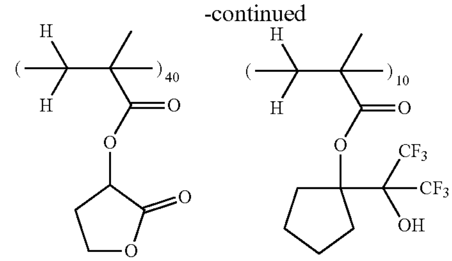

Mw = 8,600
Mw/Mn = 1.67

Example 5-2: Polymer 2

Polymer 2

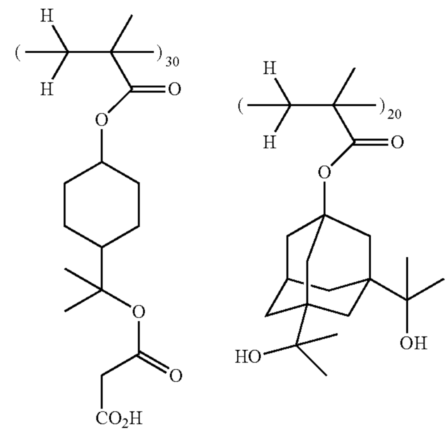

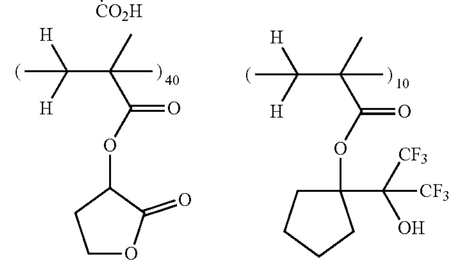

Mw = 8,400
Mw/Mn = 1.65

Example 5-3: Polymer 3

Polymer 3

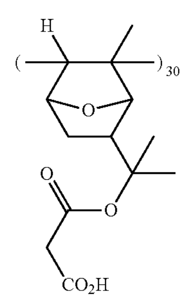

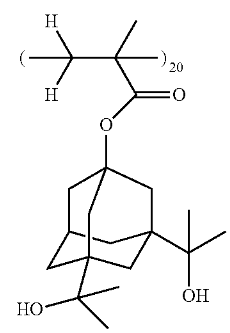

-continued
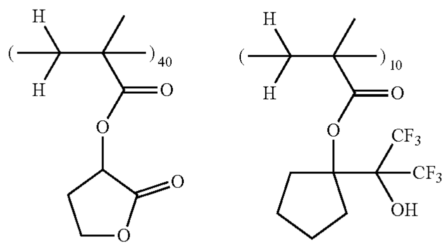
Mw = 8,300
Mw/Mn = 1.67
Example 5-4: Polymer 4
Polymer 4
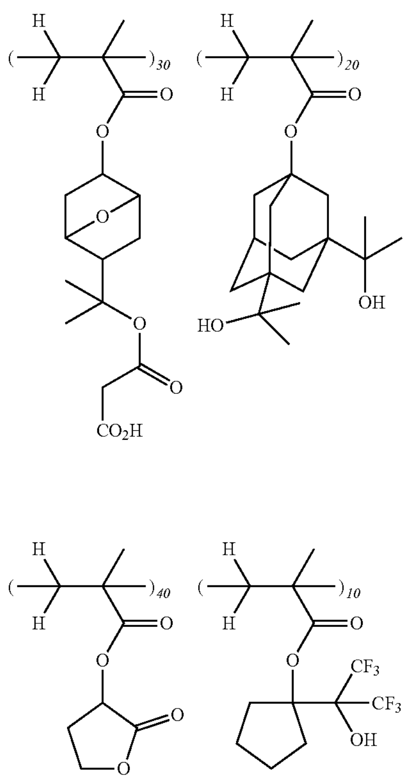
Mw = 8,300
Mw/Mn = 1.66
Example 5-5: Polymer 5
Polymer 5
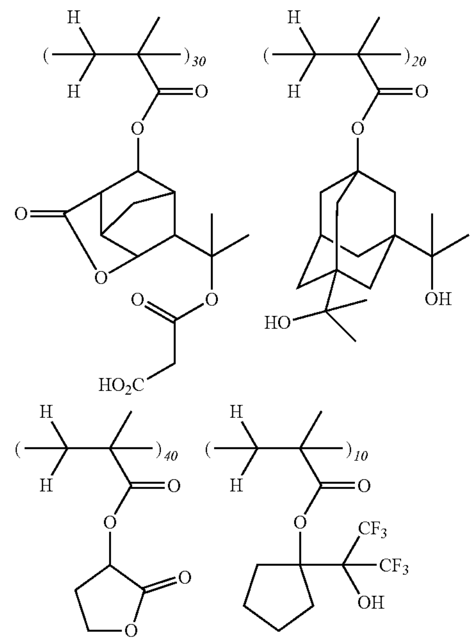
Mw = 8,500
Mw/Mn = 1.66
Example 5-6: Polymer 6
Polymer 6
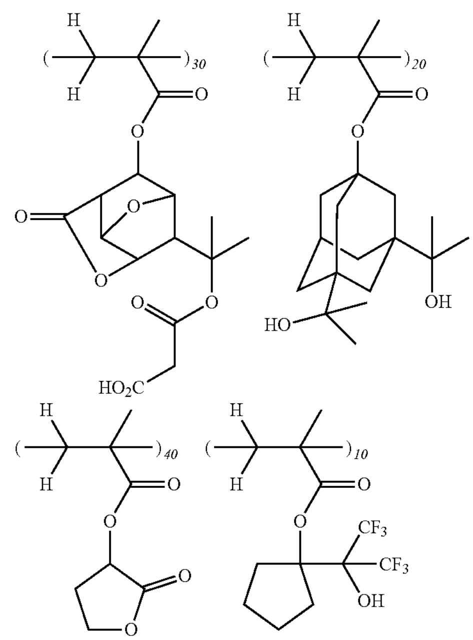
Mw = 8,900
Mw/Mn = 1.71

Example 5-7: Polymer 7
Polymer 7
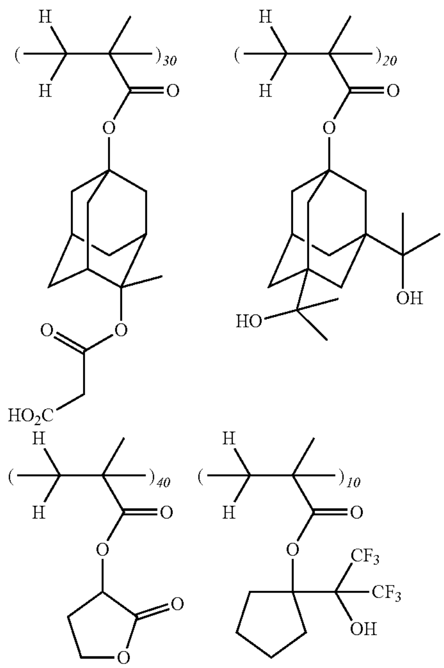
Mw = 8,800
Mw/Mn = 1.72
Example 5-8: Polymer 8
Polymer 8
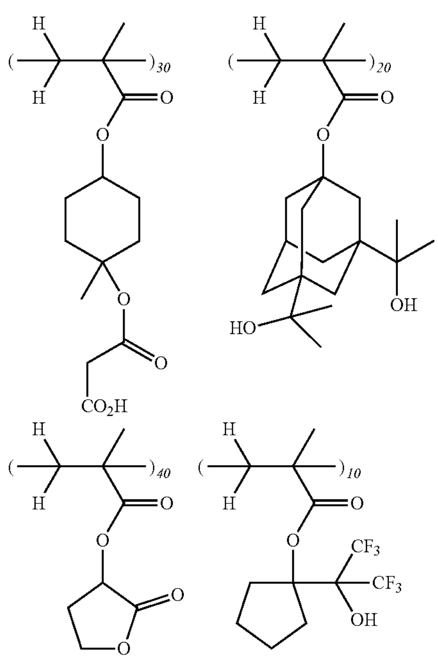
Mw = 8,500
Mw/Mn = 1.68
Example 5-9: Polymer 9
Polymer 9
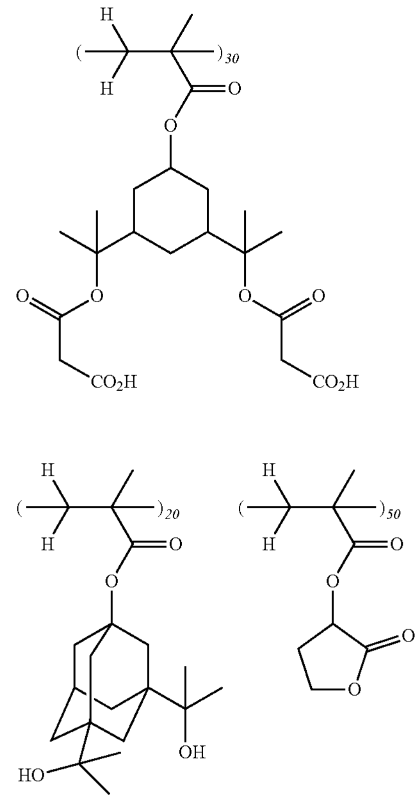
Mw = 8,700
Mw/Mn = 1.70
Example 5-10: Polymer 10
Polymer 10
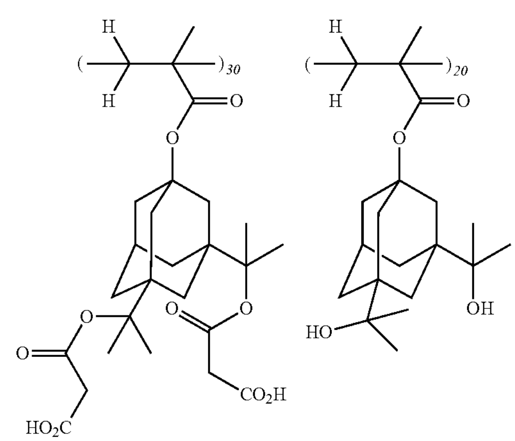

-continued
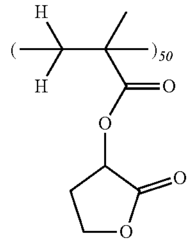
Mw = 8,800
Mw/Mn = 1.69
Example 5-11: Polymer 11
Polymer 11
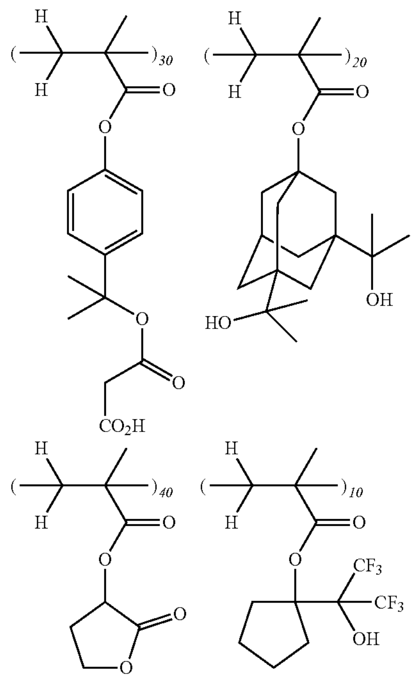
Mw = 9,000
Mw/Mn = 1.76
Example 5-12: Polymer 12
Polymer 12
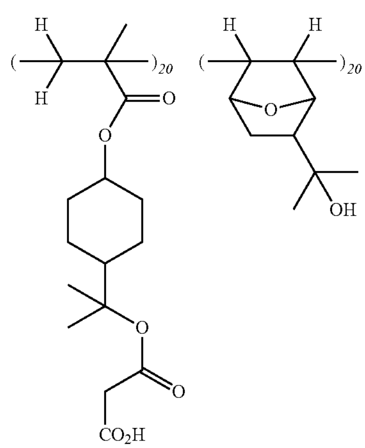
-continued
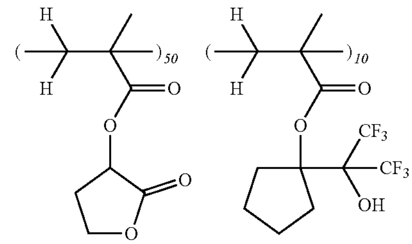
Mw = 8,700
Mw/Mn = 1.70
Example 5-13: Polymer 13
Polymer 13
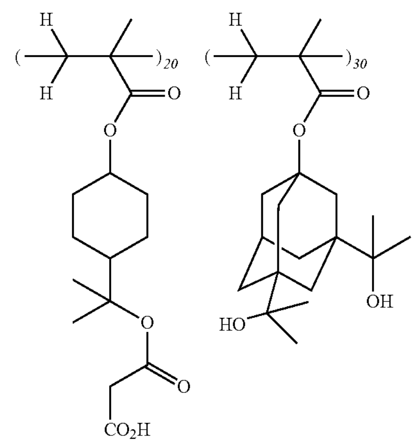
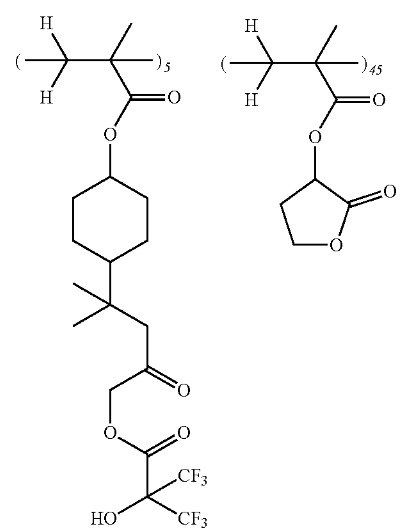
Mw = 8,300
Mw/Mn = 1.66

Example 5-14: Polymer 14
Polymer 14
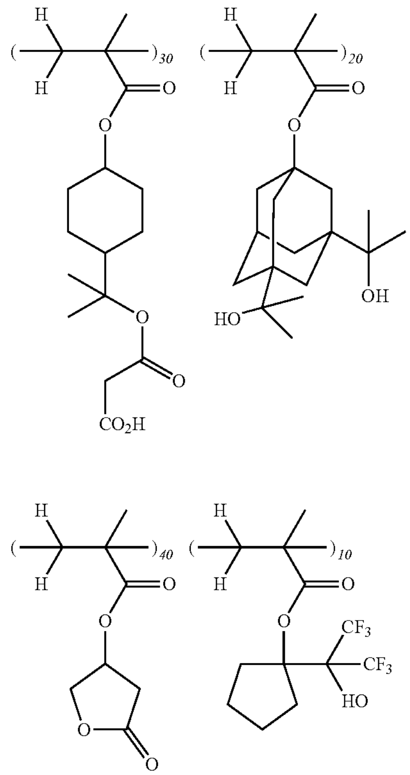
Mw = 8,500
Mw/Mn = 1.65
Example 5-15: Polymer 15
Polymer 15
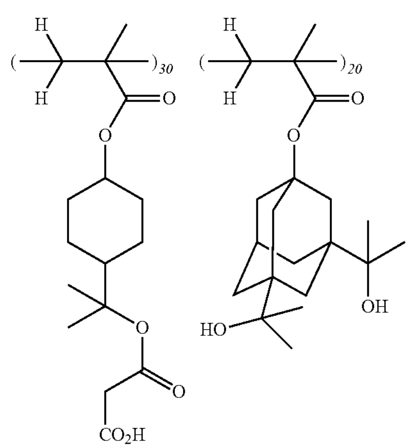
-continued
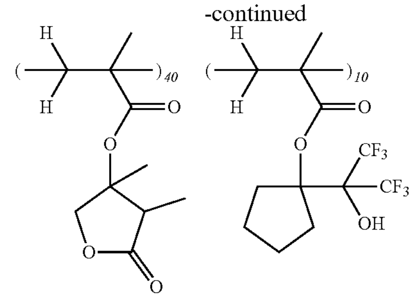
Mw = 8,800
Mw/Mn = 1.71
Example 5-16: Polymer 16
Polymer 16
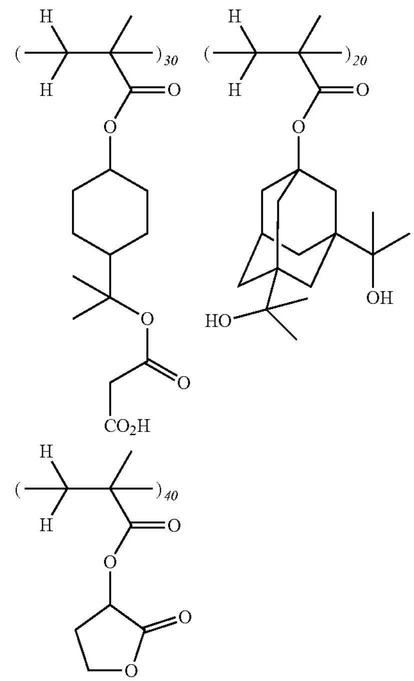
Mw = 8,800
Mw/Mn = 1.71
Example 5-17: Polymer 17
Polymer 17
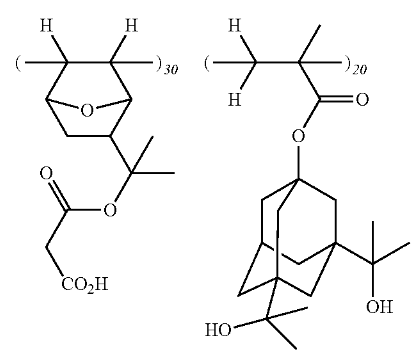

-continued
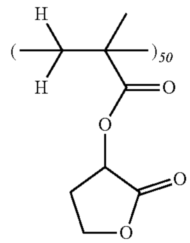
Mw = 8,800
Mw/Mn = 1.71
Example 5-18: Polymer 18
Polymer 18
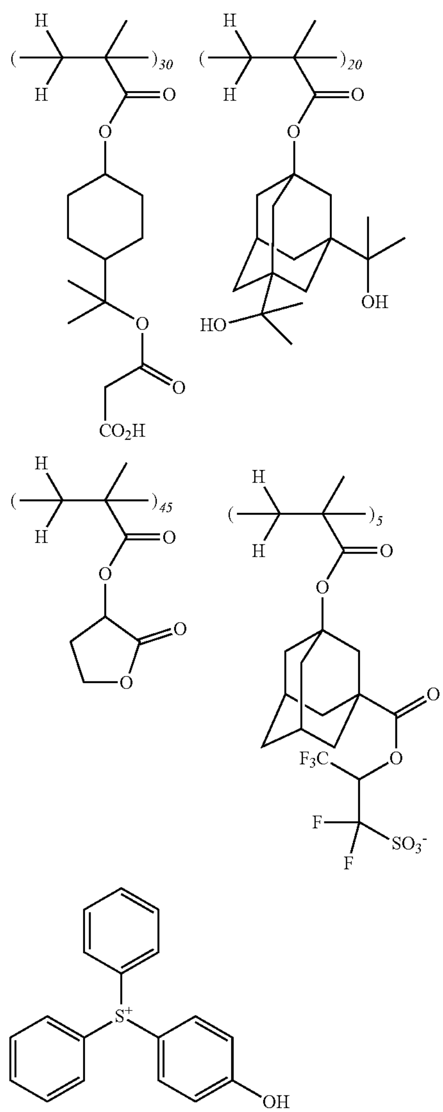
Mw = 8,800
Mw/Mn = 1.71
Example 5-19: Polymer 19
Polymer 19
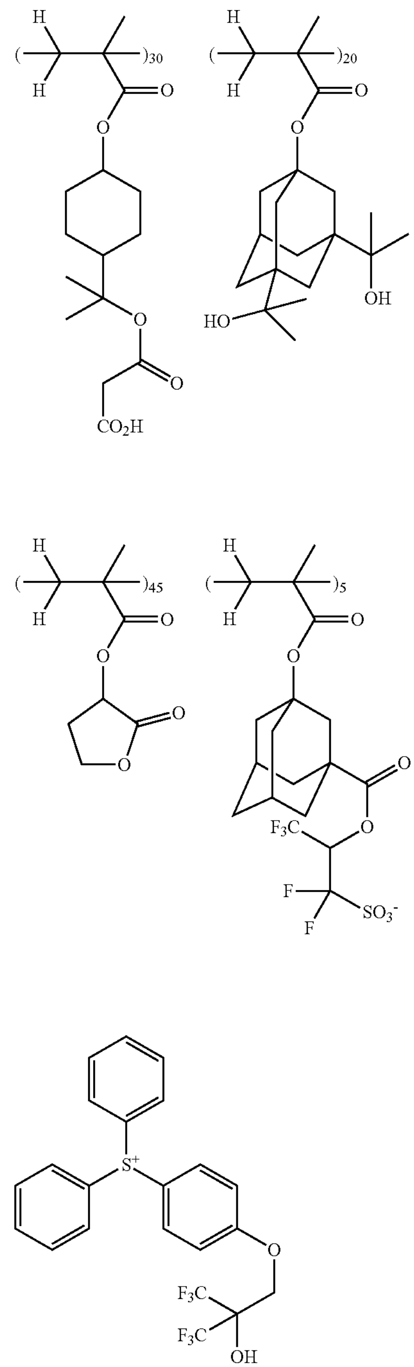
Mw = 8,800
Mw/Mn = 1.71

Example 5-20: Polymer 20
Polymer 20
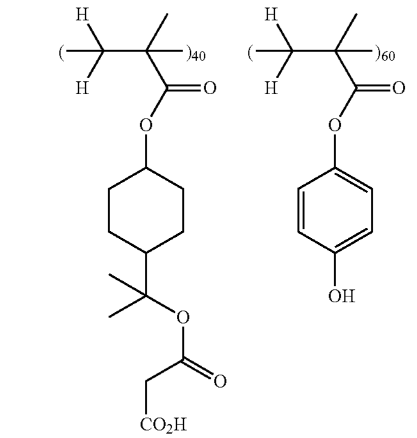
Mw = 8,800
Mw/Mn = 1.71
Example 5-21: Polymer 21
Polymer 21
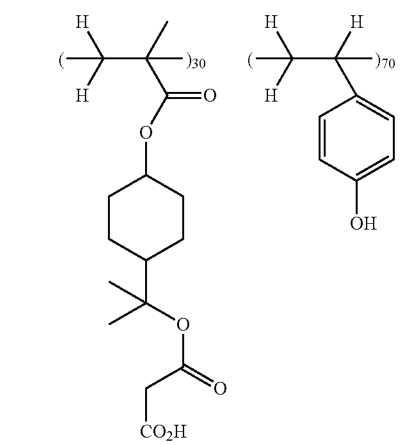
Mw = 8,800
Mw/Mn = 1.71
Comparative Example 1-1: Comparative Polymer 1
Comparative Polymer 1
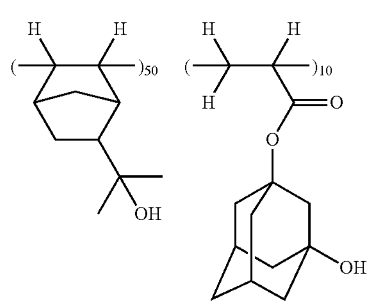
-continued
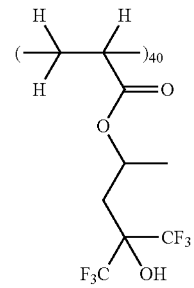
Mw = 8,400
Mw/Mn = 1.65
Comparative Example 1-2: Comparative Polymer 2
Comparative Polymer 2
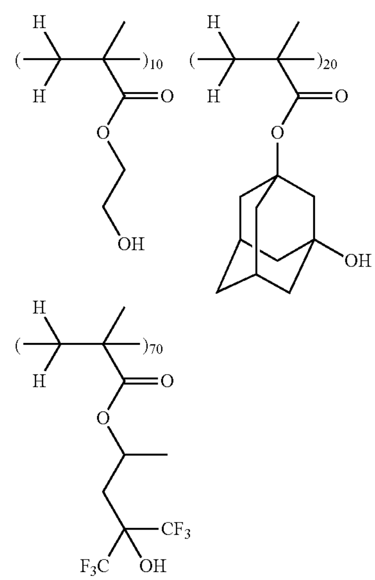
Mw = 8,500
Mw/Mn = 1.63
Comparative Example 1-3: Comparative Polymer 3
Comparative Polymer 3
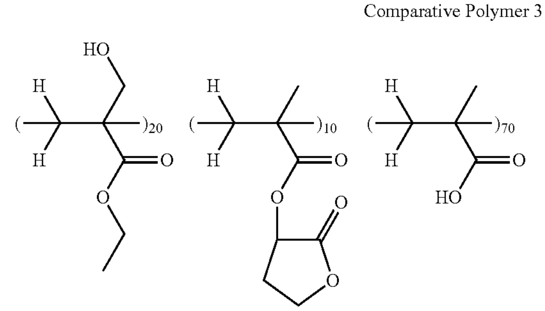
Mw = 8,700
Mw/Mn = 1.65

Comparative Example 1-4: Comparative Polymer 4
Comparative Polymer 4
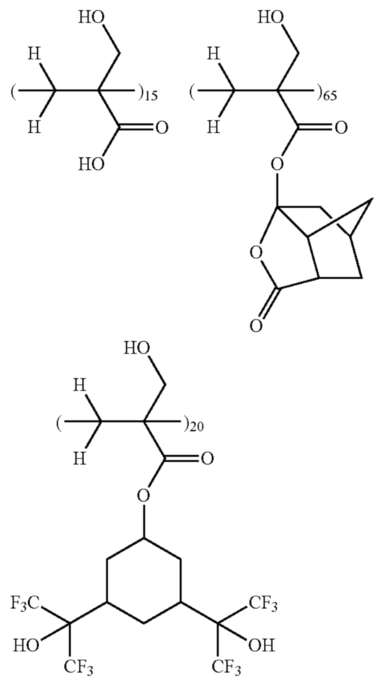
Mw = 8,600
Mw/Mn = 1.62
Comparative Example 1-5: Comparative Polymer 5
Comparative Polymer 5
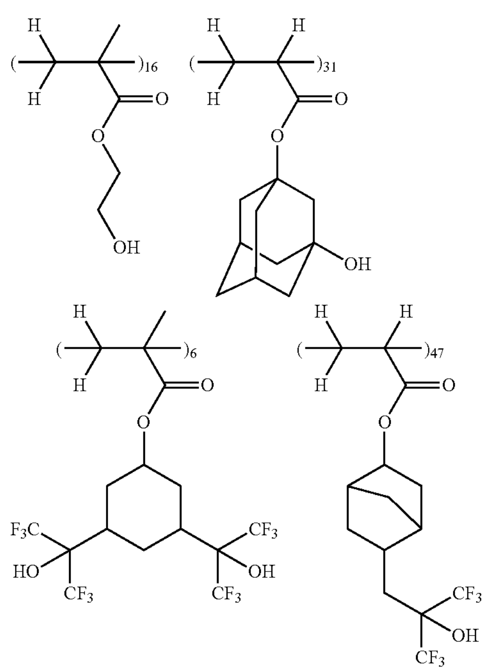
Mw = 8,400
Mw/Mn = 1.66
Comparative Example 1-6: Comparative Polymer 6
Comparative Polymer 6
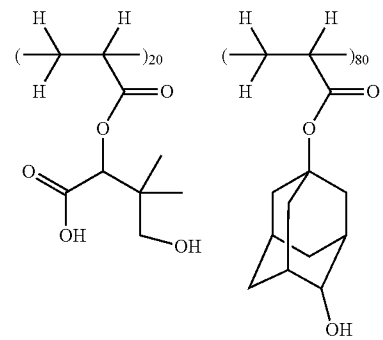
Mw = 8,600
Mw/Mn = 1.63
Comparative Example 1-7: Comparative Polymer 7
Comparative Polymer 7
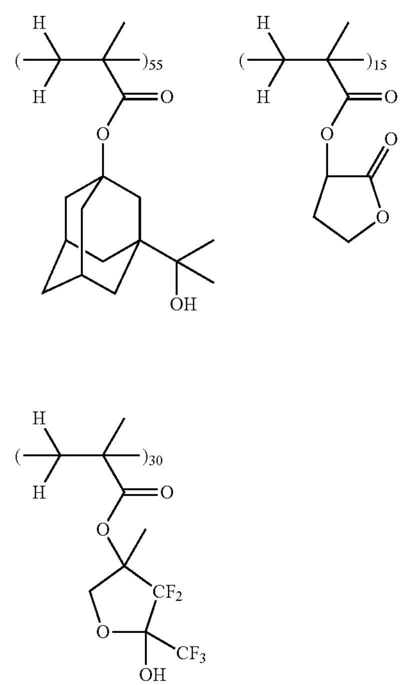
Mw = 8,600
Mw/Mn = 1.63

Comparative Polymer 8
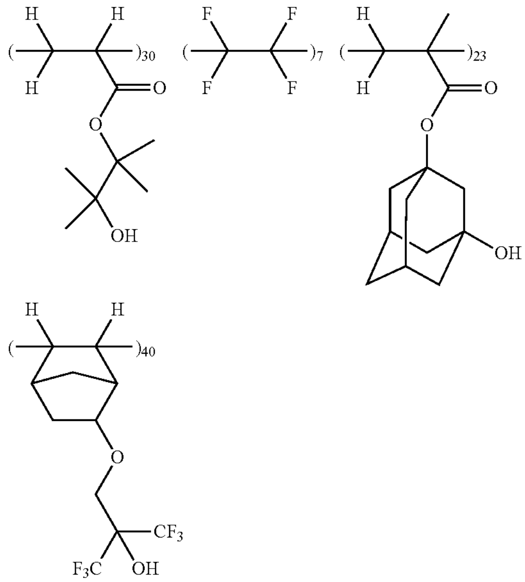
Mw = 8,500
Mw/Mn = 1.61
Comparative Example 1-9: Comparative Polymer 9
Comparative Polymer 9
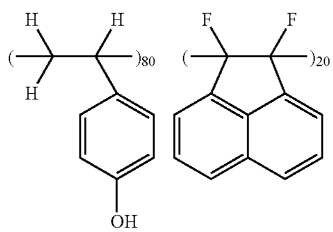
Mw = 8,400
Mw/Mn = 1.65
Comparative Example 1-10: Comparative Polymer 10
Comparative Polymer 10
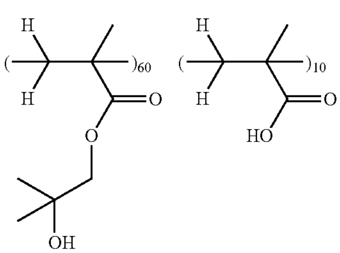
-continued
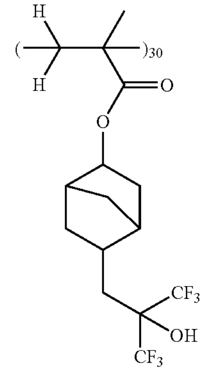
Mw = 8,400
Mw/Mn = 1.65
Comparative Example 1-11: Comparative Polymer 11
Comparative Polymer 11
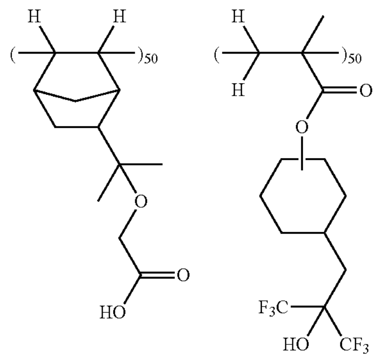
Mw = 8,400
Mw/Mn = 1.65
Comparative Example 1-12: Comparative Polymer 12
Comparative Polymer 12
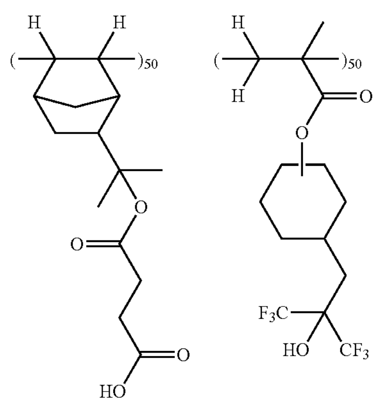
Mw = 8,400
Mw/Mn = 1.65

[3] Preparation of Resist Compositions

Examples 6-1 to 6-21 & Comparative Examples 2-1 to 2-12

Resist compositions R-01 to R-21 and Comparative Resist compositions R-22 to R-33 were prepared by using inventive Polymers 1 to 21 or Comparative Polymers 1 to 12 as the base resin, dissolving the polymer and other components in a solvent in accordance with the recipe shown in Tables 1 to 3, and filtering through a Teflon® filter having a pore size of 0.2 μm.

In Tables 1 to 3, acid generator (PAG-1 to 4), water-repellent polymer (SF-1), sensitivity regulator (Q-1 to 4), crosslinker (XL-1), and solvent are as identified below.

Photoacid Generator: PAG-1 to PAG-4

PAG-1

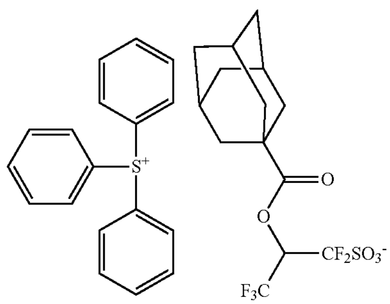

PAG-2

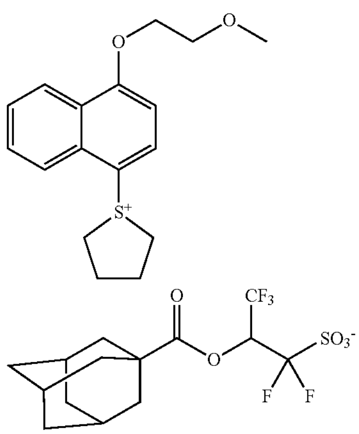

PAG-3

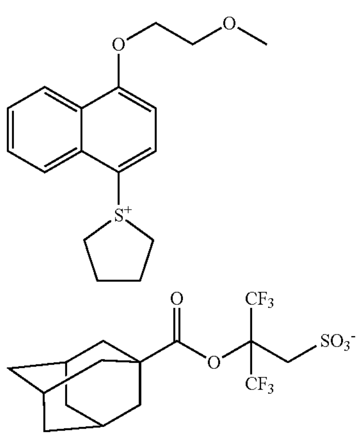

-continued

PAG-4

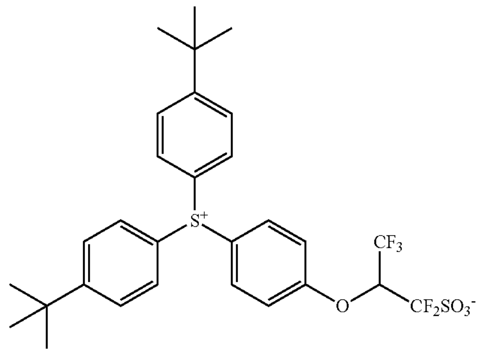

Sensitivity Regulator: Q-1 to Q-4

Q-1

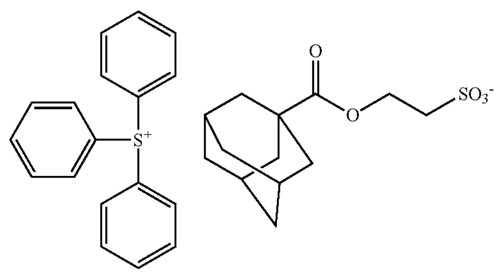

Q-2

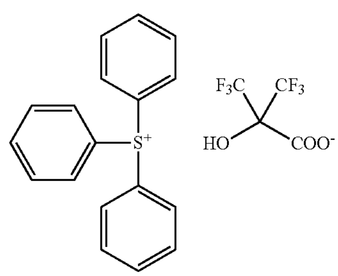

Q-3

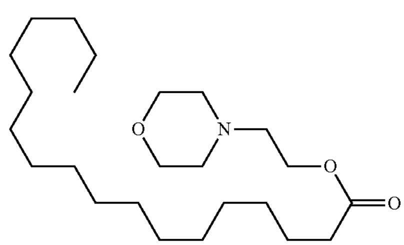

Q-4

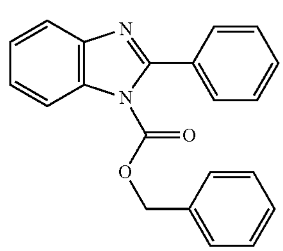

Water-Repellent Polymer: SF-1

SF-1

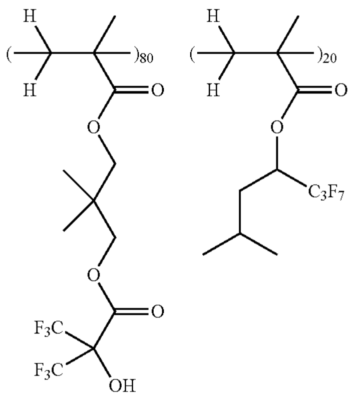

Mw = 8,700
Mw/Mn = 1.85

Crosslinker: XL-1

XL-1

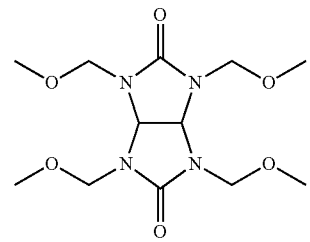

Solvent:

PGEE: propylene glycol monoethyl ether

DAA: diacetone alcohol

GBL: γ-butyrolactone

TABLE 1

| | | Resist composition | Resin (pbw) | PAG (pbw) | Sensitivity regulator (pbw) | Water-repellent polymer (pbw) | Crosslinker (pbw) | Solvent (pbw) |
|---|---|---|---|---|---|---|---|---|
| Example | 6-1 | R-01 | Polymer 1 (100) | PAG-4 (5.0) | Q-2 (3.5) | SF-1 (5.0) | — | PGEE (2,000) DAA (400) GBL (100) |
| | 6-2 | R-02 | Polymer 2 (100) | PAG-4 (5.0) | Q-2 (3.5) | SF-1 (5.0) | — | PGEE (2,000) DAA (400) GBL (100) |
| | 6-3 | R-03 | Polymer 3 (100) | PAG-4 (5.0) | Q-2 (3.5) | SF-1 (5.0) | — | PGEE (2,000) DAA (400) GBL (100) |
| | 6-4 | R-04 | Polymer 4 (100) | PAG-4 (5.0) | Q-2 (3.5) | SF-1 (5.0) | — | PGEE (2,000) DAA (400) GBL (100) |
| | 6-5 | R-05 | Polymer 5 (100) | PAG-4 (5.0) | Q-2 (3.5) | SF-1 (5.0) | — | PGEE (2,000) DAA (400) GBL (100) |
| | 6-6 | R-06 | Polymer 6 (100) | PAG-4 (5.0) | Q-2 (3.5) | SF-1 (5.0) | — | PGEE (2,000) DAA (400) GBL (100) |
| | 6-7 | R-07 | Polymer 7 (100) | PAG-4 (5.0) | Q-2 (3.5) | SF-1 (5.0) | — | PGEE (2,000) DAA (400) GBL (100) |
| | 6-8 | R-08 | Polymer 8 (100) | PAG-4 (5.0) | Q-2 (3.5) | SF-1 (5.0) | — | PGEE (2,000) DAA (400) GBL (100) |
| | 6-9 | R-09 | Polymer 9 (100) | PAG-4 (5.0) | Q-2 (3.5) | SF-1 (5.0) | — | PGEE (2,000) DAA (400) GBL (100) |
| | 6-10 | R-10 | Polymer 10 (100) | PAG-4 (5.0) | Q-2 (3.5) | SF-1 (5.0) | — | PGEE (2,000) DAA (400) GBL (100) |
| | 6-11 | R-11 | Polymer 11 (100) | PAG-4 (5.0) | Q-1 (3.5) | SF-1 (5.0) | — | PGEE (2,000) DAA (400) GBL (100) |

TABLE 2

| | | Resist composition | Resin (pbw) | PAG (pbw) | Sensitivity regulator (pbw) | Water-repellent polymer (pbw) | Crosslinker (pbw) | Solvent (pbw) |
|---|---|---|---|---|---|---|---|---|
| Example | 6-12 | R-12 | Polymer 12 (100) | PAG-1 (5.0) | Q-1 (3.5) | SF-1 (5.0) | — | PGEE (2,000) DAA (400) GBL (100) |

TABLE 2-continued

| | Resist composition | Resin (pbw) | PAG (pbw) | Sensitivity regulator (pbw) | Water-repellent polymer (pbw) | Crosslinker (pbw) | Solvent (pbw) |
|---|---|---|---|---|---|---|---|
| 6-13 | R-13 | Polymer 13 (100) | PAG-2 (5.0) | Q-3 (3.5) | SF-1 (5.0) | — | PGEE (2,000) DAA (400) GBL (100) |
| 6-14 | R-14 | Polymer 14 (100) | PAG-3 (8.5) | Q-1 (3.5) | SF-1 (5.0) | — | PGEE (2,000) DAA (400) GBL (100) |
| 6-15 | R-15 | Polymer 15 (100) | PAG-1 (5.0) | Q-4 (3.5) | SF-1 (5.0) | — | PGEE (2,000) DAA (400) GBL (100) |
| 6-16 | R-16 | Polymer 16 (100) | PAG-1 (5.0) | Q-1 (3.5) | SF-1 (5.0) | — | PGEE (2,000) DAA (400) GBL (100) |
| 6-17 | R-17 | Polymer 17 (100) | PAG-3 (8.5) | Q-1 (3.5) | SF-1 (5.0) | — | PGEE (2,000) DAA (400) GBL (100) |
| 6-18 | R-18 | Polymer 18 (100) | — | Q-1 (3.5) | SF-1 (5.0) | — | PGEE (2,000) DAA (400) GBL (100) |
| 6-19 | R-19 | Polymer 19 (100) | — | Q-1 (3.5) | SF-1 (5.0) | — | PGEE (2,000) DAA (400) GBL (100) |
| 6-20 | R-20 | Polymer 20 (100) | PAG-4 (5.0) | Q-3 (3.5) | SF-1 (5.0) | XL-1 (5.0) | PGEE (2,000) DAA (400) GBL (100) |
| 6-21 | R-21 | Polymer 21 (100) | PAG-4 (5.0) | Q-4 (3.5) | SF-1 (5.0) | XL-1 (5.0) | PGEE (2,000) DAA (400) GBL (100) |

TABLE 3

| | | Resist composition | Resin (pbw) | PAG (pbw) | Sensitivity regulator (pbw) | Water-repellent polymer (pbw) | Crosslinker (pbw) | Solvent (pbw) |
|---|---|---|---|---|---|---|---|---|
| Comparative Example | 2-1 | R-22 | Comparative Polymer 1 (100) | PAG-4 (5.0) | Q-1 (3.5) | SF-1 (5.0) | — | PGEE (2,000) DAA (400) GBL (100) |
| | 2-2 | R-23 | Comparative Polymer 2 (100) | PAG-4 (5.0) | Q-4 (3.5) | SF-1 (5.0) | XL-1 (5.0) | PGEE (2,000) DAA (400) GBL (100) |
| | 2-3 | R-24 | Comparative Polymer 3 (100) | PAG-4 (5.0) | Q-4 (3.5) | SF-1 (5.0) | XL-1 (5.0) | PGEE (2,000) DAA (400) GBL (100) |
| | 2-4 | R-25 | Comparative Polymer 4 (100) | PAG-4 (5.0) | Q-1 (3.5) | SF-1 (5.0) | XL-1 (5.0) | PGEE (2,000) DAA (400) GBL (100) |
| | 2-5 | R-26 | Comparative Polymer 5 (100) | PAG-3 (8.5) | Q-3 (3.5) | SF-1 (5.0) | XL-1 (5.0) | PGEE (2,000) DAA (400) GBL (100) |
| | 2-6 | R-27 | Comparative Polymer 6 (100) | PAG-4 (5.0) | Q-1 (3.5) | SF-1 (5.0) | — | PGEE (2,000) DAA (400) GBL (100) |
| | 2-7 | R-28 | Comparative Polymer 7 (100) | PAG-1 (5.0) | Q-1 (3.5) | SF-1 (5.0) | — | PGEE (2,000) DAA (400) GBL (100) |
| | 2-8 | R-29 | Comparative Polymer 8 (100) | PAG-4 (5.0) | Q-1 (3.5) | SF-1 (5.0) | XL-1 (5.0) | PGEE (2,000) DAA (400) GBL (100) |
| | 2-9 | R-30 | Comparative Polymer 9 (100) | PAG-1 (5.0) | Q-3 (3.5) | SF-1 (5.0) | XL-1 (5.0) | PGEE (2,000) DAA (400) GBL (100) |
| | 2-10 | R-31 | Comparative Polymer 10 (100) | PAG-2 (5.0) | Q-1 (3.5) | SF-1 (5.0) | — | PGEE (2,000) DAA (400) GBL (100) |
| | 2-11 | R-32 | Comparative Polymer 11 (100) | PAG-4 (5.0) | Q-2 (3.5) | SF-1 (5.0) | — | PGEE (2,000) DAA (400) GBL (100) |
| | 2-12 | R-33 | Comparative Polymer 12 (100) | PAG-4 (5.0) | Q-2 (3.5) | SF-1 (5.0) | — | PGEE (2,000) DAA (400) GBL (100) |

[4] ArF Lithography Patterning Test 1

Examples 7-1 to 7-21 & Comparative Examples 3-1 to 3-12

On a silicon wafer which had been coated with antireflective coating ARC29A (Nissan Chemical Corp.) to a thickness of 78 nm, the resist composition (R-01 to R-33) was spin coated, then baked on a hot plate at 100° C. for 60 seconds to form a resist film of 100 nm thick. Using an ArF excimer laser scanner NSR-S307E (Nikon Corp., NA 0.85, σ0.93/0.74, annular illumination), exposure was performed through a 6% halftone phase shift mask bearing a line-and-space (L/S) pattern with a space width of 90 nm and a pitch of 180 nm, a space width of 80 nm and a pitch of 160 nm or a space width of 70 nm and a pitch of 140 nm (on-wafer size) or a trench pattern with a space width of 90 nm and a pitch of 1,650 nm (on-wafer size) while varying the dose and focus (dose pitch: 1 mJ/cm$^2$, focus pitch: 0.025 m). After the exposure, the wafer was baked (PEB) at the temperature shown in Table 4 for 60 seconds and puddle developed in 2.38 wt % TMAH aqueous solution for 30 seconds. The wafer was rinsed with deionized water and spin dried, forming a negative pattern. The L/S patterns and trench pattern after development were observed under TD-SEM S-9380 (Hitachi Hitechnologies, Ltd.).

Evaluation of Sensitivity

As an index of sensitivity, the optimum dose (Eop, mJ/cm$^2$) which provided a L/S pattern with a space width of 90 nm and a pitch of 180 nm was determined. A smaller dose value indicates a higher sensitivity.

Evaluation of Exposure Latitude (EL)

The exposure dose which provided a L/S pattern with a space width of 90 nm±10% (i.e., 81 nm to 99 nm) was determined. EL (%) is calculated from the exposure doses according to the following equation:

$$EL\ (\%)=(|E_1-E_2|/Eop)\times 100$$

wherein $E_1$ is an exposure dose which provides a L/S pattern with a space width of 81 nm and a pitch of 180 nm, $E_2$ is an exposure dose which provides a L/S pattern with a space width of 99 nm and a pitch of 180 nm, and Eop is the optimum exposure dose which provides a L/S pattern with a space width of 90 nm and a pitch of 180 nm.

Evaluation of Line Width Roughness (LWR)

The L/S pattern formed by exposure in the optimum dose (determined in the sensitivity evaluation) was observed under TD-SEM. The space width was measured at longitudinally spaced apart 10 points, from which a 3-fold value (3σ) of standard deviation (σ) was determined and reported as LWR. A smaller value of 3σ indicates a pattern having a lower roughness and more uniform space width.

Evaluation of Depth of Focus (DOF)

As an index of DOF, a range of focus which provided a trench pattern with a space width of 90 nm±10% (i.e., 81 to 99 nm) was determined. A greater value indicates a wider DOF.

Evaluation of Resolution

Resolution is the minimum size that can be resolved among the L/S patterns with a size from 70 nm to 90 nm (pitch 140 to 180 nm). A smaller value indicates better resolution.

The results are shown in Tables 4 and 5.

TABLE 4

| | | Resist composition | PEB temp. (° C.) | Eop (mJ/cm$^2$) | EL (%) | LWR (nm) | DOF (μm) | Resolution (nm) |
|---|---|---|---|---|---|---|---|---|
| Example | 7-1 | R-01 | 100 | 29.4 | 15.6 | 5.8 | 0.21 | 50 |
| | 7-2 | R-02 | 105 | 30.1 | 15.9 | 5.6 | 0.20 | 55 |
| | 7-3 | R-03 | 100 | 33.2 | 14.9 | 5.6 | 0.22 | 60 |
| | 7-4 | R-04 | 100 | 28.5 | 15.8 | 5.3 | 0.21 | 55 |
| | 7-5 | R-05 | 95 | 29.3 | 15.6 | 5.5 | 0.22 | 50 |
| | 7-6 | R-06 | 110 | 30.1 | 14.9 | 5.4 | 0.20 | 65 |
| | 7-7 | R-07 | 100 | 32.8 | 15.3 | 5.3 | 0.21 | 50 |
| | 7-8 | R-08 | 100 | 29.8 | 15.6 | 6.0 | 0.21 | 55 |
| | 7-9 | R-09 | 105 | 29.6 | 15.0 | 5.4 | 0.19 | 60 |
| | 7-10 | R-10 | 100 | 30.5 | 15.3 | 5.4 | 0.19 | 55 |
| | 7-11 | R-11 | 100 | 31.8 | 16.1 | 5.3 | 0.20 | 50 |
| | 7-12 | R-12 | 110 | 29.3 | 16.2 | 5.2 | 0.21 | 50 |
| | 7-13 | R-13 | 100 | 29.8 | 15.7 | 5.7 | 0.22 | 65 |
| | 7-14 | R-14 | 95 | 31.2 | 14.8 | 5.5 | 0.19 | 55 |
| | 7-15 | R-15 | 105 | 31.8 | 15.2 | 5.4 | 0.18 | 50 |
| | 7-16 | R-16 | 100 | 28.7 | 15.1 | 5.5 | 0.19 | 50 |
| | 7-17 | R-17 | 100 | 31.1 | 15.3 | 5.3 | 0.19 | 55 |
| | 7-18 | R-18 | 100 | 32.9 | 14.9 | 5.2 | 0.20 | 60 |
| | 7-19 | R-19 | 105 | 29.6 | 15.6 | 5.4 | 0.21 | 50 |
| | 7-20 | R-20 | 100 | 28.9 | 14.7 | 5.4 | 0.19 | 50 |
| | 7-21 | R-21 | 100 | 31.5 | 15.2 | 5.5 | 0.18 | 55 |

TABLE 5

| | | Resist composition | PEB temp. (° C.) | Eop (mJ/cm$^2$) | EL (%) | LWR (nm) | DOF (μm) | Resolution (nm) |
|---|---|---|---|---|---|---|---|---|
| Comparative Example | 3-1 | R-22 | 120 | 30.6 | 8.1 | 9.9 | 0.08 | 120 |
| | 3-2 | R-23 | 100 | 30.1 | 7.6 | 10.0 | 0.09 | 110 |
| | 3-3 | R-24 | 100 | 30.0 | 5.8 | 9.8 | 0.10 | 105 |
| | 3-4 | R-25 | 105 | 29.9 | 7.7 | 8.9 | 0.07 | 100 |
| | 3-5 | R-26 | 95 | 31.8 | 6.1 | 8.6 | 0.09 | 110 |
| | 3-6 | R-27 | 100 | 28.9 | 6.9 | 9.1 | 0.11 | 95 |
| | 3-7 | R-28 | 100 | 32.1 | 8.3 | 8.7 | 0.07 | 100 |

TABLE 5-continued

| | Resist composition | PEB temp. (° C.) | Eop (mJ/cm$^2$) | EL (%) | LWR (nm) | DOF (μm) | Resolution (nm) |
|---|---|---|---|---|---|---|---|
| 3-8 | R-29 | 100 | 30.4 | 8.5 | 9.2 | 0.09 | 120 |
| 3-9 | R-30 | 100 | 30.1 | 5.8 | 9.3 | 0.10 | 100 |
| 3-10 | R-31 | 110 | 29.9 | 7.5 | 8.7 | 0.12 | 70 |
| 3-11 | R-32 | 105 | 29.7 | 7.7 | 7.9 | 0.15 | 80 |
| 3-12 | R-33 | 100 | 29.1 | 6.4 | 7.6 | 0.14 | 75 |

As is evident from Tables 4 and 5, the resist compositions within the scope of the invention have practically acceptable sensitivity. Both EL and DOF have a wide margin. LWR is low as compared with the resists of Comparative Examples. Resolution is also excellent.

[5] ArF Lithography Patterning Test 2

Examples 8-1 to 8-9 & Comparative Examples 4-1 to 4-5

On a substrate, a spin-on carbon film ODL-180 (Shin-Etsu Chemical Co., Ltd.) having a carbon content of 80 wt % was deposited to a thickness of 180 nm and a silicon-containing spin-on hard mask SHB-A940 having a silicon content of 43 wt % was deposited thereon to a thickness of 35 nm. On this substrate for trilayer process, the resist composition (in Table 6) was spin coated, then baked on a hot plate at 100° C. for 60 seconds to form a resist film of 60 nm thick.

Using an ArF excimer laser immersion lithography scanner NSR-S610C (Nikon Corp., NA 1.30, σ 0.90/0.72, cross-pole opening 35 deg., cross-pole illumination, azimuthally polarized illumination), exposure was performed through a 6% halftone phase shift mask bearing a contact hole (CH) pattern with a hole size of 55 nm and a pitch of 110 nm (on-wafer size) while varying the dose and focus (dose pitch: 1 mJ/cm$^2$, focus pitch: 0.025 μm). After the exposure, the wafer was baked (PEB) at the temperature shown in Table 5 for 60 seconds and puddle developed in 2.38 wt % TMAH aqueous solution for 30 seconds. The wafer was rinsed with deionized water and spin dried, obtaining a negative pattern. The CH pattern after development was observed under TD-SEM CG4000 (Hitachi Hitechnologies, Ltd.).

Evaluation of Sensitivity

As an index of sensitivity, the optimum dose (Eop, mJ/cm$^2$) which provided a CH pattern with a hole size of 55 nm and a pitch of 110 nm was determined. A smaller dose value indicates a higher sensitivity.

Evaluation of Exposure Latitude (EL)

The exposure dose which provided a CH pattern with a hole size of 55 nm±10% (i.e., 49.5 nm to 60.5 nm) was determined. EL (%) is calculated from the exposure doses according to the following equation:

$$\text{EL (\%)}=(|E_1-E_2|/Eop)\times 100$$

wherein $E_1$ is an exposure dose which provides a CH pattern with a hole size of 49.5 nm and a pitch of 110 nm, $E_2$ is an exposure dose which provides a CH pattern with a hole size of 60.5 nm and a pitch of 110 nm, and Eop is the optimum exposure dose which provides a CH pattern with a hole size of 55 nm and a pitch of 110 nm.

Evaluation of Critical Dimension Uniformity (CDU)

For the CH pattern formed by exposure in the optimum dose (determined in the sensitivity evaluation), the hole size was measured at 10 areas subject to an identical dose of shot (9 contact holes per area), from which a 3-fold value (3σ) of standard deviation (σ) was determined and reported as CDU. A smaller value of 3σ indicates a CH pattern having improved CDU.

The results are shown in Table 6.

TABLE 6

| | | Resist composition | PEB temp. (° C.) | Eop (mJ/cm$^2$) | EL (%) | CDU 3σ (nm) |
|---|---|---|---|---|---|---|
| Example | 8-1 | R-01 | 100 | 28.4 | 14.6 | 6.2 |
| | 8-2 | R-02 | 105 | 27.8 | 14.1 | 5.9 |
| | 8-3 | R-03 | 100 | 28.1 | 15.3 | 6.1 |
| | 8-4 | R-07 | 100 | 27.1 | 14.6 | 5.5 |
| | 8-5 | R-10 | 100 | 28.1 | 15.1 | 5.8 |
| | 8-6 | R-12 | 110 | 27.9 | 14.8 | 6.2 |
| | 8-7 | R-13 | 100 | 27.6 | 15.3 | 5.8 |
| | 8-8 | R-14 | 95 | 28.7 | 15.2 | 6.3 |
| | 8-9 | R-18 | 100 | 28.9 | 14.9 | 5.6 |
| Comparative Example | 4-1 | R-22 | 120 | 27.8 | 8.9 | 10.3 |
| | 4-2 | R-27 | 100 | 30.9 | 8.2 | 9.8 |
| | 4-3 | R-28 | 100 | 29.9 | 7.9 | 10.3 |
| | 4-4 | R-32 | 105 | 29.3 | 6.7 | 8.9 |
| | 4-5 | R-33 | 100 | 29.1 | 7.6 | 8.2 |

As is evident from Table 6, the resist compositions within the scope of the invention show practically acceptable sensitivity, a wide margin of EL, and excellent CDU.

[6] EB Writing Test

Examples 9-1 to 9-5 & Comparative Examples 5-1 to 5-3

On a silicon wafer which had been surface treated in HMDS gas phase at 90° C. for 60 seconds, each of the resist compositions in Table 7 was spin coated and prebaked on a hot plate at 100° C. for 60 seconds to form a resist film of 60 nm thick. Using an EB lithography system JBX-9000 (JEOL, Ltd.) at an accelerating voltage of 50 kV, a L/S pattern having a space width of 100 nm and a pitch of 200 nm (on-wafer size) was written while varying the dose (dose variation pitch 2 μC/cm$^2$). After the imagewise exposure, the resist film was baked (PEB) at the temperature shown in Table 7 for 60 seconds, puddle developed in 2.38 wt % TMAH aqueous solution for 30 seconds, rinsed with deionized water, and spin dried, obtaining a negative pattern. The L/S pattern after development was observed under TD-SEM S-9380 (Hitachi Hitechnologies, Ltd.).

Evaluation of Sensitivity

As an index of sensitivity, the optimum dose (Eop, μC/cm$^2$) which provided a L/S pattern with a space width of 100 nm and a pitch of 200 nm was determined. A smaller dose value indicates a higher sensitivity.

Evaluation of Exposure Latitude (EL)

The exposure dose which provided a L/S pattern with a space width of 100 nm±10% (i.e., 90 nm to 110 nm) was determined. EL (%) is calculated from the exposure doses according to the following equation:

$$EL\ (\%)=(|E_1-E_2|/Eop)\times 100$$

wherein $E_1$ is an exposure dose which provides a L/S pattern with a space width of 90 nm and a pitch of 200 nm, $E_2$ is an exposure dose which provides a L/S pattern with a space width of 110 nm and a pitch of 200 nm, and Eop is the optimum exposure dose which provides a L/S pattern with a space width of 100 nm and a pitch of 200 nm.

Evaluation of Line Width Roughness (LWR)

The L/S pattern formed by exposure in the optimum dose (determined in the sensitivity evaluation) was observed under TD-SEM. The space width was measured at longitudinally spaced apart 10 points, from which a 3-fold value (3σ) of standard deviation (σ) was determined and reported as LWR. A smaller value of 3σ indicates a pattern having a lower roughness and more uniform space width.

The results are shown in Table 7.

TABLE 7

| | | Resist composition | PEB temp. (° C.) | Eop (μC/cm²) | EL (%) | LWR (nm) |
|---|---|---|---|---|---|---|
| Example | 9-1 | R-03 | 100 | 43.4 | 14.5 | 4.6 |
| | 9-2 | R-11 | 105 | 45.1 | 15.3 | 4.9 |
| | 9-3 | R-19 | 100 | 46.4 | 14.9 | 5.3 |
| | 9-4 | R-20 | 110 | 42.5 | 15.5 | 4.7 |
| | 9-5 | R-21 | 100 | 45.9 | 14.7 | 5.1 |
| Comparative Example | 5-1 | R-30 | 95 | 46.2 | 8.9 | 9.3 |
| | 5-2 | R-32 | 105 | 43.5 | 7.8 | 9.4 |
| | 5-3 | R-33 | 100 | 44.9 | 8.5 | 8.9 |

As is evident from Table 7, the resist compositions within the scope of the invention show practically acceptable sensitivity, a wide margin of EL, and low LWR.

Japanese Patent Application No. 2017-159962 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A monomer represented by the formula (1a) or (1b), and adapted to undergo a polarity switch under the action of acid, (1a)

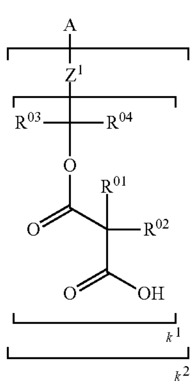

-continued (1b)

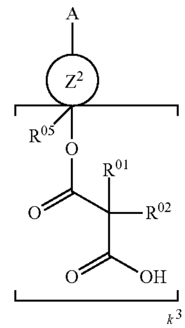

wherein A is a $C_2$-$C_{20}$ organic group containing a polymerizable functional group, $R^{01}$ and $R^{02}$ are each independently hydrogen, or a $C_1$-$C_6$ straight, branched or cyclic monovalent hydrocarbon group in which any constituent —$CH_2$— moiety may be replaced by —O— or —C(═O)—, $R^{01}$ and $R^{02}$ may bond together to form an alicyclic group with the carbon atom to which they are attached, $R^{03}$ to $R^{05}$ are each independently a $C_1$-$C_{10}$ straight, branched or cyclic monovalent hydrocarbon group, $R^{03}$ and $R^{04}$ may bond together to form an alicyclic group with the carbon atom to which they are attached, $Z^1$ is a single bond, or a $C_1$-$C_{20}$ straight, branched or cyclic ($k^1$+1)-valent aliphatic hydrocarbon group in which any constituent —$CH_2$— moiety may be replaced by —O— or —C(═O)—, with the proviso that when A bonds with $Z^1$ or $Z^2$ via an ester bond, the carbon atom in $Z^1$ or $Z^2$ in bond with the ester oxygen atom in A is not tertiary carbon atom, excluding the case wherein the carbon atom in $Z^1$ or $Z^2$ in bond with A is the carbon atom at the 1-position on an adamantane ring, $Z^2$ is a $C_3$-$C_{10}$ ($k^3$+1)-valent cycloaliphatic hydrocarbon group in which any constituent —$CH_2$— moiety may be replaced by —O— or —C(═O)—, $k^1$ is an integer of 1 to 4, $k^2$ is 1 or 2, and $k^3$ is an integer of 1 to 3.

2. The monomer of claim 1 wherein A is an acryloyloxy, methacryloyloxy or optionally heteroatom-containing cycloalkenyl group.

3. A polymer comprising recurring units containing a group represented by the formula (2a) and/or a group represented by the formula (2b) on a side chain, and adapted to undergo a polarity switch under the action of acid, (2a)

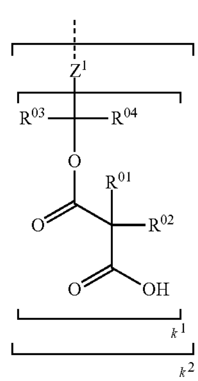

-continued (2b)

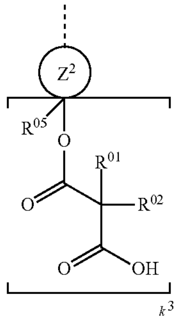

wherein the broken line denotes a valance bond to the polymer backbone, $R^{01}$ and $R^{02}$ are each independently hydrogen, or a $C_1$-$C_6$ straight, branched or cyclic monovalent hydrocarbon group in which any constituent —$CH_2$— moiety may be replaced by —O— or —C(═O)—, $R^{01}$ and $R^{02}$ may bond together to form an alicyclic group with the carbon atom to which they are attached, $R^{03}$ to $R^{05}$ are each independently a $C_1$-$C_{10}$ straight, branched or cyclic monovalent hydrocarbon group, $R^{03}$ and $R^{04}$ may bond together to form an alicyclic group with the carbon atom to which they are attached, $Z^1$ is a single bond, or a $C_1$-$C_{20}$ straight, branched or cyclic ($k^1$+1)-valent aliphatic hydrocarbon group in which any constituent —$CH_2$— may be replaced by —O— or —C(═O)—, with the proviso that when the backbone bonds with $Z^1$ or $Z^2$ via an ester bond, the carbon atom in $Z^1$ or $Z^2$ in bond with the ester oxygen atom therein is not tertiary carbon atom, excluding the case wherein the carbon atom in $Z^1$ or $Z^2$ is the carbon atom at the 1-position on an adamantane ring, $Z^2$ is a $C_3$-$C_{10}$ ($k^3$+1)-valent cycloaliphatic hydrocarbon group in which any constituent —$CH_2$— moiety may be replaced by —O— or —C(═O)—, $k^1$ is an integer of 1 to 4, $k^2$ is 1 or 2, and $k^3$ is an integer of 1 to 3.

4. The polymer of claim 3 wherein the recurring units are selected from the formulae (3a) to (3c):

(3a)

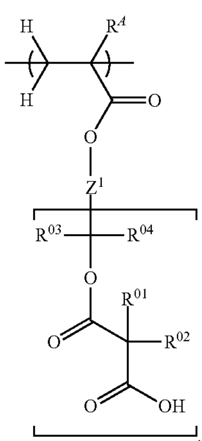

-continued (3b)

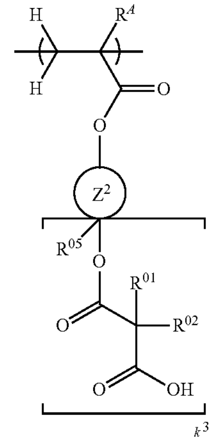

(3c)

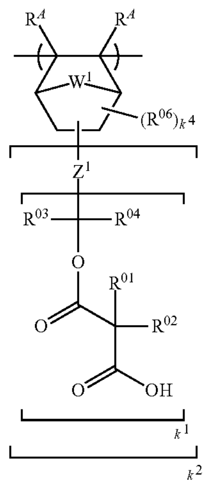

wherein $R^A$ is each independently hydrogen, methyl or trifluoromethyl, $R^{01}$, $R^{02}$ and $R^{06}$ are each independently hydrogen, or a $C_1$-$C_6$ straight, branched or cyclic monovalent hydrocarbon group in which any constituent —$CH_2$— moiety may be replaced by —O— or —C(═O)—, $R^{01}$ and $R^{02}$ may bond together to form an alicyclic group with the carbon atom to which they are attached, in the case of $k^4$≥2, two $R^{06}$ may bond together to form an alicyclic group with the carbon atoms to which they are attached, $R^{03}$ to $R^{05}$ are each independently a $C_1$-$C_{10}$ straight, branched or cyclic monovalent hydrocarbon group $R^{03}$ and $R^{04}$ may bond together to form an alicyclic group with the carbon atom to which they are attached, $W^1$ is —$CH_2$—, —$CH_2CH_2$—, —O— or —S—, or two separate —H, $Z^1$ is a single bond, or a $C_1$-$C_{20}$ straight, branched or cyclic ($k^1$+1)-valent aliphatic hydrocarbon group in which any constituent —$CH_2$— moiety may be replaced by —O— or —C(═O)—, with the proviso that the carbon atom in $Z^1$ or $Z^2$ in bond with the ester oxygen atom in the polymer backbone in the formula is not tertiary carbon atom, excluding the case wherein the carbon atom in $Z^1$ or $Z^2$ is the carbon atom at the 1-position on an adamantane ring, $Z^2$ is a $C_3$-$C_{10}$ ($k^3$+1)-valent cycloaliphatic hydrocarbon group in which any constituent —$CH_2$— moiety may be replaced by —O— or —C(═O)—, $k^1$ is an integer of 1 to 4, $k^2$ is 1 or 2, $k^3$ is an integer of 1 to 3, and $k^4$ is an integer of 1 to 4.

5. The polymer of claim 3, further comprising recurring units of at least one type selected from recurring units having the formulae (4a) to (4c):

(4a)

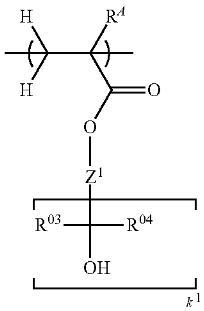

(4b)

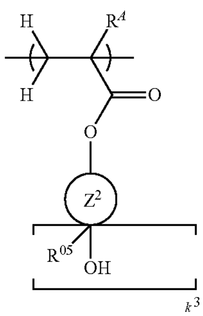

(4c)

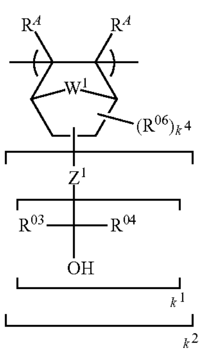

wherein $R^A$ is each independently hydrogen, methyl or trifluoromethyl, $R^{03}$ to $R^{05}$ are each independently a $C_1$-$C_{10}$ straight, branched or cyclic monovalent hydrocarbon group $R^{03}$ and $R^{04}$ may bond together to form an alicyclic group with the carbon atom to which they are attached, $R^{06}$ is each independently hydrogen, or a $C_1$-$C_6$ straight, branched or cyclic monovalent hydrocarbon group in which any constituent —$CH_2$— moiety may be replaced by —O— or —C(═O)—, in the case of $k^4 \geq 2$, two $R^{06}$ may bond together to form an alicyclic group with the carbon atoms to which they are attached, $W^1$ is —$CH_2$—, —$CH_2CH_2$—, —O— or —S—, or two separate —H, $Z^1$ is a single bond, or a $C_1$-$C_{20}$ straight, branched or cyclic ($k^1$+1)-valent aliphatic hydrocarbon group in which any constituent —$CH_2$— moiety may be replaced by —O— or —C(═O)—, with the proviso that the carbon atom in $Z^1$ or $Z^2$ in bond with the ester oxygen atom in the polymer backbone in the formula is not tertiary carbon atom, excluding the case wherein the carbon atom in $Z^1$ or $Z^2$ is the carbon atom at the 1-position on an adamantane ring, $Z^2$ is a $C_3$-$C_{10}$ ($k^3$+1)-valent cycloaliphatic hydrocarbon group in which any constituent —$CH_2$— moiety may be replaced by —O— or —C(═O)—, $k^1$ is an integer of 1 to 4, $k^2$ is 1 or 2, $k^3$ is an integer of 1 to 3, and $k^4$ is an integer of 1 to 4.

6. The polymer of claim 3, further comprising recurring units of at least one type selected from recurring units having the formulae (5a) to (5c):

(5a)

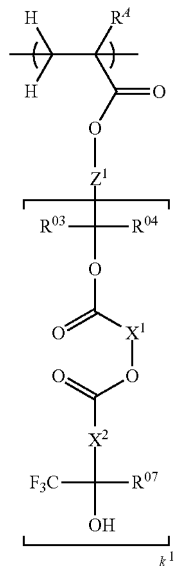

(5b)

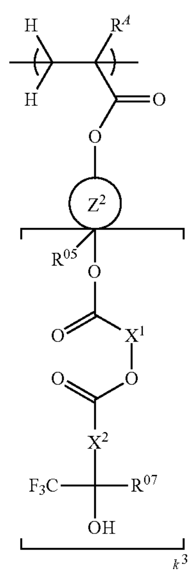

-continued (5c)

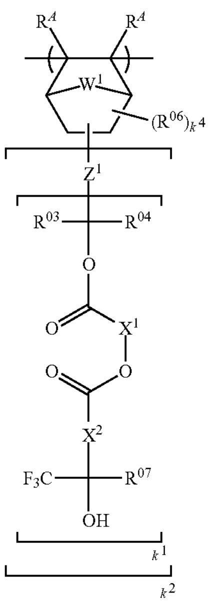

wherein $R^A$ is each independently hydrogen, methyl or trifluoromethyl, $R^{03}$ to $R^{05}$ are each independently a $C_1$-$C_{10}$ straight, branched or cyclic monovalent hydrocarbon group, $R^{03}$ and $R^{04}$ may bond together to form an alicyclic group with the carbon atom to which they are attached, $R^{06}$ is each independently hydrogen, or a $C_1$-$C_6$ straight, branched or cyclic monovalent hydrocarbon group in which any constituent —$CH_2$— moiety may be replaced by —O— or —C(═O)—, in the case of $k^4 \geq 2$, two $R^{06}$ may bond together to form an alicyclic group with the carbon atoms to which they are attached, $R^{07}$ is hydrogen, methyl or trifluoromethyl, $W^1$ is —$CH_2$—, —$CH_2CH_2$—, —O— or —S—, or two separate —H, $X^1$ is a $C_1$-$C_{10}$ straight, branched or cyclic alkylene group, $X^2$ is a single bond, methylene or ethylidene group, $Z^1$ is a single bond, or a $C_1$-$C_{20}$ straight, branched or cyclic ($k^1$+1)-valent aliphatic hydrocarbon group in which any constituent —$CH_2$— moiety may be replaced by —O— or —C(═O)—, with the proviso that the carbon atom in $Z^1$ or $Z^2$ in bond with the ester oxygen atom in the polymer backbone in the formula is not tertiary carbon atom, excluding the case wherein the carbon atom in $Z^1$ or $Z^2$ is the carbon atom at the 1-position on an adamantane ring, $Z^2$ is a $C_3$-$C_{10}$ ($k^3$+1)-valent cycloaliphatic hydrocarbon group in which any constituent —$CH_2$— moiety may be replaced by —O— or —C(═O)—, $k^1$ is an integer of 1 to 4, $k^2$ is 1 or 2, $k^3$ is an integer of 1 to 3, and $k^4$ is an integer of 1 to 4.

7. The polymer of claim 3, further comprising recurring units of at least one type selected from recurring units having the formulae (6a) to (6d):

(6a)

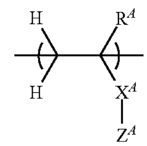

(6b)

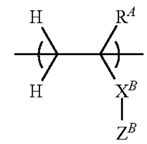

(6c)

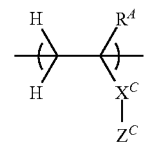

(6d)

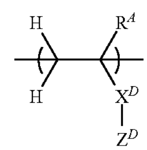

wherein $R^A$ is each independently hydrogen, methyl or trifluoromethyl, $Z^A$ is a $C_1$-$C_{20}$ fluoroalcohol-containing substituent group which is free of a structure undergoing a polarity switch under the action of acid, $Z^B$ is a $C_6$-$C_{20}$ phenolic hydroxyl-containing substituent group, $Z^C$ is a $C_1$-$C_{20}$ carboxyl-containing substituent group, $Z^D$ is a substituent group having a lactone structure, sultone structure, carbonate structure, cyclic ether structure, acid anhydride structure, alcoholic hydroxyl, alkoxycarbonyl, sulfonamide or carbamoyl moiety, $X^A$ to $X^D$ are each independently a single bond, methylene, ethylene, phenylene, fluorinated phenylene, naphthylene, —O—R—, or —C(═O)—Z—R—, Z is —O— or —NH—, and R is a $C_1$-$C_6$ straight, branched or cyclic alkylene, $C_2$-$C_6$ straight, branched or cyclic alkenylene, phenylene or naphthylene group, which may contain a carbonyl moiety, ester bond, ether bond or hydroxyl moiety.

8. The polymer of claim 3, further comprising recurring units of at least one type selected from recurring units having the formulae (7a) to (7c):

(7a)

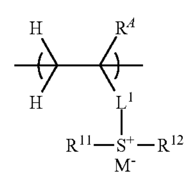

-continued (7b)

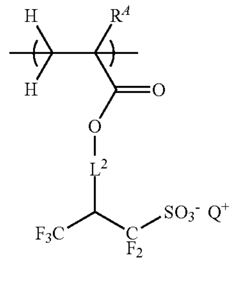

(7c)

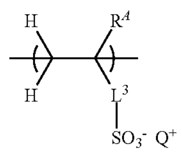

wherein $R^A$ is each independently hydrogen, methyl or trifluoromethyl, $R^{11}$ and $R^{12}$ are each independently a $C_1$-$C_{20}$ straight, branched or cyclic monovalent hydrocarbon group which may contain a heteroatom, $R^{11}$ and $R^{12}$ may bond together to form a ring with the sulfur atom to which they are attached, $L^1$ is a single bond, phenylene group —C(═O)-$L^{11}$-$L^{12}$- or —O-$L^{12}$-, $L^{11}$ is —O— or —NH—, $L^{12}$ is a $C_1$-$C_6$ straight, branched or cyclic alkylene group, $C_2$-$C_6$ straight, branched or cyclic alkenylene group, or phenylene group, which may contain a carbonyl moiety, ester bond, ether bond or hydroxyl moiety, $L^2$ is a single bond or -$L^{21}$-C(═O)—O—, $L^{21}$ is a $C_1$-$C_{20}$ straight, branched or cyclic divalent hydrocarbon group which may contain a heteroatom, $L^3$ is a single bond, methylene, ethylene, phenylene, fluorinated phenylene, —C(═O)-$L^{31}$-$L^{32}$- or —O-$L^{32}$-, $L^{31}$ is —O— or —NH—, and $L^{32}$ is a $C_1$-$C_6$ straight, branched or cyclic alkylene group, $C_2$-$C_6$ straight, branched or cyclic alkenylene group, or phenylene group, which may contain a carbonyl moiety, ester bond, ether bond or hydroxyl moiety, $M^-$ is a non-nucleophilic counter ion, $Q^+$ is a sulfonium cation having the formula (7d) or an iodonium cation having the formula (7e):

(7d)

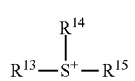

(7e)

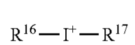

wherein $R^{13}$ to $R^{17}$ are each independently a $C_1$-$C_{20}$ straight, branched or cyclic monovalent hydrocarbon group which may contain a heteroatom, any two of $R^{13}$, $R^{14}$ and $R^{15}$ may bond together to form a ring with the sulfur atom to which they are attached.

9. The polymer of claim 3, further comprising recurring units of at least one type selected from recurring units having the formula (8):

(8)

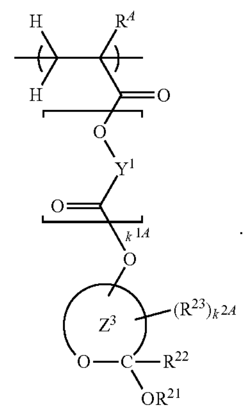

wherein $R^A$ is hydrogen, methyl or trifluoromethyl, $R^{21}$ to $R^{23}$ are each independently hydrogen or a $C_1$-$C_{15}$ straight, branched or cyclic monovalent hydrocarbon group in which any constituent —$CH_2$— moiety may be replaced by —O— or —C(═O)—, $Y^1$ is each independently a $C_1$-$C_{15}$ straight, branched or cyclic divalent hydrocarbon group in which any constituent —$CH_2$— moiety may be replaced by —O— or —C(═O)—, the arc $Z^3$ is a divalent hydrocarbon group which bonds with the carbon and oxygen atoms in the formula to form a $C_4$-$C_{20}$ non-aromatic mono- or polycyclic ring having a hemiacetal structure, $k^{1A}$ is 0 or 1, and $k^{2A}$ is an integer of 0 to 3.

10. A resist composition comprising a base resin containing the polymer of claim 3.

11. The resist composition of claim 10, further comprising an acid generator.

12. The resist composition of claim 10, further comprising an organic solvent.

13. A pattern forming process comprising the steps of applying the resist composition of claim 10 onto a substrate, prebaking to form a resist film, exposing the resist film to high-energy radiation to define exposed and unexposed regions, baking, and developing the exposed resist film in a developer to form a pattern.

14. The pattern forming process of claim 13 wherein the developing step uses an alkaline developer in which the unexposed region of resist film is dissolved and the exposed region of resist film is not dissolved, for forming a negative tone pattern.

15. The monomer of claim 1, represented by the formula (1a-1), (1b-1) or (1c-1):

(1a-1)

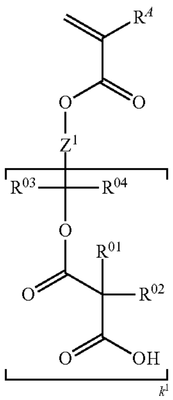

(1b-1)

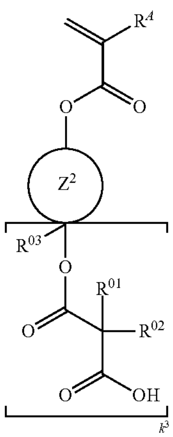

(1c-1)

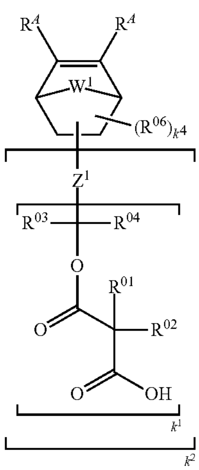

wherein $R^{01}$ to $R^{05}$, $Z^1$, $Z^2$, $k^1$ to $k^3$ are as defined above, $R^A$ is each independently hydrogen, methyl or trifluoromethyl, $R^{06}$ is each independently hydrogen, or a $C_1$-$C_6$ straight, branched or cyclic monovalent hydrocarbon group in which any constituent —$CH_2$— moiety may be replaced by —O— or —C(═O)—, $W^1$ is —$CH_2$—, —$CH_2CH_2$—, —O— or —S—, or two separate —H, and $k^4$ is an integer of 1 to 4, in the case of $k^4 \geq 2$, two $R^{06}$ may bond together to form an alicyclic group with the carbon atom(s) to which they are attached.

16. The monomer of claim 15, represented by the formula (1a-2), (1b-2) or (1c-2):

(1a-2)

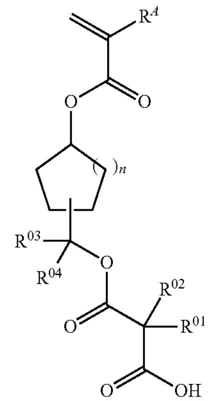

(1b-2)

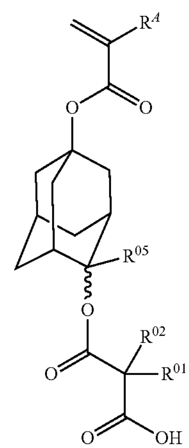

(1c-2)

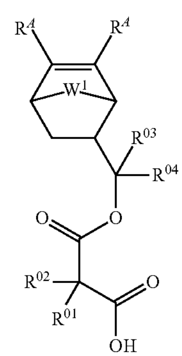

wherein $R^A$, $R^{01}$ to $R^{05}$, and $W^1$ are as defined above, and n is 1 or 2.
17. A monomer which is selected from the group consisting of Monomers 1 to 11:
Monomer 1
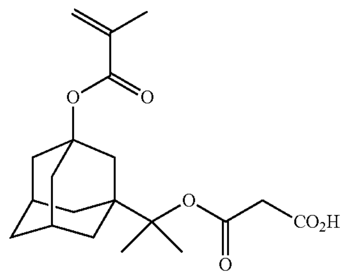
Monomer 2
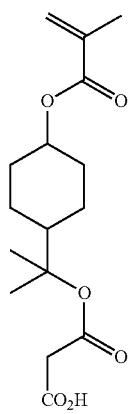
Monomer 3
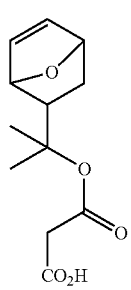
-continued
Monomer 4
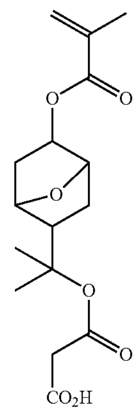
Monomer 5
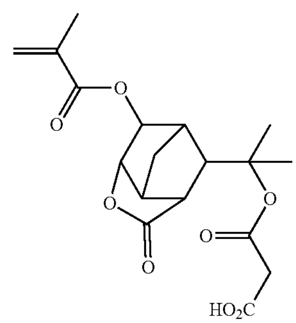
Monomer 6
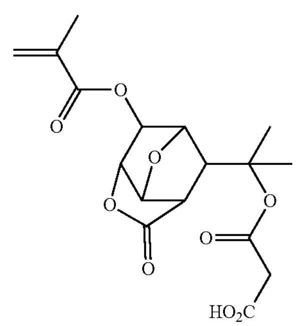
Monomer 7
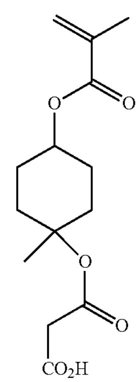

Monomer 8
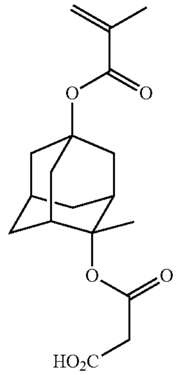
Monomer 9
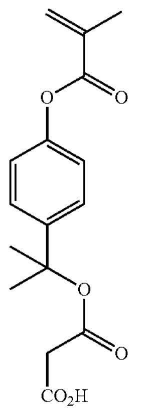
Monomer 10
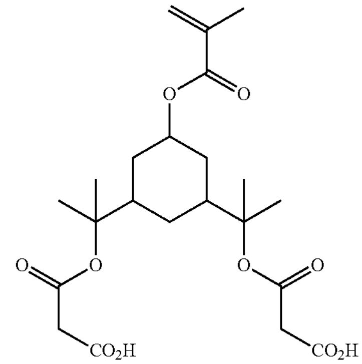
Monomer 11
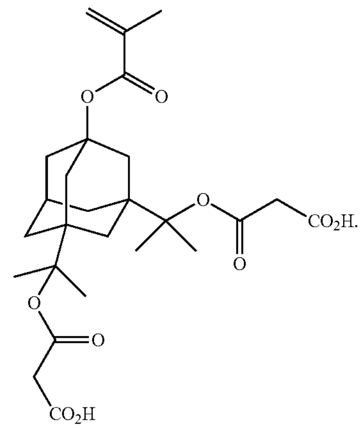
* * * * *